(12) United States Patent
Druffel et al.

(10) Patent No.: US 12,243,950 B2
(45) Date of Patent: Mar. 4, 2025

(54) PASTES FOR SOLAR CELLS, SOLAR CELLS, AND METHODS OF MAKING SAME

(71) Applicant: Bert Thin Films, Inc., Louisville, KY (US)

(72) Inventors: Thad Druffel, Louisville, KY (US); Ruvini Dharmadasa, Louisville, KY (US)

(73) Assignee: Bert Thin Films, Inc., Louisville, KY (US)

( * ) Notice: Subject to any disclaimer, the term of this patent is extended or adjusted under 35 U.S.C. 154(b) by 0 days.

(21) Appl. No.: 17/837,087

(22) Filed: Jun. 10, 2022

(65) Prior Publication Data

US 2022/0320357 A1    Oct. 6, 2022

Related U.S. Application Data

(63) Continuation of application No. PCT/US2020/064514, filed on Dec. 11, 2020.
(Continued)

(51) Int. Cl.
*H01B 1/22* (2006.01)
*H01L 31/0224* (2006.01)
(Continued)

(52) U.S. Cl.
CPC ........... *H01L 31/0512* (2013.01); *H01B 1/22* (2013.01); *H01L 31/02245* (2013.01); *H01L 31/18* (2013.01)

(58) Field of Classification Search
CPC ......... H01L 31/022425; H01L 31/0512; H01L 31/1804; H01B 1/22
See application file for complete search history.

(56) References Cited

U.S. PATENT DOCUMENTS

| 6,585,796 B2 | 7/2003 | Hosokura et al. |
| 9,698,283 B2 | 7/2017 | Hardin et al. |
| | (Continued) | |

FOREIGN PATENT DOCUMENTS

| CN | 103700428 | 4/2014 |
| CN | 103700428 A | 4/2014 |
| | (Continued) | |

OTHER PUBLICATIONS

Machine translation of WO-2019088525-A1, Gao M. (Year: 2019).*
(Continued)

*Primary Examiner* — Mayla Gonzalez Ramos
(74) *Attorney, Agent, or Firm* — Wood Herron & Evans LLP

(57) ABSTRACT

A paste (32) for use in metallization of a solar cell (12) includes an organic vehicle (44) and a mixture of copper-containing particles (46), metal-oxide-containing nanoparticles (50), and secondary oxide particles (52) different from the metal-oxide-containing nanoparticles (50). The secondary oxide particles (52) include particles (42) of a metal oxide and a metal of the metal oxide capable of reducing at least some of the metal-oxide-containing nanoparticles (50) to metal when heated. The organic vehicle (44) is capable of reducing the metal oxide of the secondary oxide particles (52) upon decomposition of the organic vehicle (44). A paste (32) includes a mixture of particles (42) including metallic copper particles (46), nanoparticles (50), and metal oxide particles (52) in the organic vehicle (44). The nanoparticles (50) include at least one oxide of nickel, copper, cobalt, manganese, and lead. The metal oxide of the metal oxide particles (52) has a more negative Gibbs Free Energy of Formation than a metal oxide of the at least one oxide of the nanoparticles (50).

33 Claims, 95 Drawing Sheets

Related U.S. Application Data

(60) Provisional application No. 62/947,316, filed on Dec. 12, 2019.

(51) Int. Cl.
  *H01L 31/05* (2014.01)
  *H01L 31/18* (2006.01)

(56) References Cited

U.S. PATENT DOCUMENTS

| | | | |
|---|---|---|---|
| 2009/0095344 A1 | 4/2009 | Machida et al. | |
| 2011/0277831 A1* | 11/2011 | Yoshida | H01B 1/22 252/514 |
| 2011/0315217 A1 | 12/2011 | Gee | |
| 2012/0061624 A1* | 3/2012 | Jung | H01B 1/22 252/514 |
| 2012/0161081 A1* | 6/2012 | Kleine Jaeger | H01B 1/02 977/932 |
| 2014/0264191 A1 | 9/2014 | Rantala | |
| 2019/0181277 A1* | 6/2019 | Park | H01B 1/22 |

FOREIGN PATENT DOCUMENTS

| | | | | |
|---|---|---|---|---|
| EP | 0028819 | A1 | 5/1981 | |
| EP | 0068167 | A2 | 1/1983 | |
| EP | 2337036 | A2 | 6/2011 | |
| EP | 2418656 | A1 * | 2/2012 | H01B 1/22 |
| EP | 2444979 | A1 | 4/2012 | |
| EP | 2822000 | A1 | 1/2015 | |
| EP | 2911160 | A1 | 8/2015 | |
| EP | 3419028 | A1 | 12/2018 | |
| WO | 2013085249 | A1 | 6/2013 | |
| WO | WO-2019088525 | A1 * | 5/2019 | C03C 8/14 |

OTHER PUBLICATIONS

Machine translation of EP-2418656-A1, Hwan O J et al. (Year: 2012).*
Database WPI, Week 201435, 2014, Thomas Scientific, London, GB; AN 2014-J98874 XP002802322.
PCT Office, International Search Report and Written Opinion issued in PCT/US2020/064514 mailed on Jul. 27, 2021.
PCT Office, International Preiminary Report on Patentability issued in PCT/US2020/064514 mailed on May 17, 2022.
European Patent Office, Examination Report issued in EP 20845247.4 dated Jul. 28, 2023.
European Patent Office, Intention to Grant issued in EP 20 845 247.4-1102 dated May 14, 2024 (5 pages).
Stephen King, Peter, Jarvie and Helen Dobson, Nanoparticle, Encyclopedia Britannica, May 14, 2019. Article No. 1109065, 10 Pages, USA.
European Patent Office Examination Report 2906, Application No. 20845247.4, Report Dated Jan. 29, 2024, 2 Pages.
The Intellectual Property Office of Vietnam, Office Action issued in Vietnamese Application No. 1-2022-04313 dated Jun. 3, 2024 (with English Translation) 3 pages.
China National Intellectual Property Administration, Examination Report issued in 202080084323.7 dated Nov. 20, 2023.
Curtolo, D.C.; Xiong, N.; Friedrich, S.; and Friedrich, B; "High- and Ultra-High-Purity Aluminum, a Review on Technical Production Methodologies," Metals 2021, 11, 1407.

* cited by examiner

PASTES FOR SOLAR CELLS, SOLAR CELLS, AND METHODS OF MAKING SAME

CROSS-REFERENCE TO RELATED APPLICATIONS

This application claims priority to U.S. Application No. 62/947,316 filed on Dec. 12, 2019, and which is incorporated by reference herein in its entirety.

FEDERALLY SPONSORED RESEARCH

This invention was made with government support from the National Science Foundation under STTR contract No. 1-1448883 and SBIR contract No. 11-1660161 and from the State of Kentucky under STTR contract No. KSTC-184-512-15-188 and SBIR contract No. 2018-001.

TECHNICAL FIELD

The present invention relates generally to the manufacturing of solar panels and to paste compositions for use during the manufacturing of components of solar panels, and more particularly to metal-containing pastes, solar cells made with those pastes, and the methods of making and using those pastes in solar panel manufacturing.

BACKGROUND

The solar industry has seen tremendous growth, an average year-over-year increase in the prior decade being about 29%. Manufacturing capacity of solar panels reached about 150 gigawatts in 2018. The industry is dominated by crystalline silicon solar cells with about 95% of market capacity being crystalline silicon solar panels. However, despite growth, competitive pricing has resulted in an 80% decrease in the market price of solar panels. As a result, profit margins have significantly narrowed.

While being made primarily of silicon, a solar panel has numerous other structures by which sunlight is converted into electricity. A solar panel is composed of solar cells that are typically connected in series using tabbing wires/ribbons and are hermetically encapsulated between a glass front sheet and a back sheet. Each solar cell includes a silicon wafer that is doped to produce a p-n junction. When exposed to sunlight, the electric field at the p-n junction separates charge carriers (i.e., electrons and holes). In this way, electrical current is produced.

Other structures of a solar panel can include an antireflective coating (e.g., silicon nitride (SiN) and titanium dioxide ($TiO_2$)) on the front side or sun-exposed side of the doped silicon wafer. The coating reduces light reflection from the cell and thus improves the efficiency of the cell. Charge carriers produced during light exposure are collected by conductive contacts on the front side and back side of each cell. The conductive contacts are typically positioned across the front side in lines 15 µm to 200 µm wide and spaced every 0.7 mm to 5 mm apart. Each line may be referred to as a "finger." The spacing and individual widths of the fingers permit sunlight to impinge upon large surface areas of the doped silicon. The conductive contact on the backside does not need to be transparent. Often a thin layer of metal, such as aluminum, forms the back side of the cell. Additional conductive connections, such as bus bars, which are 0.1 mm to 2 mm wide and made of silver, are electrically coupled to the fingers and backside aluminum. While not limited to any particular number, the number of bus bars can range from 2 to 8 and may be replaced with other configurations and even non-busbar designs.

The fingers and bus bars on current silicon solar cells are nearly all silver (Ag). With the increased demand and plummeting margins, manufacturers have minimized silver use. That minimization has been accomplished through improvements to the paste formulation and optimization of the paste-printing process. One method of reducing cost is to reduce the width of each finger of silver. This alone has resulted in a 50% reduction in silver consumption. While additional reductions are possible, there is a lower limit, below which both device performance and production yields become unacceptable. As manufacturers push the lower limit on silver use to reduce costs, less expensive alternatives to silver are being investigated.

Copper is an ideal alternative to silver. Copper is significantly cheaper while having comparable electrical conductivity. One downside, however, is that copper degrades a solar cell quickly, and so the use of copper complicates manufacturing. To address degradation, particularly diffusion of copper into silicon, different techniques may be utilized to deposit copper on silicon. One technique is electroplating. While generally successful, electroplating requires newer equipment and added processing beyond current silver-paste screen-printing techniques. Because significant capital investment is required to utilize electroplating of copper, it has not been adopted by industry. There are additional disadvantages.

Electroplated copper requires application of a diffusion barrier on the silicon prior to the deposition of copper. The copper is then electroplated over that barrier. The diffusion barrier thus separates the copper from the silicon. During use of the solar cell, the copper is prohibited by the barrier from diffusing into the silicon. Another issue is, unlike silver, copper readily oxidizes.

Once oxidized, both adhesion of copper to the diffusion barrier and solderability are negatively affected. Soldering of other electrical connections to the fingers is then problematic. To minimize oxidation, a capping layer of tin or silver is applied over the copper. This complicated multi-layered structure requires significant capital expenditures and multiple separate deposition processes. These additional layers and processes nullify any material cost benefit to using copper. Additionally, the plating baths also pose environmental, health and safety issues. Ultimately, the material cost savings to using copper is overshadowed by high capital costs and costs of production.

To address these and other problems, what is needed in the art is a replacement for silver in solar panels. More particularly, manufacturers seek a solution to problems posed by use of copper in place of silver.

SUMMARY

The present invention overcomes the foregoing and other shortcomings and drawbacks of solar panels, pastes, and methods for manufacturing same. While the invention will be described in connection with certain embodiments, it will be understood that the invention is not limited to these embodiments. On the contrary, the invention includes all alternatives, modifications and equivalents as may be included within the spirit and scope of the present invention.

In accordance with the principles of the invention, a paste for use in metallization of a solar cell comprises an organic vehicle, and a mixture of copper-containing particles, metal-oxide-containing nanoparticles, and secondary oxide particles different from the metal-oxide-containing nanoparticles in the organic vehicle. The secondary oxide particles include particles of a metal oxide and a metal of the metal oxide capable of reducing at least some of the metal-oxide-containing nanoparticles to metal when the paste is heated to a temperature at which the organic vehicle decomposes.

In one embodiment, the organic vehicle is capable of reducing the metal oxide of the secondary oxide particles upon decomposition of the organic vehicle.

In one embodiment, the organic vehicle includes polyvinylpyrrolidone.

In one embodiment, the secondary oxide particles include frit particles.

In one embodiment, the copper-containing particles include metallic copper particles or copper alloy particles.

In one embodiment, the metallic copper particles have at least one metal of nickel, cobalt, or manganese on the surfaces of the metallic copper particles or on the surfaces of the copper alloy particles.

In one embodiment, the at least one metal of nickel, cobalt, or manganese is in the form of a metallic particle on the surfaces of the metallic copper particles or on the surfaces of the copper alloy particles.

In one embodiment, the at least one metal of nickel, cobalt, or manganese is in the form of a metal oxide particle on the surfaces of the metallic copper particles or on the surfaces of the copper alloy particles.

In one embodiment, the metallic copper particles or the copper alloy particles and/or the at least one metal are doped with at least phosphorous.

In one embodiment, the surfaces of the metallic copper particles or the surfaces of the copper alloy particles are not fully covered by the at least one metal.

In one embodiment, the at least one metal covers at least a portion of the surfaces of the metallic copper particles or covers at least a portion of the surfaces of the copper alloy particles.

In one embodiment, the metal oxide of the secondary oxide particles is antimony oxide.

In one embodiment, the metal-oxide containing nanoparticles include at least one oxide of nickel, copper, cobalt, manganese, and lead.

In one embodiment, the metal-oxide-containing nanoparticles include oxides of nickel and lead.

In one embodiment, the metal oxide of the secondary oxide particles includes antimony oxide.

In one embodiment, the metal-oxide-containing nanoparticles include oxides of nickel, copper, and lead.

In one embodiment, the paste is free of silver.

In one embodiment, a ratio of secondary oxide particles to metal-oxide-containing nanoparticles is in a range of 0.50 to 16.96 by weight.

In one embodiment, a ratio of secondary oxide particles to metal-oxide-containing nanoparticles is in a range of 1.50 to 3.51 by weight.

In one embodiment, the at least one metal of nickel, cobalt, and manganese is in the form of a metallic particle on the surfaces of the copper-containing particles and the copper-containing particles with metallic particles have a surface area in the range of 1 $m^2/g$ to 5 $m^2/g$.

In one embodiment, the at least one metal of nickel, cobalt, and manganese is in the form of a metallic particle on the surfaces of the copper-containing particles and the copper-containing particles with metallic particles have a surface area in the range of 0.7 $m^2/g$ to 5 $m^2/g$.

In one embodiment, the copper-containing particles include a mixture of a fine copper powder and a coarse copper powder.

In one embodiment, the fine copper powder is characterized by an average particle size in a range of 1.2 μm to 3.2 μm and the coarse copper powder is characterized by an average particle size in a range of 7.53 μm to 14.69 μm, 10 μm to 20 μm or 1.75 μm to 7.20 μm.

In one embodiment, the organic vehicle is an organic binder and an organic solvent.

In one embodiment, the organic vehicle further includes a viscosity modifier.

In one embodiment, the organic solvent is propylene glycol.

In one embodiment, the organic vehicle further includes an organic binder.

In accordance with the principles of the present invention, a paste comprises an organic vehicle, and a mixture of particles including metallic copper particles, nanoparticles, and metal oxide particles in the organic vehicle. The nanoparticles include at least one oxide of nickel, copper, cobalt, manganese, antimony, tellurium, bismuth, and lead.

In one embodiment, the metal oxide of the metal oxide particles has a more negative Gibbs Free Energy of Formation than a metal oxide of the at least one oxide of the nanoparticles.

In one embodiment, the metallic copper particles form the largest volume portion of metal in the paste.

In one embodiment, the nanoparticles include lead oxide containing particles.

In one embodiment, the nanoparticles are oxides of nickel and lead.

In one embodiment, the metal oxide particles include particles of antimony oxide.

In one embodiment, the nanoparticles include lead oxide containing particles and the metal oxide particles include particles of antimony oxide.

In one embodiment, the organic vehicle is capable of reducing the metal oxide particles upon decomposition of the organic vehicle.

In one embodiment, the organic vehicle includes polyvinylpyrrolidone.

In one embodiment, the metal oxide particles include frit particles.

In one embodiment, the metallic copper particles have at least one metal of nickel, cobalt, or manganese on the surfaces of the metallic copper particles.

In one embodiment, the at least one metal of nickel, cobalt, or manganese is in the form of a metallic particle on the surfaces of the metallic copper particles.

In one embodiment, the at least one metal of nickel, cobalt, or manganese is in the form of a metal oxide particle on the surfaces of the metallic copper particles.

In one embodiment, the metallic copper particles and/or the at least one metal are doped with at least phosphorous.

In one embodiment, the surfaces of the metallic copper particles are not fully covered by the at least one metal.

In one embodiment, the at least one metal covers at least a portion of the surfaces of the metallic copper particles.

In one embodiment, the metal oxide particles are particles of antimony oxide.

In one embodiment, the nanoparticles include at least one oxide of nickel, copper, cobalt, manganese, and lead.

In one embodiment, the nanoparticles include oxides of nickel and lead.

In one embodiment, the metal oxide particles are particles of antimony oxide.

In one embodiment, the nanoparticles include oxides of nickel, copper, and lead.

In one embodiment, the paste is free of silver.

In one embodiment, a ratio of metal oxide particles to nanoparticles is in a range of 0.5 to 17 by weight.

In one embodiment, a ratio of metal oxide particles to nanoparticles is in a range of 1.5 to 3.5 by weight.

In one embodiment, a ratio of metal oxide particles to nanoparticles is in a range of 0.25 to 20 by weight.

In one embodiment, a ratio of metal oxide particles to nanoparticles is in a range of 3 to 17 by weight.

In one embodiment, the nanoparticles include lead oxide and/or lead hydroxide containing particles and the metal oxide particles include particles of antimony oxide.

In one embodiment, the metallic copper particles are modified to include metal-containing particles on their surfaces.

In one embodiment, the modified metallic copper particles have a surface area greater than a surface area of the metallic copper particles without modification.

In one embodiment, the modified metallic copper particles have a surface area in the range of 0.7 $m^2/g$ to 5 $m^2/g$.

In one embodiment, the modified metallic copper particles have a surface area in the range of 1 $m^2/g$ to 5 $m^2/g$.

In one embodiment, the metallic copper particles include a mixture of a fine copper powder and a coarse copper powder.

In one embodiment, the fine copper powder is characterized by an average particle size in a range of 1.2 μm to 3.2 μm and the coarse copper powder is characterized by an average particle size in a range of 7.53 μm to 14.69 μm, 10 μm to 20 μm, or 1.75 μm to 7.20 μm.

In one embodiment, the organic vehicle is an organic binder and an organic solvent.

In one embodiment, the organic vehicle further includes a viscosity modifier.

In one embodiment, the organic solvent is propylene glycol.

In one embodiment, the organic vehicle further includes an organic binder.

In one embodiment, the organic solvent is one of propylene glycol, dipropylene glycol, and tripropylene glycol, or combinations thereof.

In one embodiment, the metallic copper particles consist of a fine copper powder. In one embodiment, the fine copper powder is characterized by an average particle size in a range of 1.2 μm to 3.2 μm.

In accordance with the principles of the present invention, a paste consists essentially of an organic vehicle, and a mixture of metallic copper particles, nanoparticles, and metal oxide particles in the organic vehicle. The nanoparticles include at least one oxide of nickel, copper, cobalt, manganese, antimony, tellurium, bismuth, and lead.

In accordance with the principles of the present invention, a paste consists of an organic vehicle and a mixture of metallic copper particles, nanoparticles, and metal oxide particles in the organic vehicle. The nanoparticles include at least one oxide of nickel, copper, cobalt, manganese, antimony, tellurium, bismuth, and lead.

In accordance with the principles of the present invention, a solar cell comprises a semiconductor substrate and at least one copper-containing conductor on the semiconductor substrate. The copper-containing conductor includes a plurality of grains of copper or a copper alloy and at least portions of grain boundaries between adjacent grains include at least one of lead, copper, cobalt, manganese, tellurium, and bismuth and at least one other metal.

In one embodiment, an oxide of at least one other metal has a more negative Gibbs Free Energy of Formation than lead oxide.

In one embodiment, the at least one other metal is antimony.

In one embodiment, at least portions of the grain boundaries further include nickel.

In one embodiment, the copper-containing conductor and the semiconductor substrate meet at an interface and the interface includes lead and the at least one other metal between the semiconductor substrate and the grains.

In one embodiment, the interface includes a metal silicide.

In one embodiment, the interface further includes nickel.

In one embodiment, the solar cell is free of silver.

In one embodiment, the copper-containing conductor is a finger.

In one embodiment, the finger has a thickness in the range of 10 μm to 100 μm.

In one embodiment, the solar cell includes a highly doped silicon emitter layer, and the finger is in electrical contact with the silicon emitter layer.

In one embodiment, the finger has a resistivity that is in the range of 2 times to 10 times the resistivity of bulk metallic copper.

In one embodiment, the conductor is a busbar.

In one embodiment, the busbar has a thickness in the range of 10 μm to 100 μm.

In one embodiment, the solar cell includes an anti-reflective layer on the semiconductor substrate, the anti-reflective layer defines an outer surface of the solar cell, and the busbar is in direct contact with the anti-reflective layer but does not contact the semiconductor substrate.

In one embodiment, the solar cell further includes a plurality of the busbars arranged in a pattern in which the busbars are spaced apart by a distance of less than 40 mm.

In one embodiment, the solar cell is free of a separately deposited diffusion barrier between the copper-conductor and the semiconductor substrate.

In accordance with the principles of the present invention, a method of making a solar cell comprises placing a paste on a surface of a substrate, the paste comprising an organic vehicle and a mixture of particles including metallic copper particles, nanoparticles, and metal oxide particles in the organic vehicle. The nanoparticles include at least one oxide of nickel, copper, cobalt, manganese, and lead. The paste is heated to a temperature at which the organic vehicle decomposes and reduces at least some of the metal oxides to a metal.

In one embodiment, heating includes heating in air.

In one embodiment, during heating, the metal reduces at least some of the metal-oxide-containing nanoparticle to metal.

In one embodiment, the substrate includes a silicon nitride layer and during heating, the heated metal oxides and metal react with the silicon nitride layer.

In accordance with the principles of the present invention, a process for modifying surfaces of copper-containing particles for use in a paste comprises mixing copper-containing particles with metal ions in a solution, adding a reducing agent to the mixture of copper-containing particles and metal ions to reduce the metal ions to metal such that the metal deposits on surfaces of the copper-containing particles, and separating the surface modified copper-containing particles from the solution.

In one embodiment, the process further comprises heating the mixture of copper-containing particles, metal ions, and a reducing agent.

In one embodiment, the surface modified copper-containing particles have a surface area greater than the particles of copper prior to depositing the metal.

In one embodiment, the surface modified copper-containing particles have a surface area of at least 0.66 m²/g.

In one embodiment, the surface modified copper-containing particles have a surface area of at least 0.83 m²/g.

In one embodiment, the metal ions are one or more of nickel, manganese, and cobalt. One embodiment includes a paste that contains the surface modified copper-containing particles.

In accordance with the principles of the present invention, a method of making a paste for metallization of a solar cell comprises mixing a plurality of particles together in an organic vehicle. The plurality of particles includes copper-containing particles, nanoparticles, and secondary oxide particles.

In one embodiment, prior to mixing, the method further includes modifying the surfaces of the copper-containing particles to increase a surface area of the copper-containing particles by at least 20%.

In one embodiment, prior to mixing, the method further includes modifying the surfaces of the copper-containing particles by exposing the copper-containing particles to a solution and depositing particles of a metal and/or a metal oxide on the surfaces of the copper-containing particles.

In one embodiment, prior to mixing, the method further includes mixing a first powder containing the copper-containing particles with a second powder containing the copper-containing particles, the first powder is characterized by a first average particle size and a first particle size distribution and the second powder is characterized by a second average particle size and a second particle size distribution, the first average particle size being greater than the second average particle size.

In one embodiment, all the copper-containing particles are from a single particle size distribution.

In one embodiment, mixing includes mixing at least 80 wt. % of the copper-containing particles, 1 to 15 wt. % of the secondary oxide particles, and 1 to 10 wt. % nanoparticles with 1 to 13 wt. % organic vehicle.

In one embodiment, mixing includes mixing metallic copper particles, nanoparticles containing at least lead, and antimony oxide particles together.

In one embodiment, prior to mixing, the method further includes modifying the surfaces of the copper-containing particles to increase a surface area of the copper-containing particles by at least 2%.

In one embodiment, the copper-containing particles consist of a fine copper powder.

In one embodiment, the fine copper powder is characterized by an average particle size in a range of 1.2 µm to 3.2 µm.

In one embodiment, a ratio of secondary oxide particles to metal-oxide-containing nanoparticles is in a range of 0.25 to 20 by weight.

In one embodiment, a ratio of secondary oxide particles to metal-oxide-containing nanoparticles is in a range of 3 to 17 by weight.

BRIEF DESCRIPTION OF THE DRAWINGS

The accompanying drawings, which are incorporated in and constitute a part of this specification, illustrate embodiments of the invention and together with the detailed description given below, serve to explain various aspects of the invention.

FIGS. 31K, 31L, 31M, 31N, 31O show the impact of the amount of organic vehicle in the paste and the firing conditions (i.e. the hold time) on the $J_{sc}$, the $V_{oc}$, the FF, the $\eta$ and the resistance across the fingers, respectively, when the surface modified fine copper containing particles in the paste had a surface area of 2.65 m$^2$/g.

DETAILED DESCRIPTION

Figure 1:
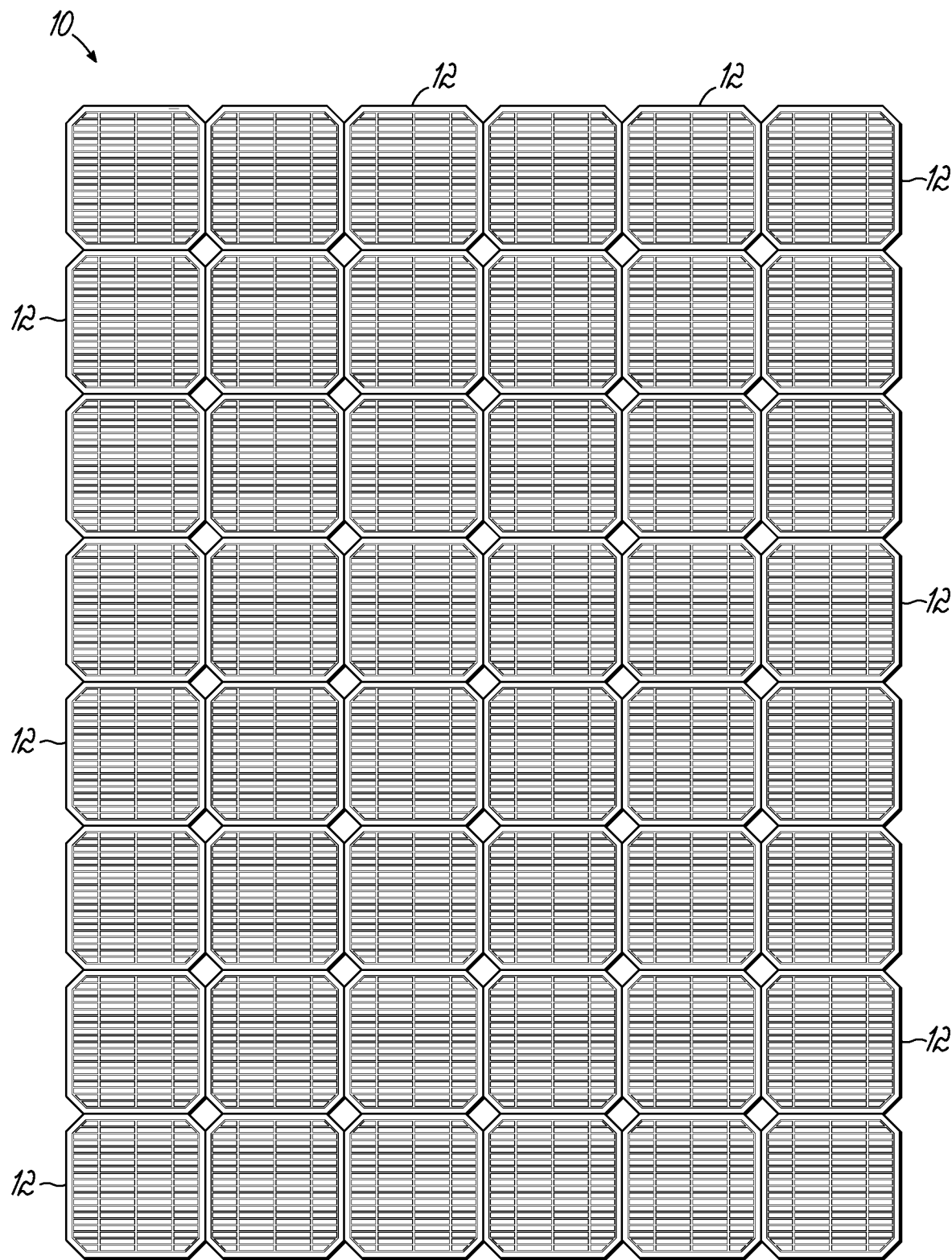
FIG. 1 is a plan view of a cell array of a solar panel according to one embodiment of the invention.
Figure 2:
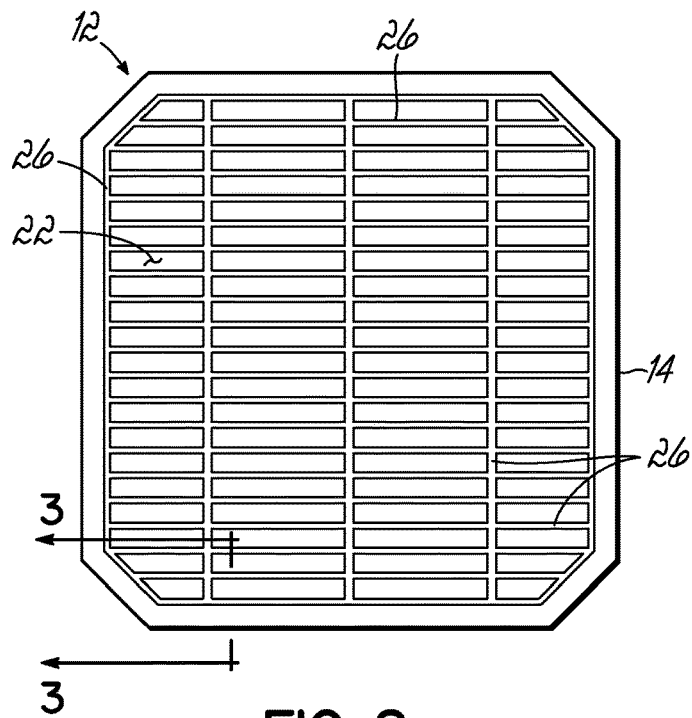
FIG. 2 is an enlarged plan view of one solar cell of the solar panel shown in FIG. 1 according to one embodiment of the invention.

With reference to FIGS. 1 and 2, a cell array 10 of a solar panel (not shown) includes a plurality of solar cells 12. Although not shown in FIG. 1, the cell array 10 may be a package of components including a front sheet, a rear sheet, and encapsulant layers (e.g., ethylene vinyl acetate). A silicon substrate lies between the front sheet and the rear sheet between the encapsulant layers. Interconnections are needed to electrically connect the cells 12 within the array 10 together. These components maybe enclosed within a frame (not shown). The number of cells 12 within the array 10 may vary from that shown. For example, solar panels may include sixty cells or more. Other common cell counts are 72 and 90. But, embodiments of the invention are not limited to any number of solar cells 12 in the cell array 10.

As is described herein, one or more of the cells 12 may include one or more electrical conductors (i.e., electrodes) containing copper. The largest proportion of the metal conductors may be copper with the remaining proportion being of other metals and/or metal-containing materials. In one embodiment, one or more of the solar cells 12 is free of silver. Advantageously, the solar cells 12 may be produced in a cost-effective manner as copper-containing conductors replace silver conductors. Furthermore, as is described herein, the copper-containing conductors are produced from a copper-containing paste in a metallization process. As a further advantage, the pastes of the present invention may be substituted into processes that currently utilize silver-containing pastes, such as solar cell/panel manufacturing processes. As will be appreciated, this eliminates the necessity of large capital investments observed with copper electroplating techniques while providing a cost-effective process for producing a solar cell having predominately copper electrodes and in which silver is absent.

Figure 3:
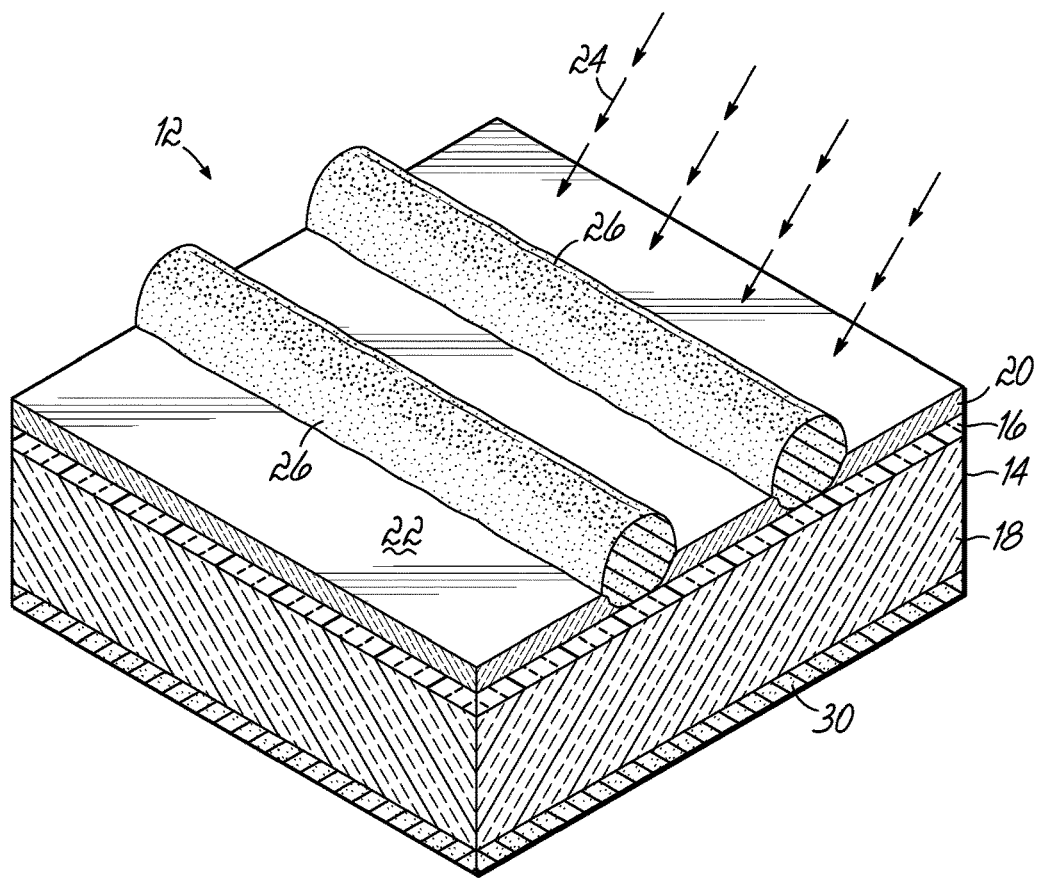
FIG. 3 is an enlarged perspective cross-sectional view of the solar cell of FIG. 2 taken along section line 3-3.

With reference to FIGS. 2 and 3, the solar cell 12 includes a semiconductor substrate or wafer 14. The wafer 14 is monocrystalline silicon. However, embodiments of the invention are equally applicable to polycrystalline silicon substrates as well as other semiconductor substrates and films. With reference to FIG. 3, the wafer 14 may include an n-type doped silicon region 16 adjacent a p-type doped silicon region 18 to form a p-n junction. Other architectures may include a reversal of the p and n doped regions and the incorporation of localized doped regions. The combination of regions 16 and 18 permits separation of electrons from holes when the silicon is struck by photons of light. An anti-reflective coating 20 covers the n-type doped silicon region 16 and defines a front surface 22 of the solar cell 12. By way of example, the anti-reflective coating 20 may be silicon nitride (SiN). The anti-reflective coating 20 reduces the amount of reflection of the incident light (shown by arrows 24 in FIG. 3) from the front surface 22 and thereby increases the portion of incident light 24 that impinges the wafer 14. The anti-reflective coating 20 also assists in passivating the surface of the silicon wafer 14, which reduces recombination losses. This improves the electrical efficiency of the solar cell 12.

A plurality of electrical conductors 26, referred to as fingers, are exposed at the front surface 22 of the solar cell 12. As shown in FIG. 3, the fingers 26 penetrate the anti-reflective coating 20 and are in electrical contact with the wafer 14, and particularly with the n-type doped silicon region 16. A backside conductor 30 is in electrical contact with the p-type doped region 18 of the wafer 14 opposite the fingers 26. The conductors 26 and 30 conduct the current produced by photons of light impinging the wafer 14 to ultimately generate electricity. In accordance with embodiments of the invention, one or more of the fingers 26 and/or the backside conductor 30 may be copper-containing and further in that regard may be free of silver. The fingers 26 made as described herein have a conductivity that is 2 times to 10 times less conductive than bulk metallic copper. The resistivity of the fingers is the reciprocal of their conductivity. The backside conductor 30 may be formed of aluminum or another electrical conductor, which has a thickness in the range of 10 µm to 100 µm. As described above, by way of example, the fingers 26 may be formed from a copper-containing paste and so replace silver-containing pastes in the manufacture of the solar cell 12.

Figure 5:
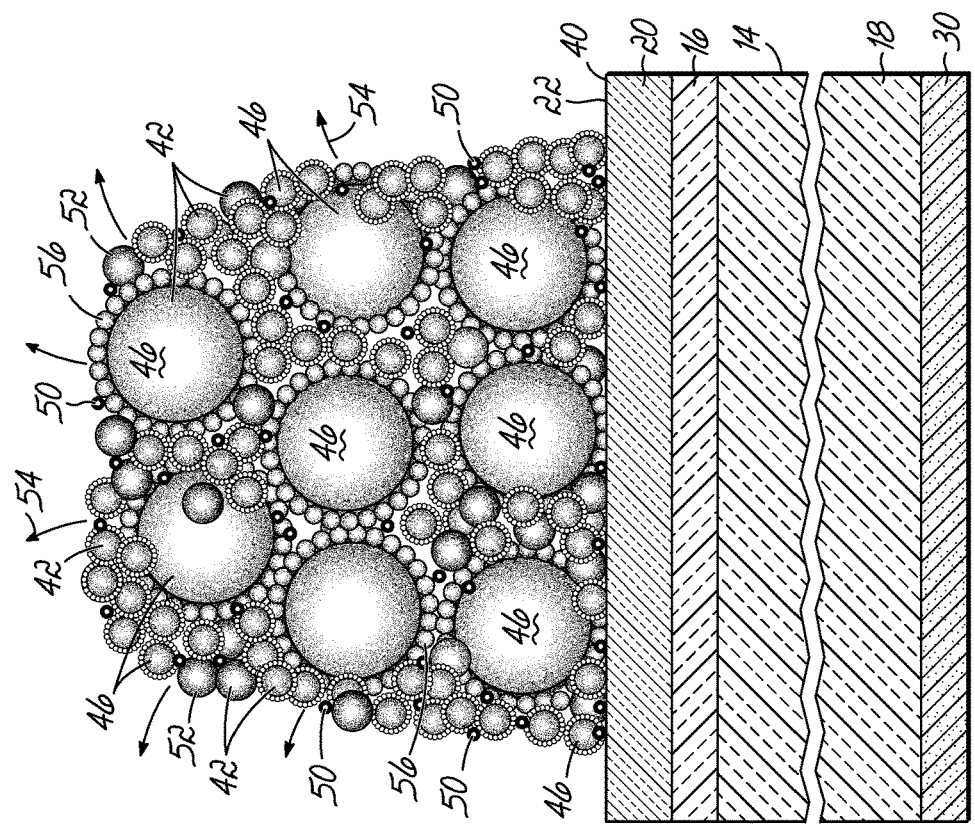
FIG. 5 is a schematic representation of a cross-section of the line of paste of FIG. 4 following drying according to one embodiment of the invention.
Figure 4:
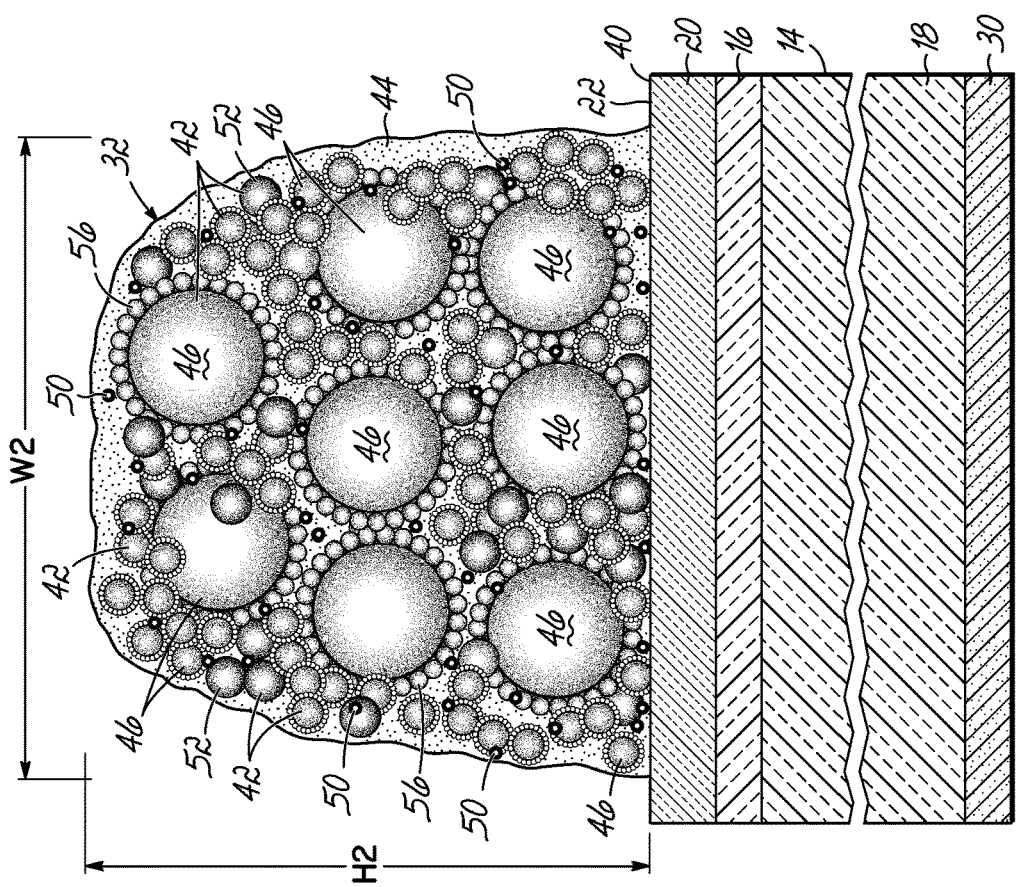
FIG. 4 is a schematic representation of a cross-section of a line of paste on a substrate according to one embodiment of the invention.
Figure 6:
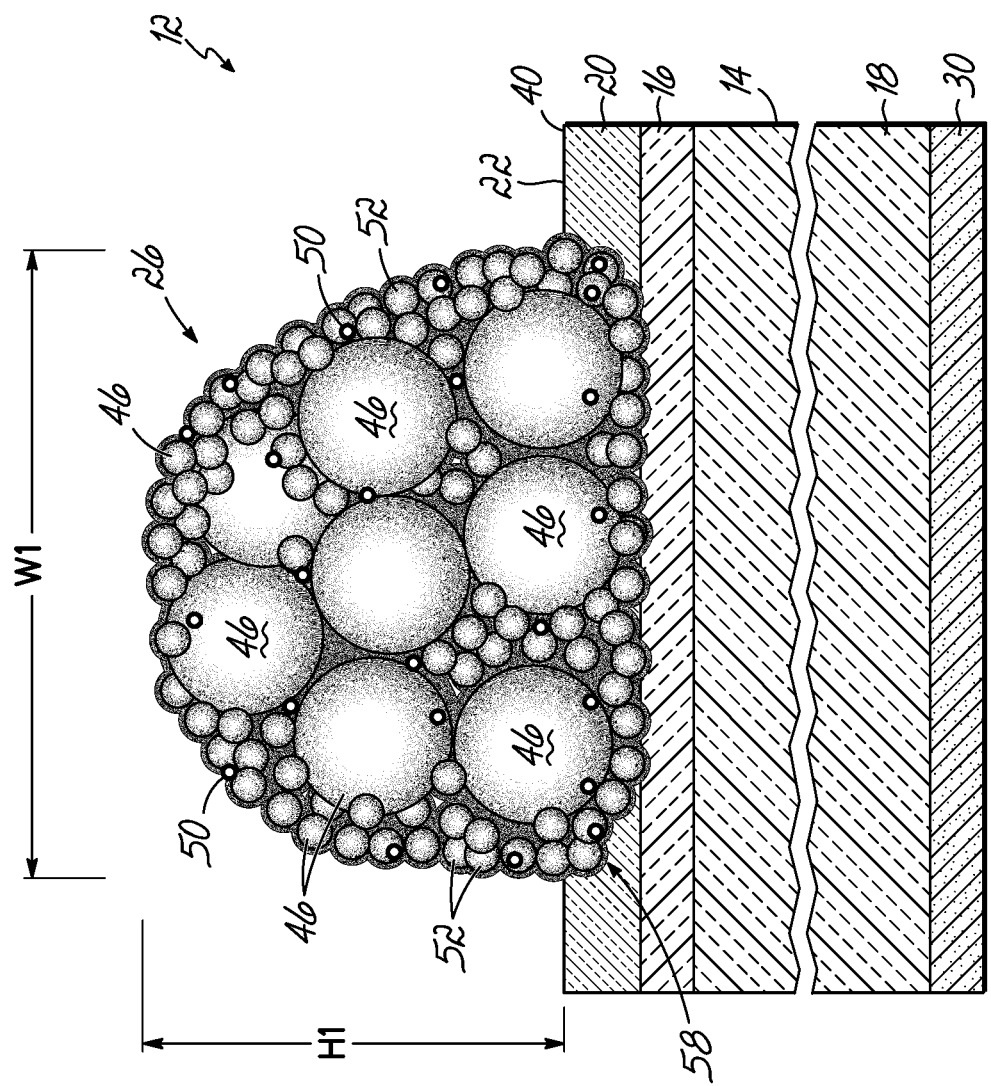
FIG. 6 is a schematic representation of a cross-section of a line following firing of the line of FIG. 5.

In that regard and with reference now to FIGS. 4, 5, and 6, a copper-containing paste 32 (shown in FIG. 4) according to one embodiment of the invention is placed on the front surface 22 of a substrate 40. The copper-containing paste 32 may be screen printed on the substrate 40 or dispensed by another method. As shown, the substrate 40 includes the anti-reflective coating 20 and the wafer 14. Where the backside conductor 30 is made of aluminum, it may already be present (as shown) or may be formed during a process of producing the fingers 26. During manufacturing, the substrate 40, anti-reflective coating 20, wafer 14, backside conductor 30, and paste 32 are used or deposited to produce the cell 12 shown in FIG. 2.

During printing on the substrate 40, and with reference to FIG. 4, the copper-containing paste 32 defines an elongated body (e.g., a line) having a height, a width, and a length on the substrate 40. The elongated body is transformed into a finger during firing of the paste 32, described below. To that end, the paste 32 includes a plurality of particles 42 contained in an organic vehicle 44. The rheological properties of the paste 32 may be adjusted by changing the composition of the organic vehicle 44 and/or the particles 42 to permit the paste 32 to be dispensed via a screen-printing process (e.g., similar to that utilized to screen print a silver-containing paste onto silicon wafers) or by another method. The rheological properties of the paste 32 are sufficient to permit the paste 32 to be dispensed while also permitting the paste 32 to maintain a dispensed pattern and not run across the substrate 40; thus allowing the fingers to maintain a high aspect ratio (finger height/finger width)

By way of example only, and not limitation, the organic vehicle 44 may be a mixture of organic binders together with one or more solvents, dispersants, viscosity modifiers and/or surface tension modifiers. Exemplary binders include polyvinylpyrrolidone (PVP), ethyl cellulose, and monosaccharides, such as fructose. Exemplary solvents include alcohols, ester alcohols, and glycols, such as propylene glycol, ethylene glycol, polyethylene glycol, Texanol™ ester alcohol, as well as ether alcohols and glycols, such as diethylene glycol and triethylene glycols, in addition to water. Exemplary viscosity and surface tension modifiers include DIS- PERBYK® 111, DISPERBYK® 180, DISPERBYK® 190, RHODAFAC® RE-610, and sodium stearate, to name only a few. The volume of the organic vehicle 44 in the paste 32 and the proportion of each type of particle 42 can be tuned to meet a desired rheological (e.g. viscosity) specification. In general, the paste 32 may comprise of only a few weight percent organic vehicle 44. By way of example, the paste 32 includes the organic vehicle 44 in a range from 1 wt. % to 15 wt. %.

The copper-containing paste 32 is a mixture of particles of differing composition. That is, the paste 32 may be a mixture of powders that provide all the particles 42. Each one of the powders may include particles 42 having different composition, particle size, and/or particle shape.

In one embodiment, the copper-containing paste 32 includes a plurality of copper-containing particles 46 that form the largest portion by volume of the particles 42 in the paste 32. The copper-containing particles 46 may form the majority volume of the fingers 26. With the make-up of the particles 42, following firing, the fingers 26 are capable of providing electrical conductivity, via metallic copper or copper-containing metal, sufficient to promote efficient solar cell performance. By way of example, the copper-containing particles 46 may be metallic copper and form from 48 vol. % to 88 vol. % of the solids in the paste 32. This may translate into at least 80 wt. % copper metal in the paste 32 before drying. The range of copper metal in the paste 32 may be from 62 wt. % to 98 wt. %. While the copper-containing particles 46 are described with reference to metallic copper, the copper-containing particles 46 are not limited to metallic copper, which may include minor impurities elements. The copper-containing particles 46 may be particles of a copper-containing alloy or copper-containing non-metallic (e.g., oxide) particles capable of being reduced to copper or to a copper-containing alloy. Copper-containing alloys are those that contain copper as their principal component, for example, bronze (a copper-tin alloy) and brass (a copper-zinc alloy).

As further examples, copper-alloys may include copper in combination with other metal elements including nickel, aluminum, and/or lead. Copper-phosphorous alloys are also contemplated. The copper-containing particles 46 may be a mixture of two or more of metallic copper, copper-containing alloy, and non-metallic copper-containing material.

The copper-containing particles 46 are provided in the paste 32 by a powder that is described by a particle size distribution. By way of example, a particle size distribution for one copper powder may include particles in a range of from 10 μm to 22 μm in size. That is, the powder contains particles from 10 μm in size up to 22 μm in size with an average particle size in the range. By way of further example, a narrower particle size distribution of copper-containing particles 46 includes particles ranging from 10 μm to 20 μm in size. Other exemplary examples include progressively narrower particle size distributions, particle size distributions with particles in the range of 7.5 μm to 14.7 μm (these are $D_{10}$ and $D_{90}$, respectively), 1.8 μm to 7.7 μm (these are $D_{10}$ and $D_{90}$, respectively), 1.2 μm to 3.2 μm (these are $D_{10}$ and $D_{90}$, respectively), or 0.2 μm to 1.6 μm (these are $D_{10}$ and $D_{90}$, respectively). The copper-containing particles 46 may be particles from one powder having a particle size distribution (e.g., one of the exemplary distributions above), or a mixture of multiple different powders such that there are multiple distinct particle size distributions mixed in the paste 32. The particle size distribution correlates with the surface area per unit weight of the powder. Thus, as the particle size distribution is shifted to smaller particles, the surface area per gram of the powder increases.

For example, a powder of coarse copper-containing particles 46 may be mixed with a powder of fine copper-containing particles 46. The fine copper-containing powder 46 may fill in the interstices between the larger copper-containing particles 46 in the paste 32. This results in a bimodal particle size distribution of copper-containing particles 46 in the paste 32 and may maximize the volume of copper in the paste 32. In this way, combinations of any two or more of the particle size distributions identified above may be mixed together to adjust the volume percentage of copper in the paste 32 to be within a desired range. For a binary mixture, the ratio of different sized copper-containing powders by weight may range from 60 wt. % coarse-40 wt. % fine to 90 wt. % coarse-10 wt. % fine. For example, a coarse copper powder having a particle size distribution with a range in particle size from 10 μm to 20 μm may be mixed with a fine copper powder having a particle size distribution with a range of 1.2 μm to 3.2 μm at a ratio of 90 wt. % coarse to 10 wt. % fine. Other ratios of two or more copper powders are possible, for example, a coarse copper powder having a particle size distribution with a range of particles sizes from 7.5 μm to 14.7 μm may be mixed with a fine copper powder having a particle size distribution with a range of particle sizes from 1.2 μm to 3.2 μm at a ratio of 70 wt. % coarse to 30 wt. % fine. As an example of four different copper-containing powders, a particle size distribution with a range of particle sizes from 10 μm to 22 μm is mixed with three other copper-containing powders having particle size distributions with ranges from 7.5 μm to 14.7 μm, from 1.8 μm to 7.7 μm, and from 1.2 μm to 3.2 μm at a weight ratio of 37 to 21 to 12 to 30, respectively. Copper-containing powders according to embodiments of the invention are commercially available from the Bean Town (copper flakes), Chemical Store (item Cu112SP), ACuInternational (items 610 and 603), and Ames Goldsmith (item C1-2000).

It will be appreciated that the copper-containing paste 32 in FIG. 4 is a schematic representation. While the particles 42 within the paste 32 are shown as a spherical morphology, embodiments of the invention are not limited to any single one of the particles being spherical. Other particle morphologies are possible, namely flakes, acicular, faceted, dendritic, spongey, rounded, porous, oblong, wire, and decorated, to name only a few.

Referring to FIG. 4, the paste 32 includes other particles 42 differing in at least composition from the copper-containing particles 46. In the exemplary embodiment, the other particles 42 in the paste 32 include nanoparticles 50. The nanoparticles 50 are each a discrete object where all three dimensions are equal to or less than 100 nm. The nanoparticles 50 may form agglomerates or aggregates in which case the agglomerate or aggregate may measure up to 1 μm in each orthogonal direction. In one embodiment, the nanoparticles 50 are metals, metal oxides, and/or metal hydroxides of one or more of nickel (Ni), copper (Cu), lead (Pb), cobalt (Co), manganese (Mn), and silver (Ag). By way of example only, mixed element nanoparticles may include Cu, Ni, and Pb; Ni, Ni, and Pb; or Mn, Mn, and Pb. For example, nanoparticles 50 include nanoparticles of mixed oxides of Cu/Ni/Pb, Cu—Ag/Ni/Pb nanoparticles, mixed oxides of Co/Co/Pb nanoparticles, mixed oxides of Ni—Co/Ni/Pb nanoparticles, mixed oxides of Ni—Ag/Ni/Pb nanoparticles, and mixed oxides of Mn/Mn/Pb nanoparticles. As is described below, each metal in the A/B/C notation (e.g. Cu/Ni/Pb) may be provided by a metal salt such that a Ni/Ni/Pb nanoparticle is synthesized with Ni being provided by two different nickel-containing salts. Those metals may be oxidized during synthesis. The nanoparticles 50 may be doped with one or more of phosphorous (P), chloride (Cl), and boron (B), which may be due to the process by which the nanoparticles 50 are synthesized. An exemplary process for making the nanoparticles 50 is described below with reference to FIGS. 7A and 7B.

The nanoparticles 50 are included in the paste 32 in an amount sufficient to reduce or eliminate oxidation of metallic copper or copper alloy either in the paste 32 or formed during manufacturing of the solar cell 12, described further below, while also reducing copper diffusion into the wafer 14 during use of the solar cell 12. The nanoparticles 50 may also enable etching of the anti-reflective coating 20 and permit an electrical connection of the copper with the wafer 14. Reduction in copper diffusion may be by way of forming a barrier between copper of the fingers 26 and the wafer 14 during manufacturing. Without being bound by any theory, the nanoparticles 50 are believed to participate in the formation of the barrier so that elements of the nanoparticles 50 form an interface between the silicon of the wafer 14 and the copper from the copper-containing particles 46. By way of example, the nanoparticles 50 may be present in an amount up to 17 wt. % in the paste 32. And, as further examples, the nanoparticles 50 may be present in a detectable amount up to 5 wt. %; a detectable amount up to 3 wt. %; from about 0.2 wt. % (or near a lower limit of detection) up to 3 wt. %; or from about 0.2 wt. % up to 5 wt. % in the paste 32. Mixtures of different nanoparticles are also contemplated with the total weight of the mixture falling within the ranges above. For example, a mixture of nanoparticles 50 may be 50 wt. % Ni/Ni/Pb nanoparticles and 50 wt. % Cu/Ni/Pb nanoparticles.

As shown in FIGS. 4 and 5, the copper-containing particles 46 may be surface modified. In one embodiment, the particles 46 are coated with smaller particles 56 that surround at least portions of each individual copper-containing particle 46. The copper-containing particles 46 are, in essence, encrusted with smaller particles 56. The particles 56 may cover the entirety of each particle 46. However, the particles 56 may cover only patches of each surface of the particle 46 and so the particles 56 may not be uniformly distributed over the surface of each particle 46. In that arrangement, the uncovered area of the particle 46 is left exposed within the paste 32. This configuration of smaller particles covering larger particles results in an increase in the surface area measured from the surface area of the uncoated particles 46 to a surface area of copper particles 46 coated with particles 56. The surface area may be increased by up to 20%. By way of example, uncoated copper particles having a surface area of 0.6 m$^2$/g may be modified to have a surface area of at least 0.83 m$^2$/g. As a further example, the copper-containing particles 46 may be modified to have a surface area in the range of 0.83 m$^2$/g to 1.61 m$^2$/g. In one embodiment, the surface area increase is 1.5%. Thus, as an example, a range for the increase in the surface area is from 1.5% to 20%. However, surface modification may also produce an increase in surface area of as high as 3,000% over the surface area of an uncoated particle 46. Surface area may be measured via the BET method. Surface area was measured using the Micromeritics® Gemini VII Series 2390 Surface Area Analyzer. The copper containing particles 46 and nanoparticles 50 were degassed in the Micromeritics® FlowPrep 060 system under a flow of inert gas (nitrogen, $N_2$) at 160° C. for 2 hours. The degassing procedure causes contaminants such as water to be desorbed from the surface of the powders, and the gas removes it from the sample tube.

The Gemini unit uses $N_2$ physisorption to measure the adsorption isotherms of the powders. Multipoint measurements of the isotherms are used to calculate the surface area of the powders using the Brunauer-Emmett-Teller equation. Controlling surface area of the copper-containing particles 46 may control formation of an interface between the finger 26 and the wafer 14.

Figure 9A:
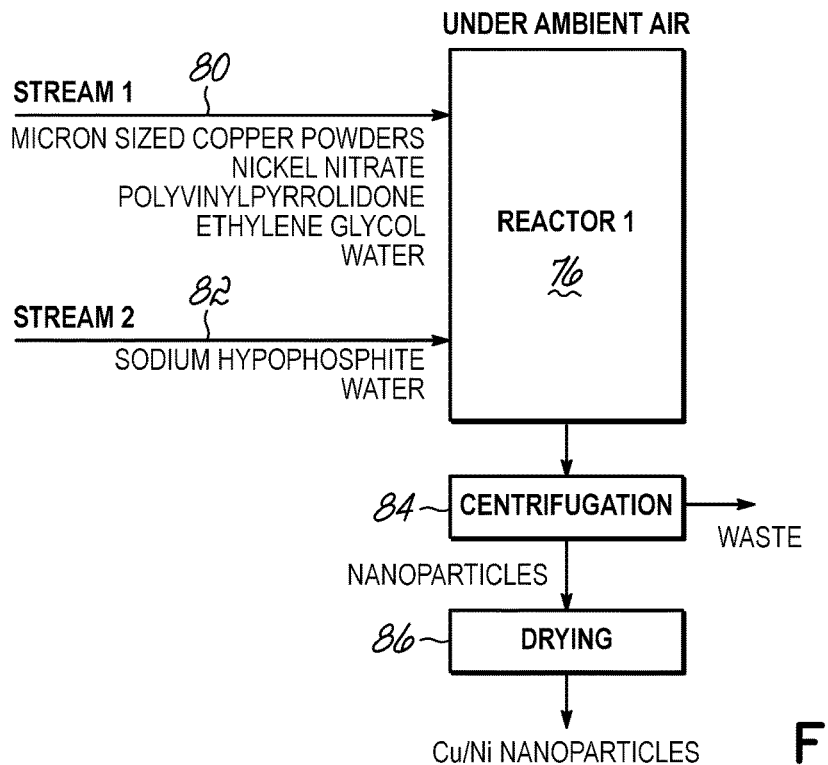
FIG. 9A is a process chart for surface modification of copper-containing particles prior to use in a paste according to one embodiment of the invention.

The copper-containing particles 46 may be coated with particles 56 according to a process shown in FIG. 9A. The particles 56 may be metallic or oxides/hydroxides of various metals. By way of example, the particles 56 may be metallic copper and/or oxides/hydroxides of at least one of copper (Cu), nickel (Ni), and manganese (Mn). The particles 56 may be doped with phosphorous (P) due to the process by which they are synthesized, described below. The particles 56 may be nucleated and grown on the surfaces of the copper-containing particles 46. As such, the particles 56 may be at least weakly bonded to the surfaces of each of the copper-containing particles 46. Embodiments of the invention are not limited to bonding between the particles 56 and any other particle in the paste 32. Being located at the surface, the particles 56 are positioned to shield the copper-containing particles 46 from oxidation or other undesired reaction during manufacturing. Constituents of the particles 56 may form at least a portion of an interface between the finger 26 and the wafer 14.

With continued reference to FIG. 4, the paste 32 includes secondary oxide particles 52. Similar to the particles 56, the secondary oxide particles 52 may also participate in reducing or inhibiting oxidation of the copper in the copper-containing particles 46 while enabling etching of the anti-reflective coating 20. The secondary oxide particles 52 thus permit an electrical connection between copper of the fingers 26 and the wafer 14 during manufacturing, described below. In addition to that or as an alternative, the secondary oxide particles 52 may assist in forming the interface between the copper in the finger 26 and silicon in the wafer 14 to prevent copper diffusion into the silicon during use of the solar cell 12. The secondary oxide particles 52 may be reduced to their constituent metal during heating and may then be capable of reducing at least oxide/hydroxide nanoparticles 50 and/or the oxides/hydroxides of the particles 56. Further, the secondary oxide particles 52 alone or in combination with one or both the nanoparticles 50 and the particles 56 may form a liquid sintering aid during manufacturing of the solar cell 12. Liquid phase sintering is a technique used in the sintering of alloys and composites. In a composite containing two materials, the secondary material will have a lower melting point than the first. Consequently, this material will melt at the given processing temperature, while the other remains solid. When the primary material is soluble in the liquid phase, the liquid will wet the particles, and in tightly packed structure, create capillary forces which brings the particles together. In addition, the liquid enables higher diffusion rates which assists in faster sintering and lower processing temperatures. The ratio of the nanoparticles 50 to secondary oxide particles 52 to particles 56 in the paste 32 may at least partially control the etching process between the paste 32 and the anti-reflective coating 20 during firing.

With regard to reducing oxides in the paste 32, the secondary oxide particles 52 may be one or more metal oxides having a more negative Gibbs Free Energy of Formation than at least one of the oxides of the nanoparticles 50 and oxides of the particles 56. By way of example, the secondary oxide particles 52 may have a greater negative Gibbs Free Energy of Formation than at least one of copper oxide ($Cu_2O$, CuO), lead oxide (PbO, $PbO_2$), or nickel oxide (NiO) at the temperatures to which the wafer 14 and paste 32 are heated during manufacturing. In one embodiment, the secondary oxide particles 52 are antimony oxide ($Sb_2O_3$) particles. Other secondary oxide particles 52 include, but are not limited to tin oxide (SnO, $SnO_2$), tellurium oxide (TeO), manganese oxide (MnO, $MnO_2$), phosphorous oxides ($P_4O_{10}$, $PO_2$), bismuth oxide ($Bi_2O_3$), chromium oxide ($Cr_2O_3$), and aluminum oxide ($Al_2O_3$). The use of these oxides to reduce other oxides in the paste 32 may depend on the oxidation state of the secondary oxide particles 52, the melting point temperature of the secondary oxide particles 52, the processing temperature and the partial pressure of a reducing environment surrounding the secondary oxide particles 52. Further, the secondary oxide particles 52 may include frit particles, such as lead-containing silicate glasses or other metal-containing glasses that contain one or more oxide components that have a more negative Gibbs Free Energy of Formation than at least one of $Cu_2O$, CuO, $PbO_2$, PbO, and NiO. Exemplary frit particles include borate glasses, such as $B_2O_3$—PbO—ZnO glass, and silicate glasses, such as PbO—$SiO_2$—$B_2O_3$—$Al_2O_3$ glass.

The paste 32 may include from 1 wt. % to 15 wt. % of the secondary oxide particles 52. The secondary oxide particles 52 may have a surface area in a range of 2 $m^2$/g to 2.5 $m^2$/g. A ratio of secondary oxide particles 52 to the nanoparticles 50 may determine the amount of oxide reduced and/or the amount of sintering aid that develops during heating. In one embodiment, a ratio of secondary oxide particles 52 to nanoparticles 50 is in a range of 0.50 to 16.96 by weight. In another embodiment, a ratio of secondary oxide particles 52 to metal-oxide-containing nanoparticles is in a range of 1.50 to 3.51 by weight. As used herein, "consisting essentially of" means that no other elements or particles are intentionally added to the paste. However, impurity content of other elements in oxide or metallic form from powders or the fabrication process are contemplated.

With reference to FIGS. 4 and 5, once the paste 32 is dispensed, the substrate 40 and paste 32 are exposed to temperatures from 20° C. to 400° C. or, more specifically, from 20° C. to 200° C. to dry. During drying at least some of the organic vehicle 44 is removed from the paste 32. This is shown schematically in FIG. 5 by arrows 54.

Following drying, the particles 42 of the paste 32 are fired in a metallization process to produce the fingers 26 and/or the backside conductor 30. In one embodiment, manufacturing of the solar cell 12, including drying and firing, is completed in air. That is, the atmosphere during drying and firing is not controlled or modified by addition of inert or reducing gases. During firing, the particles 42 are exposed to temperatures from 600° C. to 930° C. in air for from 0.8 s to 10 s depending on the temperature profile of the furnace, belt speed and the composition of the paste 32. At these temperatures and times, in one embodiment, at least one of the organic binders remaining from the organic vehicle 44 decomposes and forms a reducing environment localized around the particles 42. It is believed that this environment reduces the secondary oxide particles 52. Reduction of at least some of the secondary oxide particles 52 produces at least one metal from the secondary oxide particle 52. For example, the composition of the organic vehicle 44 is believed to reduce antimony oxide ($Sb_2O_3$) to metallic antimony (Sb). As an additional example, the organic vehicle 44 may also reduce lead oxide to lead (Pb).

In turn, the metal from the secondary oxide particle 52 reduces at least some of the nanoparticles 50 and/or the particles 56 on the copper-containing particles 46. Continuing the example with Sb, the metallic Sb generated reduces oxides of the nanoparticles 50 and of the particles 56. Where PbO is present, the metallic Sb may generate Pb by PbO reduction, and Pb may assist in the reduction of copper oxide. Thus, by the characteristics of particles 42 in the paste 32, a cascade-type reduction reaction may be precipitated by decomposition of the organic vehicle 44. In that cascade of reduction, one oxide is reduced to metal. That metal in turn reduces another oxide in the mixture of particles 42. Depending on the temperature; the composition and the volume of nanoparticles 50, secondary oxide particles 52, and particles 56; and the proportion of the organic vehicle 44 in the paste 32, the cascade reduction reaction may reduce all oxides in the paste 32 to their constituent metals. This may include any copper oxide present in the paste 32. In that case, a paste containing a large portion of metal oxides, contains a composite of different metals.

At the temperatures at which the particles 42 are exposed during firing, reducing the nanoparticles 50 and the secondary oxide particles 52 may form a liquid sintering aid and may reduce and/or coat the copper-containing particles 46. The metal from the nanoparticles 50 and the secondary oxide particles 52 may react with the anti-reflective coating 20. This combination of particles is thought to produce an etchant.

As shown in FIGS. 5 and 6, during firing, the particles 42 sinter to form the finger 26 having a width, $W_1$, and a height, $H_1$. Generally, these dimensions are less than a corresponding width, $W_2$, and height, $H_2$, of the paste 32 (see FIG. 4) following dispensing, shown, for example in FIG. 4. Following firing/sintering, the width $W_2$ of the paste 32 shrinks to the width, $W_1$, of the finger 26. Also, the height $H_2$ of the paste 32 is reduced from firing/sintering to $H_1$. The reduction in height is at least partly due to reaction/etching of the anti-reflective coating 20, as is described further below. The dimensions, e.g., $H_1$ and $W_1$, are controlled by factors including, for example, if screen printed, (i) printer setting (e.g., squeegee pressure and speed), (ii) paste rheology and composition, (iii) screen parameters (e.g., opening size), and (iv) firing conditions.

While the paste 32 initially includes oxide particles 50 and 52, the finger 26 is metallic as some or all the oxide particles are reduced during firing of the paste 32. The finger 26 may be free of internal oxides, excepting that the outer, air exposed surface of the finger 26 may form a native oxide (e.g., CuO and/or $Cu_2O$, $Sb_2O_3$, etc.) when exposed to air. During sintering, particles and reaction products, in particular the metal from the nanoparticles 50 and the metal from the secondary oxide particles 52 together with the copper-containing particles 46, penetrate the anti-reflective coating 20. During sintering, the metals, nanoparticles 50, and/or secondary oxide particles 52 and/or the metals of those oxide particles contact the anti-reflective coating 20 and may produce reaction products of the metal and the material of the coating 20. For example, where the anti-reflective coating 20 is SiN, reaction products may include metal silicides and/or metal nitrides. These reaction products may form an interface 58 (generally indicated in FIG. 6) between the copper or copper-containing grains of the finger 26 and the wafer 14 and may include a silicide. After penetrating the anti-reflection coating 20, a composite of metal from the oxide particles 50, 52, and 56 and copper-containing particles 46 that ultimately form the finger 26 come into electrical communication with the n-type region 16 of the wafer 14. The interface 58 may prevent copper from diffusing into the silicon of the wafer 14 during fabrication and use of the solar cell 12. The interface 58 may form a boundary between the copper or copper-containing grains and the silicon of the wafer. The composition of the grain boundaries at the interface 58 may include lead, nickel, copper, cobalt, manganese, antimony, tellurium, and bismuth and/or another metal found in the nanoparticles 50 or the secondary oxide particles 52. In one embodiment, the backside conductor 30 (e.g., aluminum) is co-fired with the paste 32 in air. Thus, both the fingers 26 and the backside conductor 30 may be fired simultaneously or separately. It is noted that as the targeted width, $W_1$, of the finger 26 is reduced, the surface area of the copper-containing particles may be reduced.

Figure 7:
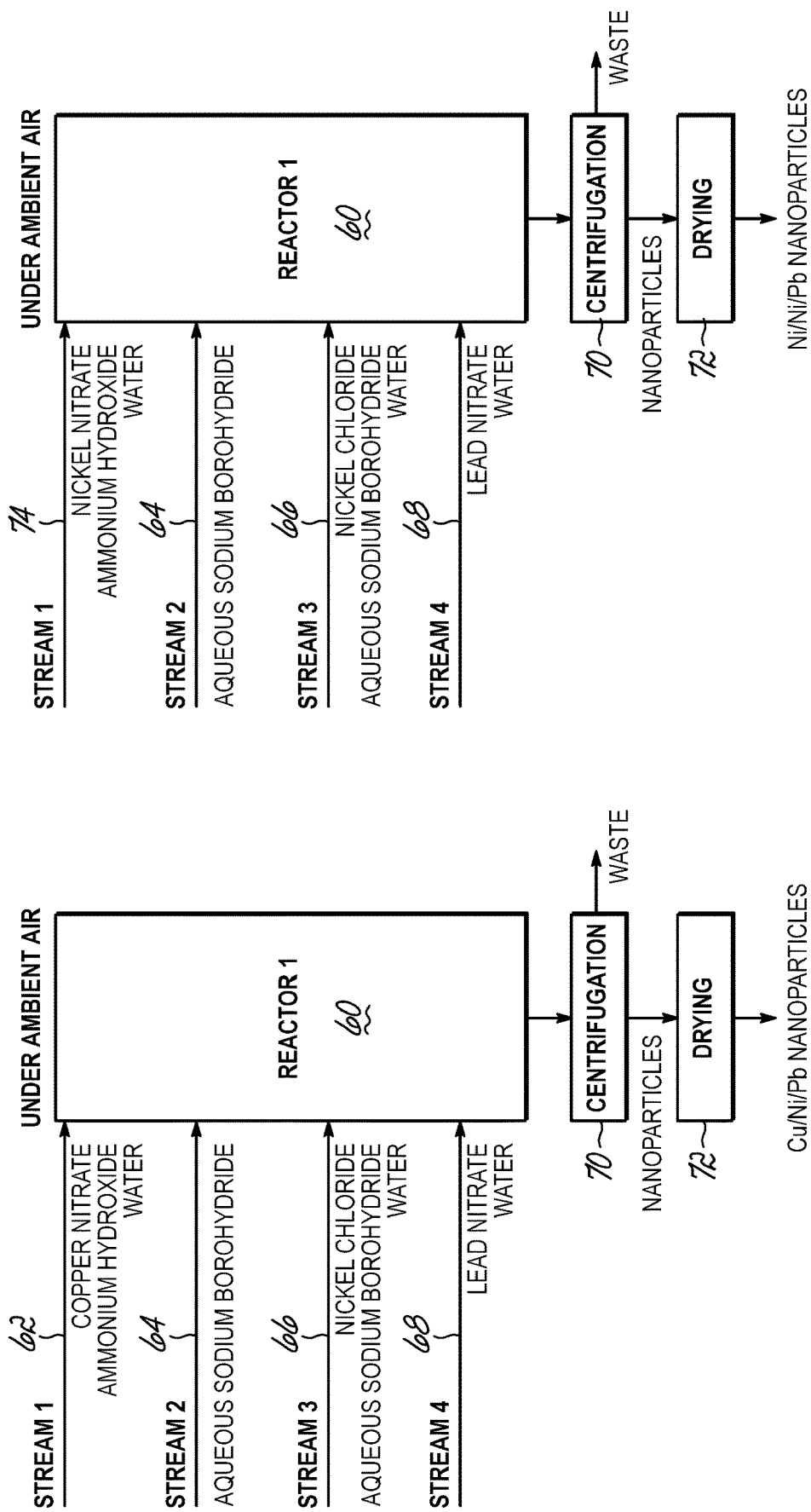
FIGS. 7A and 7B are process charts for manufacturing exemplary nanoparticles in accordance with embodiments of the invention.

As described with reference to FIG. 4, the paste 32 includes numerous particles 42. Each of these particles may be synthesized prior to their introduction into the organic vehicle 44. As an example, the nanoparticles 50 may be synthesized from various metal salts. FIGS. 7A and 7B illustrate exemplary flow charts for synthesis of the nanoparticles 50 that may be included in the paste 32.

In the exemplary process illustrated in FIG. 7A, Cu/Ni/Pb nanoparticles 50 are synthesized. As shown, in a reactor 60, a first aqueous stream 62 of copper nitrate and ammonium hydroxide are added and stirred. The ammonium hydroxide causes copper hydroxide and a metal ammonia complex to precipitate. A second stream 64 of an aqueous dispersion of sodium borohydride is added to the reactor 60 at a predetermined rate and the solution stirred. The reaction produces copper oxide/hydroxide nanoparticles 50.

Where additional coatings are desired over a copper oxide/hydroxide core, additional streams are added to the reactor 60 containing the copper oxide/hydroxide nanoparticles. For example, where a nickel oxide coating is desired over the copper oxide/hydroxide nanoparticles, a third stream 66 of aqueous nickel chloride and aqueous sodium borohydride is added to the reactor 60 and stirred. This coats the copper oxide/hydroxide nanoparticles with a layer of nickel oxide. A third layer of lead oxide/hydroxide is coated over the layer of nickel oxide by addition of a fourth stream 68 of aqueous lead nitrate to the reactor 60. This produces a lead oxide/hydroxide coating over the nickel oxide.

The following are the possible reactions and side reactions occurring during the synthesis illustrated in FIG. 7A.

Primary stoichiometric reaction occurring in a Reactor.

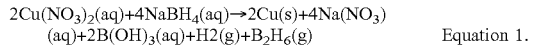

Equation 1.

Assumes excess $NaBH_4$ reacts with $H_2O$. In one process, lower than stoichiometric amounts are utilized.

$NaBH_4(aq)+4H_2O \rightarrow NaB(OH)_4(aq)+4H_2(g)$  Equation 2.

$B_2H_6$ is assumed to completely react with $H_2O$ and all the Cu reduces to $Cu_2O$ with the addition of $NiCl_2$.

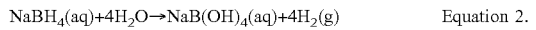

Equation 3.

Equation 4.

Cu has a multi-valence nature, so can react with $Cu^{2+}$ ions.

$Cu(s)+Cu^{2+}(aq) \rightarrow 2Cu^+(aq)$  Equation 4a.

$Cu^+$ can react with $Cl^-$ ions.

$Cu^+(aq)+(aq)CuCl(s)$  Equation 4b.

The CuCl can form $Cu_2O$.

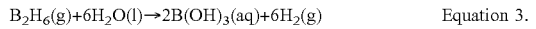

Equation 4c.

The $NiCl_2$ reacts with $NaBH_4$ to coat the $Cu_2O$ particles with Ni.

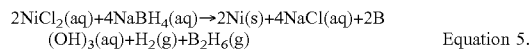

Equation 5.

A substitution reaction occurs when $Pb(NO_3)_3$ is added.

$3Ni(s)+2Pb(NO_3)_3(aq) \rightarrow 3Ni(NO_3)_2(aq)+2Pb(s)$  Equation 6.

Both the Ni and Pb shells may oxidize to NiO and PbO. Less than stoichiometric amounts may be used in the reaction. If so, $NaBH_4$ is assumed to become the limiting factor, and Equation 1 becomes Equation 7, and Equation 5 becomes Equation 8.

Non-stoichiometric reaction occurring in Batch Reactor.

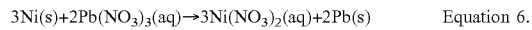

Equation 7.

The mass balance also assumes no excess $NaBH_4$ reacts with $H_2O$. The reaction in Equation 2 is assumed not to occur.

Non-stoichiometric reaction for $NiCl_2$ reacting with $NaBH_4$ to coat the $Cu_2O$ particles with Ni.

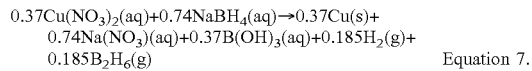

Equation 8.

Substitution reaction occurs when $Pb(NO_3)_2$ is added.

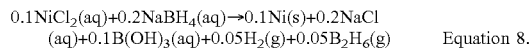

Equation 9.

For non-stoichiometric amounts, Equation 3 becomes Equation 10.

Reaction of $B_2H_6$ with $H_2O$.

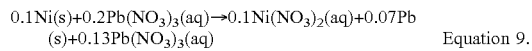

Equation 10.

Following the additions and reactions, at 70, the nanoparticles 50 are separated from the supernatant by centrifugation. And, at 72, the solid residue, which are the Cu/Ni/Pb nanoparticles, is dried. The nanoparticles 50 may be crushed to break apart agglomerates and then sieved and are ready for use in the paste 32.

Figure 8:
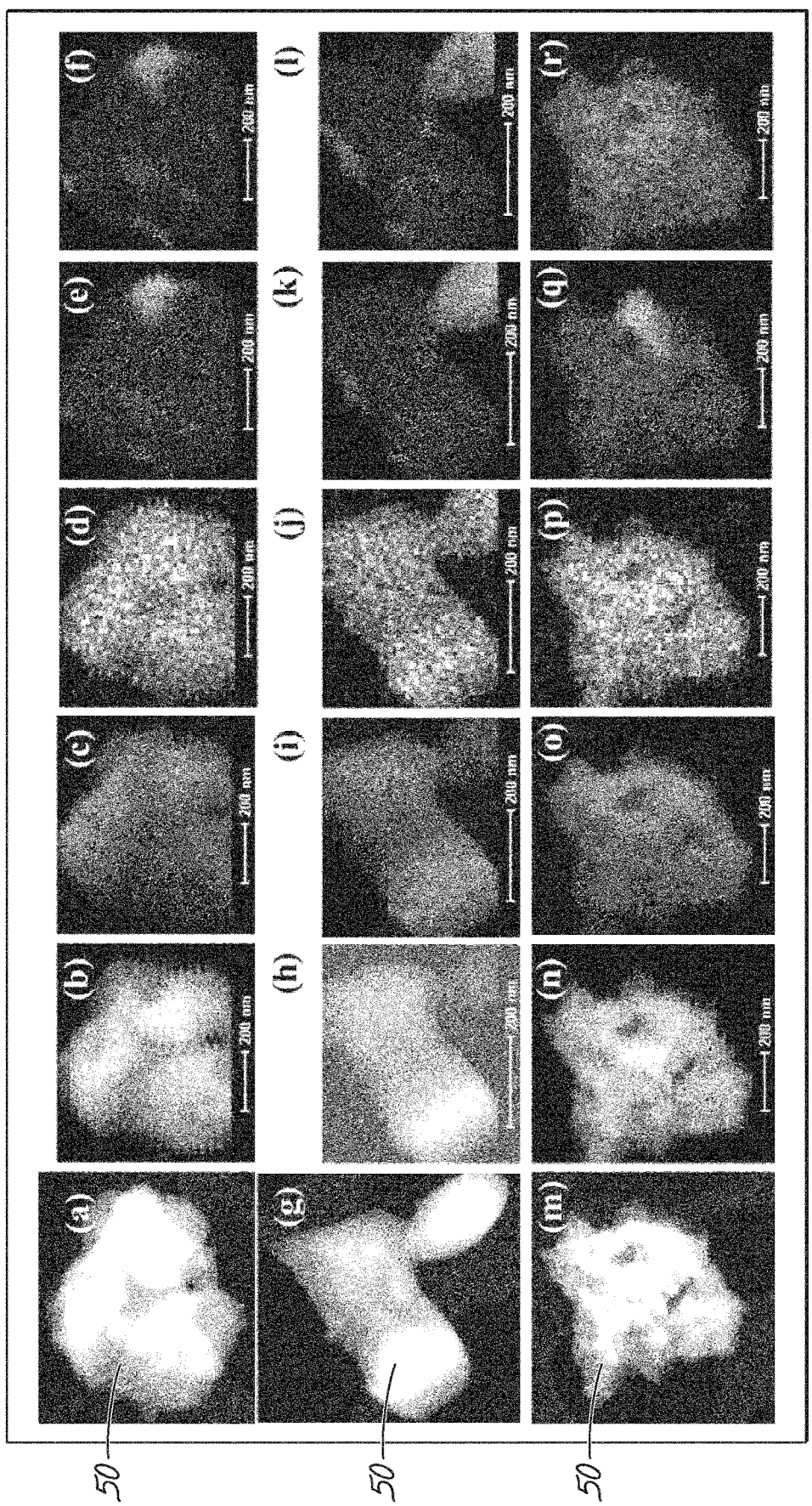
FIG. 8 shows TEM images of particles made according to one embodiment of the invention with an overlaid elemental analysis.

FIG. 8 depicts transmission electron microscope images of three different Cu/Ni/Pb nanoparticles produced in accordance with the procedure illustrated in FIG. 7A. As shown, energy-dispersive x-ray maps for Cu are shown in (b), (h), and (n); for oxygen are shown in (e), (i), and (p); for Ni are shown in (d), (j), and (p); for Cl are shown in (e), (k), and (q); and for Pb are shown in (f), (l), and (r). The element maps generally indicate the presence and uniform distribution of Cu, 0 and Ni in the nanoparticle 50. Pb and Cl appear to have a more irregular distribution.

A similar process is illustrated in FIG. 7B. However, the nanoparticles 50 produced are Ni/Ni/Pb nanoparticles. That is, the core of the nanoparticle is nickel oxide with a nickel oxide coating and then having a coating of lead oxide. Growing the nickel oxide in two stages generates a larger particle size. In that regard, a first stream 74 of nickel nitrate and ammonium hydroxide are added to the reactor 60. Subsequently, the second stream 64, then third stream 66, and the fourth stream 68 are added to the reactor 60 in a manner similar to that described with reference to FIG. 7A. Following centrifugation 70 and drying 72, Ni/Ni/Pb nanoparticles 50 are ready for addition to the paste 32.

With reference to FIG. 9A, in one embodiment, the copper-containing particles 46 are surface modified with metal oxides prior to mixing the paste 32. In the flow chart of FIG. 9A, the copper-containing particles 46 are placed in a reactor 76. The copper-containing particles 46 may be pretreated with oleic acid or the particles 46 may be untreated prior to placement in the reactor 76. Metal salts (e.g., nickel nitrate) are dissolved in an ethylene glycol-water solution containing polyvinylpyrrolidone. The solution of dissolved metal salt and ethylene glycol is injected into the reactor 76 as a first stream 80 and is mixed with an aqueous dispersion of a reducing agent, such as sodium hypophosphite (NaPO$_2$H$_2$), as a second stream 82. This solution is continuously stirred and heated in the reactor 76 for a prescribed time. The metal ions are reduced at the elevated temperatures, and the resulting reaction creates a solution of the copper-containing powders coated with metals or metal oxides/hydroxide. As an example, in FIG. 9A, the copper-containing particles 46 are coated with nickel oxide and/or nickel hydroxide. Particles 56 may coat or decorate the particles 46. It is noted that the nickel oxide/hydroxide may include phosphorous and may depend on the concentration of the reducing agent added to the reactor 76. The coated particles 46 are separated from the solution at 84 (e.g., via a centrifuge) and then dried at 86.

While a nickel salt is described with reference to FIG. 9A, various other metal salts may be used to treat the copper-containing particles 46. As examples, the coating on the copper-containing particles 46 may include cobalt (Co) and/or manganese (Mn), among others. The surface of the copper-containing particles 46 can be encrusted with particles 56 by adding the copper containing particles 46 to the reactor 76. The amount of coating 56 may be controlled by the time that the mixture remains above a specific temperature. In general, as the time and temperature are increased, the surface area of the particle encrusted copper-containing particles 46 increases. By way of example, the total surface area of the copper-containing particles 46 having the particulate coated surface increases. Generally, the increase in surface area of the particle covered copper-containing particles 46 is at least 10% and may be as high as 3,000% over uncovered particles 46.

Figure 9B:
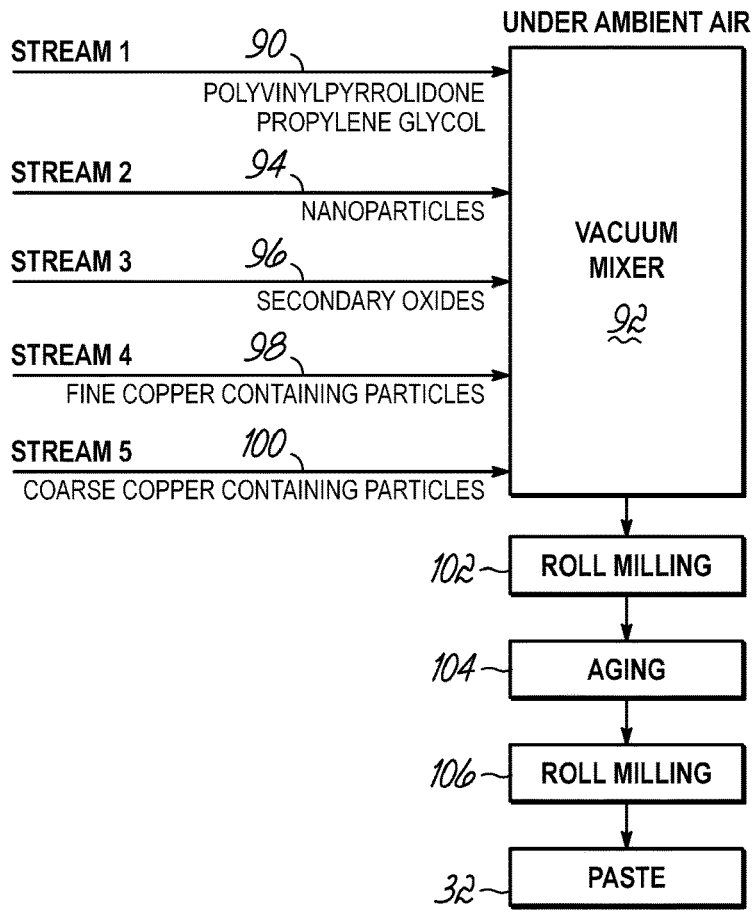
FIG. 9B is a process chart for paste formulation according to one embodiment of the invention.

Each of the particles 42 described above is then mixed with the organic vehicle 44. With reference to FIG. 9B, the organic vehicle 44, nanoparticles 50, secondary oxide particles 52, and copper-containing particles 46 are mixed to form a screen printable paste 32. As shown in FIG. 9B, the organic vehicle 44 includes polyvinylpyrrolidone, which is dissolved in the solvent (e.g., polyethylene glycol) and added to a vacuum mixer 92 at 90. Nanoparticles, such as the Cu/Ni/Pb nanoparticles 50 from FIG. 9A are also placed in the vacuum mixer 92 at 94. The nanoparticles 50 and the organic vehicle 44 are mixed under vacuum for a prescribed time. At 96, the secondary oxide particles 52 are placed in the vacuum mixer 92. That mixture is then mixed under vacuum. At 98, the copper-containing particles 46 are placed in the vacuum mixer 92 and are mixed under vacuum. When present, at 100, additional copper-containing particles 46 are placed in the vacuum mixer 92 and are mixed under vacuum. In the embodiment shown in FIG. 9B, the particles 42 in streams 94, 96, 98, 100 are added to the vacuum mixer 92 in a predetermined order according to surface area. In the exemplary embodiment, the particles 42 having the largest surface area are added first.

Once all the vehicle 44 and particles 42 have been added to the vacuum mixer 92, the mixture is mixed for a prescribed time under vacuum. At 102, the mixture is then milled. This may include using a three-roll mill, ball mill or other particle dispersing equipment. The milling process helps to break up particle agglomerates and facilitates homogenization and deaeration of the mixture. Following roll milling, at 104, the mixture is aged at elevated temperatures (e.g., 100° C.) for a prescribed length of time to improve wetting of the organic vehicle 44 on the particles 42. The mixture may be subsequently subjected to another round of roll milling at 106 and additional organic vehicle 44 (not shown) may be added to achieve a predetermined viscosity before the paste 32 is ready for use.

In order to facilitate a more complete understanding of the invention, the following non-limiting examples are provided.

EXAMPLES

In the Examples that follow, powders may be doped with phosphorous (P) or another element. This is indicated with the notation Cu/element symbol "(?)P", such as "Cu/Ni(?)P", which indicates a copper-containing particle with nickel on its surface may be doped with phosphorous. Either the copper or nickel materials (in metallic, oxide, or hydroxide form) is thought to be doped with P. Embodiments of the invention are not limited to those being doped with P or with any other element.

Example 1. Synthesis of Copper-Containing Particles with Nickel

Synthesis of copper particles with a nickel-containing particulate coated surface is illustrated by the following example. 4.50 g of polyvinylpyrrolidone (PVP) MW 40,000 was dissolved in 300 mL of ethylene glycol in a 2000 mL flask. The mixture was stirred with a paddle mixer. The mixture was prepared the day before use. 144.78 g (0.5 mols) of nickel nitrate hexahydrate was added to the PVP/ethylene glycol mixture and mixed until dissolved. 381.24 g (6.0 mols) of copper powder (Example 1 was carried out separately with each of the following copper powders 1.) 10 μm to 22 μm, 2.) 7.5 μm to 14.7 μm, 3.) 1.8 μm to 7.7 μm, and 4.) 1.2 μm to 3.2 μm) was gradually added to the mixture. The mixture was continually mixed between the additions to prevent the formation of lumps. The mixture was stirred for 30 minutes with the paddle mixer. 216.24 g (2.0 mols) of sodium hypophosphite monohydrate and 150 mL of distilled water were added to the mixture. The mixture was stirred for 30 minutes with the paddle mixer.

An aluminum foil lid was placed around the top of the beaker with a hole for the paddle mixer. With the beaker sitting on the hot plate, the hot plate temperature was increased to 350° C. and the mixture was heated for 40 minutes with continual stirring by the paddle mixer. The mixture was permitted to reach 90° C. After 40 minutes, the hot plate was switched off.

The mixture was allowed to cool and was transferred to the centrifuge containers. The material was centrifuged at 3000 rpm for 3 minutes. The supernatant was disposed of into a waste bottle. More of the mixture was added to the centrifuge containers (or distilled water if the mixture beaker has been emptied). Stir and shake the bottle thoroughly. Centrifuging and decanting was repeated until the supernatant was clear and colorless. The solid granules were placed on a drying dish and allowed to dry overnight.

The dried copper-containing particles coated with nickel oxide/hydroxide were crushed with a muller and sieved through a 325 mesh sieve.

The following equation was believed to be the reaction occurring during the synthesis. The nickel oxide will deposit on the surface of the copper.

Equation 1. Primary stoichiometric reaction occurring in Batch Reactor. Nickel nitrate is the rate limiting reagent.

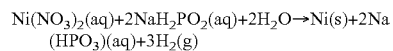

$$Ni(NO_3)_2(aq) + 2NaH_2PO_2(aq) + 2H_2O \rightarrow Ni(s) + 2Na(HPO_3)(aq) + 3H_2(g)$$

Example 2. Synthesis of Copper-Containing Particle with Cobalt

Synthesis of copper particles with a cobalt-containing particulate coated surface is illustrated by the following example. The metal used in the coating can be changed by replacing the metal salt in Example 1 with cobalt nitrate hexahydrate. 4.50 g of polyvinylpyrrolidone (PVP) 40,000 is dissolved in 300 mL of ethylene glycol in a 2000 mL flask. The mixture was stirred with a paddle mixer. The mixture was prepared the day before use. 145.52 g (0.5 mols) of cobalt nitrate hexahydrate was added to the PVP/ethylene glycol mixture and mixed until dissolved. 381.24 g (6.0 mols) of copper powder (Example 2 was carried out separately using copper powders with a 10 μm to 22 μm and a 1.2 μm to 3.2 μm size distribution) was gradually added to the mixture. The mixture was continually mixed between the additions to prevent the formation of lumps. The mixture was stirred for 30 minutes with the paddle mixer. 216.24 g (2.0 mols) of sodium hypophosphite monohydrate and 150 mL of distilled water were added to the mixture. The mixture was stirred for 30 minutes with the paddle mixer.

An aluminum foil lid is placed around the top of the beaker with a hole for the paddle mixer. With the beaker sitting on the hot plate, the hot plate temperature was increased to 350° C., and the mixture was heated for 40 minutes with continual stirring by the paddle mixer. With the hot plate set at 350° C., the mixture was permitted to reach the desired temperature of 90° C. After 40 minutes the hot plate is switched off. The mixture was allowed to cool.

The mixture was transferred to the centrifuge containers and centrifuged at 3000 rpm for 3 minutes. The supernatant was disposed of into a waste bottle. Centrifuging and decanting was repeated until the supernatant was clear and colorless. The solid granules were emptied into a drying dish and dried overnight. The dried particle encrusted copper powder was crushed with a muller and sieved through a 325 mesh sieve.

Example 3. Synthesis of Copper-Containing Particles with Manganese

Synthesis of copper particles with a manganese-containing particulate coated surface is illustrated by the following example. The metal used in the coating can be changed by replacing the metal salt in Example 1 with manganese nitrate tetrahydrate. 4.50 g of polyvinylpyrrolidone (PVP) 40,000 was dissolved in 300 mL of ethylene glycol in a 2000 mL flask. The mixture was stirred with a paddle mixer. The mixture was prepared the day before use. 125.51 g (0.5 mols) of manganese nitrate tetrahydrate was added to the PVP/ethylene glycol mixture and mixed until dissolved. 381.24 g (6.0 mols) of copper powder (Example 3 was carried out separately with each of a 10 μm to 22 μm copper powder and a 1.2 μm to 3.2 μm copper powder) was gradually added to the mixture. The mixture was continually mixed between the additions to prevent the formation of lumps. The mixture was stirred for 30 minutes with the paddle mixer. 216.24 g (2.0 mols) of sodium hypophosphite monohydrate and 150 mL of distilled water were added to the mixture. The mixture was stirred for 30 minutes with the paddle mixer.

An aluminum foil lid was placed around the top of the beaker with a hole for the paddle mixer. With the beaker sitting on the hot plate, the hot plate temperature was increased to 350° C. and the mixture was heated for 40 minutes with continual stirring by the paddle mixer. In one example, with the hot plate set at 350° C., the mixture was permitted to reach 90° C. After 40 minutes, the hot plate was switched off, and the mixture was allowed to cool.

The mixture was transferred to the centrifuge containers and centrifuged at 3000 rpm for 3 minutes. The supernatant was disposed of into a waste bottle. Decanting and centrifuging was repeated until the supernatant was clear and colorless. The solid granules were emptied into a drying dish and dried overnight.

The dried powder was crushed with a muller and sieved through a 325 mesh sieve.

Figure 10:
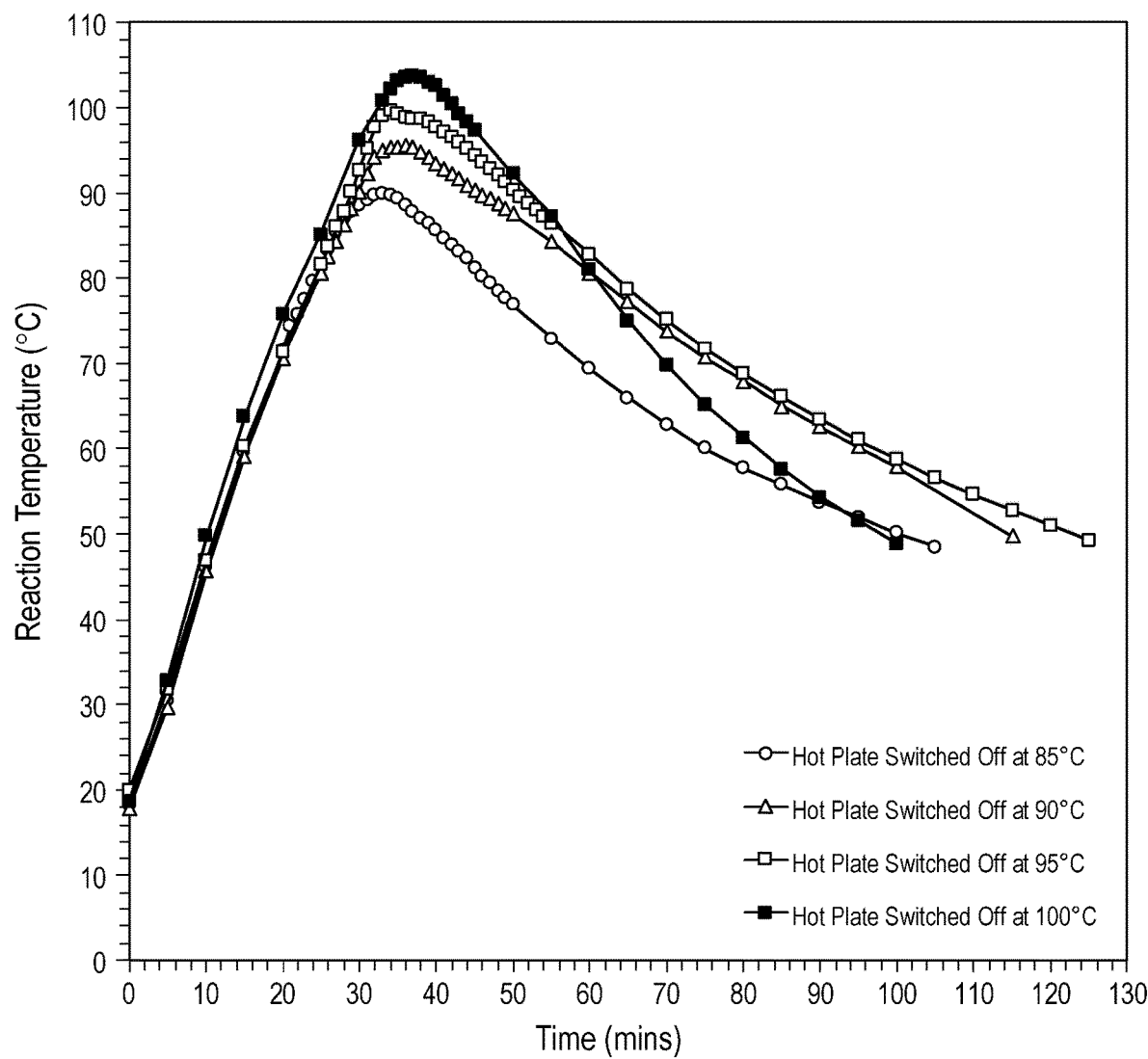
FIG. 10 is a chart showing the temperature profiles of the reaction mixture according to an exemplary process of surface modification of copper-containing particles according to one embodiment.

Example 4. Modifying the Surface Area of Copper-Containing Particles with Nickel The surface area of a coated copper powder was controlled by varying the reaction time during synthesis. The surface area of the coated powders was directly related to the time at which the reaction mixture remained above the reaction temperature. As the reactants remain above that temperature, the amount of deposited material increases which increases the surface area of the copper powders. FIG. 10 in conjunction with Table 1 shows the influence of reaction temperature and time on the surface area of a 1.2 μm to 3.2 μm copper powder subject to coating consistent with Example 1.

TABLE 1

| Temperature Hot Plate Switched Off (° C.) | Peak Temperature (° C.) | Time above 85° C. (min) | Surface Area (m$^2$/g) | Oxidation (XRD: Cu2O (111)/Cu(111)) |
| --- | --- | --- | --- | --- |
| uncoated | N/A | N/A | 0.60 | 0.001 |
| 85 | 90 | 14 | 0.83 | 0.011 |
| 90 | 96 | 27 | 1.59 | 0.001 |
| 95 | 100 | 31 | 2.33 | 0.001 |
| 100 | 104 | 32 | 3.14 | 0.000 |

The peak temperature in the reactor and the time the reaction mixture remains above 85° C. increases the surface area of the coated copper powder. In the example, the increase is 38% at 90° C. up to a 5-fold increase at 104° C.

The surface area of the coated powders is also related to the maximum temperature that the reactants experience during the reaction. The reactions using fine (1.2-3.2 microns) copper powders with an oleic acid coating are susceptible to temperature overshoot, with the copper powders with an oleic acid coating foaming during the reaction. The peak temperature was controlled by the time at which the hot plate was switched off.

Gaseous by-products were trapped inside the foam layer. At peak temperatures less than 90° C., the foam layer collapsed during cooling. In addition to the powders having a lower surface area, the material also shows signs of oxidation (see Table 1). For reactions with higher peak temperatures, the foam layer remained over the reaction mixture until the material was ready to be centrifuged.

When the reaction temperature exceeded 100° C., the foam layer collapsed once the reaction reached peak temperature, thus, reducing the thickness of the foam layer. This reduction in thickness, in addition to a slightly faster stirring rate, resulted in a faster cooling rate for this reaction. When the heating and cooling curves for the bench scale reactions are within a few degrees (i.e., can be directly superimposed), the measured surface area of the coated Cu (comparing 2 batches) is within 0.002 m$^2$/g. However, even with matching heating and cooling conditions, a delay (~1.5 hrs) before the material is centrifuged allows the gases to remain trapped in the foam for a longer period of time. Consequently, the surface area of the coated material was found to increase by 0.126 m²/g.

Figure 11A:
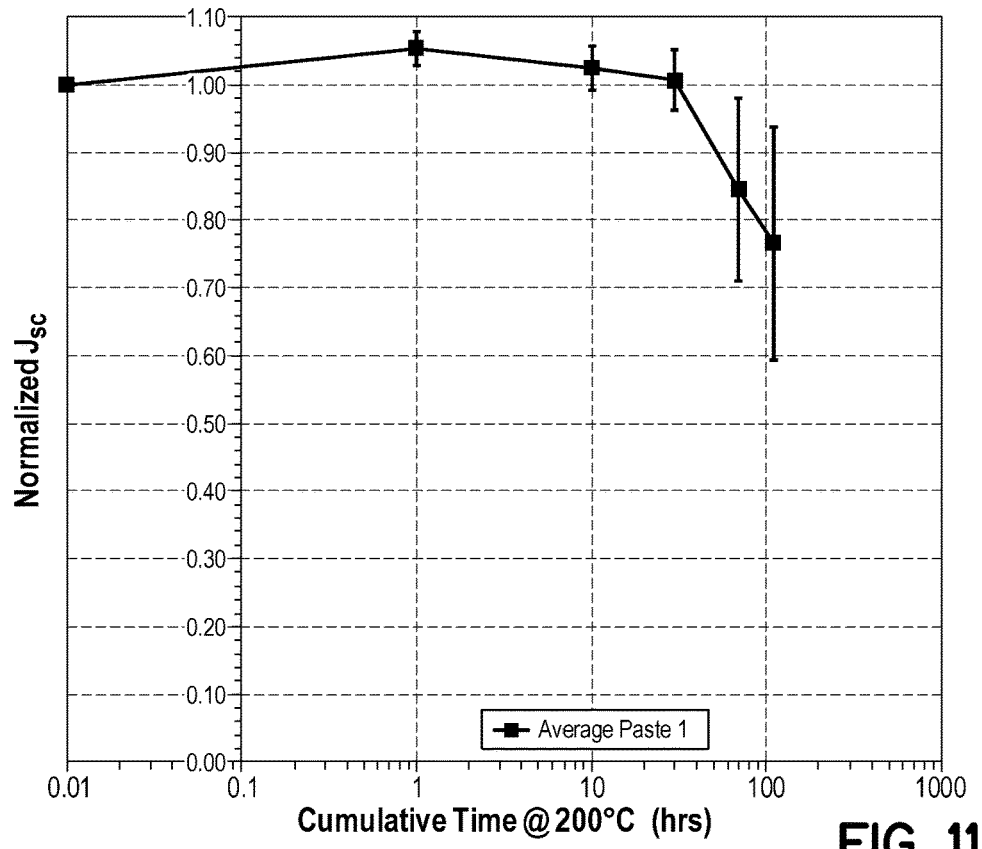
FIGS. 11A, 11B, 11C, and 11D are graphs of an accelerated aging test on normalized short circuit current density ($J_{sc}$), normalized open circuit voltage ($V_{oc}$), normalized fill factor (FF), and normalized efficiency ($\eta$), respectively, for pastes made without modifying the surface of the copper containing particles.
Figure 11B:
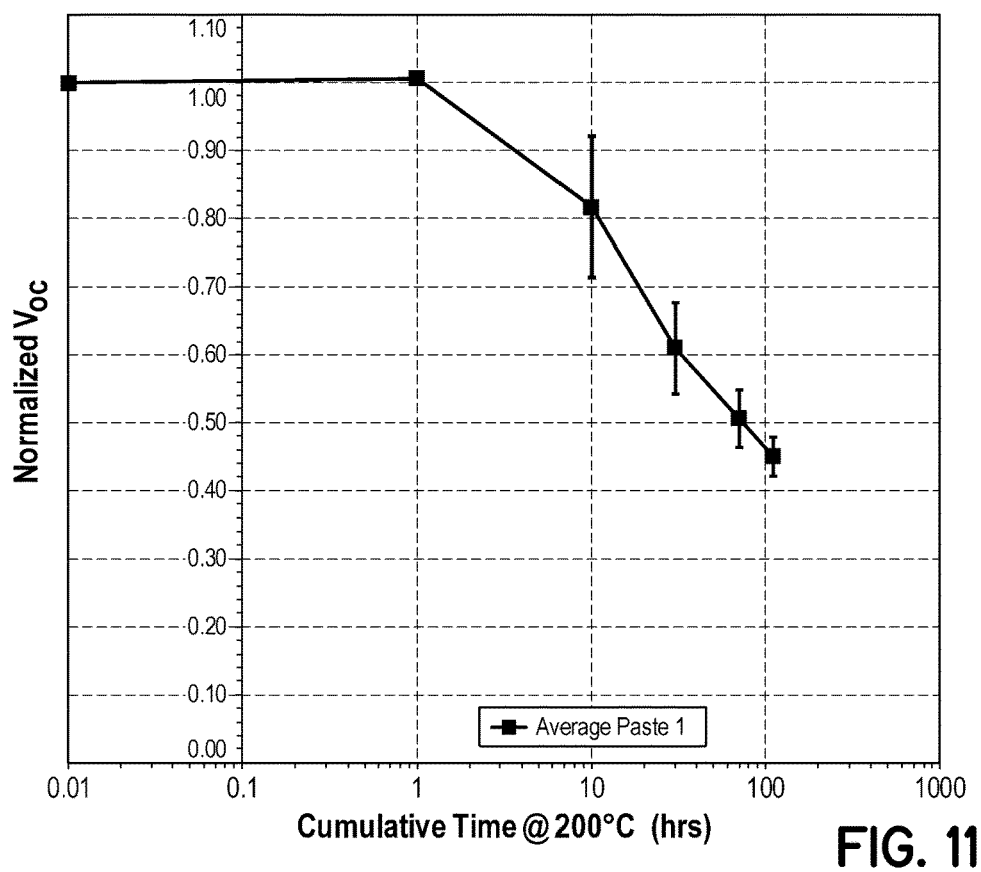
Figure 11C:
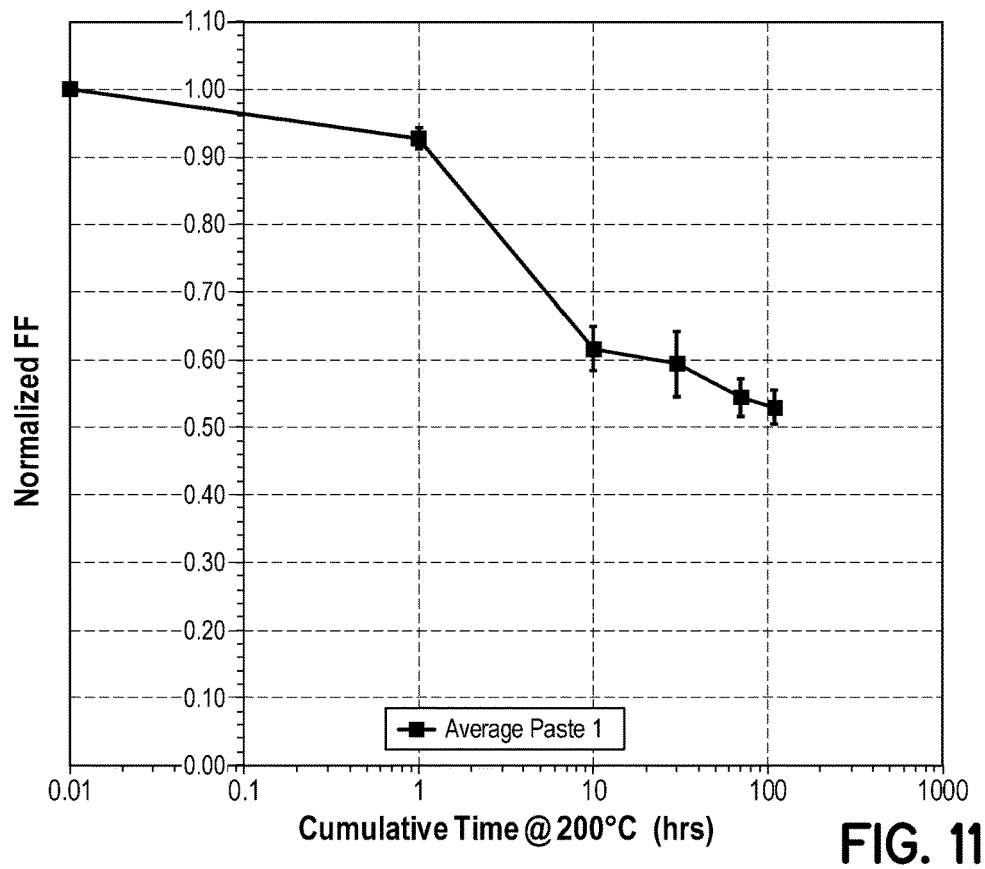
Figure 11D:
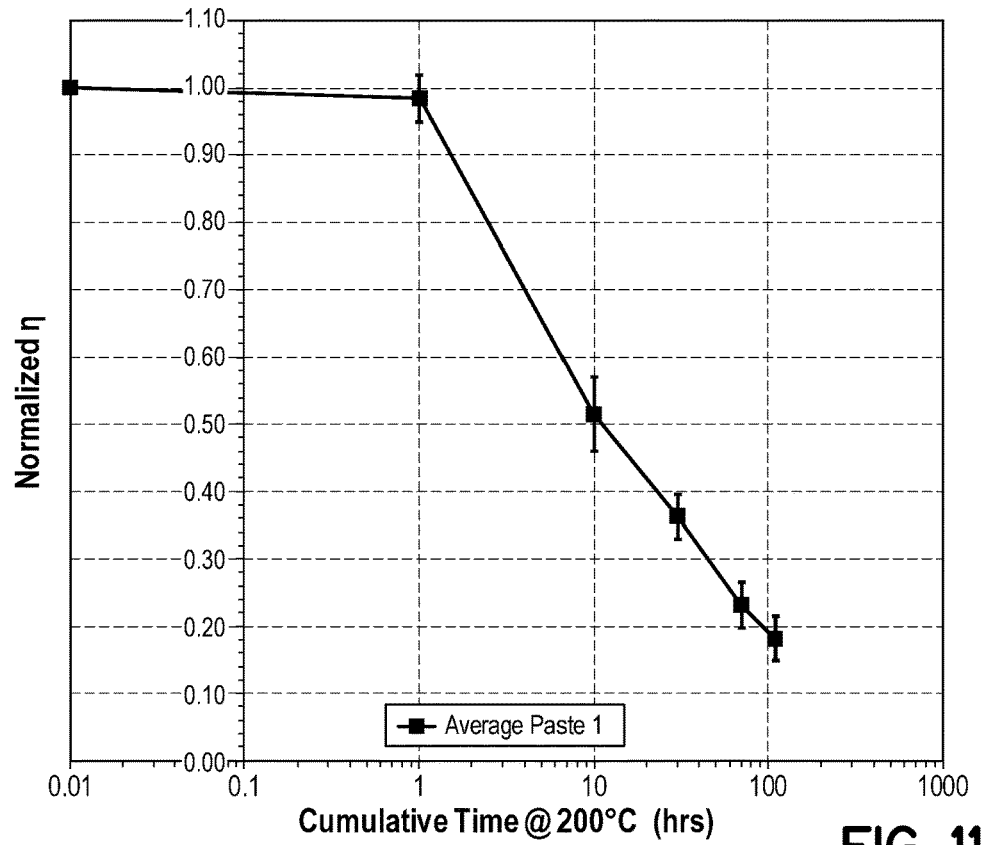

Performance of pastes including unmodified copper powders with Ni/Ni/Pb nanoparticles and $Sb_2O_3$ particles are shown in FIGS. 11A-11D. These figures illustrate an average effect of accelerated aging at 200° C. on (a) the short circuit current density, $J_{sc}$, (FIG. 11A), (b) the open circuit voltage, $V_{oc}$ (FIG. 11B) (b) the fill factor, FF, (FIG. 11C), and (d) the efficiency, η (FIG. 11D). Paste 1 was formulated with $Sb_2O_3$ and 100% Ni/Ni/Pb nanoparticles. See Table 12 (below). The copper powders were left uncoated. Results were normalized to their initial values at 0.01 hrs. The error bars are the standard deviation of the results from 5 cells.

Examples 5-9. Method to Test the Durability of Devices Metallized with the Copper-Containing Paste The durability of fired solar cells was determined by monitoring the open circuit voltage ($V_{oc}$) of the devices. A constant $V_{oc}$ indicates that the copper is not penetrating into the silicon. To speed up testing, the cells are exposed to an elevated temperature. One testing method follows the peer reviewed academic articles for copper electroplated contacts on silicon solar cells. The test thermally stresses the cell at elevated temperatures of 150° C. to 300° C. to evaluate the reliability of the cell over a much shorter period. These temperatures are above the solar cells' maximum operating temperature range of 80° C. to 90° C. One of the drawbacks of this test method is that the testing temperatures are high enough that it is possible to have chemical interactions between the materials, which would never be seen during the normal operation of a solar cell. Diffusion of copper into the junction will lead to a drop in the $V_{oc}$.

Example 5. Effect of Nanoparticle Composition on Durability

Figure 12A:
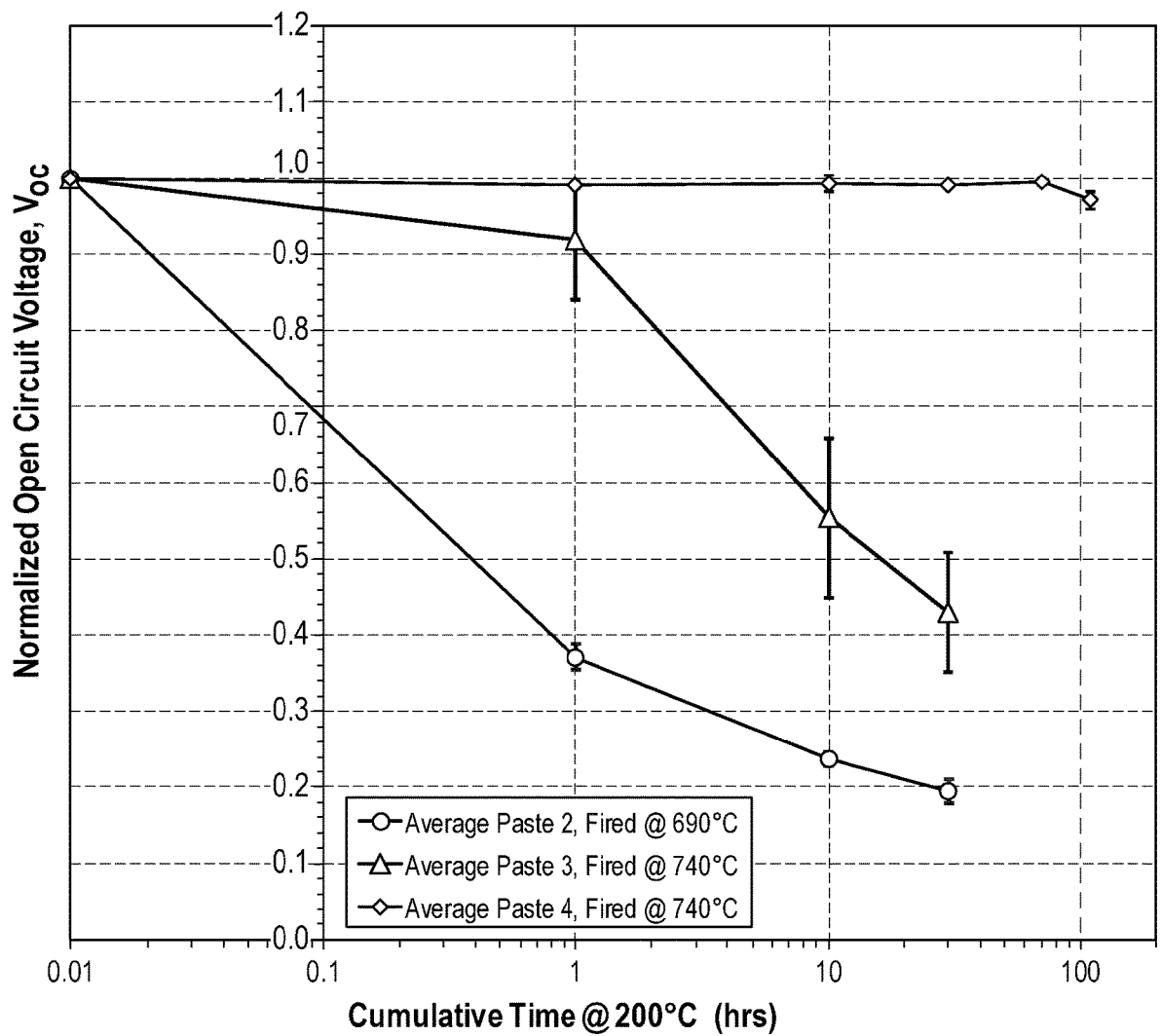
FIG. 12A is a graph of an accelerated aging test on normalized open circuit voltage ($V_{oc}$) for a paste made using different embodiments of the nanoparticles, fired at different temperatures.

Three copper-containing pastes were compared. Pastes 2, 3, and 4 were formulated as shown in Table 2 (below). The nanoparticle component of the paste was composed of (i) 100% Cu/Ni/Pb nanoparticles, (ii) 50% Cu/Ni/Pb nanoparticles and 50% Ni/Ni/Pb nanoparticles, and (iii) 100% Ni/Ni/Pb nanoparticles, respectively. FIG. 12A illustrates the effect of the nanoparticle composition on the PV performance (i.e., open circuit voltage, $V_{oc}$) after the cells were thermally stressed at 200° C. for up to 110 hrs for cells made from each of pastes 2, 3, and 4. The error bars in FIG. 12A are the standard deviation for between 4 to 6 cells measured for each paste. Results were normalized to their initial values at 0.01 hrs.

Figure 12B:
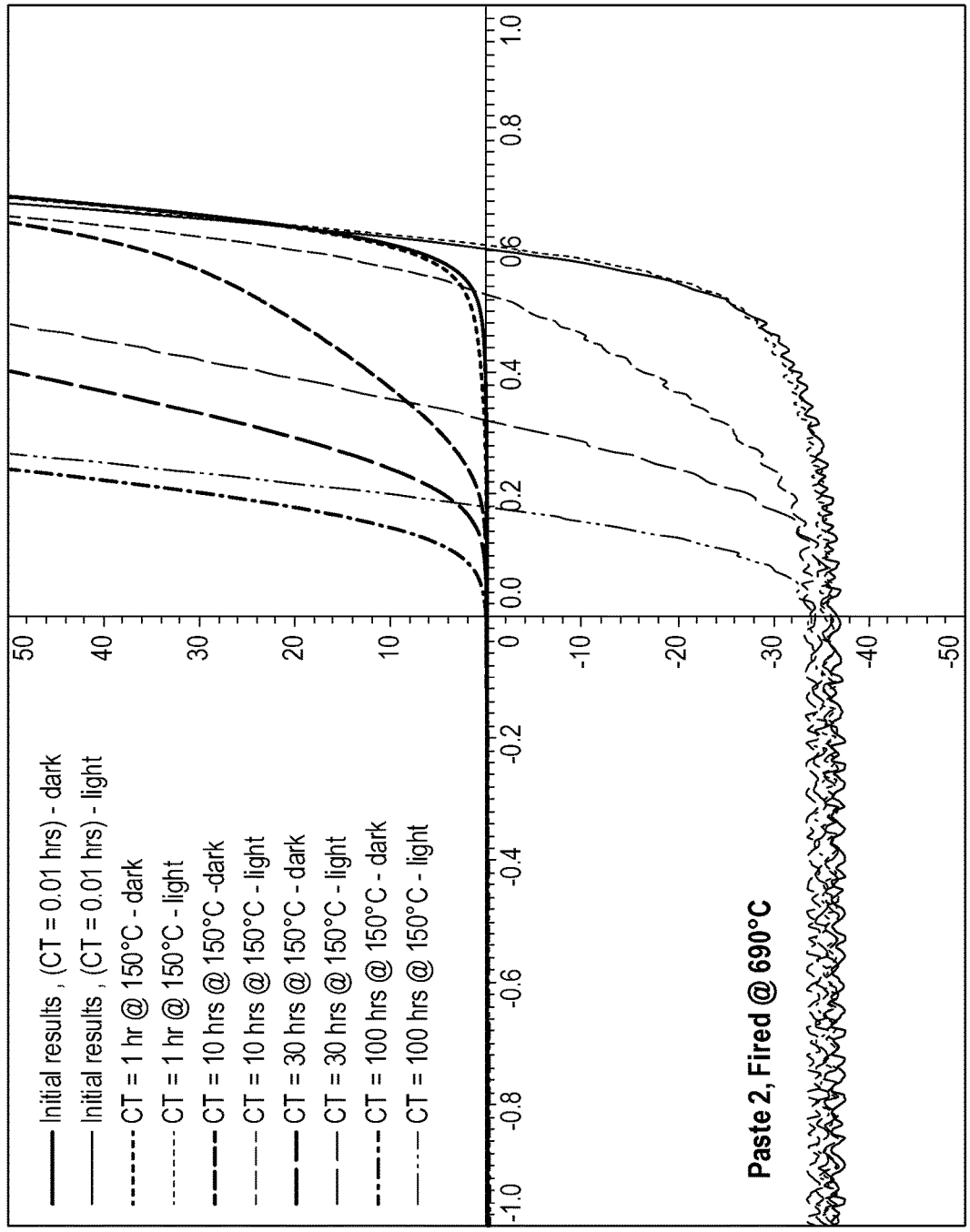
FIGS. 12B, 12C, 12D, and 12E are graphs of the impact of an accelerated aging test on the PV performance for pastes made using different embodiments of the nanoparticles, fired at different temperatures.
Figure 12C:
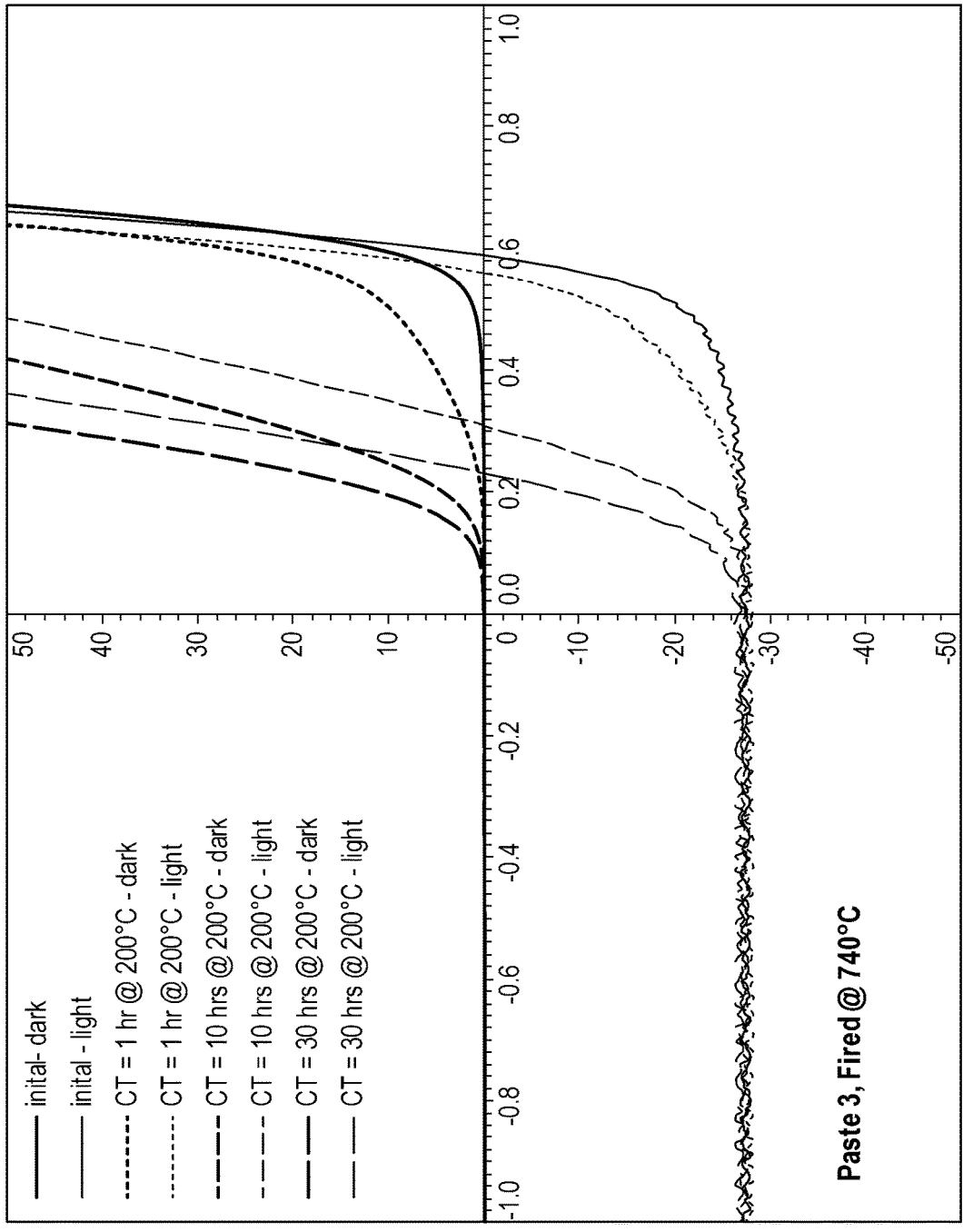
Figure 12D:
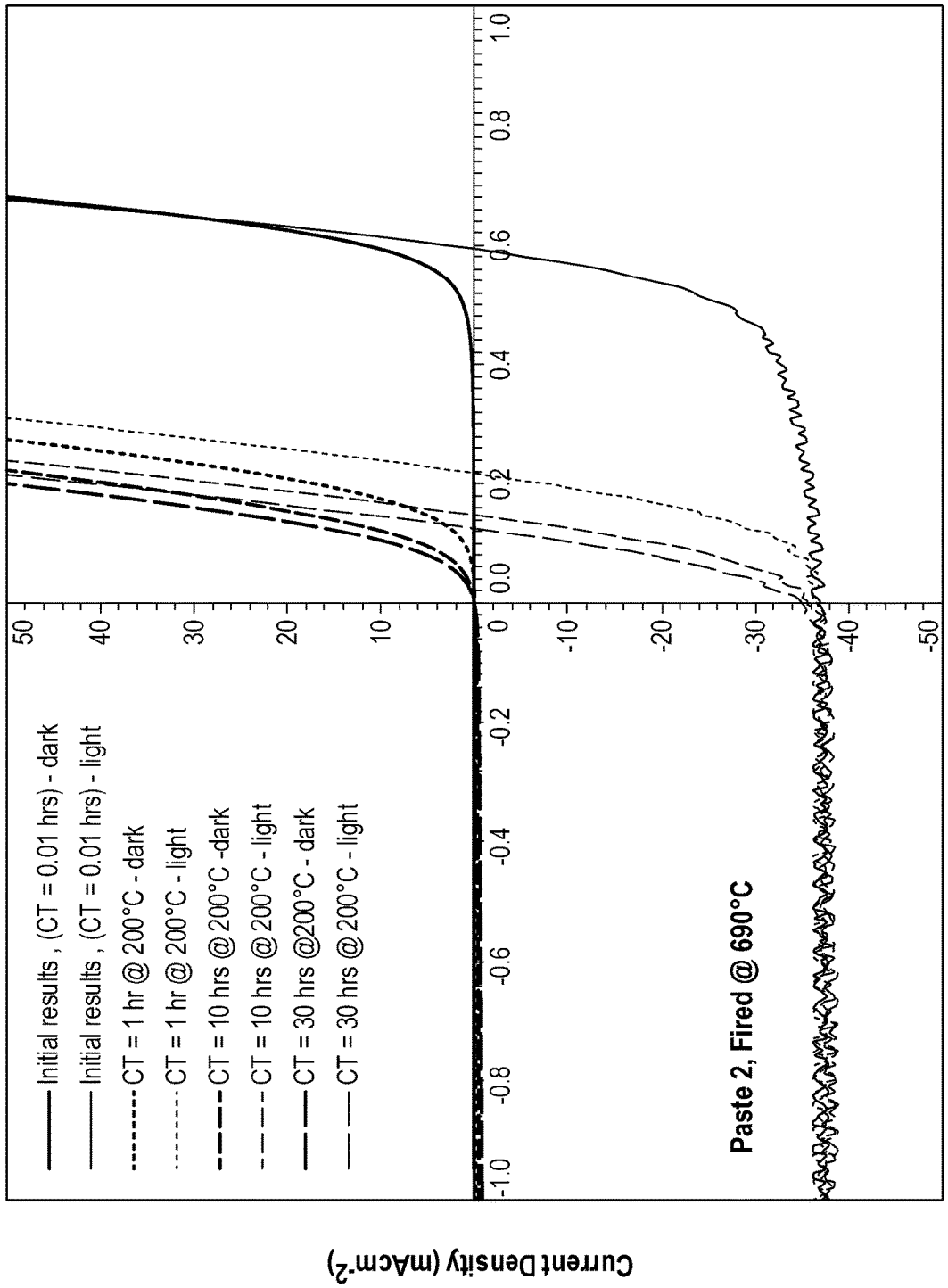
Figure 12E:
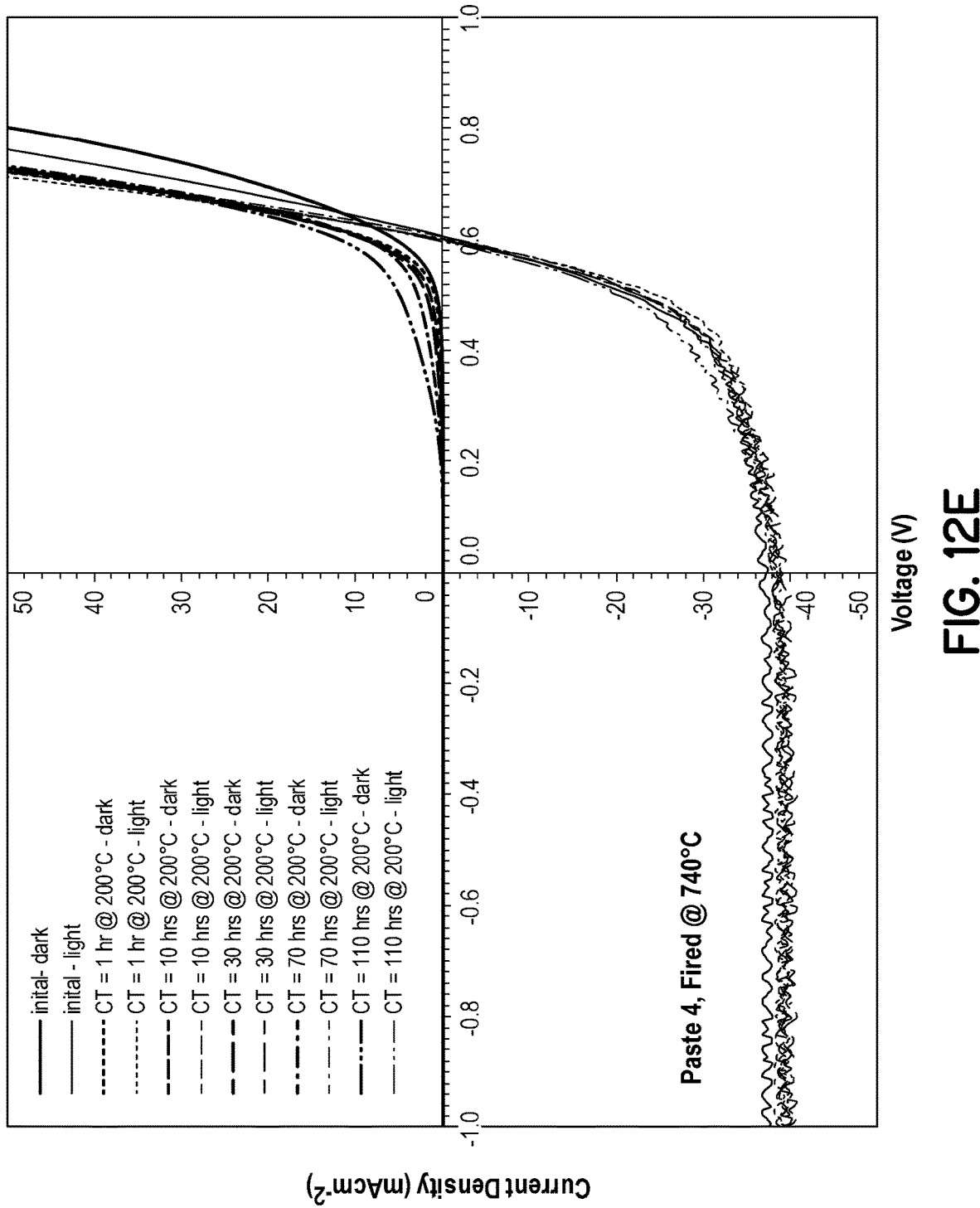
Figure 12F:
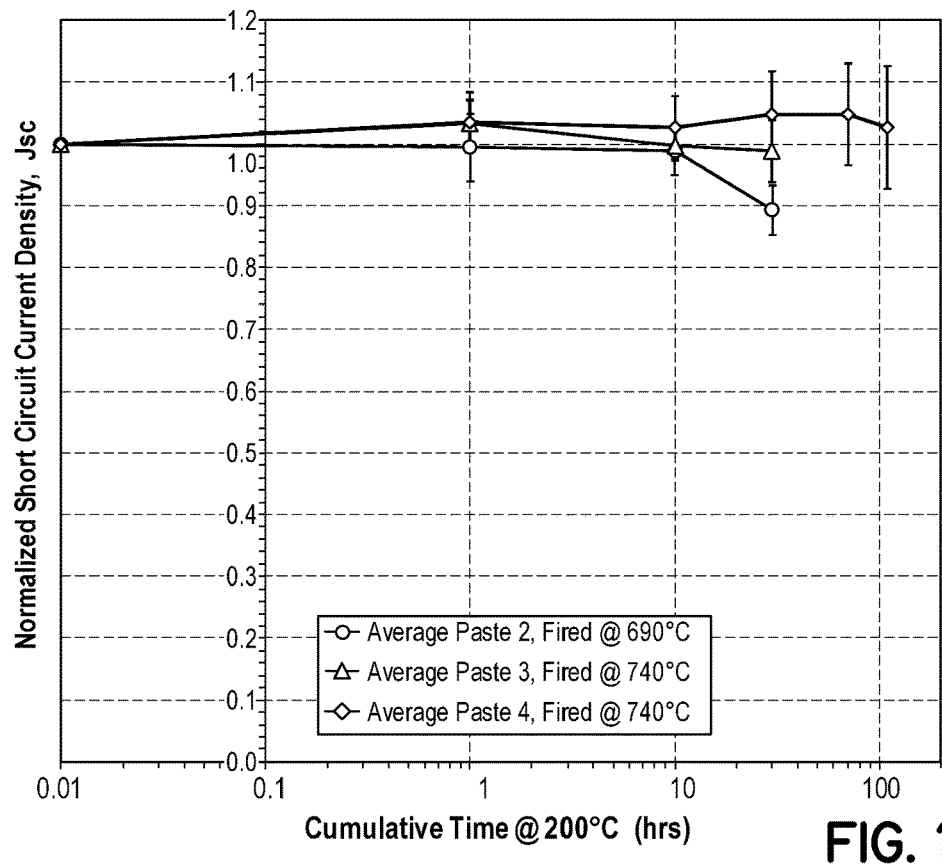
FIGS. 12F and 12G are graphs of an accelerated aging test on normalized open circuit voltage ($V_{oc}$) and normalized short circuit current density ($J_{sc}$) for pastes made using different embodiments of the nanoparticles, fired at different temperatures.
Figure 12G:
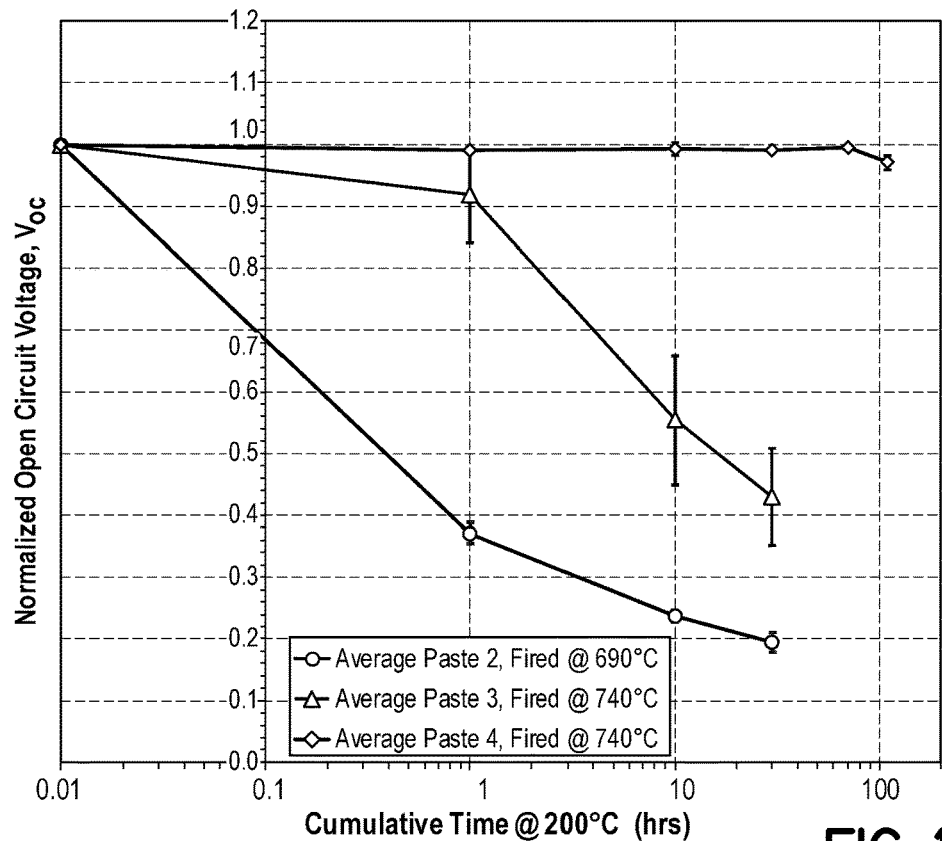
Figure 12H:
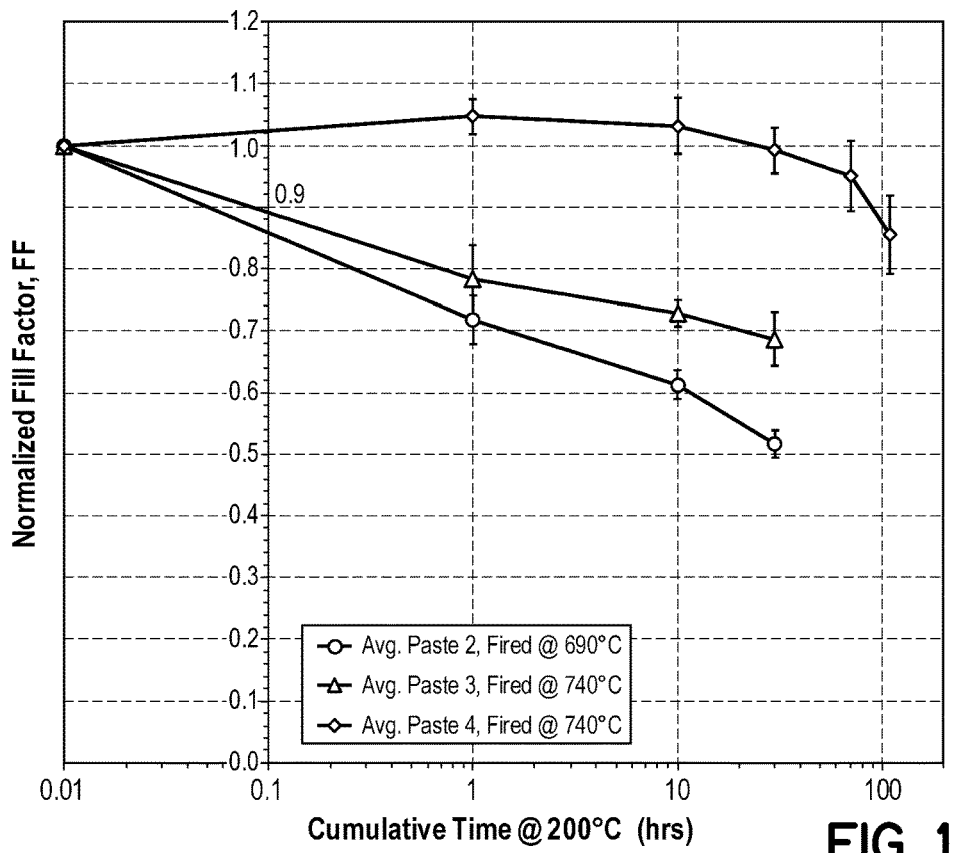
FIGS. 12H and 12I are graphs of an accelerated aging test on normalized fill factor (FF) and normalized efficiency ($\eta$) for pastes made using different embodiments of the nanoparticles, fired at different temperatures.

FIGS. 12B, 12C, 12D, and 12E illustrate the effect of accelerated aging on PV performance with FIGS. 12B and 12D being 100% Cu/Ni/Pb nanoparticles, FIG. 12C being 50% Cu/Ni/Pb nanoparticles and 50% Ni/Ni/Pb nanoparticles, and FIG. 12E being 100% Ni/Ni/Pb nanoparticles.

Figure 12I:
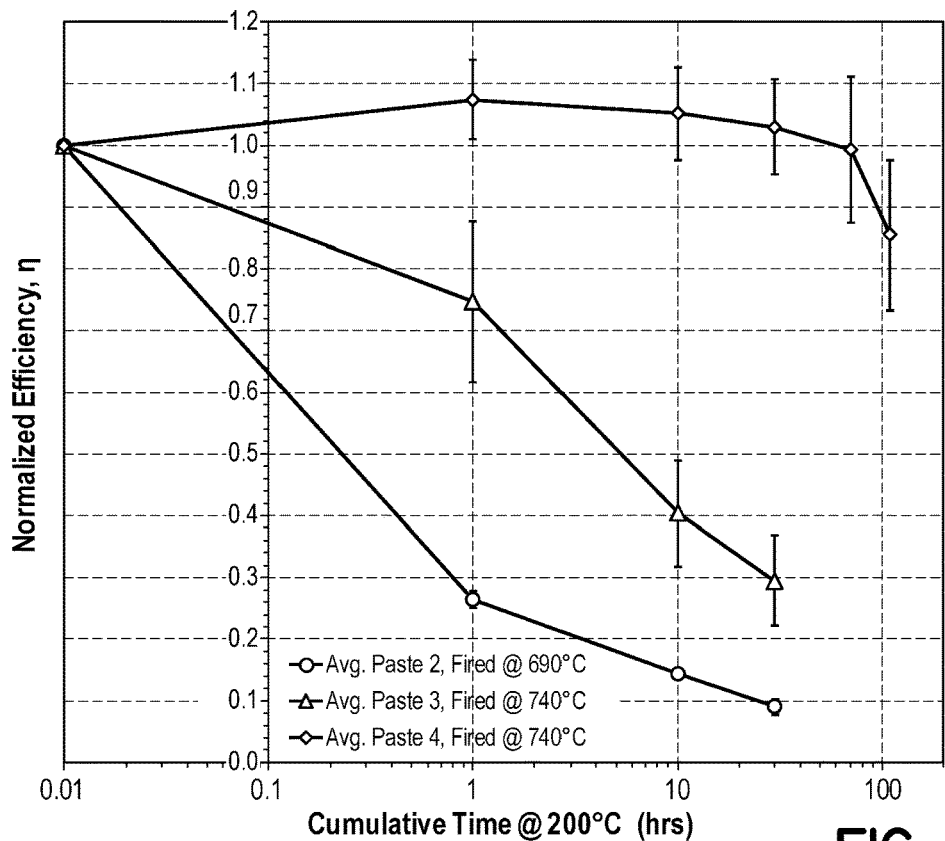
Figure 13A:
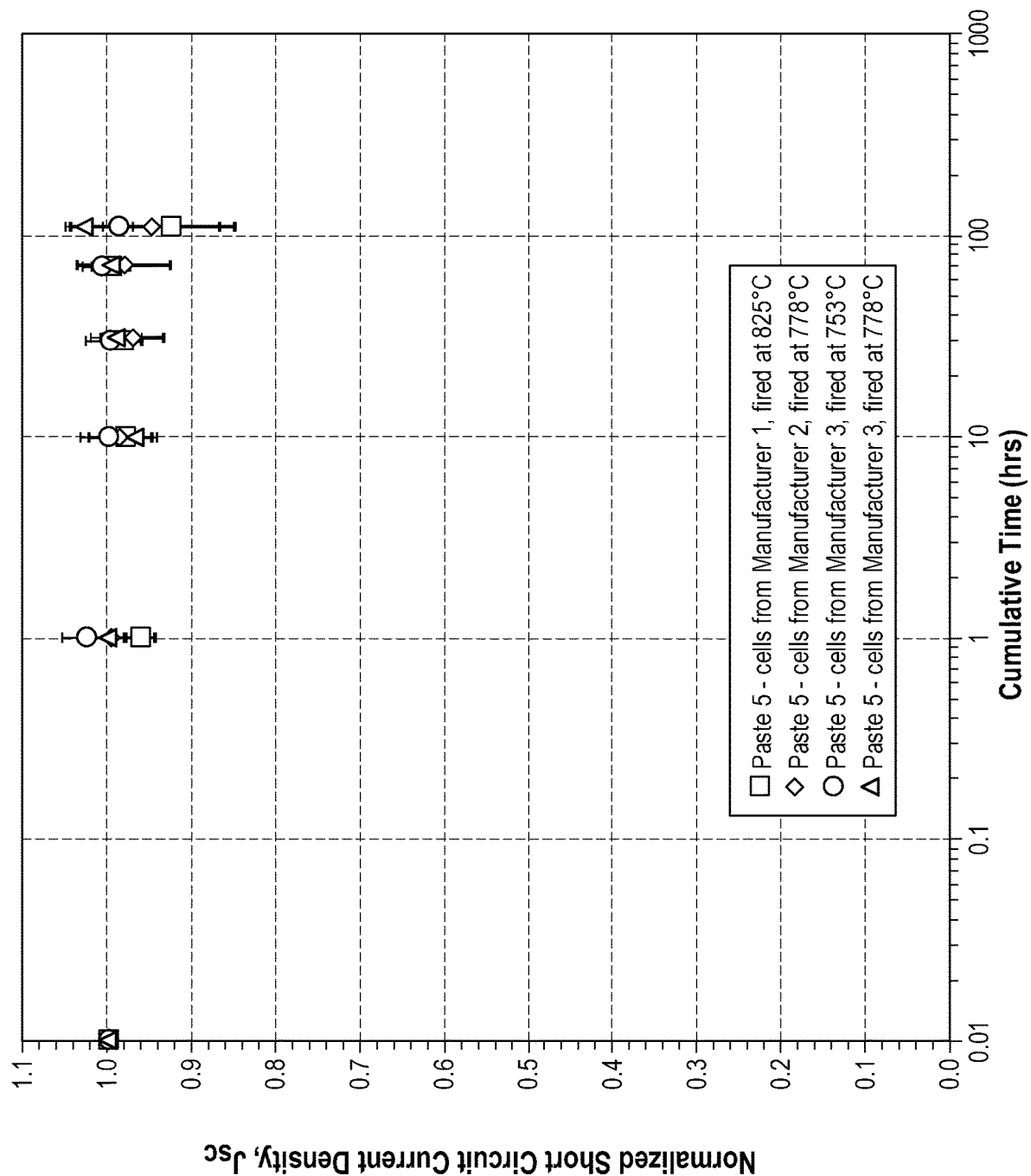
FIGS. 13A, 13B, 13C, and 13D are graphs of normalized short circuit current density ($J_{sc}$), normalized fill factor (FF), normalized open circuit voltage ($V_{oc}$), and normalized efficiency ($\eta$) for exemplary embodiments of the pastes on cells from different manufacturers.
Figure 13B:
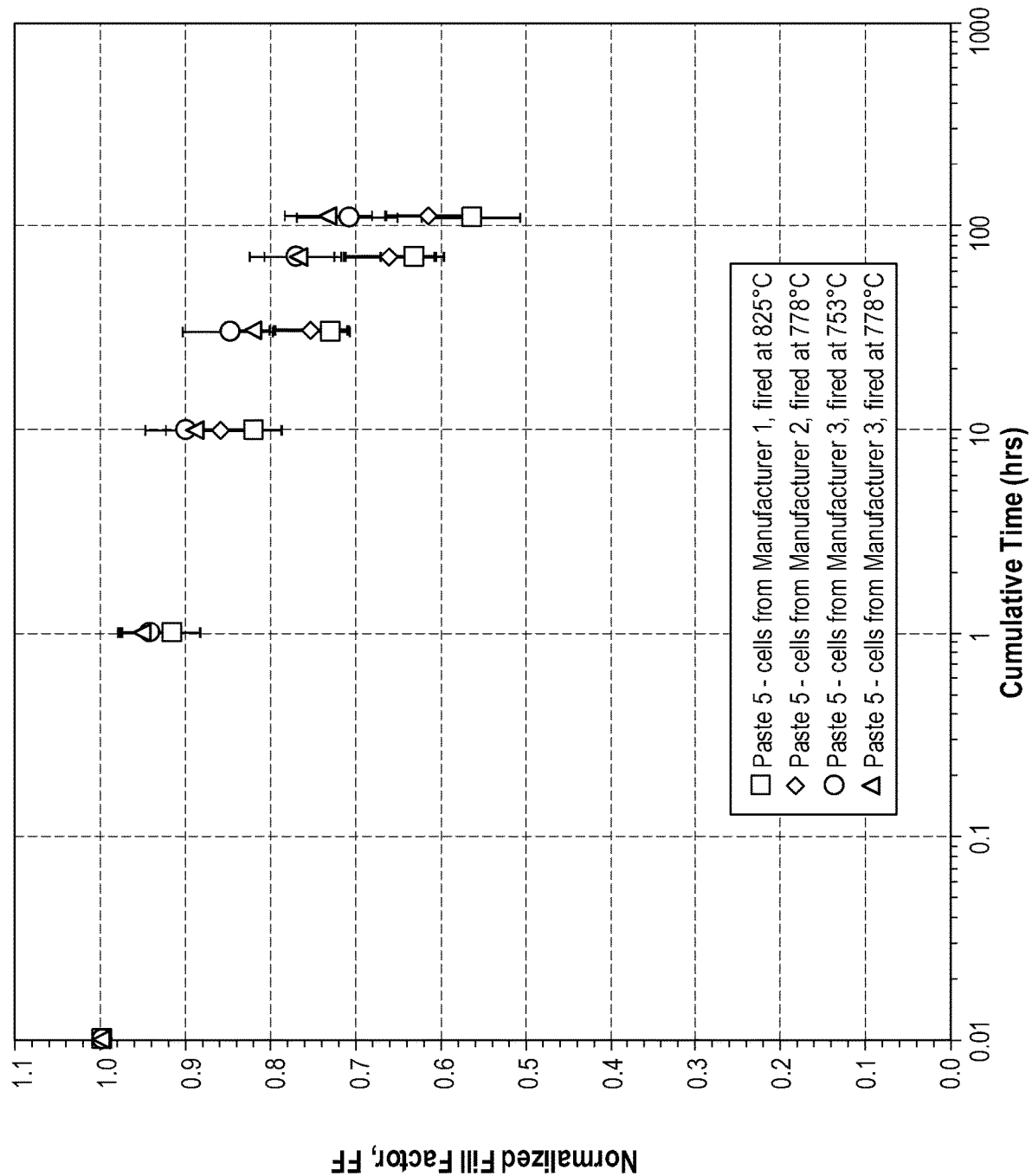
Figure 13C:
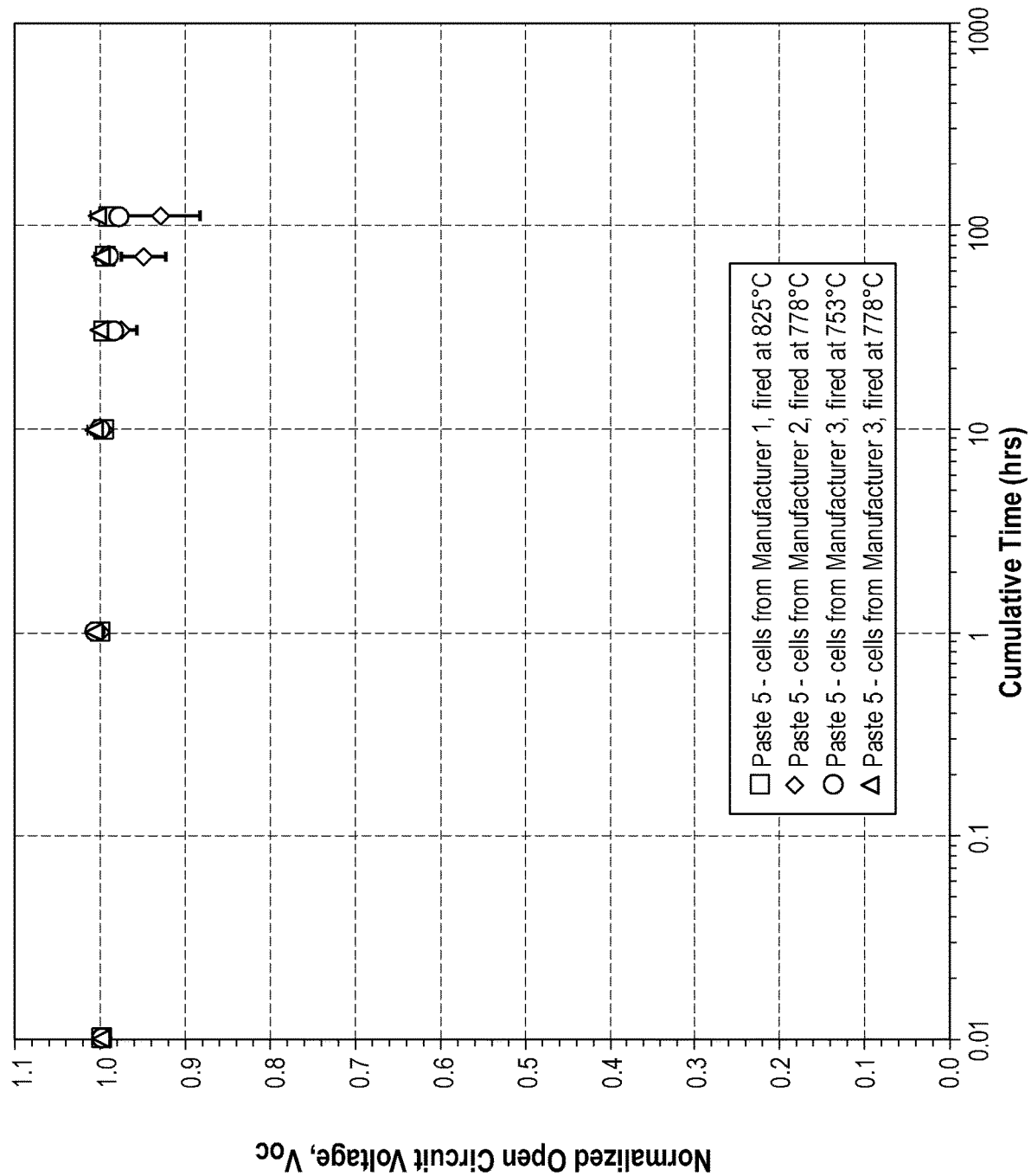
Figure 13D:
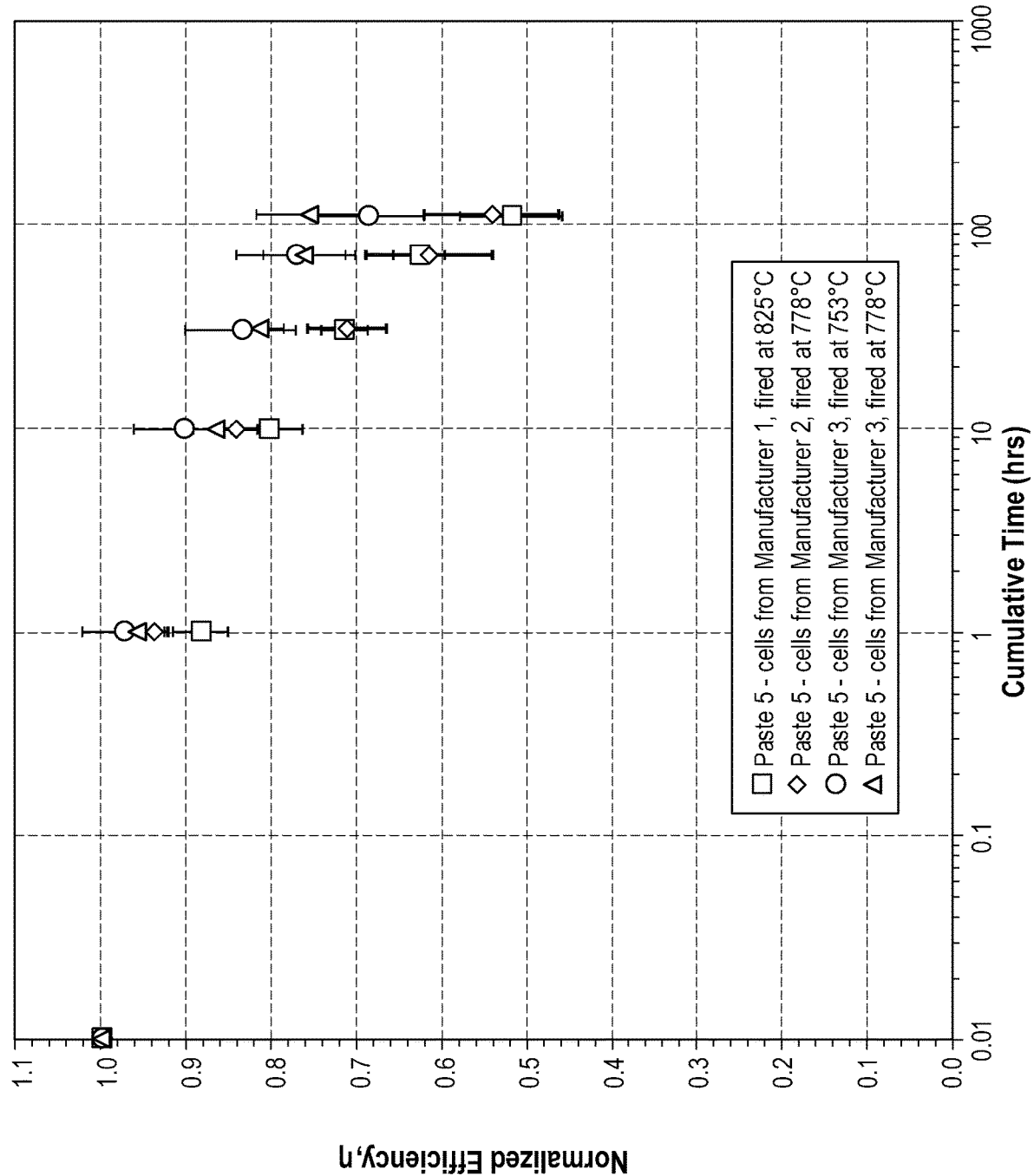
Figure 13E:
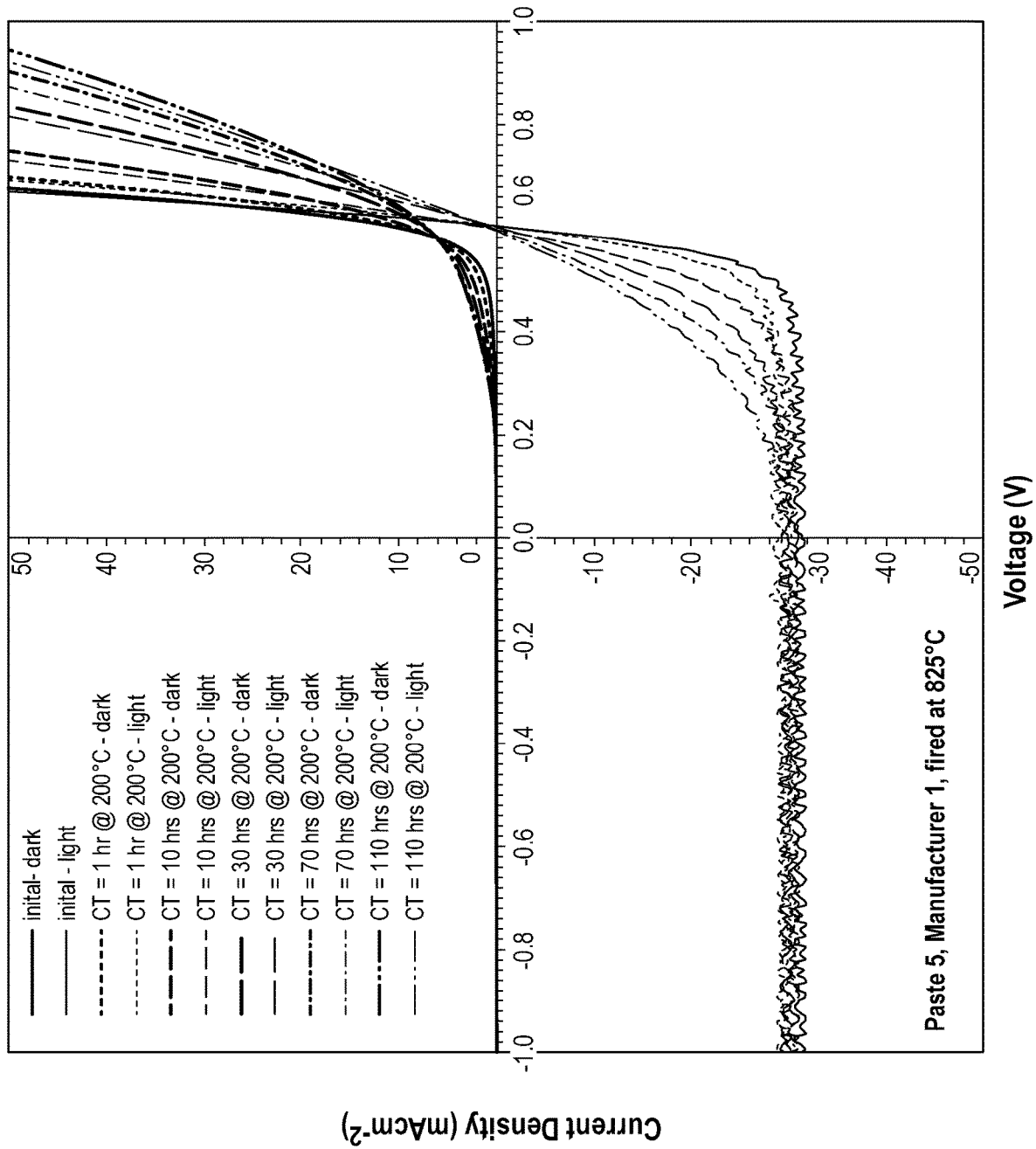
FIGS. 13E, 13F, 13G, and 13H are current-voltage graphs after accelerated aging tests on exemplary embodiments of the pastes on cells from different manufacturers.
Figure 13F:
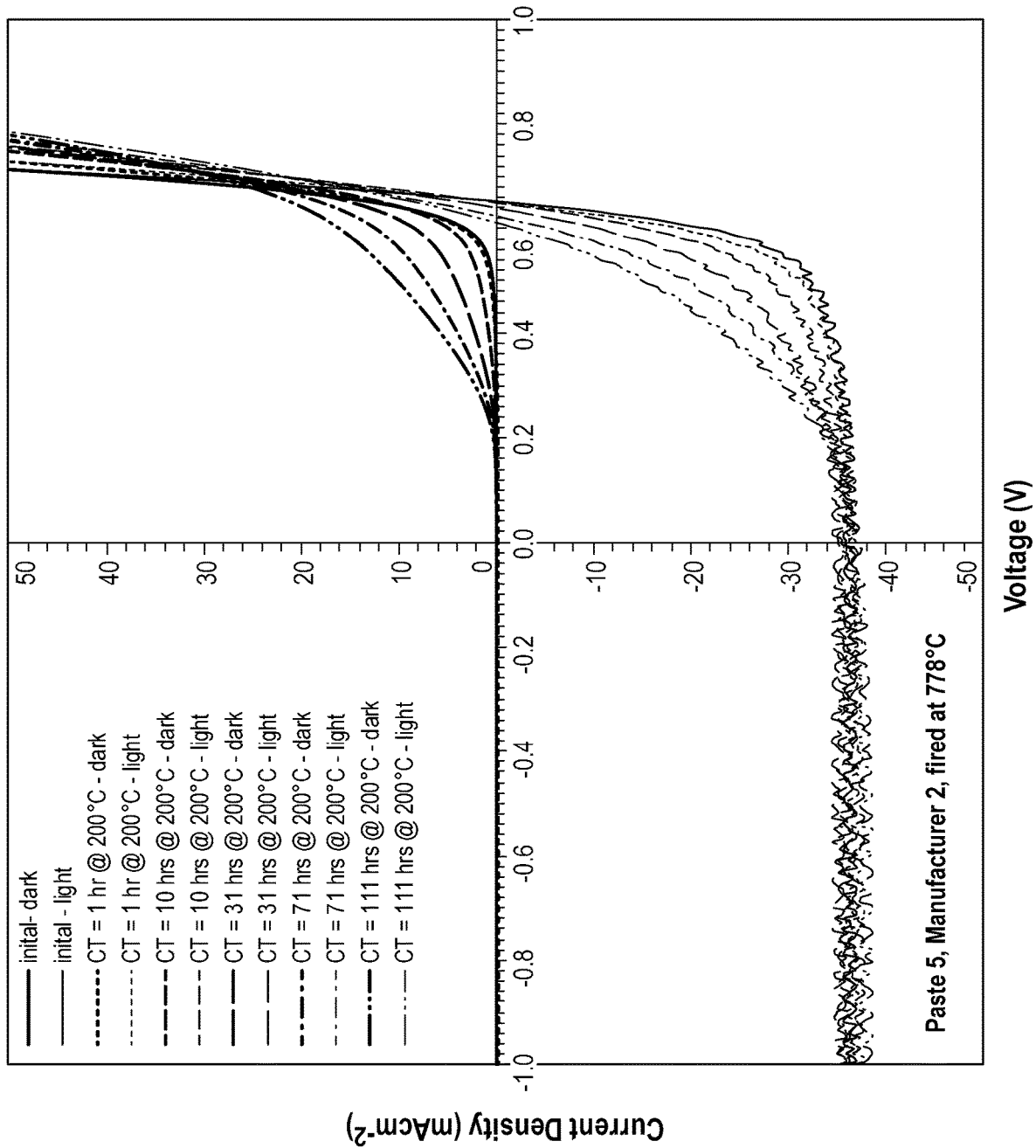
Figure 13G:
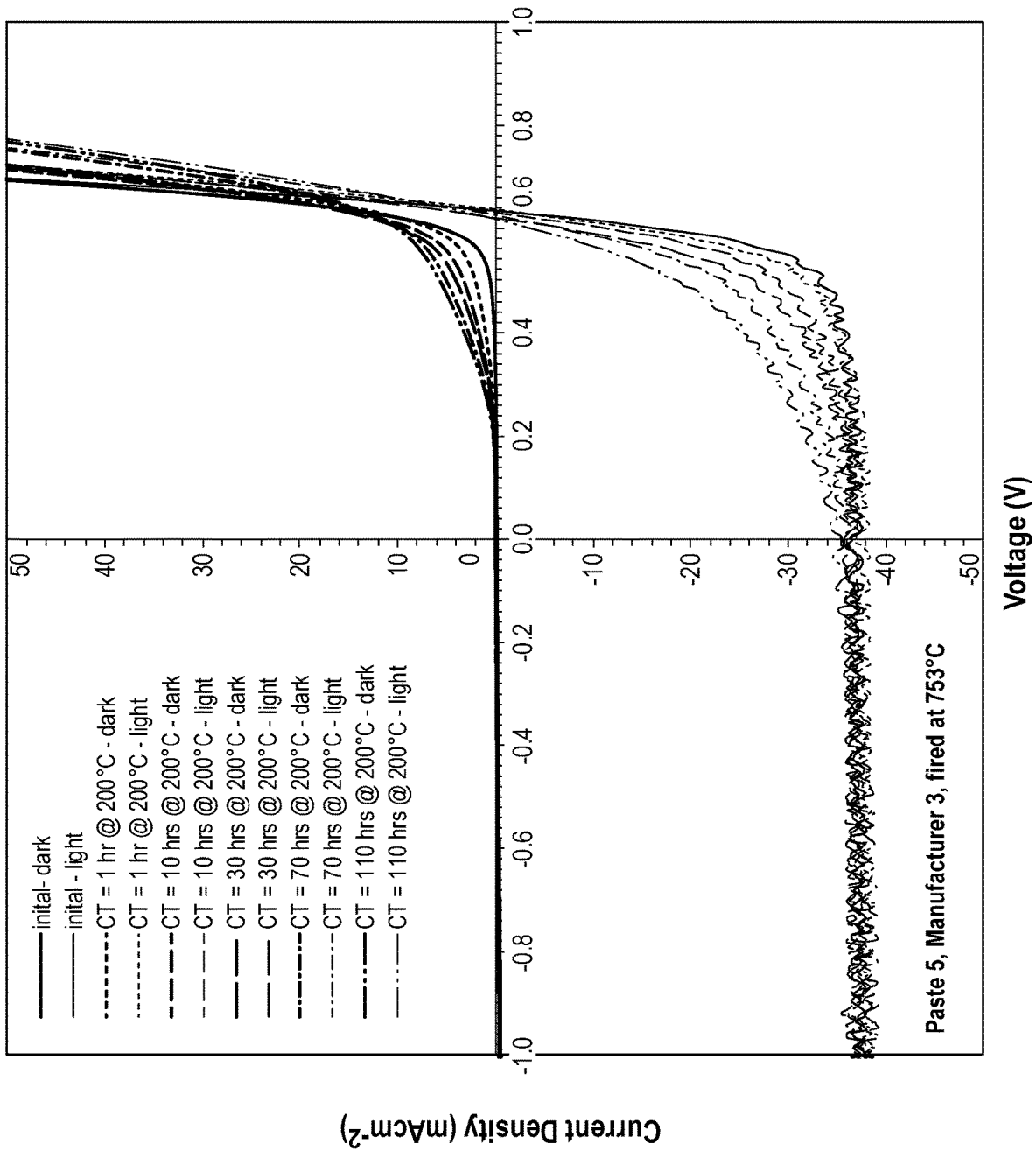
Figure 13H:
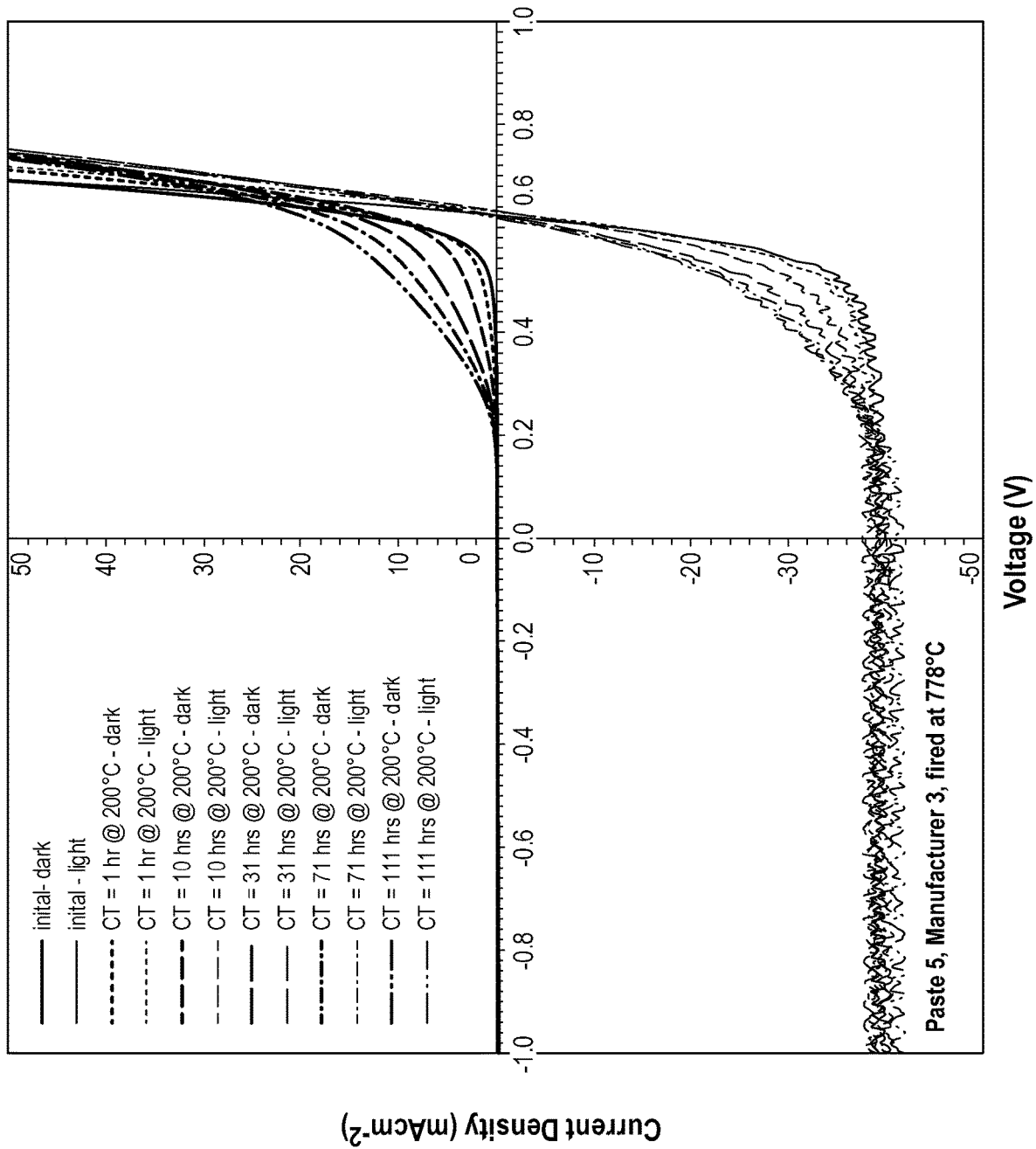

FIGS. 12F, 12G, 12H, and 12I illustrates an average effect of accelerated aging at 200° C. on the (a) short circuit current density, $J_{sc}$, (FIG. 12F), (b) open circuit voltage, $V_{oc}$, (FIG. 12G), (c) fill factor, FF, (FIG. 12H), and (d) efficiency, η (FIG. 12I). Results were normalized to their initial values at 0.01 hrs. The error bars are the standard deviation of 4 to 6 cells measured for each paste.

TABLE 2

| | Paste ID | | |
|---|---|---|---|
| Material | Paste 2 | Paste 3 | Paste 4 |
| Organic Binder: PVP 40,000 | 4.70 g (3.02 wt %) | 4.70 g (3.02 wt %) | 4.70 g (3.02 wt %) |
| Organic Solvent: Propylene Glycol | 16.68 g (10.71 wt %) | 16.68 g (10.71 wt %) | 16.68 g (10.71 wt %) |
| A/B/C nanoparticles: Cu/Ni/Pb NPs | 11.50 g (7.38 wt %) | 5.75 g (3.69 wt %) | 0 g (0 wt %) |
| A/B/C nanoparticles: Ni/Ni/Pb NPs | 0 g (0 wt %) | 5.75 g (3.69 wt %) | 11.50 g (7.38 wt %) |
| Secondary Oxide: $Sb_2O_3$ | 7.16 g (4.60 wt %) | 7.16 g (4.60 wt %) | 7.16 g (4.60 wt %) |
| Cu/D powders: Cu/Ni(?)P - fine copper powders (1.2-3.2 microns) | 11.58 g (7.43 wt %) | 11.58 g (7.43 wt %) | 11.58 g (7.43 wt %) |
| Cu/D powders: Cu/Ni(?)P - coarse copper flakes (10-20 microns) | 104.16 g (66.86 wt %) | 104.16 g (66.86 wt %) | 104.16 g (66.86 wt %) |

Example 6. Effect of the Surface Modification of the Copper Containing Powders on Durability This example demonstrates an effect of the particulate coating of a copper containing powder on the PV performance of crystalline silicon cells from three different manufacturers. The copper powders used a coating consistent with Example 1. The cells prepared were thermally stressed at 200° C. for up to 110 hrs. Performance of paste 5 of Table 3 is shown in FIGS. 13A-13H.

TABLE 3

| Material | Paste ID Paste 5 |
|---|---|
| Organic Binder: PVP 40,000 | 2.92 g (1.51 wt %) |
| Organic Solvent: Propylene Glycol | 12.69 g (6.55 wt %) |
| A/B/C nanoparticles: Ni/Ni/Pb NPs | 2.75 g (1.51 wt %) |
| Secondary Oxide: $Sb_2O_3$ | 9.64 g (4.97 wt %) |
| Cu/D powders: Cu/Ni(?)P - fine copper powders (1.2-3.2 microns) | 49.79 g (25.67 wt %) |
| Cu/D powders: Cu/Ni(?)P -large spherical copper powders (10-20 microns) | 116.05 g (59.88 wt %) |

Figure 14A:
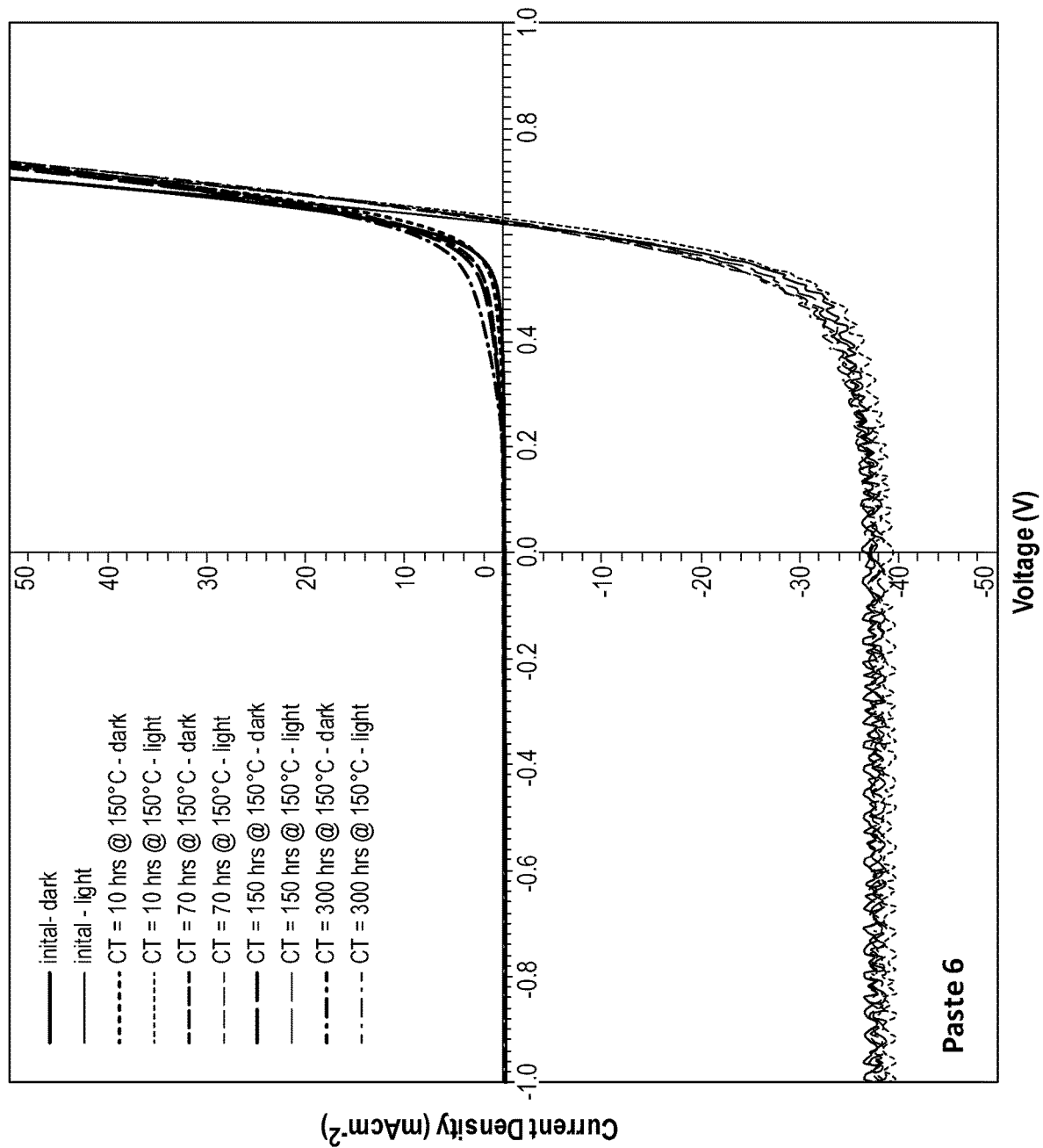
FIGS. 14A, 14B, and 14C are current vs voltage plots for accelerated aging of exemplary cells made from pastes containing increasing amounts of secondary oxide and nanoparticles.
Figure 14B:
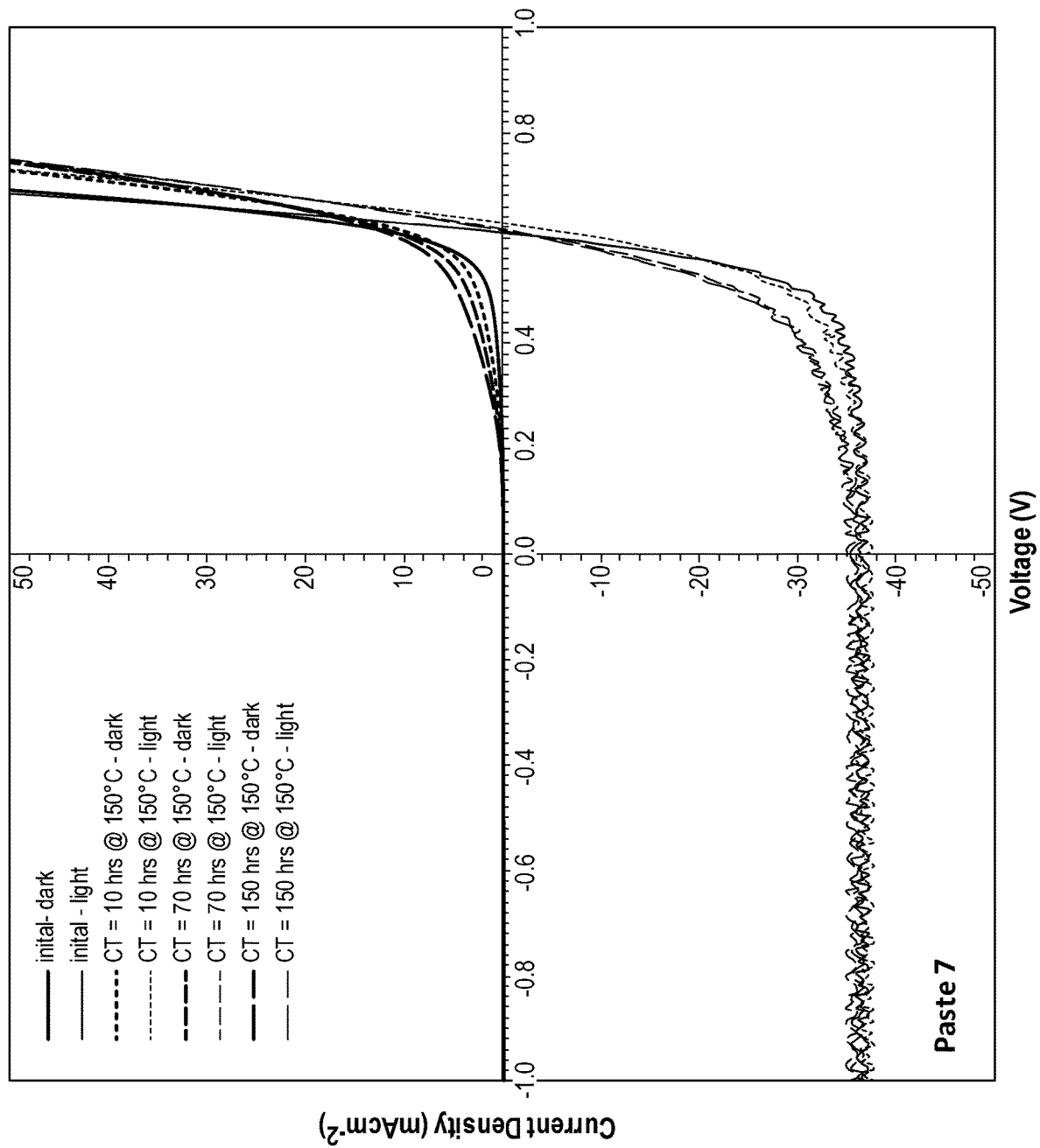
Figure 14C:
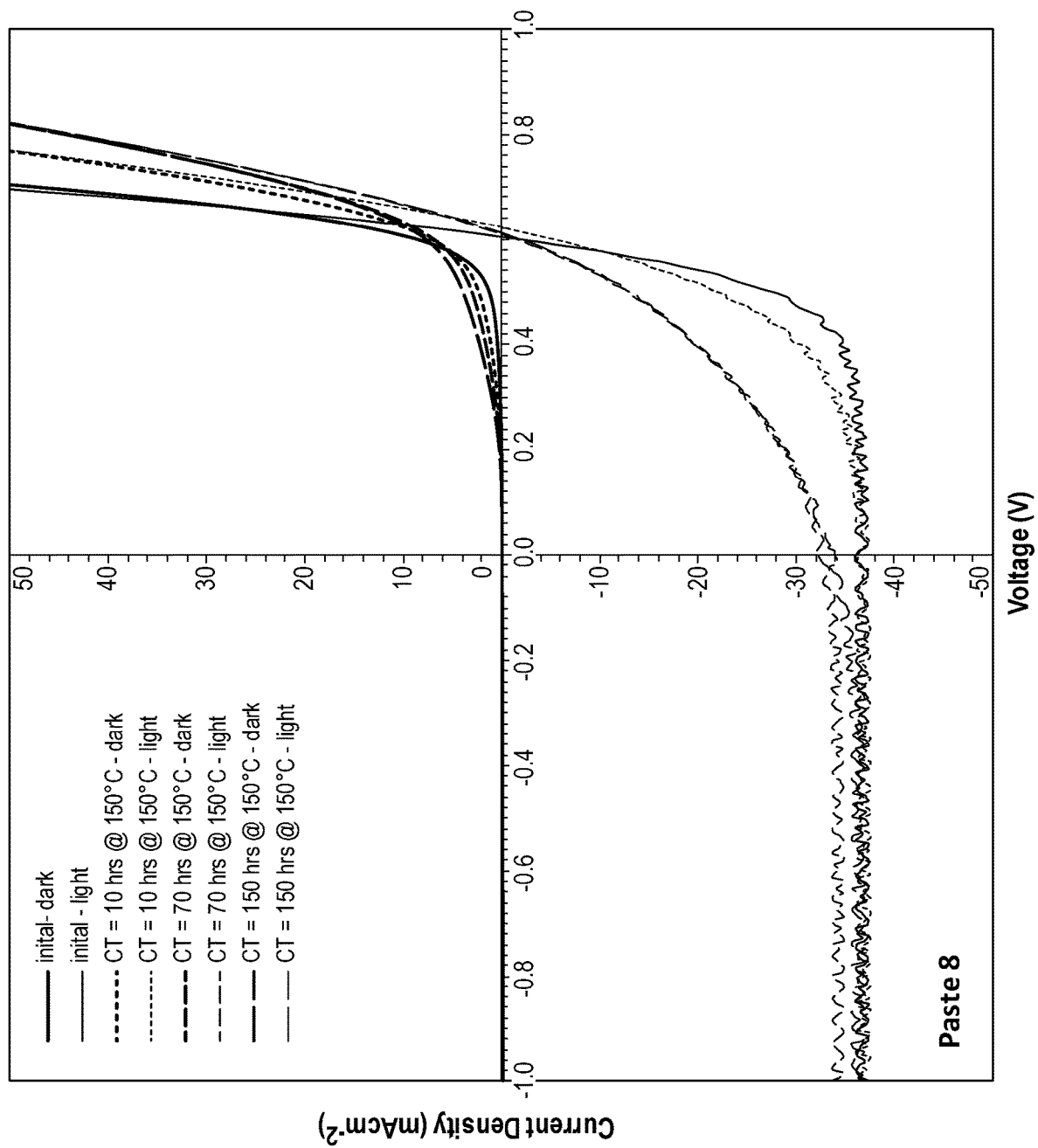
Figure 15A:
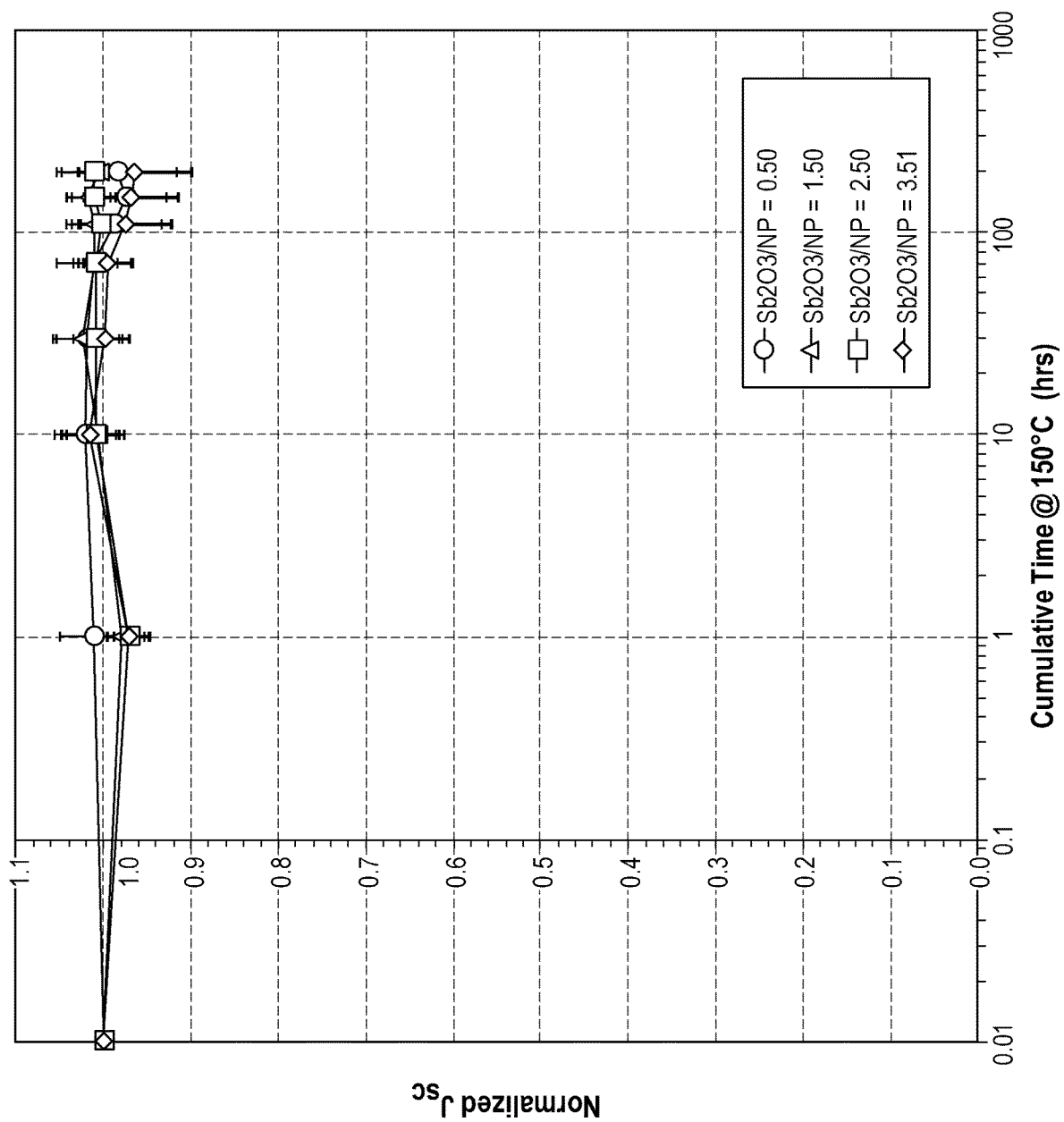
FIGS. 15A, 15B, 15C, 15D and 15E are graphs of an accelerated aging test on normalized short circuit current density ($J_{sc}$), normalized open circuit voltage ($V_{oc}$), normalized fill factor (FF), normalized efficiency ($\eta$) and normalized resistance, respectively, for different embodiments of the pastes containing increasing ratios of secondary oxide to nanoparticles.
Figure 15B:
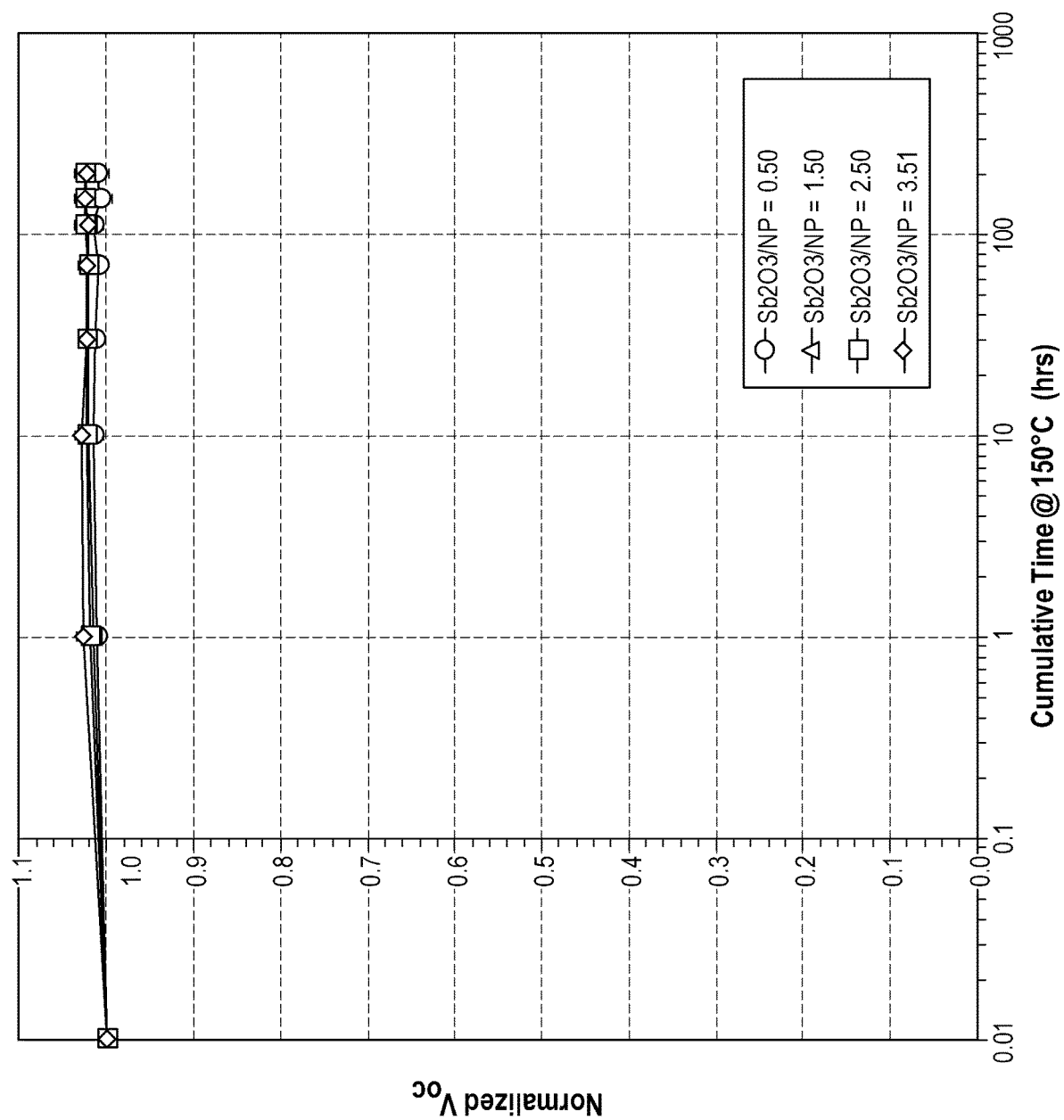
Figure 15C:
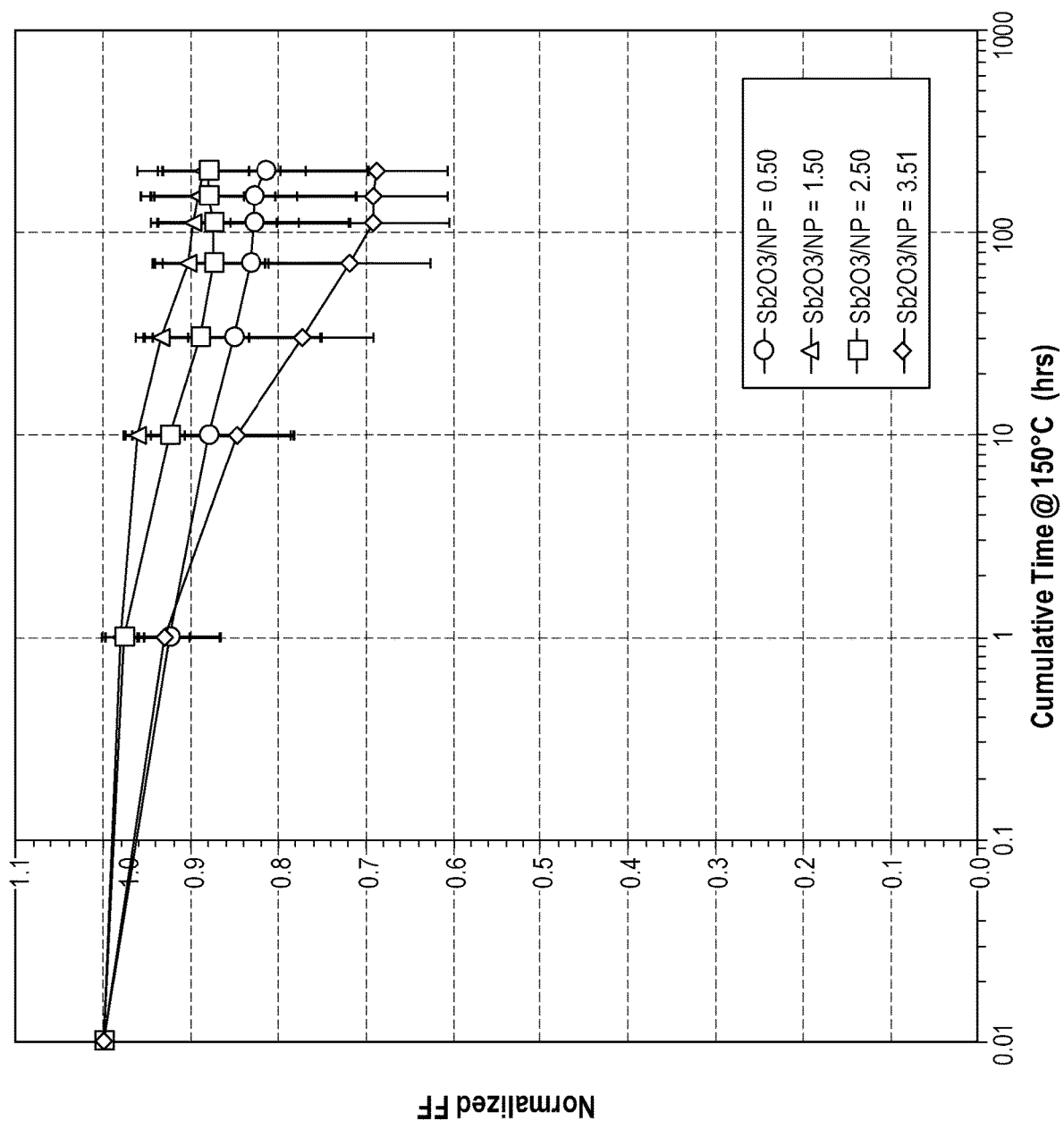
Figure 15D:
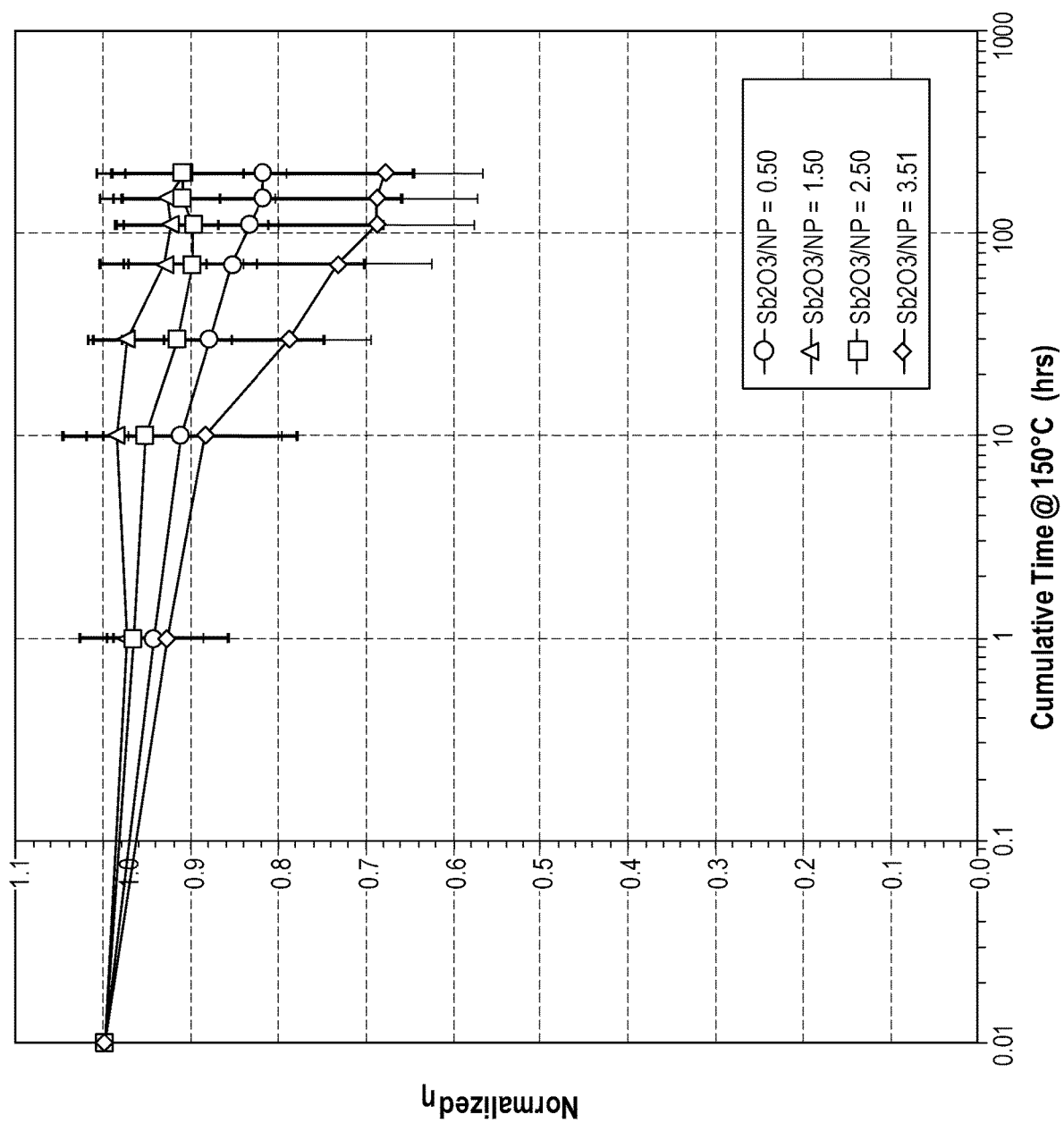
Figure 15E:
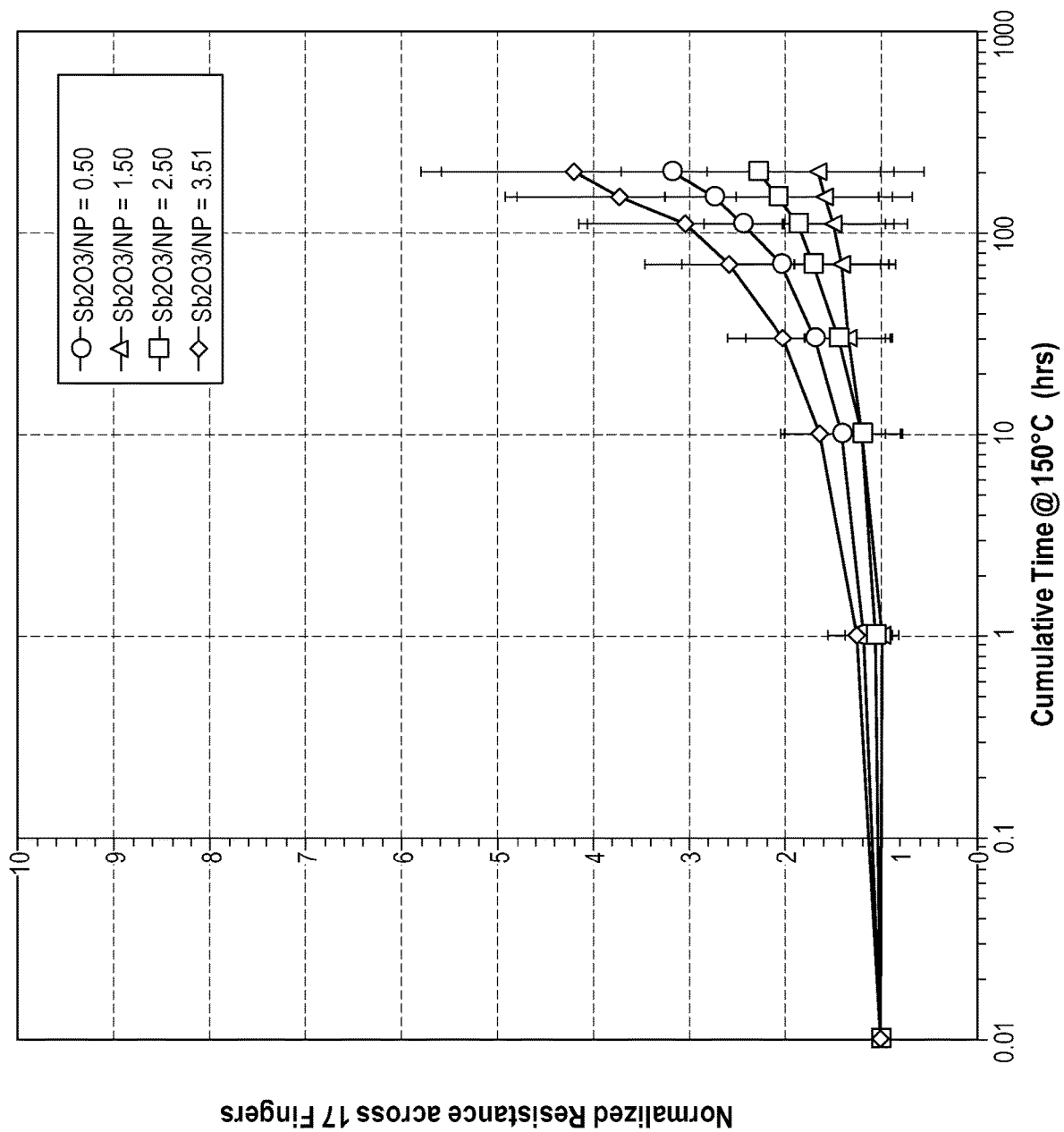
Figure 15F:
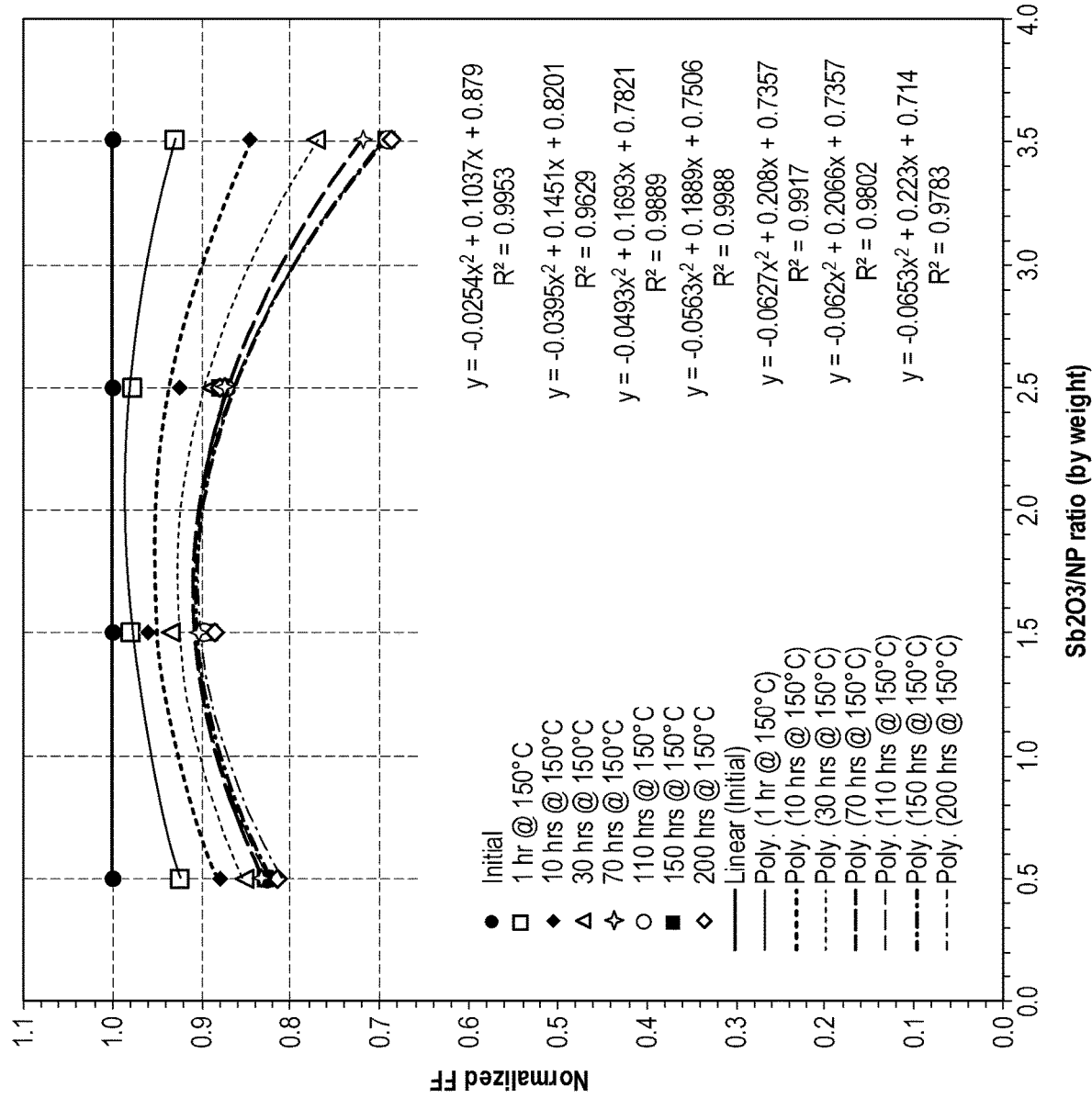
FIG. 15F is a graph of an accelerated aging test on normalized FF, as the secondary oxide to nanoparticles in the paste was changed.
Figure 16A:
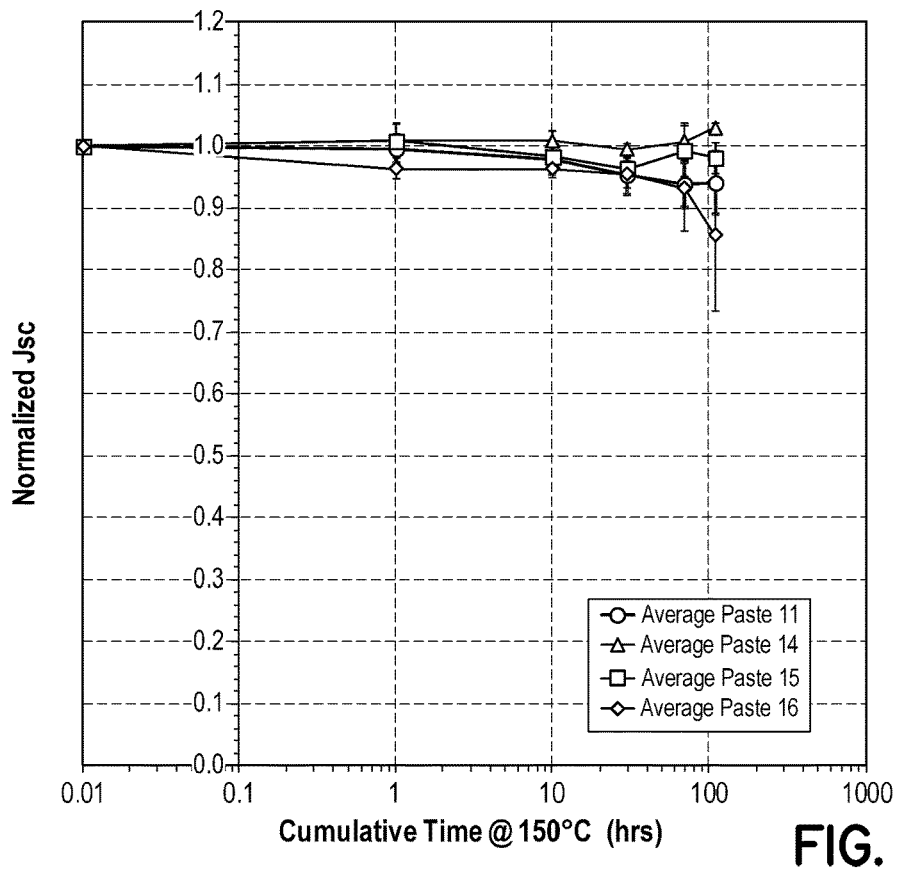
FIGS. 16A, 16B, 16C, 16D, and 16E are graphs of an accelerated aging test on normalized short circuit current density ($J_{sc}$), normalized open circuit voltage ($V_{oc}$), normalized fill factor (FF), normalized efficiency ($\eta$), and normalized resistance, respectively, for exemplary embodiments of the pastes using copper containing particles with increasing amounts of surface modification.
Figure 16B:
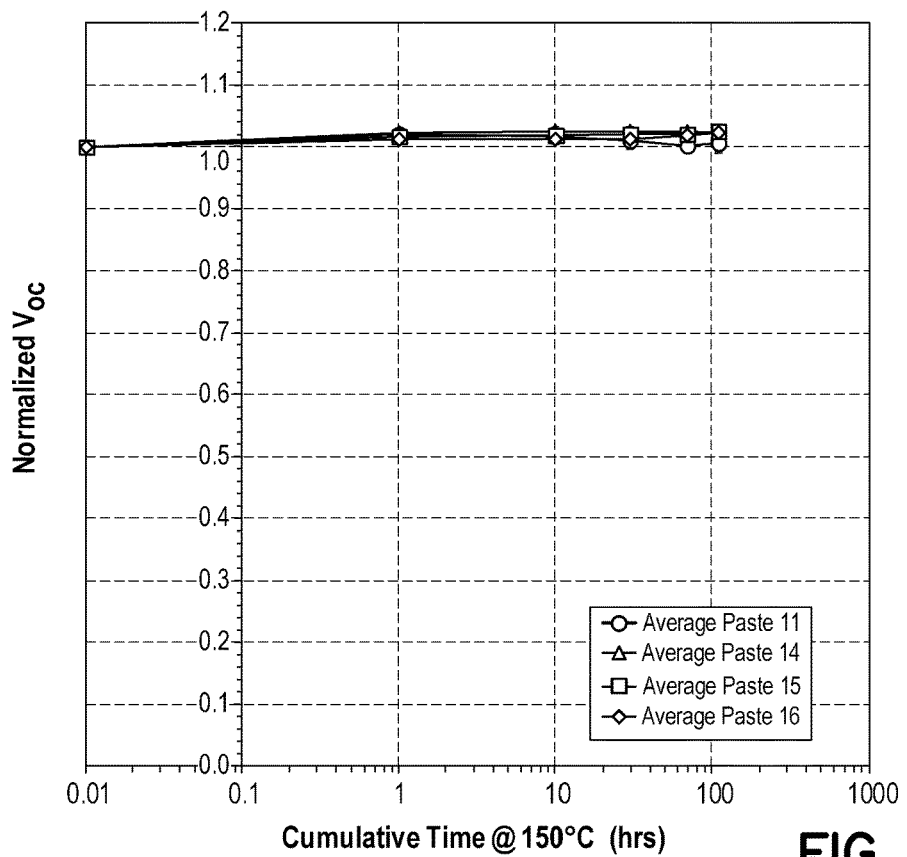
Figure 16C:
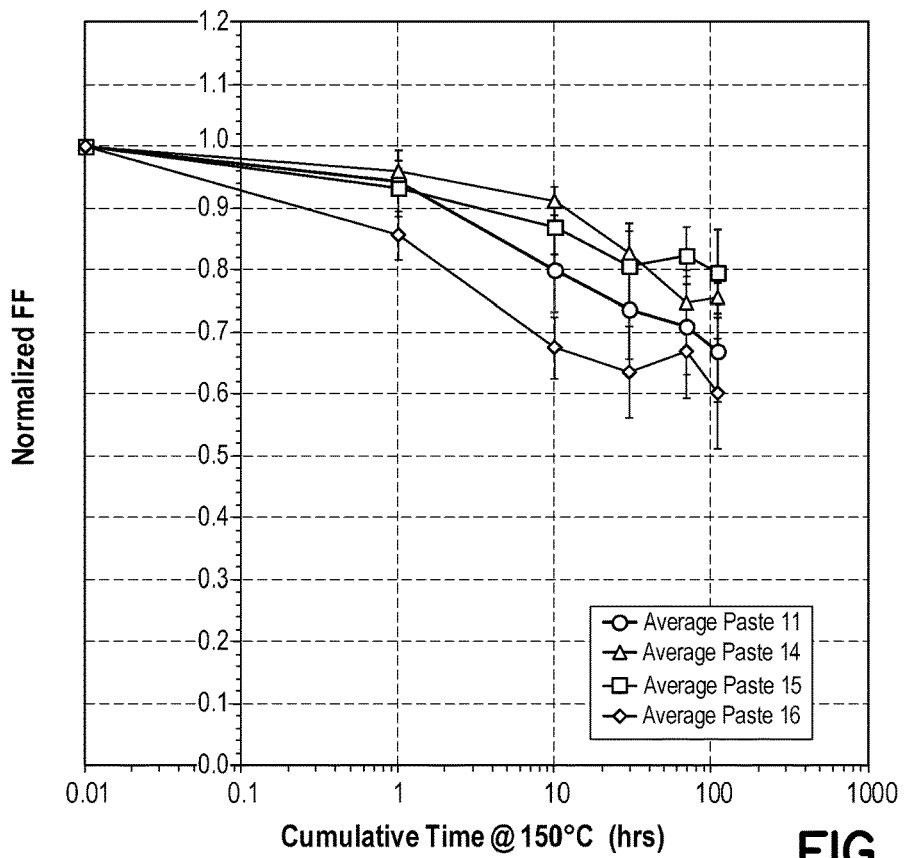
Figure 16D:
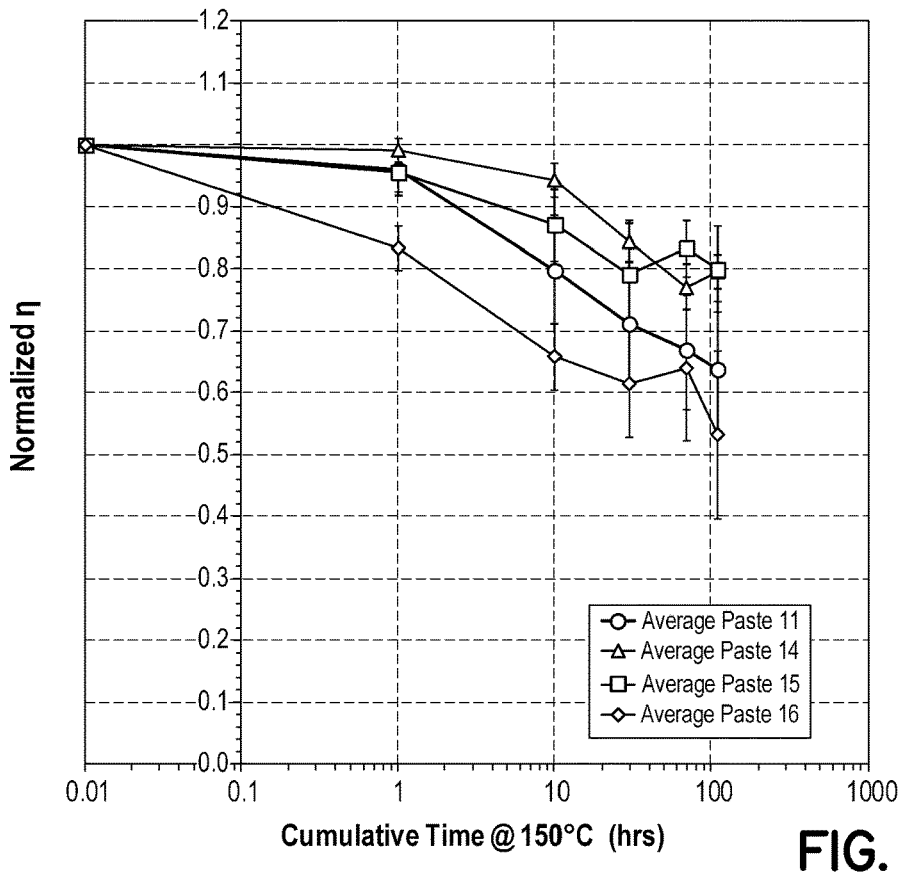
Figure 16E:
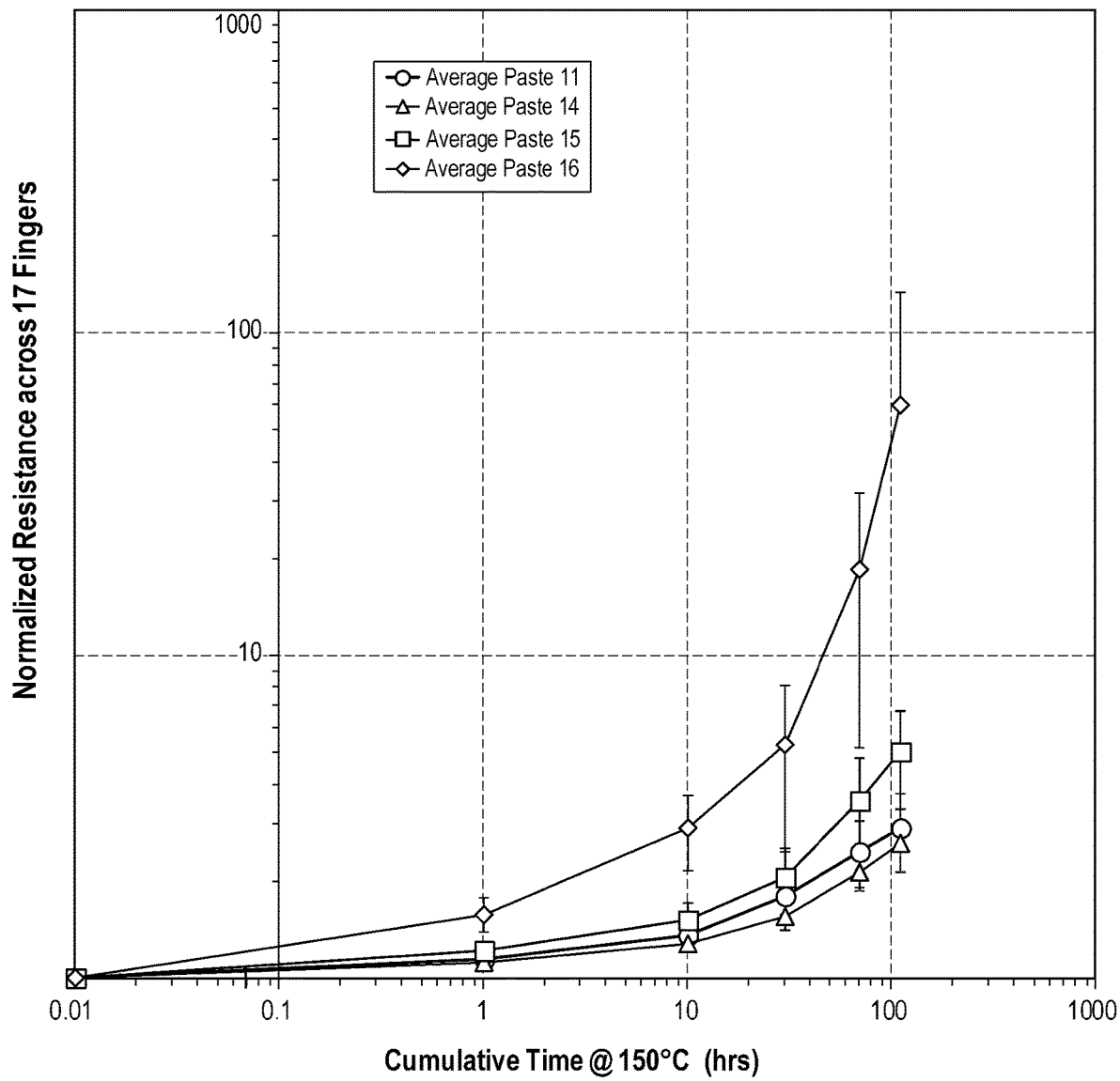
Figure 17A:
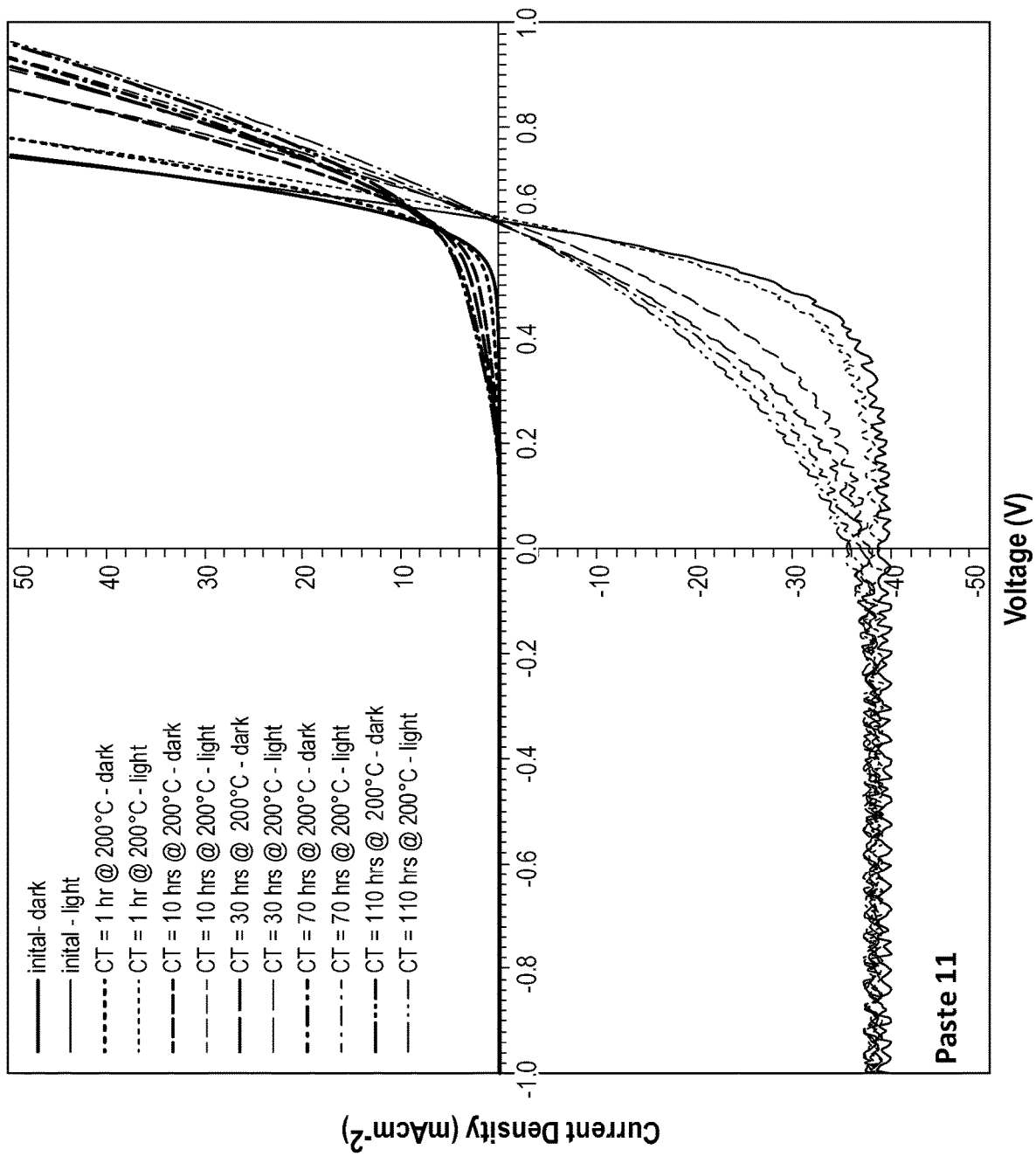
FIGS. 17A, 17B, 17C, and 17D are current density vs voltage plots for exemplary cells made from different pastes after accelerated aging tests, where the pastes use copper containing particles with increasing amounts of surface modification.
Figure 17B:
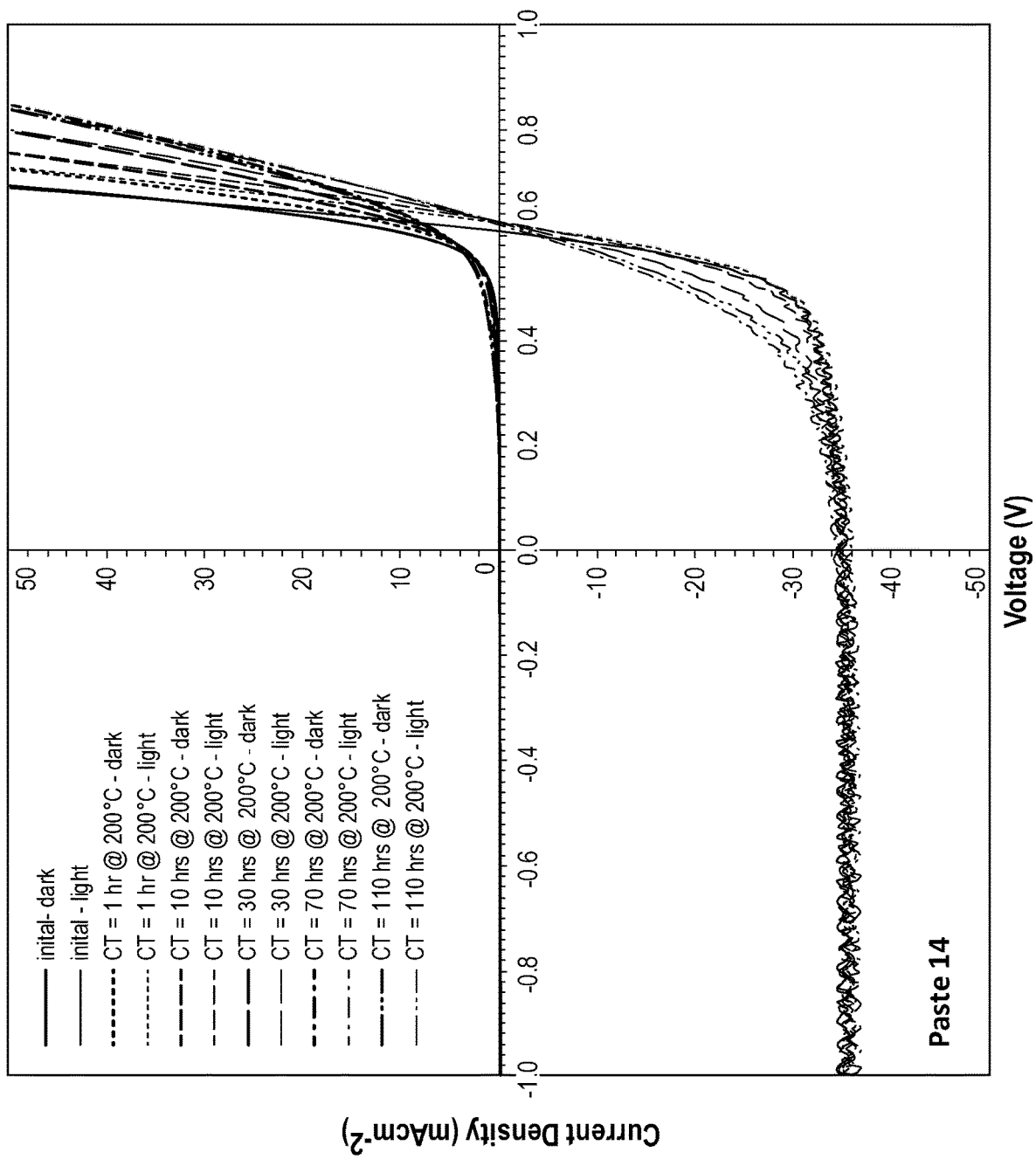
Figure 17C:
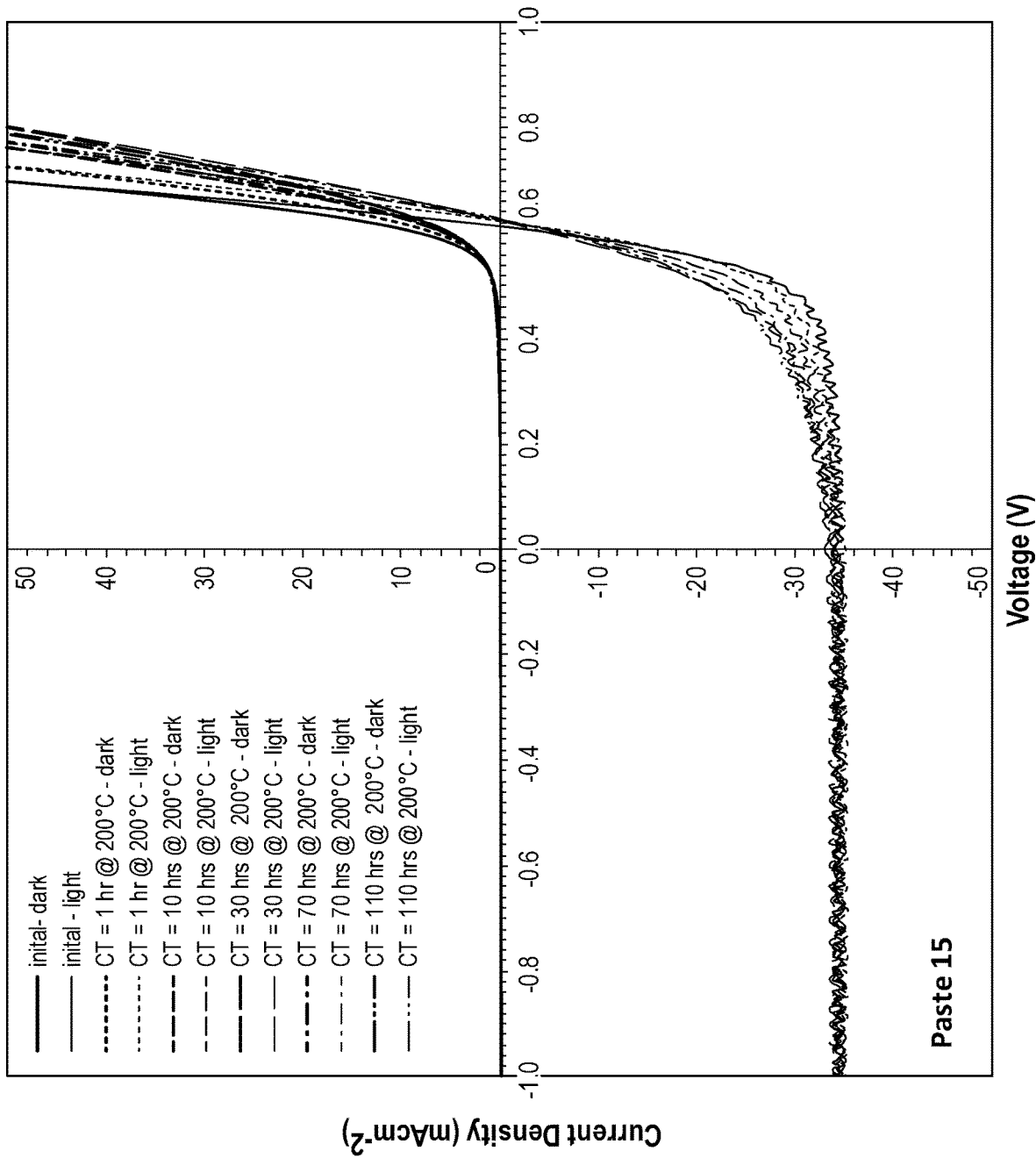
Figure 17D:
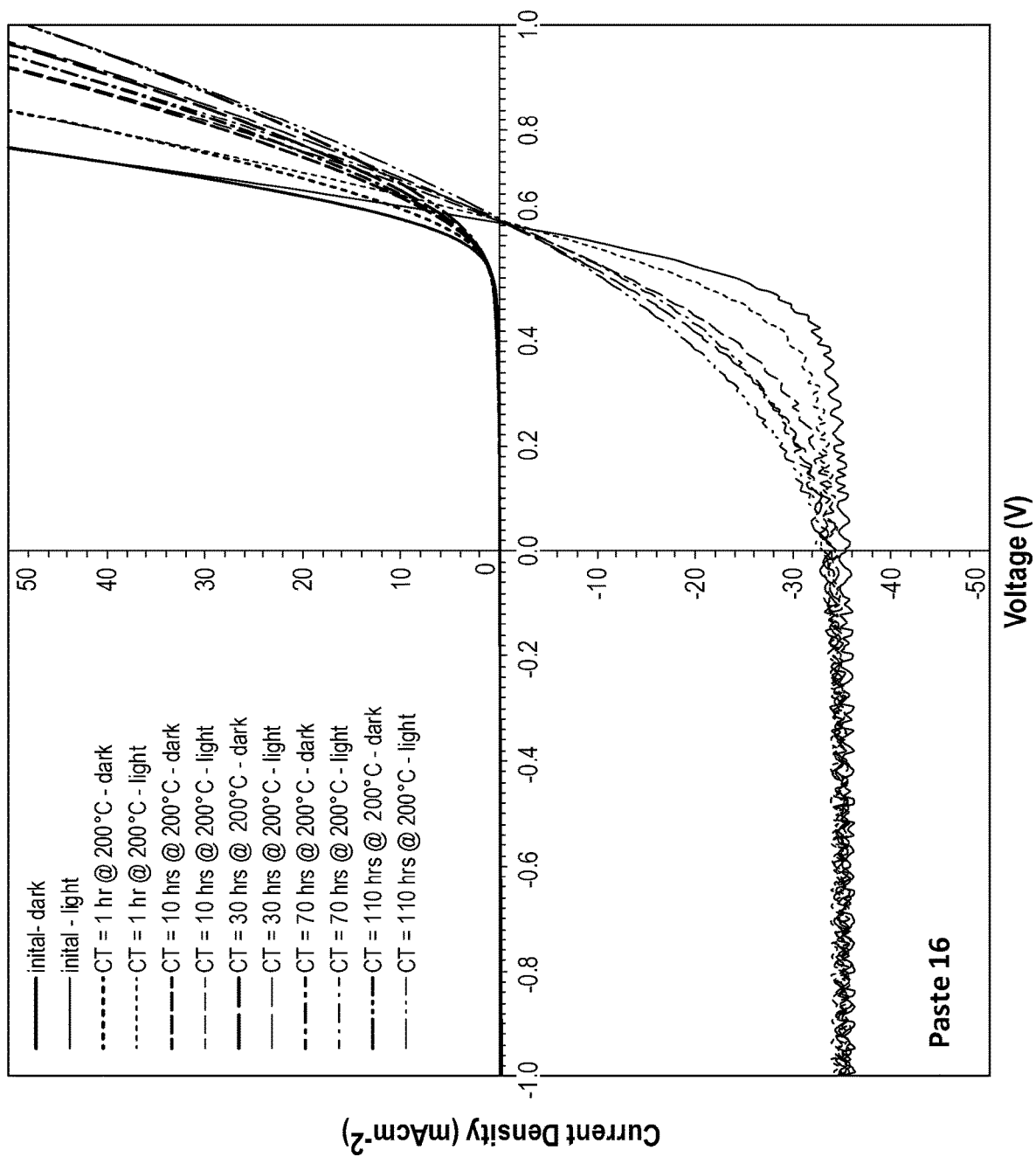

Example 7. Effect of the Relative Proportions of the Secondary Oxide Particles and Nanoparticles in the Paste on Durability This example illustrates the effect of changing the proportion of secondary oxide particles in pastes by changing the proportion of Ni/Ni/Pb nanoparticles relative to the proportion of secondary oxide particles. The weight ratio of the two particle types was kept constant at 2.50. FIGS. 14A, 14B, and 14C show the PV performance of monocrystalline silicon solar cells where the fingers were printed with the following pastes (a) Paste 6, (b) Paste 7, and (c) Paste 8 of Table 4 (below).

The cells were thermally stressed at 150° C. for up to 300 hrs. The proportion of the nanoparticles and secondary oxide particles in these pastes was increased so that the volume (solids only) of copper in the paste ranged from 85.50 vol. % to 79.51 vol. % Cu. As the proportion of nanoparticles and secondary oxide particles in the paste increased, the thickness of the glassy interface between the finger and the wafer increases. The PV performance of the cells during the accelerated aging tests is maintained by maintaining the solids only portion of the paste to be greater than 80 vol. %.

TABLE 4

| | Paste ID | | |
|---|---|---|---|
| Material | Paste 6 | Paste 7 | Paste 8 |
| Organic Binder: PVP 40,000 | 2.84 g (1.54 wt %) | 2.84 g (1.54 wt %) | 2.75 g (1.52 wt %) |
| Organic Solvent: Propylene Glycol | 9.24 g (5.00 wt %) | 10.27 g (5.50 wt %) | 10.47 g (5.81 wt %) |
| A/B/C nanoparticles: Ni/Ni/Pb NPs | 2.71 g (1.47 wt %) | 3.46 g (1.85 wt %) | 3.62 g (2.01 wt %) |

TABLE 4-continued

| | Paste ID | | |
|---|---|---|---|
| Material | Paste 6 | Paste 7 | Paste 8 |
| Secondary oxide: $Sb_2O_3$ | 6.79 g (3.67 wt %) | 8.62 g (4.62 wt %) | 9.01 g (5.00 wt %) |
| Cu/D powders: Cu/Ni(?)P - fine copper powders (1.2-3.2 microns) | 49.01 g (26.50 wt %) | 48.56 g (26.00 wt %) | 49.74 g (25.67 wt %) |
| Cu/D powders: Cu/Ni(?)P - large spherical copper powders (10-20 microns) | 114.36 g (61.84 wt %) | 113.02 g (60.51 wt %) | 107.64 g (59.78 wt %) |
| Total Vol % Copper in Paste (solids only) (vol %) | 82.01 | 80.24 | 79.51 |

The effect of accelerated aging test at 150° C. on I-V performance of mono c-Si cells with a Passivated Emitter and Rear Cell (PERC) localized Aluminum Back Surface Field (Al BSF) metallized with the pastes is shown in FIGS. 14A, 14B, and 14C.

Example 8. Effect of the Relative Proportions of the Secondary Oxide in the Paste on Durability This example shows the effect of the proportion of secondary oxide particles in the paste on the performance of the cells during accelerated aging tests at 150° C. for up to 200 hrs. The weight ratio of the secondary oxide particles to nanoparticles in the pastes were varied by changing the proportion of secondary oxide particles in the paste used to print fingers. The total surface area contribution of the coated copper-containing powder used in the pastes was fixed at 0.74 m² of coating per gram of paste. Table 5 shows the compositions of the pastes used to print the fingers. All the cells used the same bus bar paste formulation.

TABLE 5

| | Paste ID | | | |
|---|---|---|---|---|
| Material | Paste 10 | Paste 11 | Paste 12 | Paste 13 |
| Organic Binder: PVP 40,000 | 2.79 g (1.53 wt %) | 2.83 g (1.53 wt %) | 2.88 g (1.53 wt %) | 2.92 g (1.52 wt %) |
| Organic Solvent: Propylene Glycol | 9.54 g (5.23 wt %) | 9.88 g (5.23 wt %) | 10.18 g (5.40 wt %) | 10.57 g (5.51 wt %) |
| A/B/C nanoparticles: Ni/Ni/Pb NPs | 2.75 g (1.51 wt %) | 2.75 g (1.48 wt %) | 2.75 g (1.46 wt %) | 2.75 g (1.43 wt %) |
| Secondary Oxide: $Sb_2O_3$ | 1.38 g (0.76 wt %) | 4.13 g (2.23 wt %) | 6.88 g (3.65 wt %) | 9.64 g (5.06 wt %) |
| Cu/D powders: Cu/Ni(?)P - fine copper powders (1.2-3.2 microns) | 49.74 g (27.29 wt %) | 49.74 g (26.83 wt %) | 49.74 g (26.39 wt %) | 49.74 g (25.95 wt %) |
| Cu/D powders: Cu/Ni(?)P - large spherical copper powders (10-20 microns) | 116.05 g (63.68 wt %) | 116.05 g (62.60 wt %) | 116.05 g (61.57 wt %) | 116.05 g (60.55 wt %) |
| Secondary Oxide/ NP ratio | 0.50 | 1.50 | 2.50 | 3.51 |

FIGS. 15A, 15B, 15C, 15D, 15E, and 15F illustrates the effect of accelerated aging tests at 150° C. on the PV performance of mono c-Si cells with a PERC localized Al BSF cells metallized with the pastes of Table 5. All the pastes demonstrated a stable $V_{oc}$ over the duration of the tests. The finger resistance, and hence the fill factor (FF) was found to be impacted by the secondary oxide to nanoparticle ratio for the pastes. Optimum durability performance was found using a ratio of 1.50. The data at Secondary Oxide/ NP=0.5, may be thrown off by the fact that there were fewer samples, and the firing conditions were slightly off target.

Example 9. Effect of the Surface Area of the Copper-Containing Particle with Nickel on Durability A nickel coating on the copper-containing powders was quantified via measurement of the materials surface area. The amount of coating in the pastes was varied by changing the surface area of fine copper powders in the paste. The amount of coating on the copper powders was (Paste 11) 0.74, (Paste 14) 0.83, (Paste 15) 1.01, and (Paste 16) 1.10 m² per gram of paste. All pastes used a secondary oxide particle to nanoparticle ratio of 1.50. Table 6 shows the compositions of the pastes used to print the fingers. All the cells used the same bus bar paste formulation.

TABLE 6

| Material | Paste 11 | Paste 14 | Paste 15 | Paste 16 |
|---|---|---|---|---|
| Organic Binder: PVP 40,000 | 2.83 g (1.53 wt %) | 2.83 g (1.52 wt %) | 2.83 g (1.52 wt %) | 2.83 g (1.51 wt %) |
| Organic Solvent: Propylene Glycol | 9.88 g (5.23 wt %) | 11.08 g (5.94 wt %) | 11.33 g (6.06 wt %) | 11.58 g (6.19 wt %) |
| A/B/C nanoparticles: Ni/Ni/Pb NPs | 2.75 g (1.48 wt %) | 2.75 g (1.47 wt %) | 2.75 g (1.47 wt %) | 2.75 g (1.47 wt %) |
| Secondary Oxide: $Sb_2O_3$ | 4.13 g (2.23 wt %) | 4.13 g (2.21 wt %) | 4.13 g (2.21 wt %) | 4.13 g (2.21 wt %) |
| Cu/D powders: Cu/Ni(?)P - fine copper powders (1.2-3.2 microns) | 49.74 g (26.83 wt %) | 49.74 g (26.66 wt %) | 49.74 g (26.62 wt %) | 49.74 g (26.95 wt %) |
| Cu/D powders: Cu/Ni(?)P -large spherical copper powders (10-20 microns) | 116.05 g (62.60 wt %) | 116.05 g (62.20 wt %) | 116.05 g (62.11 wt %) | 116.05 g (62.03 wt %) |
| Total surface area for the copper powders per gram of paste ($m^2$ per gram of paste) | 0.74 | 0.83 | 1.01 | 1.10 |

FIGS. 16A, 16B, 16C, 16D, and 16E illustrate the effect of accelerated aging tests at 200° C. on the PV performance normalized $J_{sc}$, normalized $V_{oc}$, normalized FF, normalized and normalized resistance across the fingers, respectively, of mono c-Si cells with a PERC localized Al BSF metallized with pastes in Table 6. When the surface area of the copper containing particle with nickel was greater than 1.0 $m^2$ per gram of paste, the resistance of the fingers increased significantly; thus, leading to a reduction in FF. Using a surface area of 1.01 $m^2$ per gram of paste on these cells, resulted in lowest reduction to the FF (FIG. 16C), for the duration of the tests.

FIGS. 17A, 17B, 17C, and 17D illustrates examples of the accelerated aging on the I-V performance of the pastes illustrated in FIGS. 16A, 16B, 16C, 16D, and 16E at 200° C. When the surface area of the copper-containing particles in the paste was low (Paste 11), the diffusion barrier formed by the paste appears to be insufficient, and a noticeable increase in the dark I-V curve was observed; resulting in a lower FF and performance. However, when the surface area was high (Paste 16), the series resistance of the devices increased significantly, indicating that the barrier was too thick and becoming more resistive under the test conditions.

Example 10. Effect of Copper Particles Surface Area on Etching and Fill Factor

This example demonstrates the impact of the surface area of the copper-containing particles used in the paste on the etching functionality of the paste. Both the secondary oxide particles and the nanoparticles are able to etch a silicon nitride (SiN) anti-reflective coating. As the surface area contribution of the copper-containing particle is increased, the capability of the paste to etch through the SiN layer is believed to be reduced. The surface area contribution from the copper-containing particles was varied by varying the ratio of coarse to fine copper-containing powders in the paste. Table 7 lists the effect of changing this ratio on the surface area contribution of the copper-containing powders and its effect on bulk resistivity, contact resistivity, and FF of the devices. The pastes listed in Table 7 included nanoparticles with a Cu/Ni/Pb composition. It is theorized that during firing, the nanoparticles (Cu/Ni/Pb nanoparticles) and the $Sb_2O_3$ secondary oxide particles melt and coat the surface of the copper-containing particles. Consequently, the greater the surface area contribution of the copper-containing particles, the lesser the proportion of nanoparticles and secondary oxides from the secondary oxide particles that reach the cell surface. All samples were fired using the fire brick method. The fire brick method is a technique by which the sample cells were placed on a hot plate set to 300° C. for 3 mins. The sample cells were then immediately transferred to a muffle furnace set to between 750° C.-800° C. for between 1 s and 3 s. The furnace was stacked with fire bricks to retain the heat, when the furnace door was opened. The sample cells were placed directly on the surface of the fire bricks, and the door was shut for the duration of the time that the samples were in the furnace.

TABLE 7

| Ratio of fine 1.2-3.2 μm Cu powders to coarse 10-20 μm Cu flakes | Paste ID | Surface Area of Coated Cu in Paste ($m^2$) | Bulk Resistivity, $\rho$ ($\Omega$cm) (4-point probe method) | Contact Resistivity, $\rho_c$ ($\Omega cm^2$) | Average Fill Factor, FF |
|---|---|---|---|---|---|
| 100:0 | BTF_RD_SP27 | 424.80 $m^2$ | $5.85 \times 10^{-6}$ | 0.304 | 0.41 |
| 50:50 | BTF_RD_SP37 | 261.04 $m^2$ | $1.54 \times 10^{-6}$ | 0.206 | 0.61 |
| 40:60 | BTF_RD_SP36 | 228.26 $m^2$ | $3.49 \times 10^{-6}$ | 0.048 | 0.62 |
| 30:70 | BTF_RD_SP35 | 195.52 $m^2$ | $2.89 \times 10^{-6}$ | 0.090 | 0.57 |
| 20:80 | BTF_RD_SP34 | 162.75 $m^2$ | $2.76 \times 10^{-6}$ | 0.110 | 0.60 |

TABLE 7-continued

| Ratio of fine 1.2-3.2 µm Cu powders to coarse 10-20 µm Cu flakes | Paste ID | Surface Area of Coated Cu in Paste (m²) | Bulk Resistivity, ρ (Ωcm) (4-point probe method) | Contact Resistivity, $\rho_c$ (Ωcm²) | Average Fill Factor, FF |
|---|---|---|---|---|---|
| 10:90 | Paste 2 | 129.99 m² | $6.73 \times 10^{-6}$ | 0.074 | 0.65 |
| 0:100 | BTF_RD_SP19 | 97.23 m² | $1.61 \times 10^{-5}$ | 0.302 | 0.60 |
|  | BTF_RD_SP24 |  | $4.22 \times 10^{-6}$ | 0.122 | 0.58 |

The etching process is controlled by the amount of lead (Pb) in the paste, which may be introduced to the paste through the nanoparticles (e.g., Ni/Ni/Pb nanoparticles). The molar ratio of Ni:Pb used in the synthesis was 14:1. This amount of Pb was sufficient for a paste containing 0.83 m² of copper per gram of paste to etch through the $SiN_x$ layer and form a working cell. Replacing the coarse copper flakes with the fine (1.2-3.2 µm) copper-containing powders resulted in the paste containing 2.73 m² of copper per gram of paste. Consequently, it was believed that the amount of lead in the paste needed to be increased to etch through the $SiN_x$ layer. One solution would be to increase the loading of the Ni/Ni/Pb nanoparticles in the paste. For this 3.3 factor increase in the surface area of copper, the molar ratio of Pb to Cu (Pb/(Pb+Cu)) needed to be increased by a factor of 12. Increasing the amount of nanoparticles in the paste was believed to be impractical due to the likelihood of a negative impact on printability of the paste. In addition, the volume of copper-containing particles in the printed contacts was reduced which impacts the resistivity, p. As a consequence, the Ni/Ni/Pb nanoparticle synthesis was modified (Ni:Pb=1.6:1) so that the nanoparticles contained a higher proportion of Pb. Subsequently the amount of nanoparticles in the paste was increased by a factor of only about 2.5.

Although the pastes containing 100% of fine (1.2-3.2 µm) copper powders etched through $SiN_x$, the $\rho_c$ of the cell remained high (0.426 Ωcm²). The main cause of the high $\rho_c$ was cracking in the finger effecting the measured resistances. Cracking was believed to be due to shrinkage as a result of densification. To address that issue, coarse copper flakes were used in the paste. The overall surface area of the copper in the paste was maintained at 2.73 m² of copper per gram of paste and the quantity of nanoparticles and the secondary oxide ($Sb_2O_3$) particles was kept constant. The amount of binder and solvent in the organic vehicle was adjusted based on the proportion of solids in the paste.

Figure 18A:
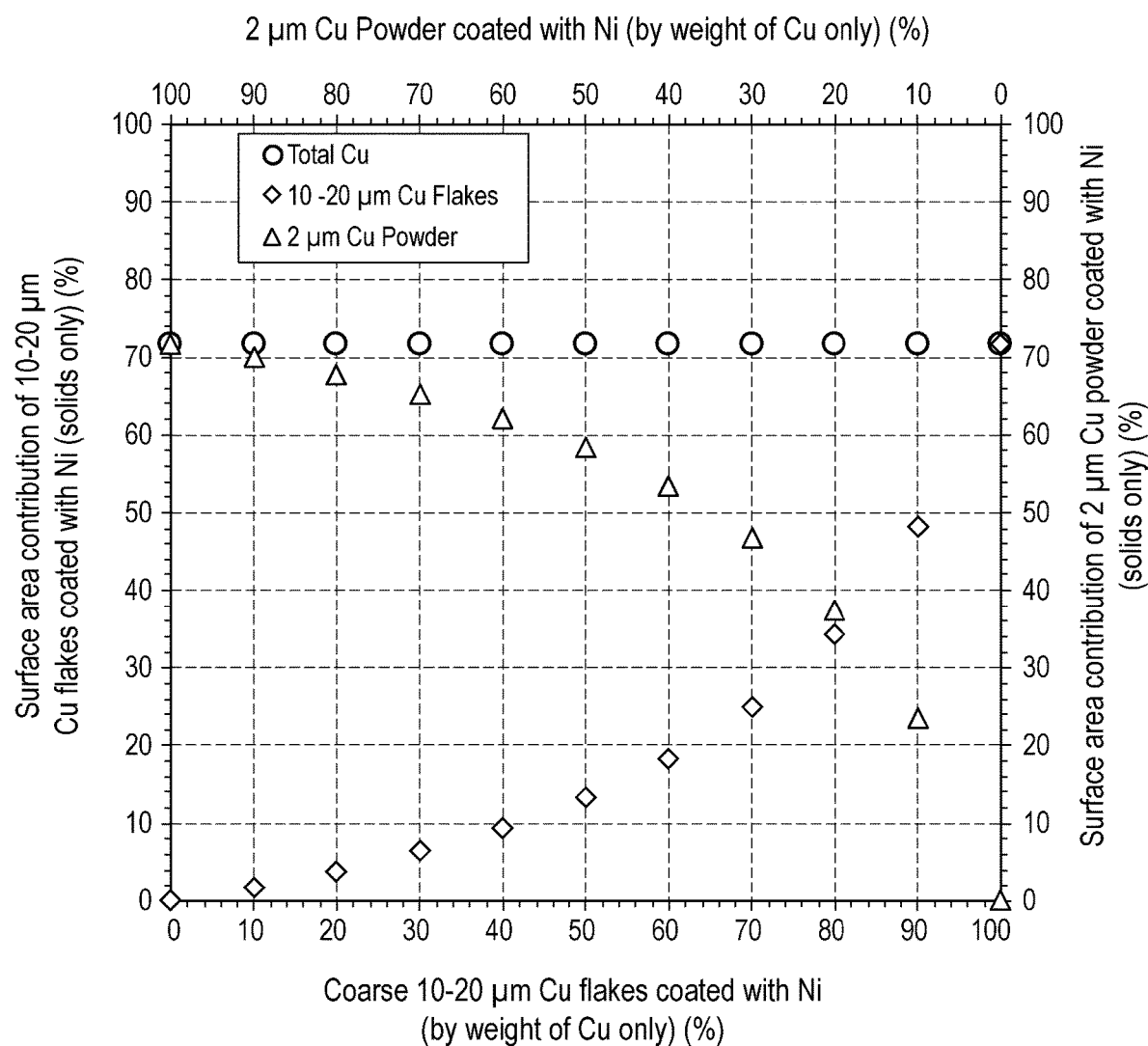
FIGS. 18A, 18B, and 18C are graphs showing the impact of varying the ratio of two copper containing particles containing different particle size ranges, on the surface area, volume and weight contribution for the total copper loading in the paste, when the total surface area contribution from the copper containing particles was kept constant.
Figure 18B:
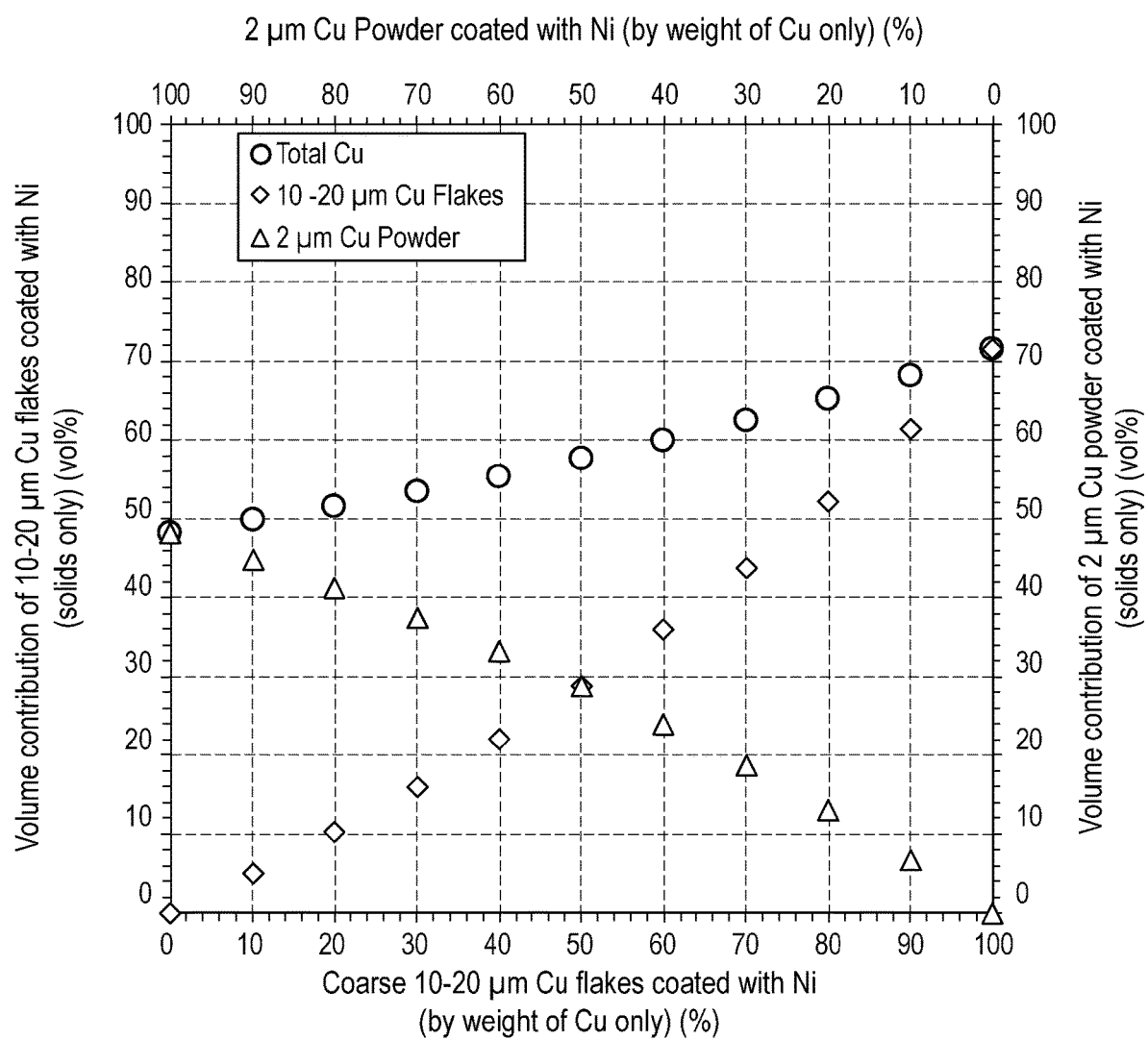
Figure 18C:
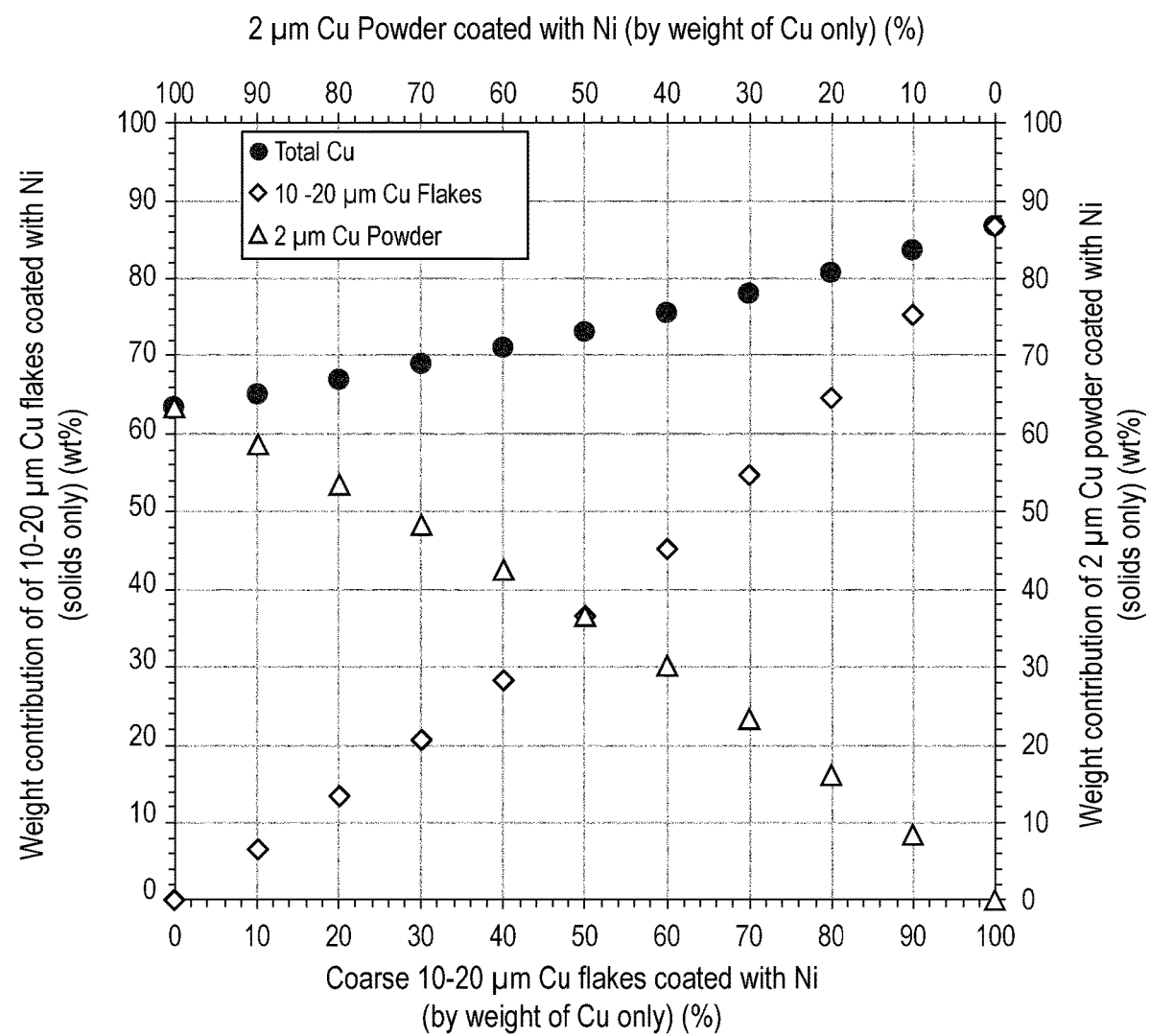
Figure 18D:
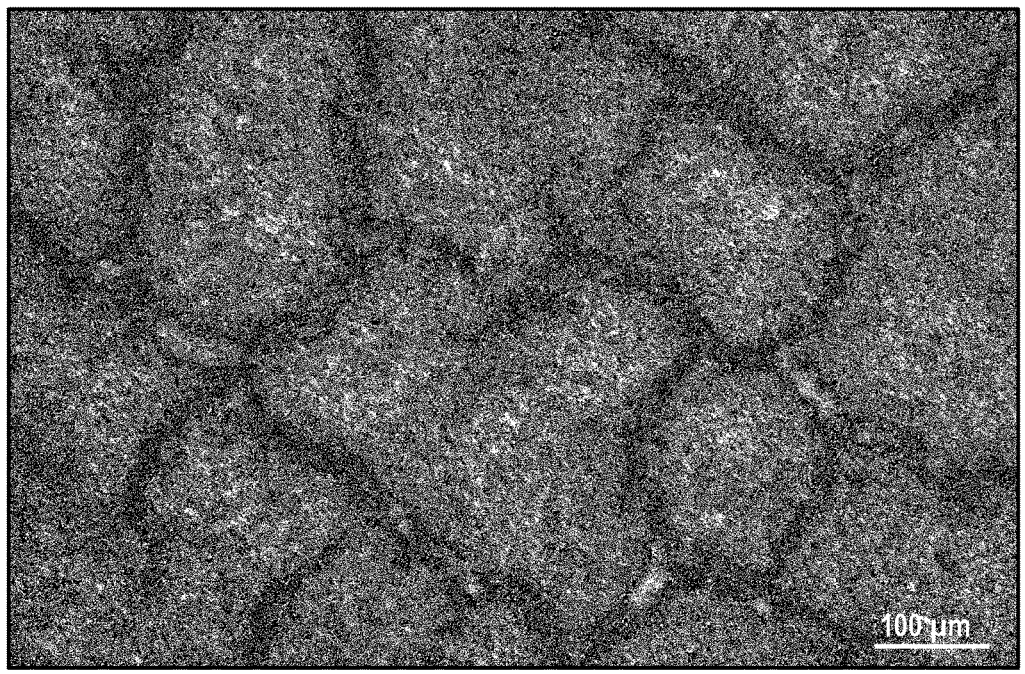
FIGS. 18D and 18E are optical microscopy images of pastes utilizing 100% coarse (10-22 µm) and 100% fine (1.2-3.2 µm) copper particles, respectively.
Figure 18E:
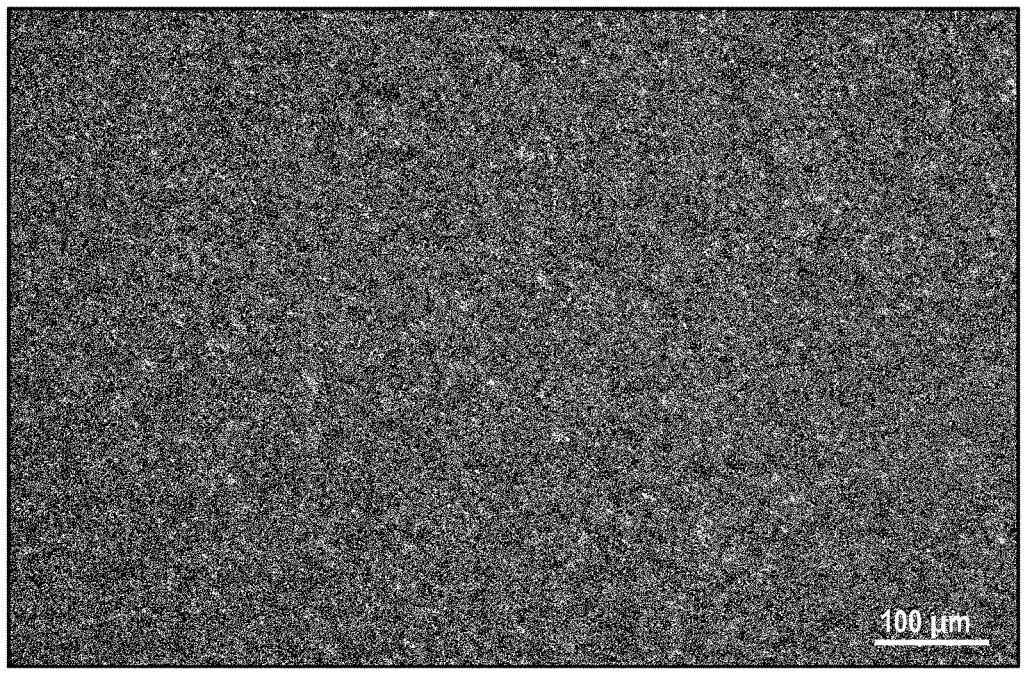
Figure 19A:
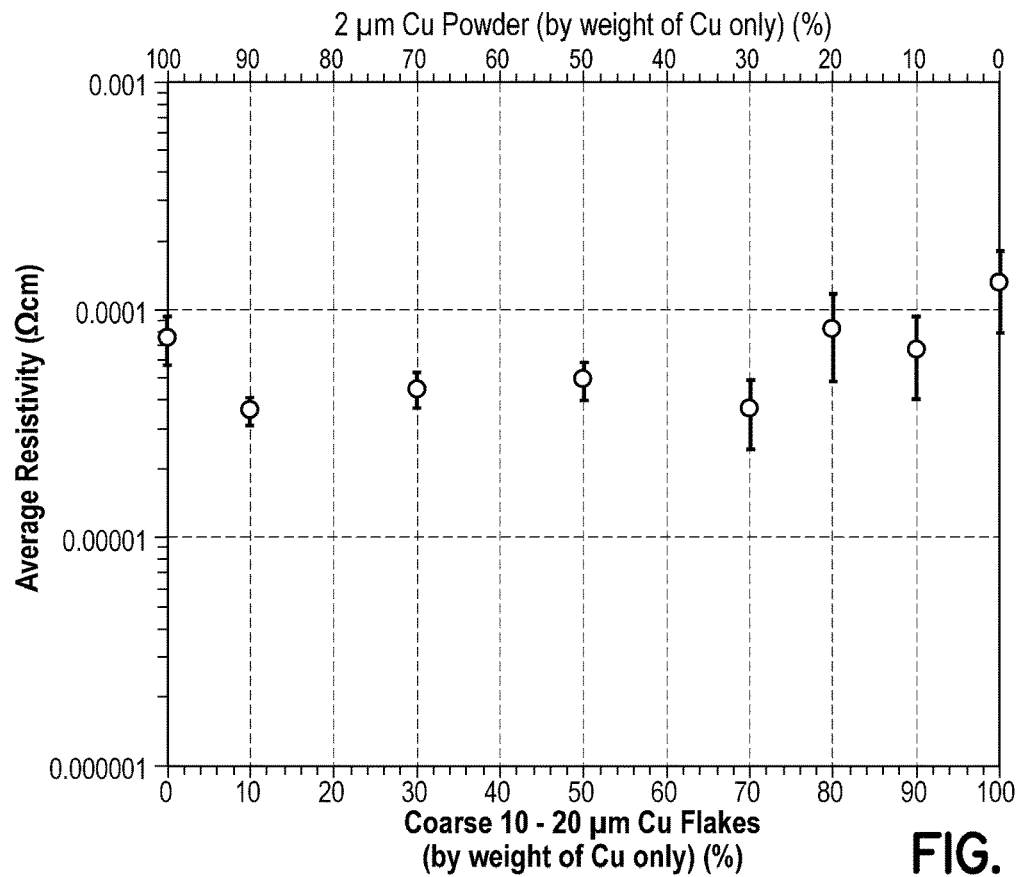
FIGS. 19A and 19B are graphs illustrating the effect of the ratio of coarse to fine copper containing particles in the paste on the resistivity of contacts formed after firing.
Figure 19B:
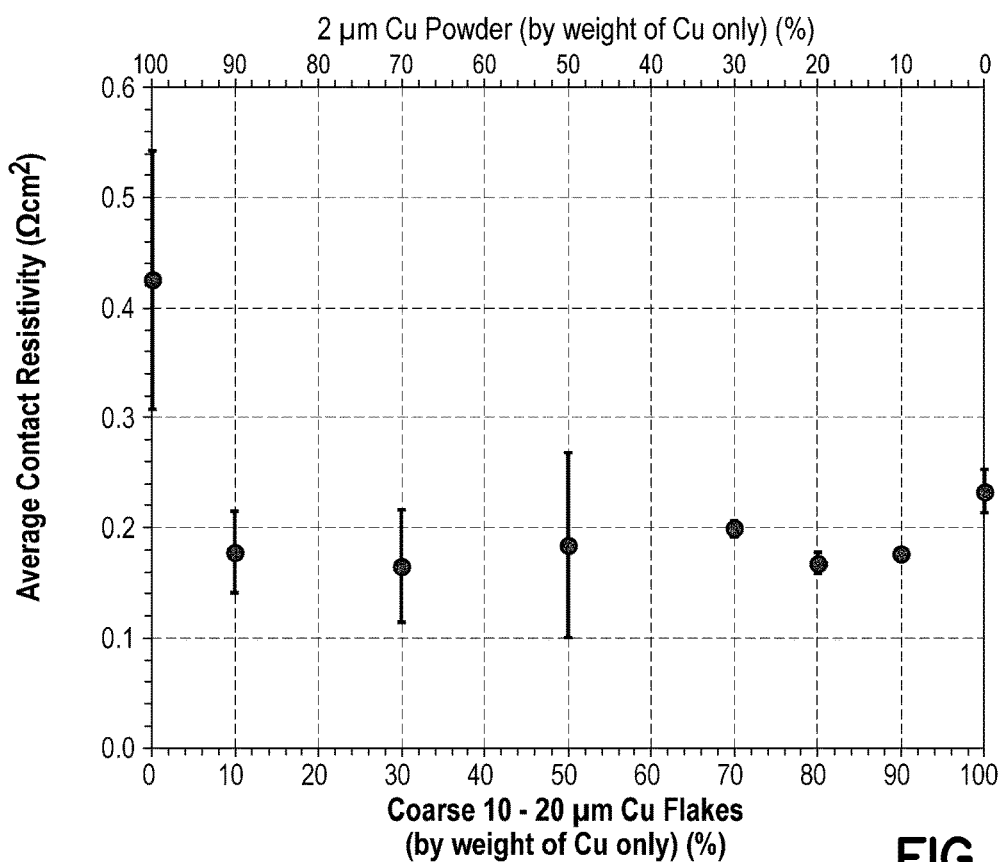

FIGS. 18A, 18B, and 18C shows the effect of the coarse (10-20 µm) to fine (1.2-3.2 µm) copper ratio on the surface area, volume, and weight contribution of the copper-containing with nickel. The effect of this ratio on the bulk resistivity (ρ) and contact resistivity ($\rho_c$) are shown in FIGS. 19A and 19B. FIGS. 18D and 18E show images of the fired pastes using 100% fine and 100% coarse powders, respectively. The pastes containing only fine copper containing powders resulted in large cracks forming, as a result of the densification process occurring during firing. As the amount of coarse copper flakes was increased cracking in the finger was reduced. This was due to the ability to load more copper-containing particles into the paste and thus increasing the volume of copper, without increasing the overall surface area contribution from the copper. A p value of $3.68 \times 10^{-5}$ Ωcm was reached when a coarse to fine copper powder ratio of 70:30 was used.

Example 11. Effect of the Shape of the Copper-Containing Particles on the Rheology and Formulation of the Paste This example shows the impact of the shape of the coarse copper powders on the paste rheology, microstructure and formulation. In this example the impact of coarse spherically shaped particles was compared to the coarse flake shaped particles. The shape and packing of spherical copper-containing particles allowed the nanoparticles and the secondary oxide particles ($Sb_2O_3$) particles to melt and flow to the $SiN_x$ layer much faster than the interconnecting porous structure of the coarse copper flakes. As a result, the amount of nanoparticles and secondary oxide particles could be reduced; thus allowing the paste containing spherical particles to have a higher solids loading and a relatively lower viscosity even though the paste contained a higher proportion of fine copper containing particles. The PV performance, viscosity, and microstructure are shown in FIGS. 20A and 20B, 20C, and 20D and 20E, respectively. Further investigation of the secondary oxide composition resulted in the $\rho_c$ being lowered to 0.065 Ωcm².

TABLE 8

| Paste ID | Paste 4 | Paste 17 |
|---|---|---|
| Ratio of Large: Small copper powders | 90:10 | 70:30 |
| Type of Large Copper powder | Coarse Copper Flakes | Spherical Copper Powders |
| Type of Nanoparticle | Ni/Ni/Pb | Ni/Ni/Pb × 9.2 |
| Surface Area of Copper in paste (m²/g of paste) | 36.0 | 45.5 |
| Volume Fraction of copper in printed paste after drying (vol %) | 65.0 | 75.2 |

Figure 20A:
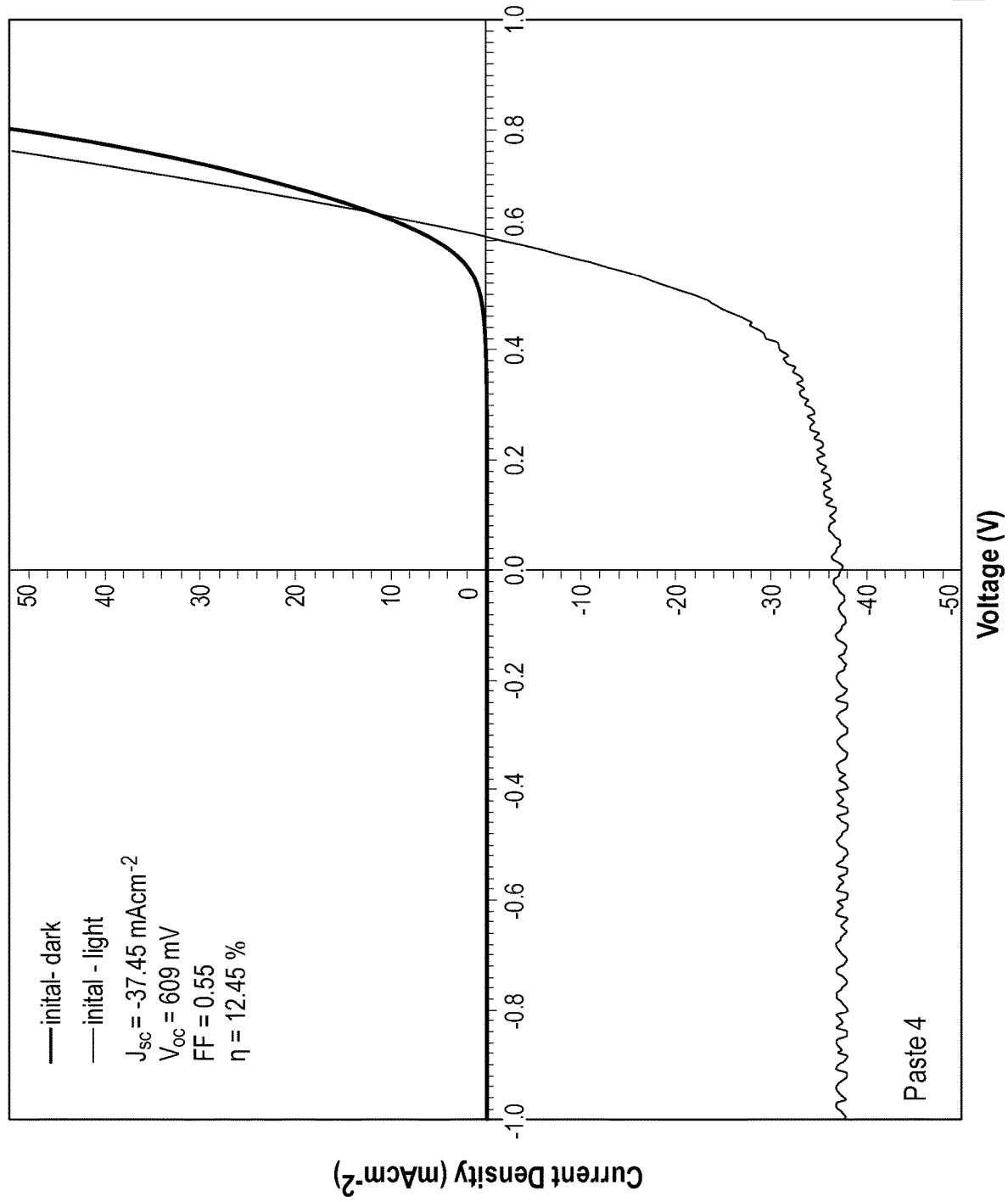
FIGS. 20A and 20B are graphs illustrating current density vs voltage plots of embodiments of the paste using different ratios of coarse to fine copper containing particles.
Figure 20B:
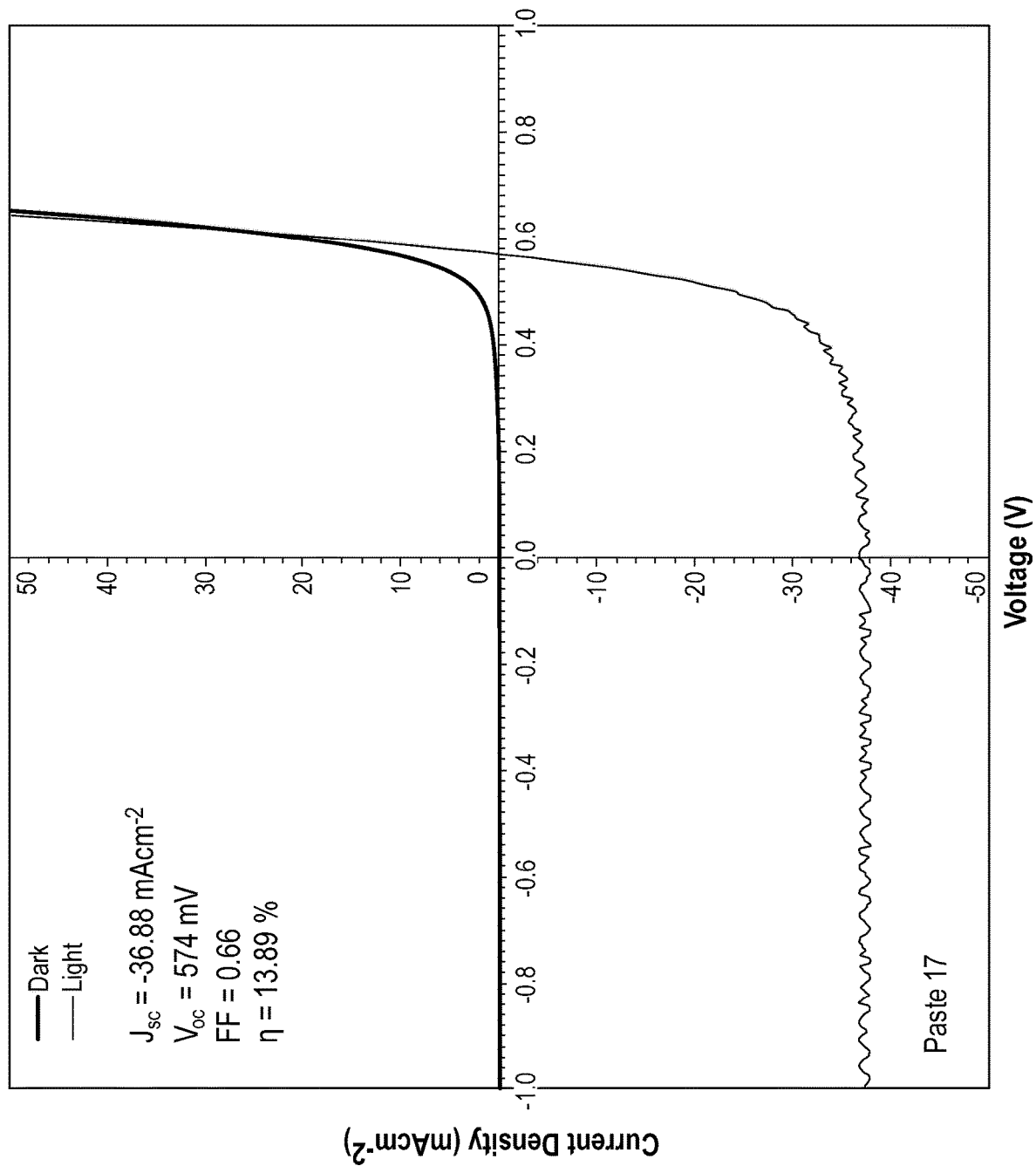
Figure 20C:
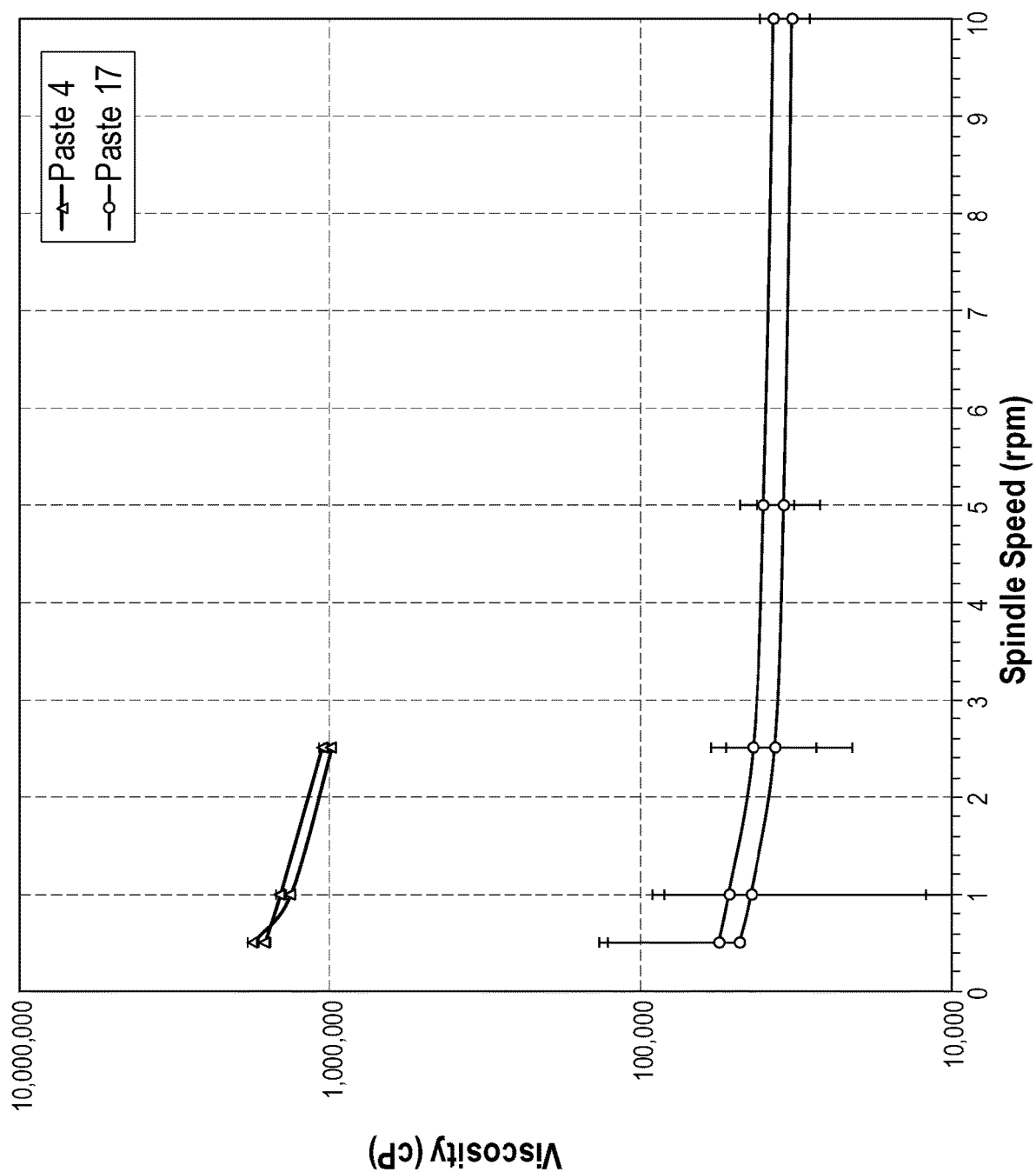
FIG. 20C is a graph of spindle speed vs viscosity of two exemplary pastes made using surface modified copper containing particles with different particle shapes.
Figure 20E:
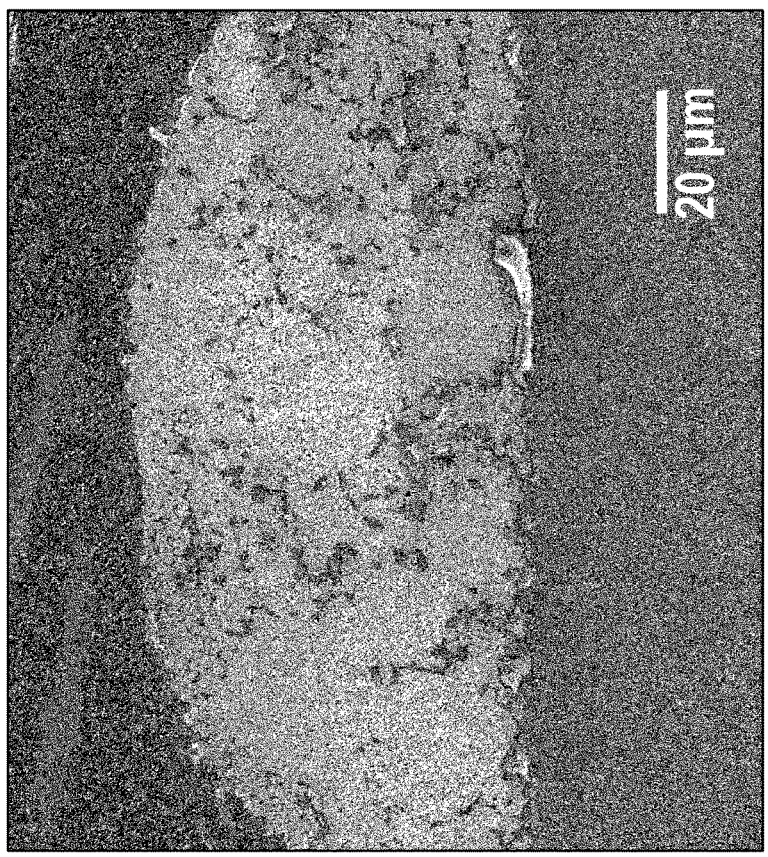
FIGS. 20D and 20E are SEM micrographs of cross sections of exemplary pastes made using surface modified copper containing powders with different particle shapes following firing.
Figure 20D:
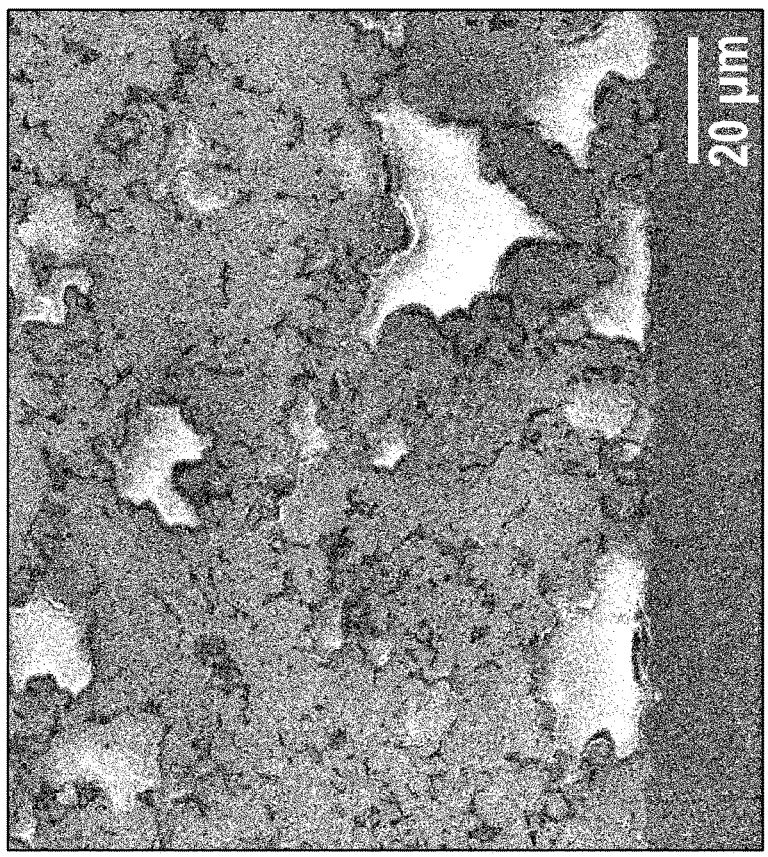

Table 8 compares Paste 4 and Paste 17. FIGS. 20A, 20B, and 20C compare I-V performance of those pastes for (a) a 90:10 mixture of (10-22 µm) coarse copper powders and fine (1.2-3.6 µm) copper powders and (b) a 70:30 mixture of (10-22 µm) spherical copper powders and fine (1.2-3.6 µm) copper powders. Cells were measured using a halogen lamp. Comparison of the volume percentage and viscosity of the pastes using coarse (10-20 µm) copper flakes and (10-22 µm) spherical copper powders is shown. In FIGS. 20D and 20E, SEM images of fired fingers from (d) coarse powders and (e) large spherical powders are shown, respectively.

Example 12. Packing Studies for Different Shaped Copper-Containing Particles To print fingers with the lowest possible resistivity, it is desirable for the particles in the paste to pack together as closely as possible with minimum void space. The shape and size of the particles, as well as the amount of organic vehicle in the paste will determine how closely the powders will pack. Table 9 provides an estimation of the apparent tap density for the different particles used in the paste. The smaller the particle size or the larger the surface area of the particles, the lower the packing density.

Figure 22:
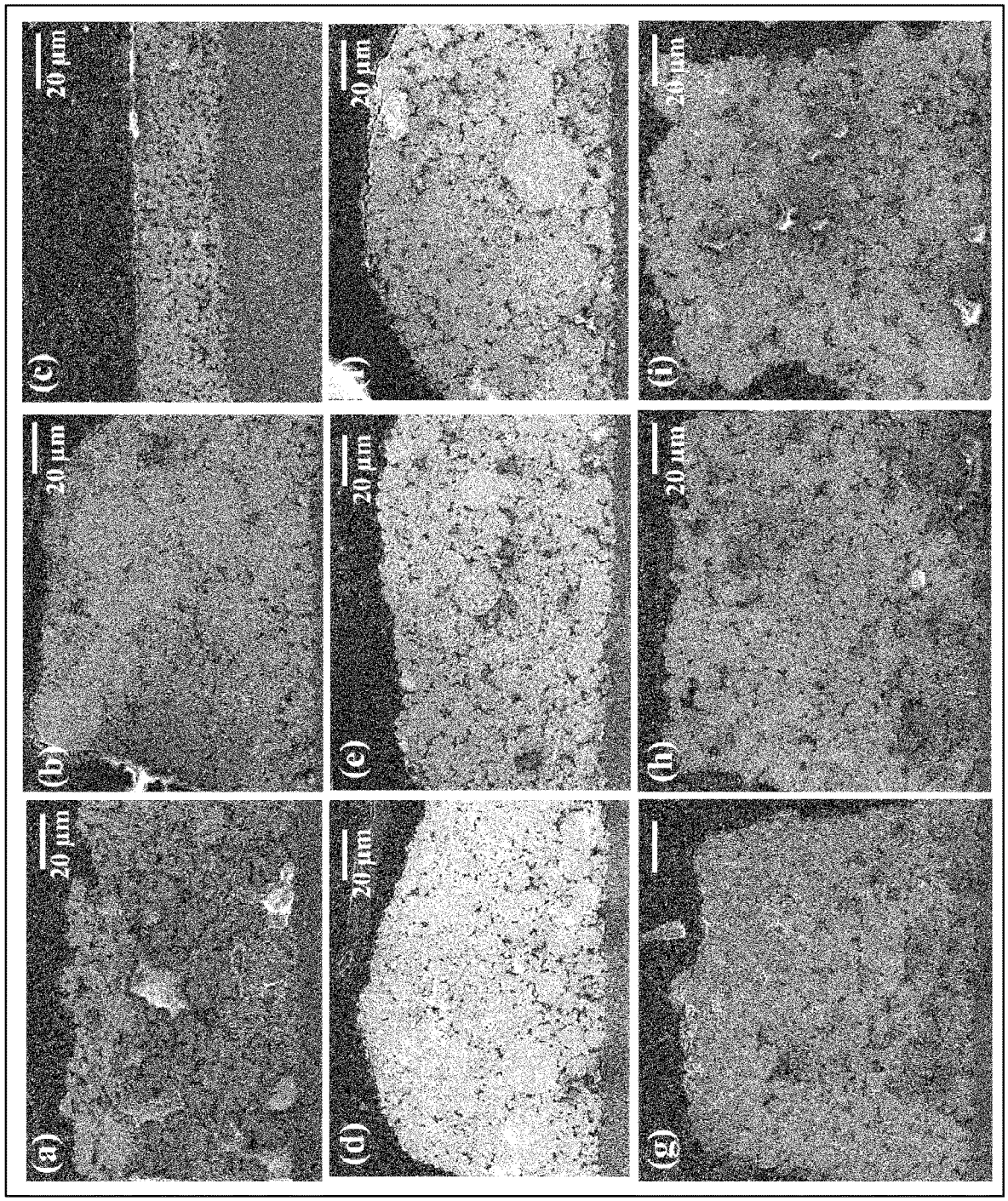
FIG. 22 are SEM images of cross-sections of fingers made with various embodiments of the pastes after firing.

FIG. 22 are SEM cross-sectional images of fingers printed with the pastes specified in Table 10 (above). In FIG. 22, the pastes are (a) Paste 2, (b) Paste 5, (c) Paste 41, (d) Paste 1, (e) Paste 21, (f) Paste 22, (g) Paste 23, (h) Paste 24, and (i) Paste 25. Denser cross sections were obtained for pastes

TABLE 9

| Material | Material Density (gcm$^{-3}$) | Surface Area (m$^2$/g) | Apparent (Tap) Density (gcm$^{-3}$) | Packing Factor ($\Phi$) |
|---|---|---|---|---|
| Cu/Ni(?)P, coarse 10-20 μm (Bean Town) Cu flakes, -325 mesh, Cu > 45 μm = 0.30 wt % 20 μm < Cu < 45 μm = 23.96 wt % Cu < 20 μm = 75.74 wt % | 8.96 (literature value) | 0.84 | 2.37 | 0.26 |
| Cu/Ni(?)P, 10-22 μm spherical Cu powders (Cu112SP, Chemical Store) Cu > 45 μm = 0.13 wt % 20 μm < Cu < 45 μm = 86.49 wt % Cu < 20 μm = 13.38 wt % | 8.96 (literature value) | 0.29-0.73 | 5.40 (reported values = 4.5-5.5) | 0.60 |
| Cu/Ni(?)P, 7.5-14.7 μm spherical Cu powders (610, ACuInternational) $d_{10}$ = 7.53 μm, $d_{50}$ = 9.89 μm, $d_{90}$ = 14.69 μm | 8.96 (literature value) | 0.57-0.64 | 4.12 (reported values = 4.3) | 0.46 |
| Cu/Ni(?)P, 1.8-7.7 μm spherical Cu powders (603, ACuInternational) $d_{10}$ = 1.75 μm, $d_{50}$ = 4.03 μm, $d_{90}$ = 7.72 μm | 8.96 (literature value) | 0.77-0.87 | 3.69 | 0.41 |
| Cu/Ni(?)P, fine 1.2-3.2 μm Cu powders (C1-2000, Ames Goldsmith) $d_{10}$ = 1.2 μm, $d_{50}$ = 1.9 μm, $d_{90}$ = 3.2 μm | 8.96 (literature value) | 1.1-4.1 (Still variable) (but can be increased up to 25.62) | 3.25 3.46 | 0.36 |
| Sb$_2$O$_3$ (1.1-1.8 μm, Bean Town) | 5.2 (literature value) | 2.74 | 1.33 | 0.26 |
| Ni/Ni/Pb × 9.2 (assumes PbO formed and not Pb(OH)$_2$) | 8.29 (calculated value) | 1.71-7.01 (but can be increased up to 33) | 0.78 | 0.09 |

TABLE 10

| Paste ID | coarse 10-20 μm (Bean Town) Cu flakes | 10-22 μm spherical Cu powders (Cu112SP, Chemical Store) | 7.5-14.7 μm spherical Cu powders (610, ACuInternational) | 1.8-7.7 μm spherical Cu powders (603, ACuInternational) | fine 1.2-3.2 μm Cu powders (C1-2000, Ames Goldsmith) |
|---|---|---|---|---|---|
| Paste 2 | 90 | — | — | — | 10 |
| Paste 41 | — | — | — | — | 100 |
| Paste 18 | — | 100 | — | — | — |
| Paste 19 | — | 90 | — | — | 10 |
| Paste 20 | — | 80 | — | — | 20 |
| Paste 17/ Paste 5 | — | 70 | — | — | 30 |
| Paste 1 | — | 37 | 21 | 12 | 30 |
| Paste 21 | — | 37 | 21 | 30 | 12 |
| Paste 22 | — | 37 | 30 | 21 | 12 |
| Paste 23 | — | — | 48 | 33 | 19 |
| Paste 24 | — | — | 60 | 43 | 15 |
| Paste 25 | — | — | 70 | 30 | — |

Figure 21A:
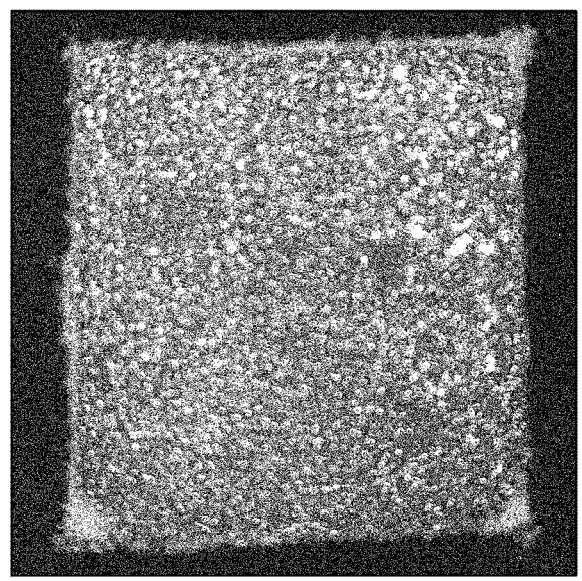
FIGS. 21A, 21B, and 21C are optical images of the pastes after firing; made by varying the ratio of coarse to fine copper containing particles from 100:0, 90:10, and 80:30, respectively.
Figure 21B:
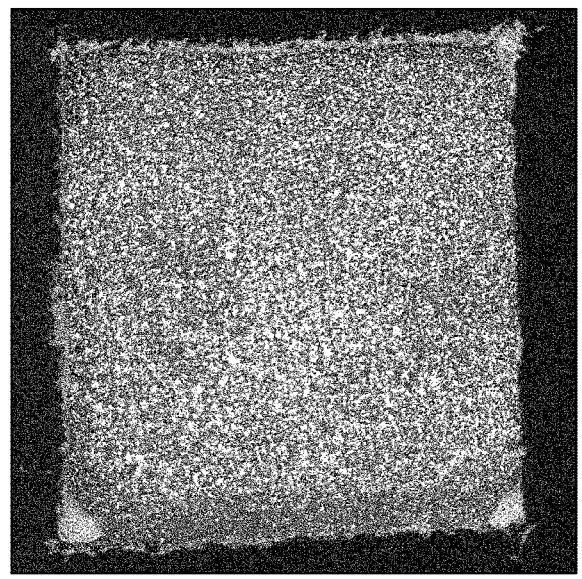
Figure 21C:
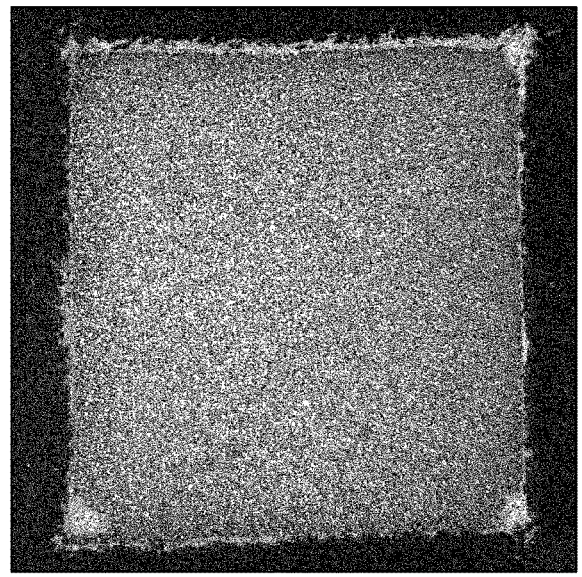

Table 10 shows the ratios of the different powders used in a selection of pastes. FIGS. 21A, 21B, and 21C shows images of squares printed with the following pastes (a) Paste 18, (b) Paste 19, and (c) Paste 20, respectively. Due to densification and shrinkage, the prints came off the silicon substrate. The squares were placed on a light box, in order to observe the porosity of the fired prints. Squares printed with a higher proportion of fine powders resulted in a denser structure.

containing a higher proportion of fine powders, as well as a broad particle size range.

Table 11 (below) shows the full paste composition of Paste 5 shown in Table 10 and FIG. 22(b). Table 12 shows the full paste composition of paste number Paste 1 shown in Table 10 and FIG. 22(d). Paste 1 was formulated so that it would contain the same ratios of secondary oxide particles to nanoparticles to copper containing particles in the paste as was used for Paste 5. However, to produce a denser cross-section, four different sizes of copper powders (Cu112SP, 610, 603 and C1-2000) were used. It was assumed that the mixing and milling process would allow the Cu112SP, 610 and 603 Cu powders to pack with a packing factor, Φ of 0.639 (random Φ). The combined weights of the Cu112SP, 610 and 603 powders was taken to have 70 wt. % of the copper powders. C1-2000 was added at 30 wt. % (of the total copper). The Cu/NP weight ratio was kept constant with PVP=0.0164 g PVP/g solids. The microstructure of the fingers printed with Paste 1 appeared denser than those of Paste 5.

TABLE 11

Paste Id.: Paste 5

| Material | Ratio by weight of the different Cu powders | Weight (g) | Volume ($cm^3$) | Packing Volume ($cm^3$) | Space ($cm^3$) | Wt % (of Paste) | Vol % (solids only) |
|---|---|---|---|---|---|---|---|
| 10-22 μm spherical Cu powders (Cu112SP, Chemical Store) | 70 | 116.05 | 12.95 | 20.27 | 7.32 | 59.88 | 56.01 |
| 7.5-14.7 μm spherical Cu powders (610, ACuInternational) | — | — | — | — | — | — | — |
| 1.8-7.7 μm spherical Cu powders (603, ACuInternational) | — | — | — | — | — | — | — |
| fine 1.2-3.2 μm Cu powders (C1-2000, Ames Goldsmith) | 30 | 49.74 | 5.55 | 8.69 | 3.14 | 25.67 | 24.01 |
| $Sb_2O_3$ | — | 9.64 | 1.85 | 2.90 | 1.05 | 4.97 | 8.02 |
| Ni/Ni/Pb × 9.2 Nanoparticles | — | 2.75 | 0.33 | 0.52 | 0.19 | 1.42 | 1.43 |
| PVP 40,000 | — | 2.92 | 2.44 | — | — | 1.51 | 10.53 |
| Propylene Glycol | — | 12.69 | 12.20 | — | — | 6.55 | — |
| TOTAL | 100 | 193.79 | 23.12 | — | — | 100.00 | 100.00 |

| | |
|---|---|
| Vol. % $Sb_2O_3$ (only considering $Sb_2O_3$ and Cu) | 9.11 vol. % |
| $Sb_2O_3$/NP ratio | 3.51 |
| Cu/NP ratio | 60.29 |
| Total Cu (solids only) | 80.02 vol. % |
| Total Cu (in Paste) | 85.55 wt. % |

TABLE 12

Paste Id.: Paste 1

| Material | Ratio by weight of different Cu powders | Weight (g) | Volume ($cm^3$) | Packing Volume ($cm^3$) | Space ($cm^3$) | Wt % (of Paste) | Vol % (solids only) |
|---|---|---|---|---|---|---|---|
| 10-22 μm spherical Cu powders (Cu112SP, Chemical Store) | 37 | 121.18 | 13.52 | 21.17 | 7.64 | 31.78 | 29.72 |
| 7.5-14.7 μm spherical Cu powders (610, ACuInternational) | 21 | 68.46 | 7.64 | 11.96 | 4.32 | 17.95 | 16.79 |
| 1.8-7.7 μm spherical Cu powders (603, ACuInternational) | 12 | 38.68 | 4.32 | 6.76 | 2.44 | 10.14 | 9.49 |
| fine 1.2-3.2 μm Cu powders (C1-2000, Ames Goldsmith) | 30 | 97.85 | 10.92 | 17.09 | 6.17 | 25.66 | 24.00 |
| $Sb_2O_3$ | — | 19.00 | 3.65 | 5.72 | 2.06 | 4.98 | 8.03 |
| Ni/Ni/Pb × 9.2 Nanoparticles | — | 5.45 | 0.66 | 1.03 | 0.37 | 1.43 | 1.44 |
| PVP 40,000 | — | 5.75 | 4.79 | — | — | 1.51 | 10.53 |
| Propylene Glycol | — | 24.96 | 24.00 | — | — | 6.55 | — |
| TOTAL | 100 | 381.33 | 45.51 | — | — | 100.00 | 100.00 |

| | |
|---|---|
| Vol. % $Sb_2O_3$ (only considering $Sb_2O_3$ and Cu) | 9.12 vol. % |
| $Sb_2O_3$/NP ratio | 3.49 |
| Cu/NP ratio | 59.85 |
| Total Cu (solids only) | 80.00 vol. % |
| Total Cu (in Paste) | 85.53 wt. % |

Example 13. Effect of the Organic Binder on Reducing the Oxides in the Paste and its Effect on Firing Conditions Some of the metals in the paste, specifically in the nanoparticles and in the coating on the surface of the copper-containing powders, are in the form of oxides. Introduction of oxides to the electrical contact in the cell will increase the resistivity of the fingers and will reduce the short circuit current density ($J_{sc}$), the fill factor (FF), and the overall efficiency (TO) of the devices. However, the oxides are advantageous as they are simpler to synthesize and the increased surface area is useful during the etching of the antireflective (SiN) layer. Because of the impact on the overall performance of the solar cell device, these materials must be reduced during the firing. Typical techniques to reduce the oxides during the synthesis include the use of hydrogen reductants such as hydrazine, sodium borohydride, etc. Forming gases are also a common reductant, but they require specialized furnaces. Organic vehicles, such as polyvinylpyrrolidone (PVP), decompose at temperatures in excess of 300° C. That decomposition produces reducing gases capable of reducing metal oxides to metals in the paste. This allows the paste to be fired in air while simultaneously reducing selected oxides present in the paste. Exemplary pastes described herein can be used in furnaces commonly used in the PV industry.

Figure 23:
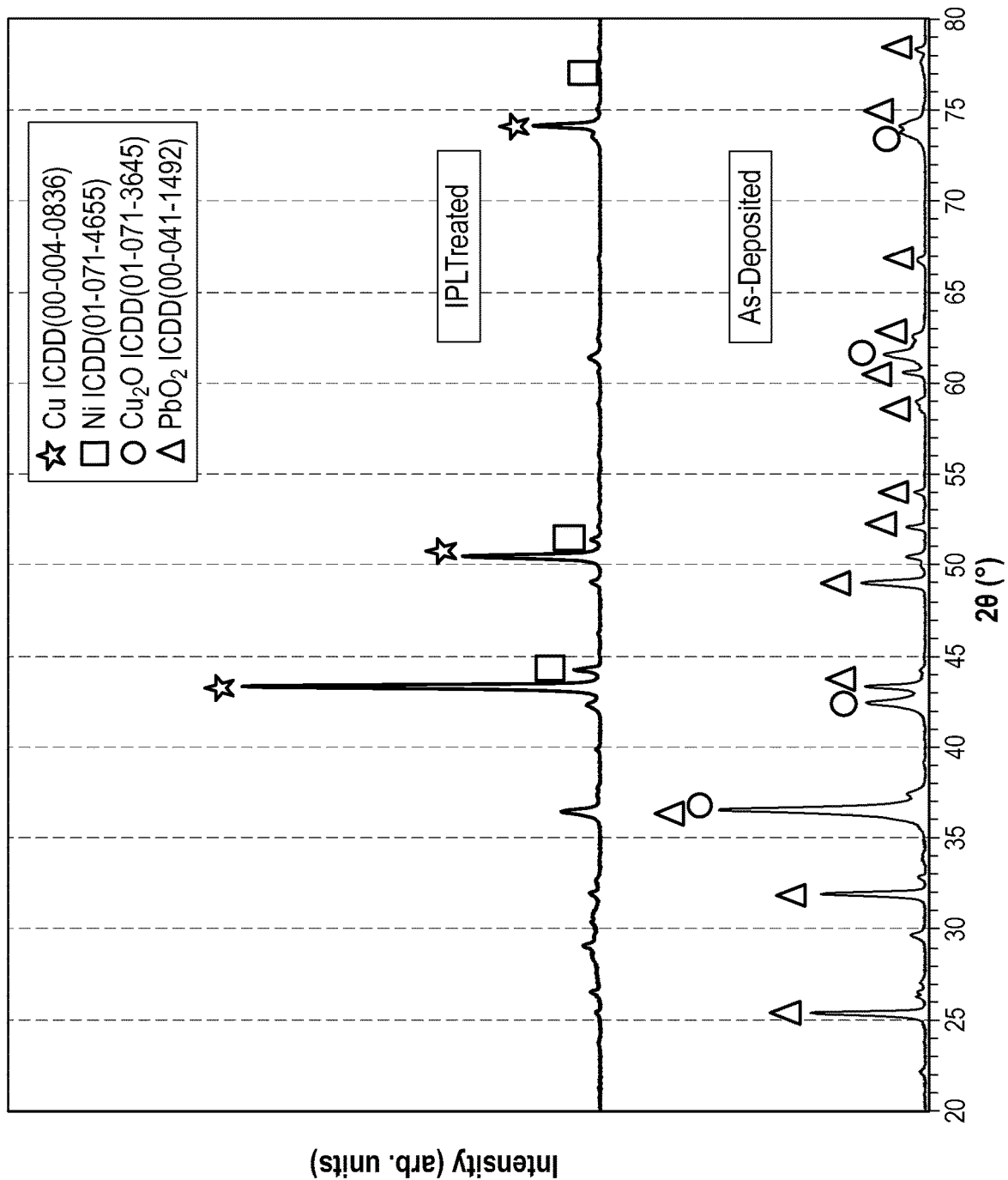
FIG. 23 is an x-ray diffraction pattern of as-deposited and heat treated films made using nanoparticles according to embodiments of the present invention.

FIG. 23 shows x-ray diffractograms (XRD) of films formulated with Cu/Ni/Pb nanoparticles, lead oxide, and PVP. Table 13 below lists the composition of the pastes in FIG. 23. The as-deposited films clearly show strong reflections for cuprous oxide ($Cu_2O$) and lead oxide ($PbO_2$). In this case the films were subjected to a rapid firing process called Intense Pulsed Light (IPL) treatment (also known as photonic sintering). IPL treatment applies multiple pulses of light in rapid succession to a given sample. The temperature rise experienced by the films is dependent on the amount of light applied and is a function of the materials' thermal conductivity, specific heat capacity, and density. Initial pulses of light were used to decompose the PVP in the film and reduce the metal oxides. Subsequent pulses of light sinter and melt the particles in to a consolidated film. The rapid heating process in combination with the PVP in the pastes, resulted in allowing the samples to be heat treated in air. FIG. 23 also shows the film after IPL treatment. The intensity of the oxide reflections have diminished and are replaced by intense copper reflections with the films preferentially orientated to the Cu(111) peak location. In addition, nickel is also present.

TABLE 13

| Material | Paste 30 |
|---|---|
| Organic Binder: | 1.25 g |
| PVP 40,000 | (4.87 wt %) |
| Organic Solvent: | 4.70 g |
| Ethylene Glycol | (18.32 wt %) |
| A/B/C nanoparticles: | 15.00 g |
| Cu/Ni/Pb Nanoparticles | (58.48 wt %) |
| Secondary Oxide: | 2.50 g |
| $PbO_2$ | (9.75 wt %) |
| Graphite | 0.20 g |
| | (0.78 wt %) |
| Cu/D powders: | 2.00 g |
| Cu/Ni/Pb 10-22 μm flakes Cu powders | (7.80 wt %) |

Figure 24A:
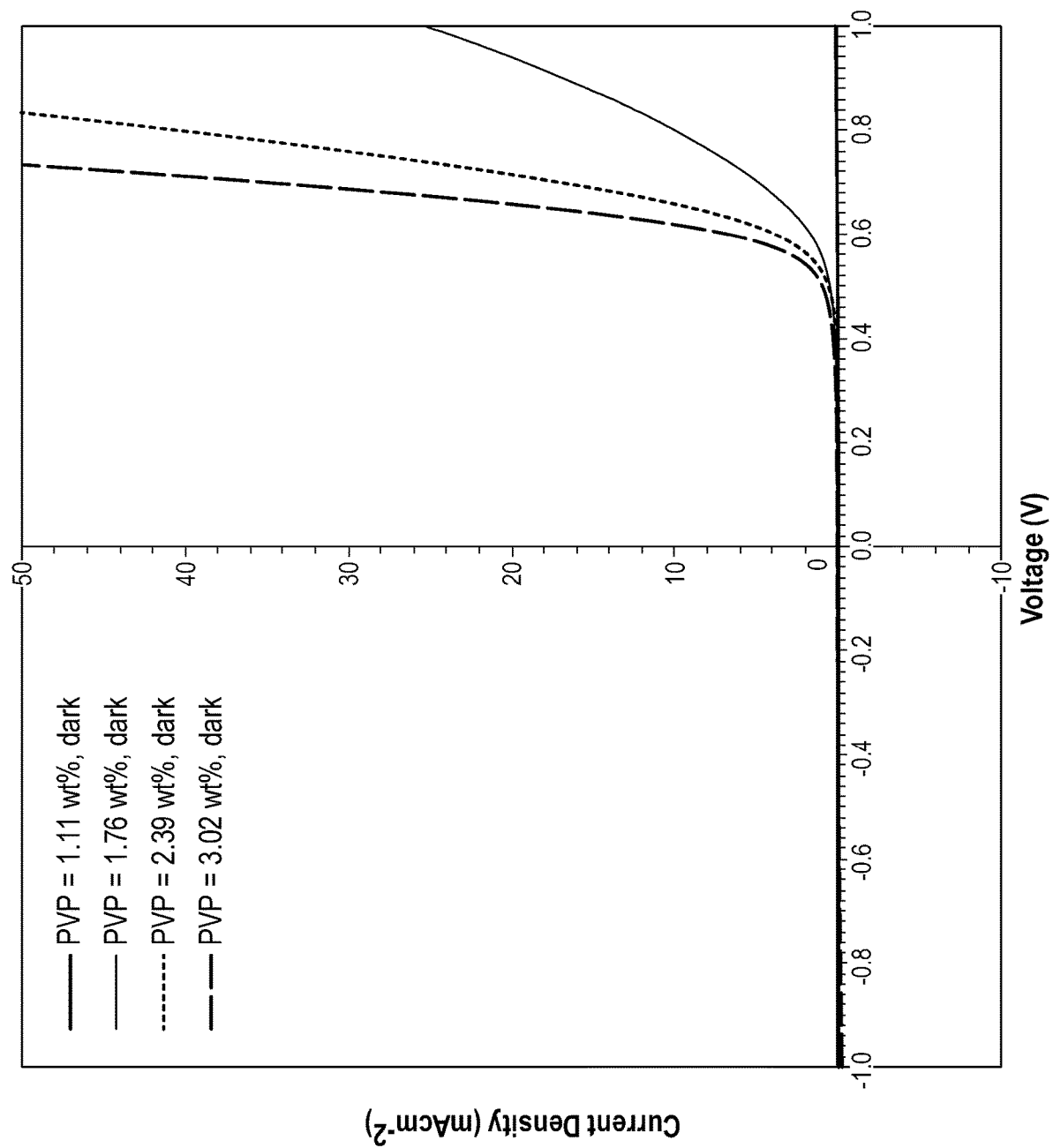
FIGS. 24A and 24B—are current density vs. voltage plots illustrate the impact of increasing the amount of organic vehicle in some embodiments of the paste and changing the firing temperature on the electrical properties of the cell.
Figure 24B:
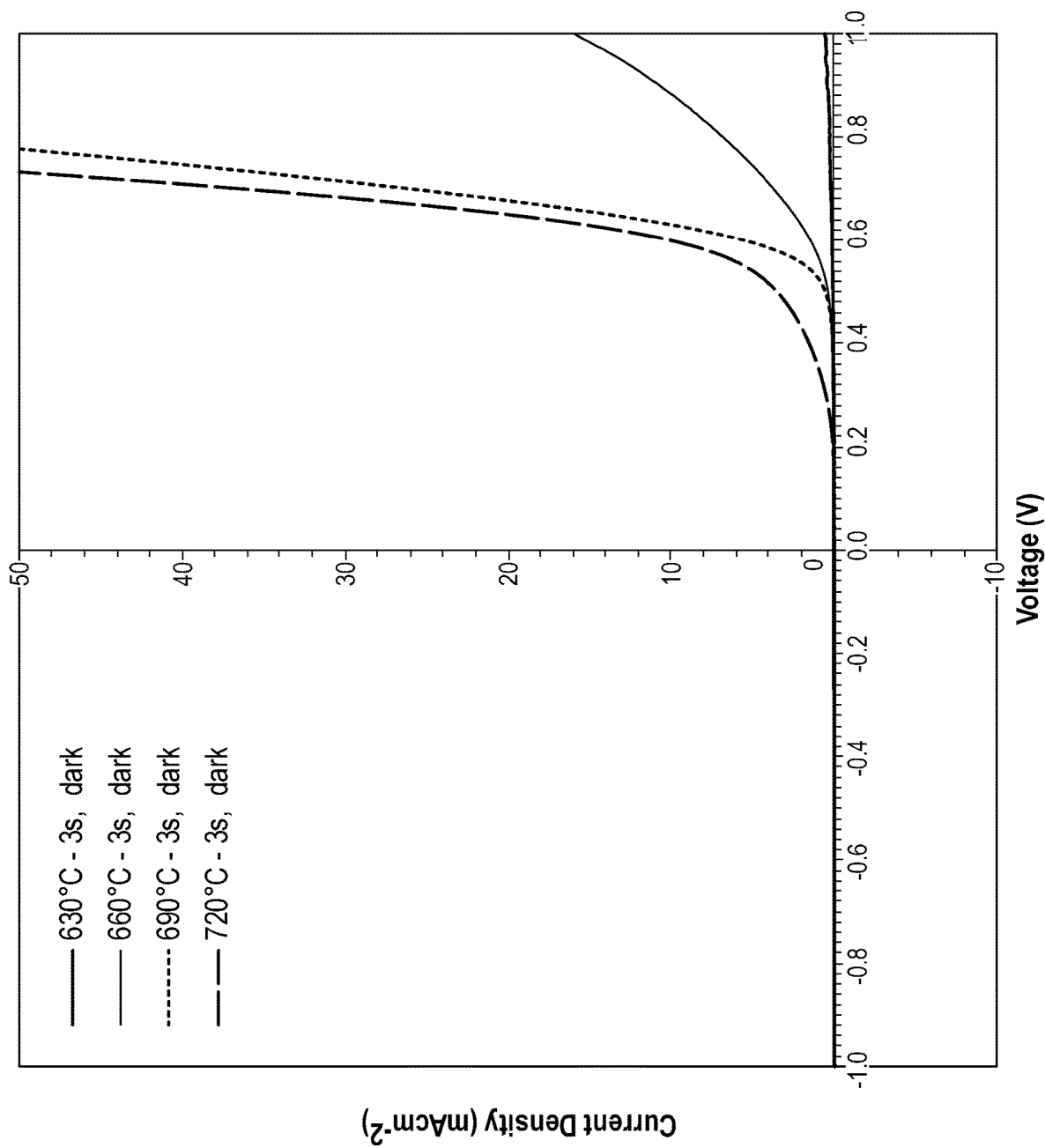
Figure 25A:
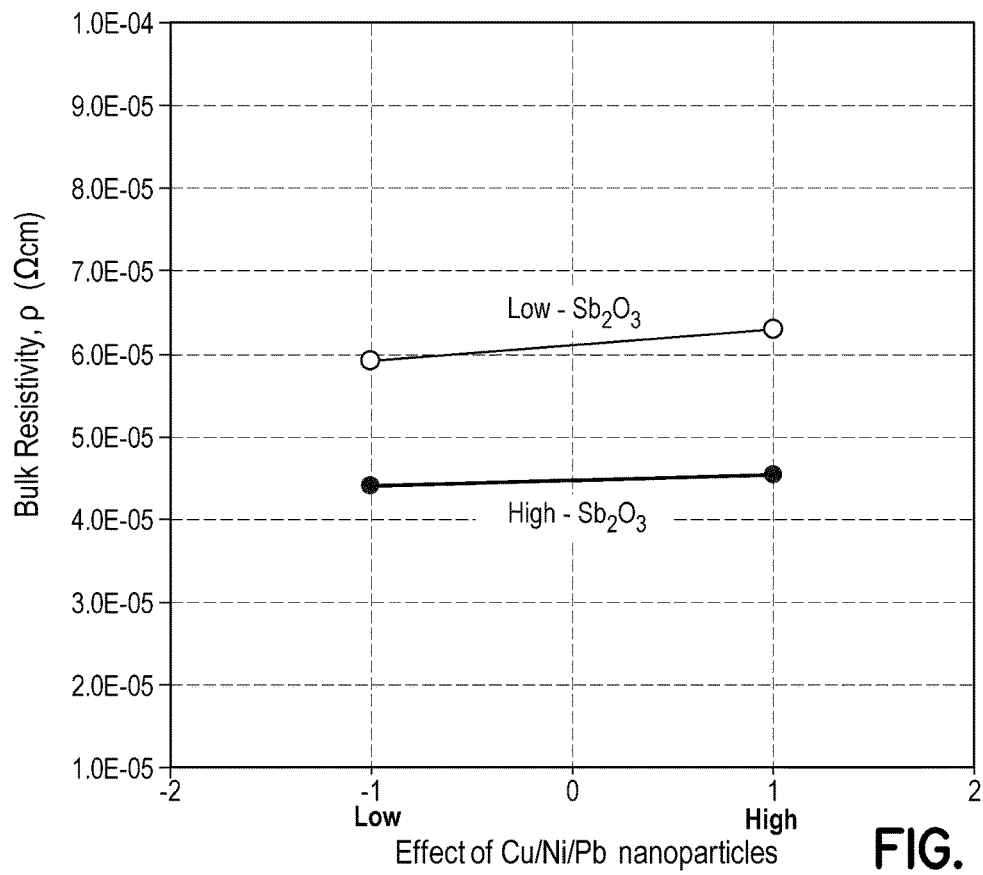
FIGS. 25A, 25B, 25C, 25D, 25E, and 25F are design of experiment (DOE) interaction effects plots to show the interaction of the secondary oxide and nanoparticles on the bulk resistivity, the contact resistivity, the $J_{sc}$, the FF, the $V_{oc}$, and the $\eta$, respectively.
Figure 25B:
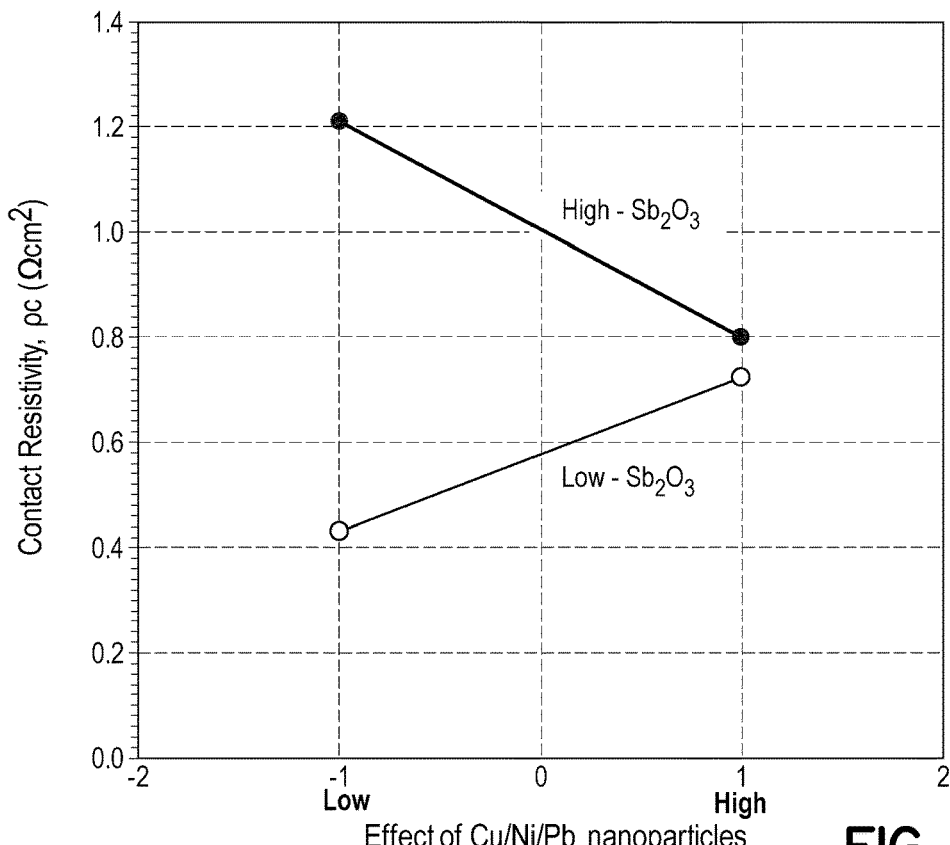
Figure 25C:
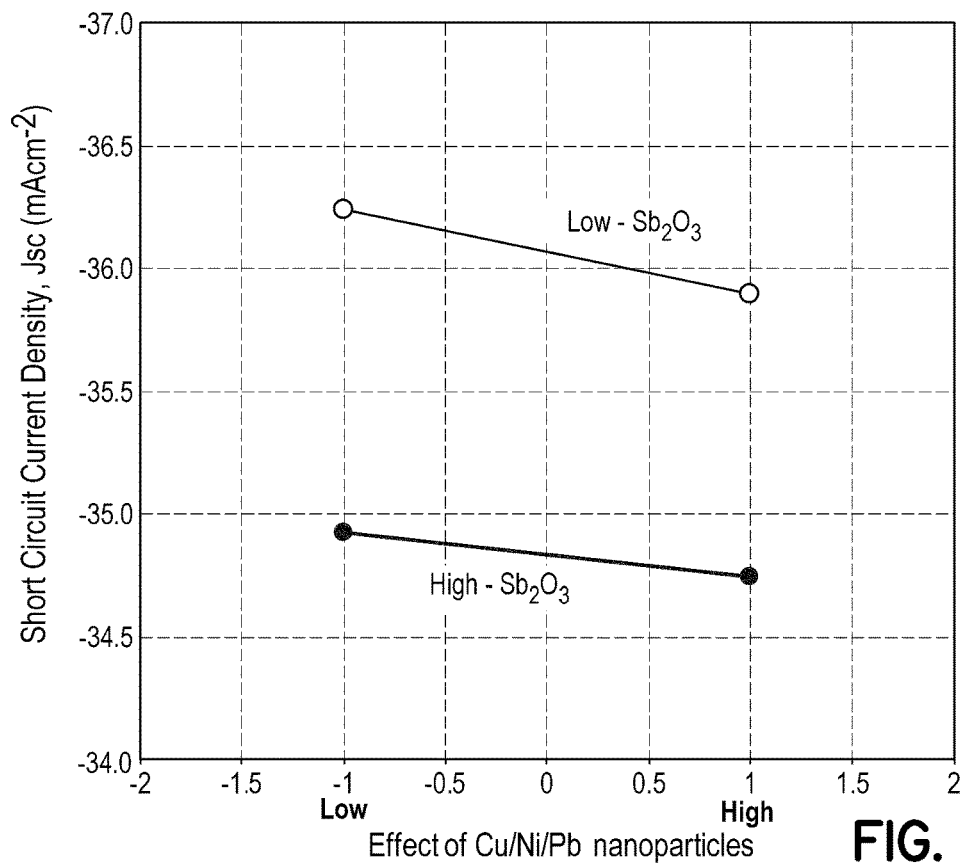
Figure 25D:
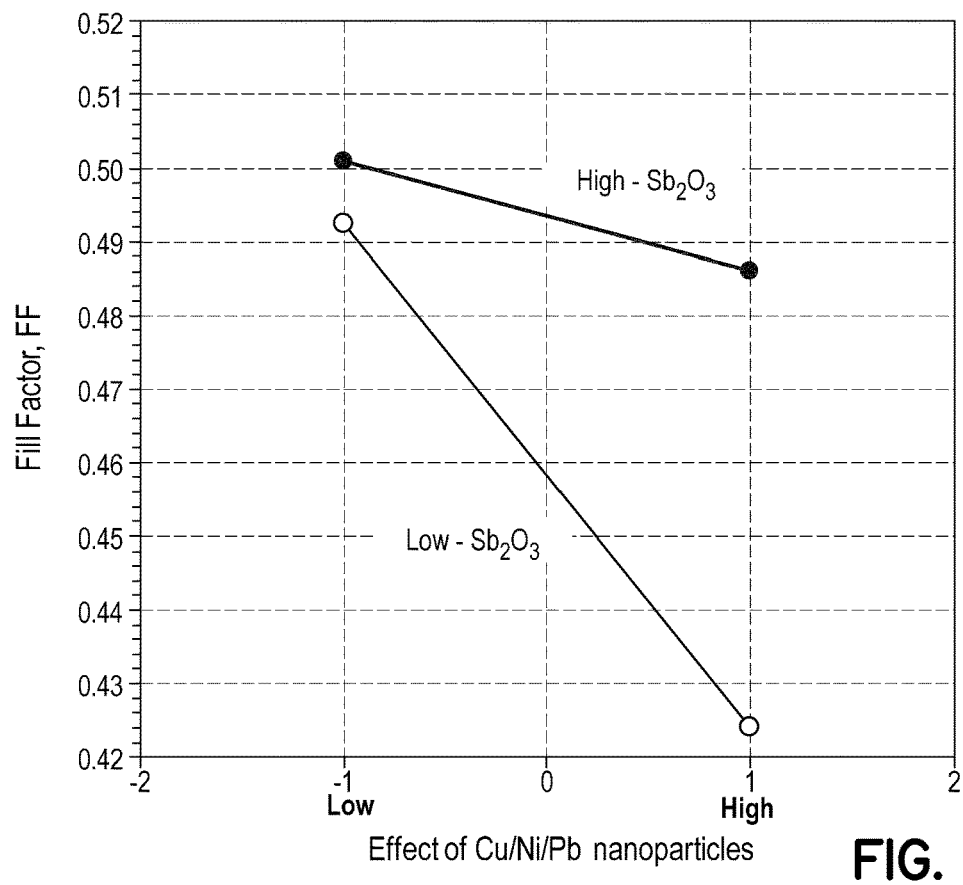
Figure 25E:
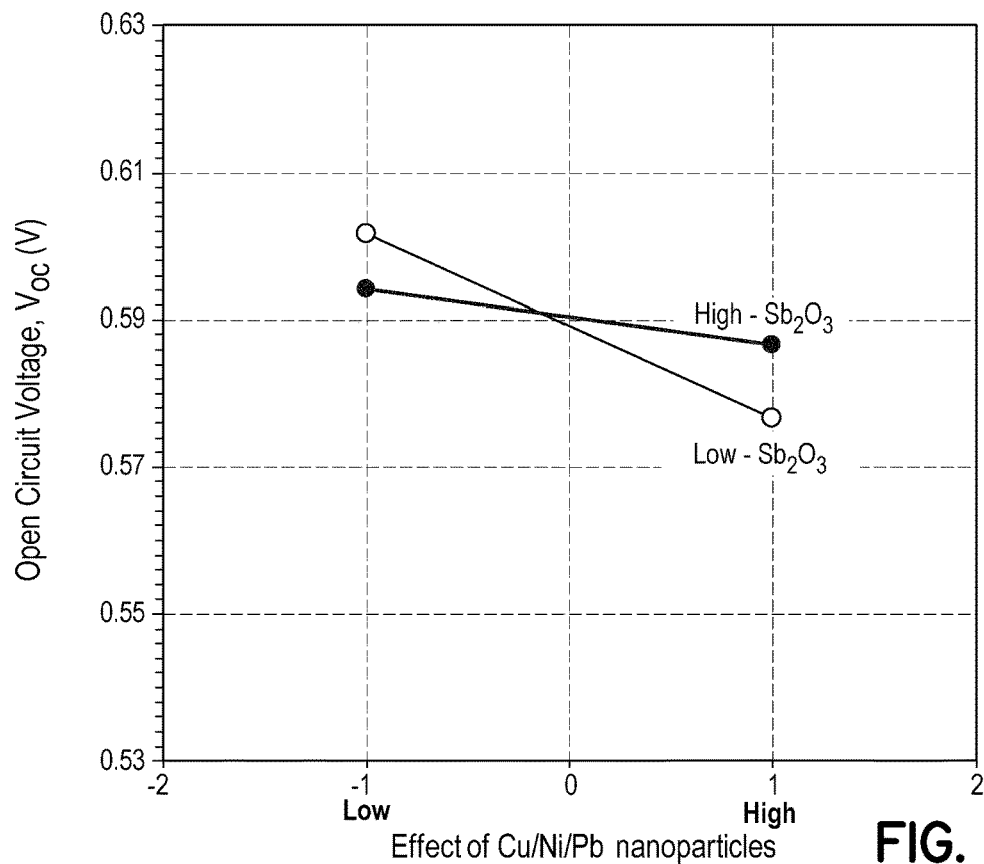
Figure 25F:
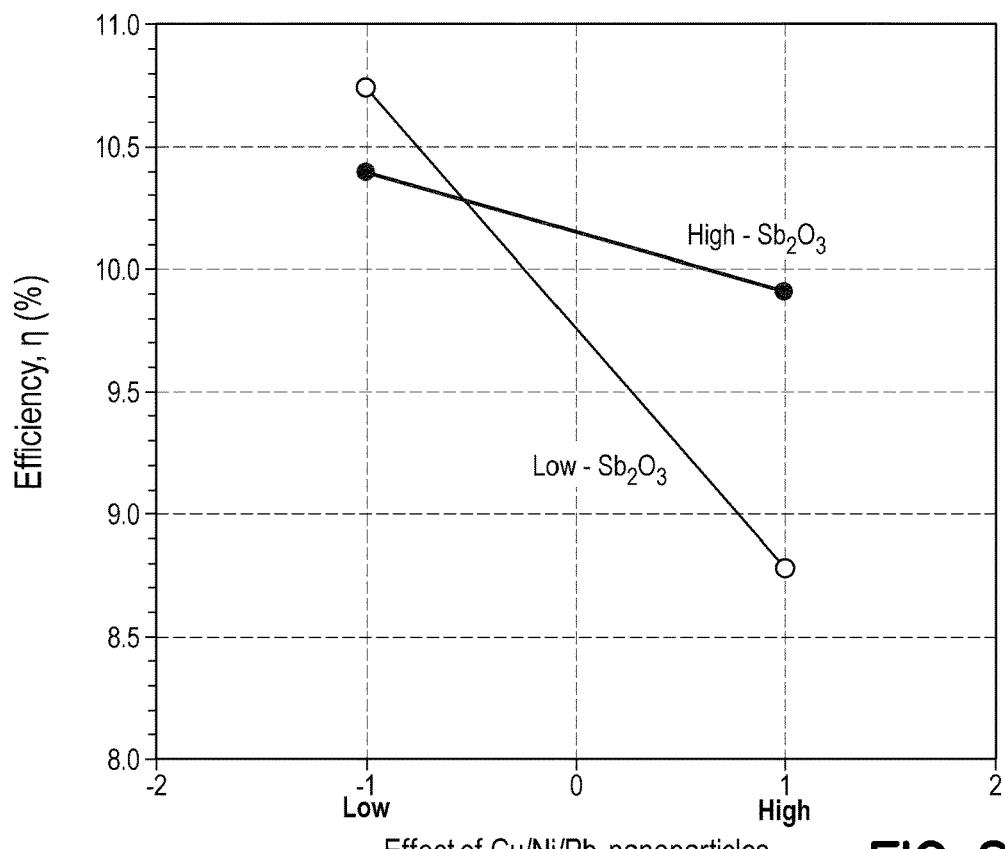

FIGS. 24A and 24B illustrate examples of the role of the binder on the etching function of the paste. Pastes were formulated with Cu/Ni/Pb nanoparticles and secondary oxide nanoparticles (antimony oxide). The amount of organic binder (PVP) in the pastes was adjusted to change the wt. % from 1.01 to 3.02 wt. %. The compositions of the pastes can be found in the Table 14 below. The pastes were printed on mono crystalline silicon solar cells with a full Al BSF rear contact. The cells were all fired using the fire brick method at 690° C. for 3 s. FIGS. 24A and 24B show the I-V curves for the cells measured in the dark. Low current under forward bias indicates that the paste has not etched through the SiN layer and made an electrical contact with the silicon. While a relatively high current between 0 to 0.5 V indicates that the paste has etched too deeply. When the amount of PVP in the paste was low (1.11 wt. %), the reducing gases were not sufficient to reduce all the oxides (nanoparticles and secondary oxides) in the paste and etch through the SiN coating. This resulted in more resistive I-V characteristics. As the amount of PVP in the paste was increased to 3.02 wt %, the reducing environment caused by the decomposition of the PVP was sufficient to reduce the oxides and etch through the SiN. FIGS. 24A and 24B also show the impact of firing temperature on the ability of the PVP to etch through the antireflective coating. Cells were printed with a paste containing 3.02 wt. % PVP and fired using the fire brick method. The cells were held in the furnace for 3 s. The furnace temperature was varied from 630-720° C. At low temperatures, there was inadequate energy input to adequately etch through the SiN and sinter the copper containing particles. Above high temperatures (720° C.), an increase in dark current is observed, which indicates that the contact appears to have penetrated deeper into the emitter. These results indicate that the firing conditions can be tuned by changing the amount of PVP in the pastes.

TABLE 14

| Material | Paste 26 | Paste 27 | Paste 28 | Paste 29 |
|---|---|---|---|---|
| Organic Binder: | 4.70 g | 3.70 g | 2.70 g | 1.70 g |
| PVP 40,000 | (3.02 wt %) | (2.39 wt %) | (1.76 wt %) | (1.11 wt %) |
| Organic Solvent: | 16.68 g | 16.68 g | 16.68 g | 16.68 g |
| Propylene Glycol | (10.71 wt %) | (10.78 wt %) | (10.85 wt %) | (10.92 wt %) |
| A/B/C nanoparticles: | 11.50 g | 11.50 g | 11.50 g | 11.50 g |
| Cu/Ni/Pb Nanoparticles | (7.38 wt %) | (7.43 wt %) | (7.48 wt %) | (7.53 wt %) |
| Secondary Oxide: | 7.16 g | 7.16 g | 7.16 g | 7.16 g |
| $Sb_2O_3$ | (4.60 wt %) | (4.63 wt %) | (4.66 wt %) | (4.69 wt %) |
| Cu/D powders: | 115.75 g | 115.75 g | 115.75 g | 115.75 g |
| 10-22 μm flakes Cu powders | (74.30 wt %) | (74.78 wt %) | (75.26 wt %) | (75.76 wt %) |

Figure 31A:
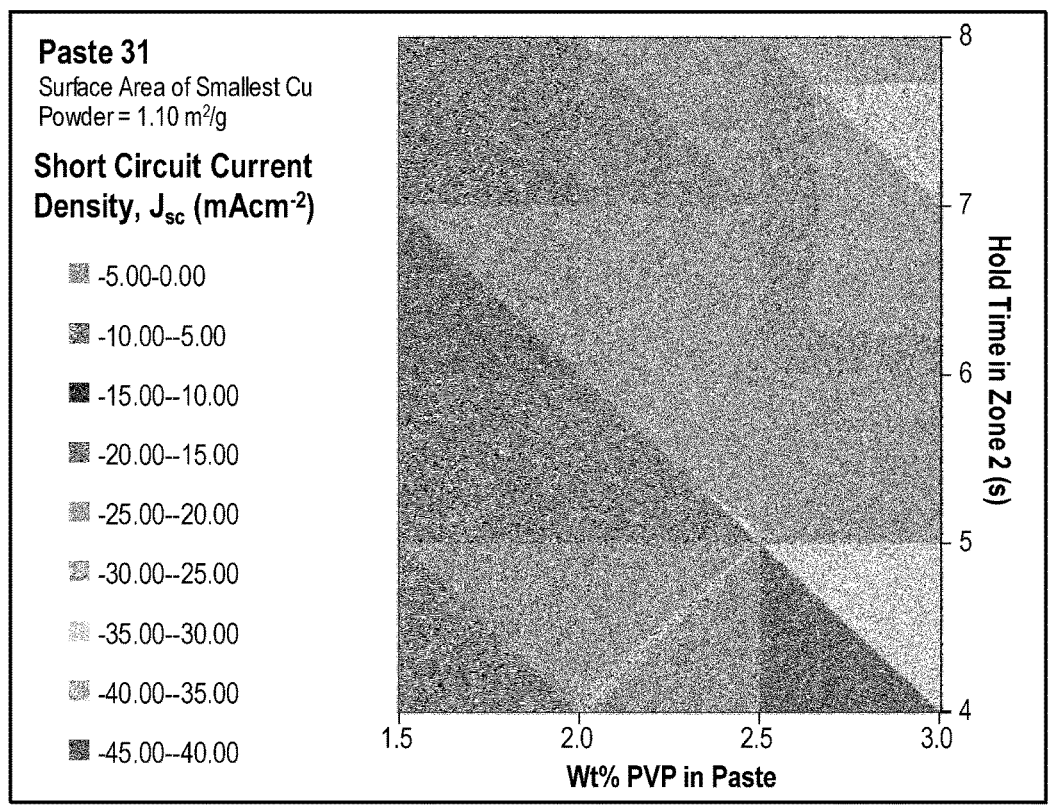
FIGS. 31A, 31B, 31C, 31D, 31E show the impact of the amount of organic vehicle in the paste and the firing conditions (i.e. the hold time) on the $J_{sc}$, the $V_{oc}$, the FF, the $\eta$ and the resistance across the fingers, respectively, when the surface modified fine copper containing particles in the paste had a surface area of 1.10 m$^2$/g.
Figure 31B:
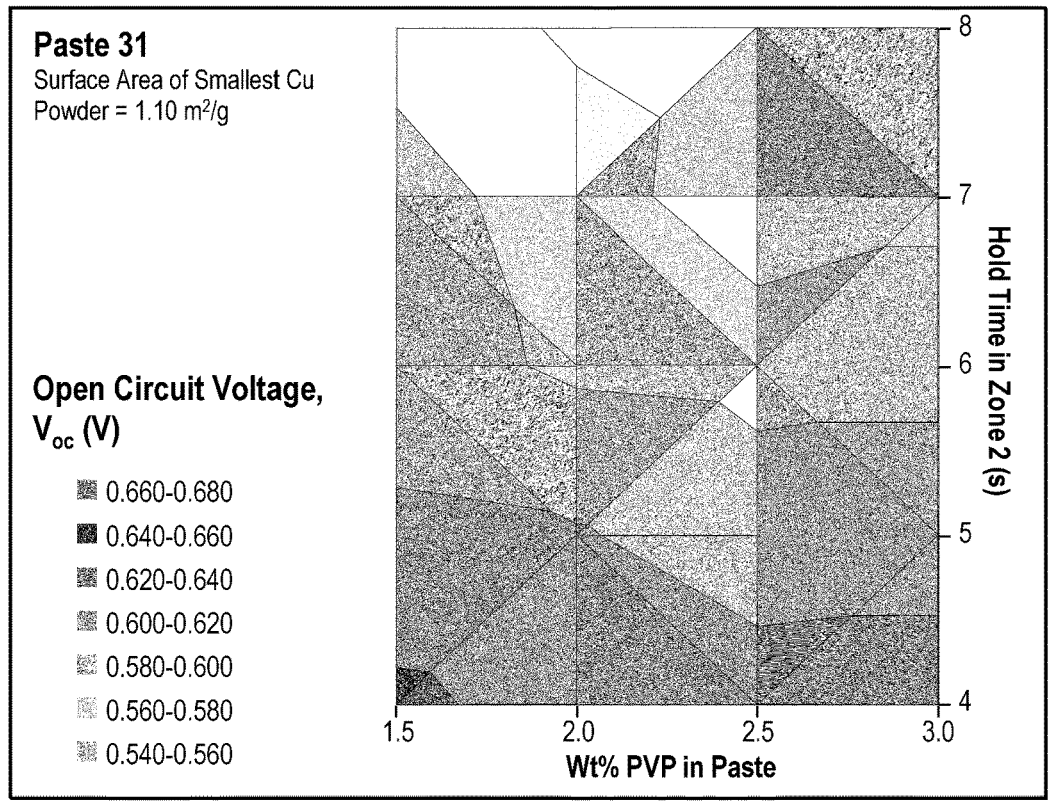
Figure 31C:
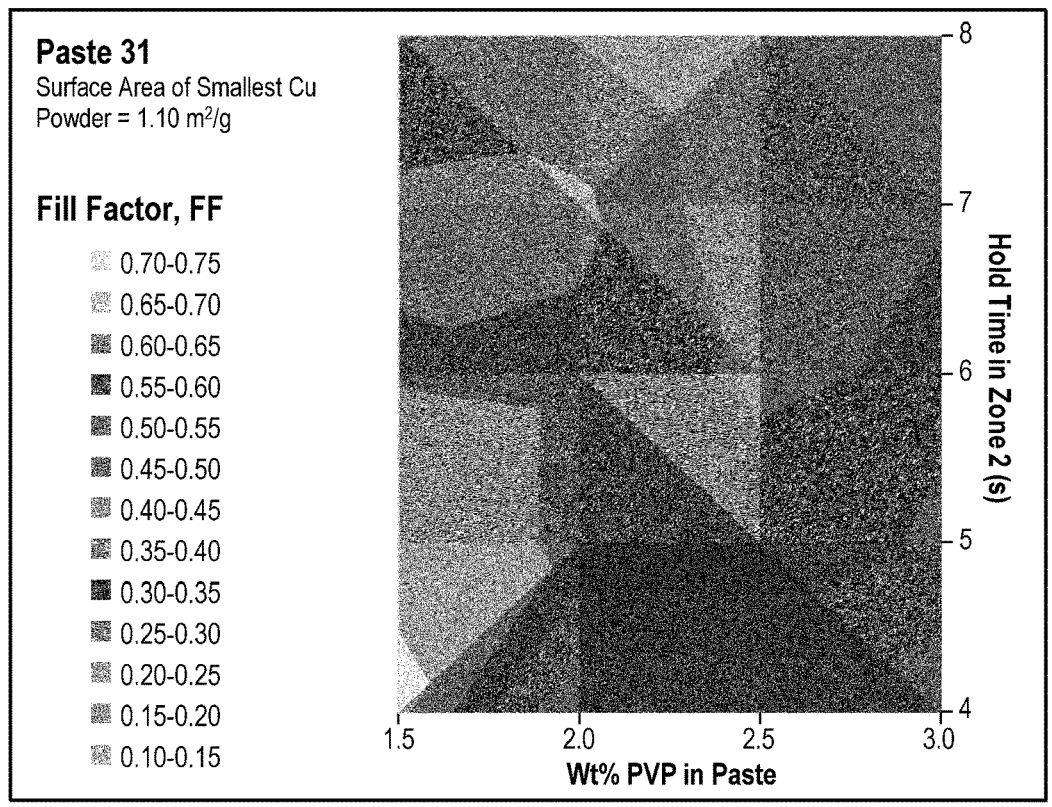
Figure 31D:
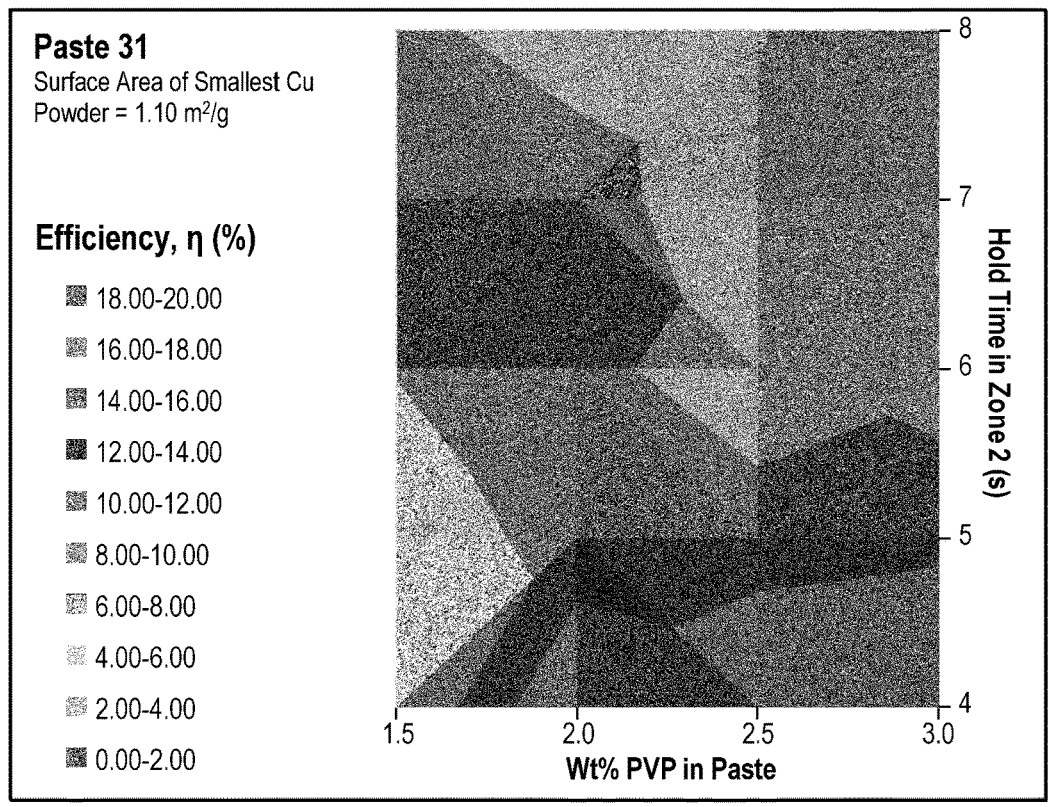
Figure 31E:
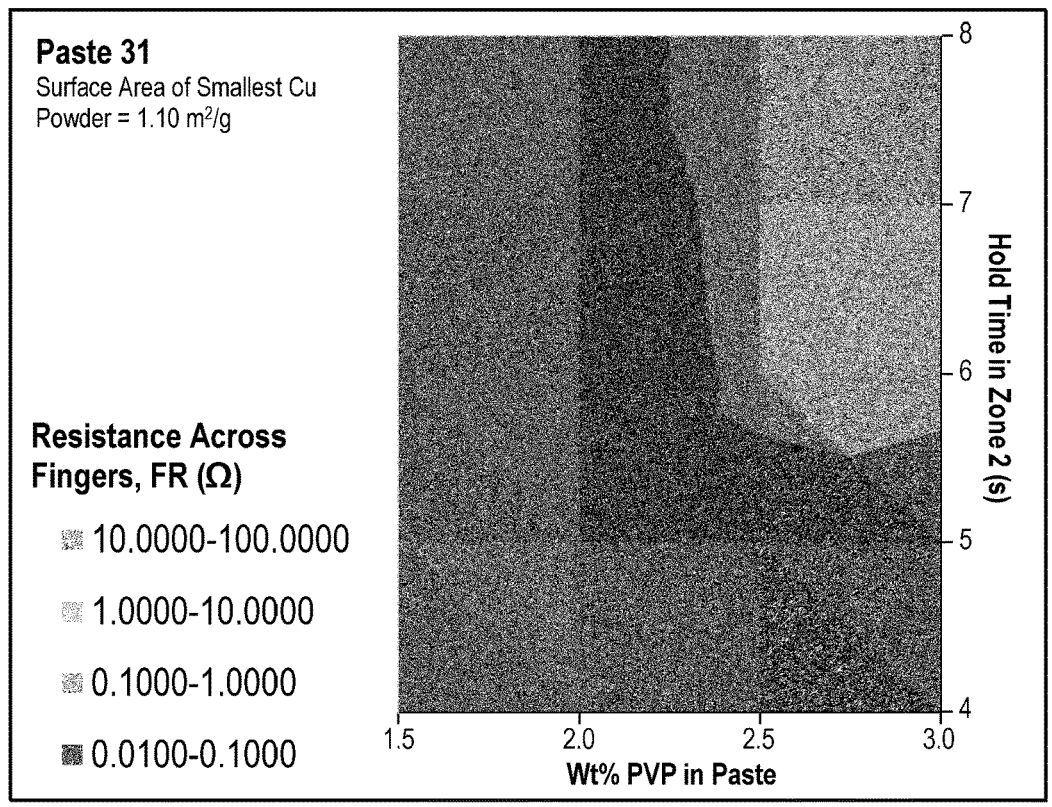
Figure 31F:
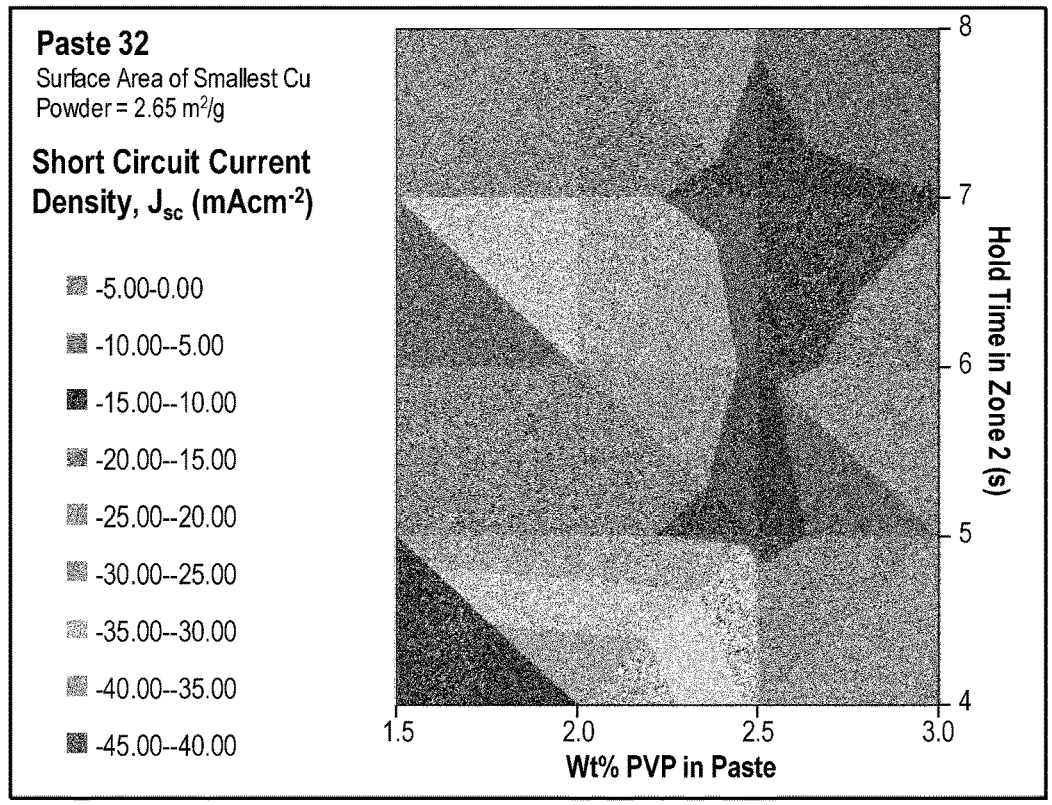
FIGS. 31F, 31G, 31H, 31I, 31J show the impact of the amount of organic vehicle in the paste and the firing conditions (i.e. the hold time) on the $J_{sc}$, the $V_{oc}$, the FF, the $\eta$ and the resistance across the fingers, respectively, when the surface modified fine copper containing particles in the paste had a surface area of 2.65 m$^2$/g.
Figure 31G:
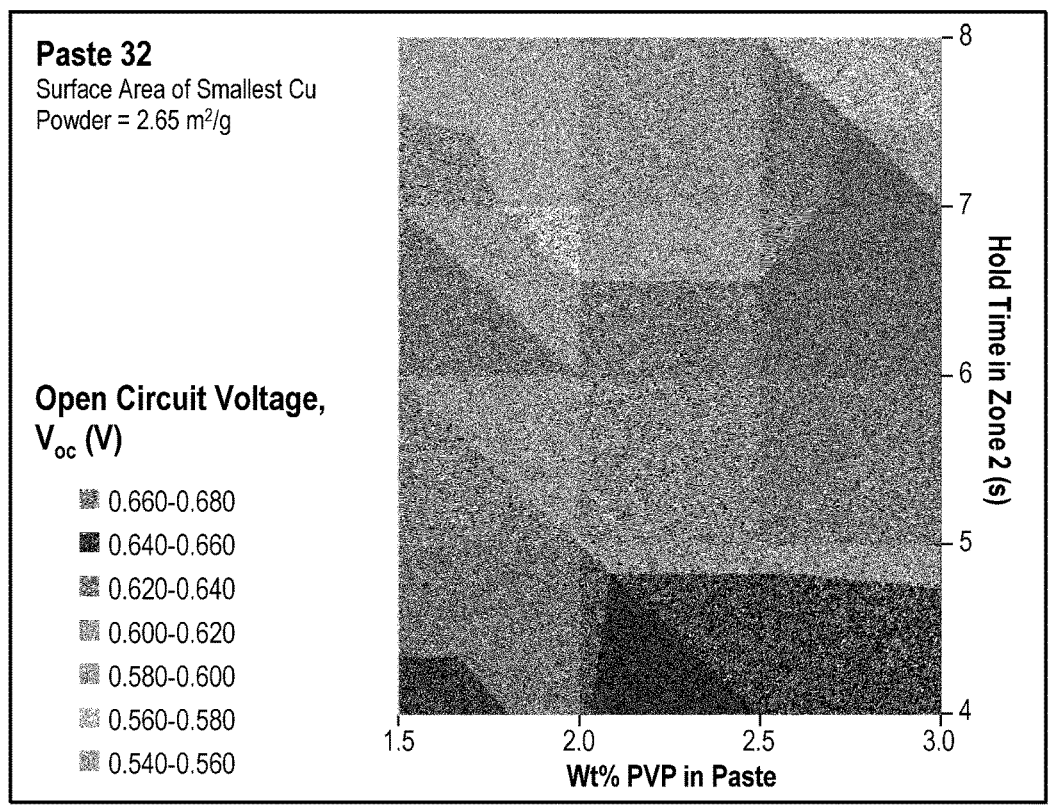
Figure 31H:
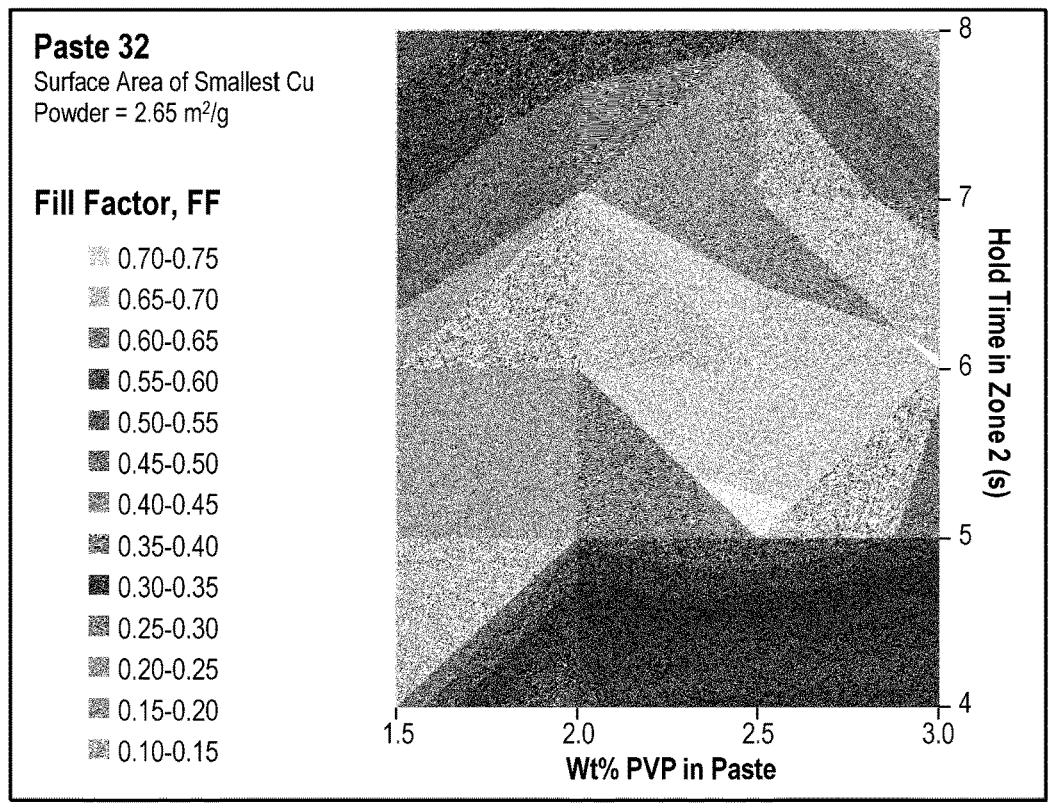
Figure 31I:
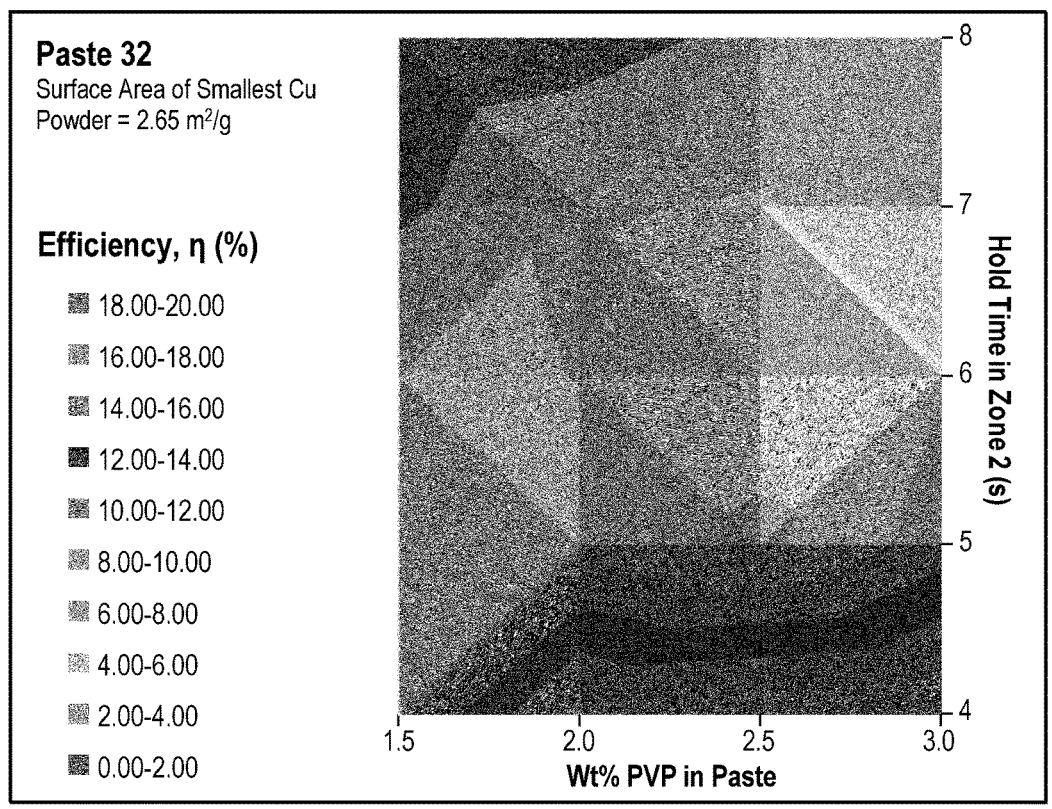
Figure 31J:
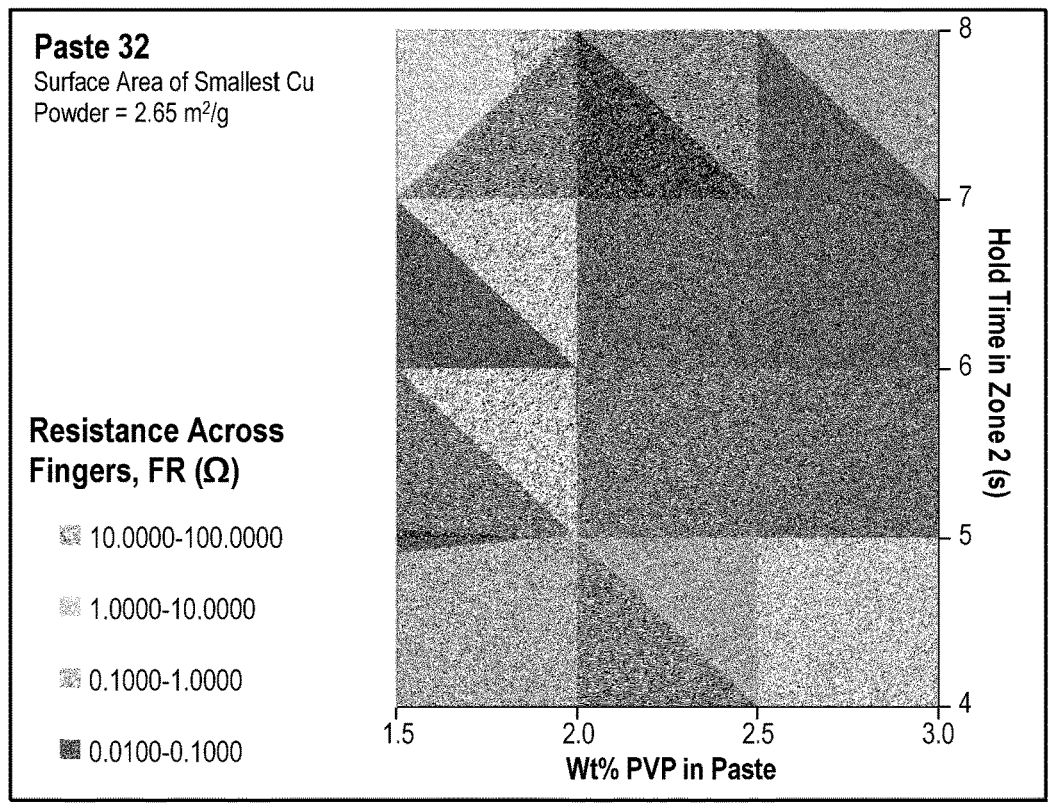
Figure 31K:
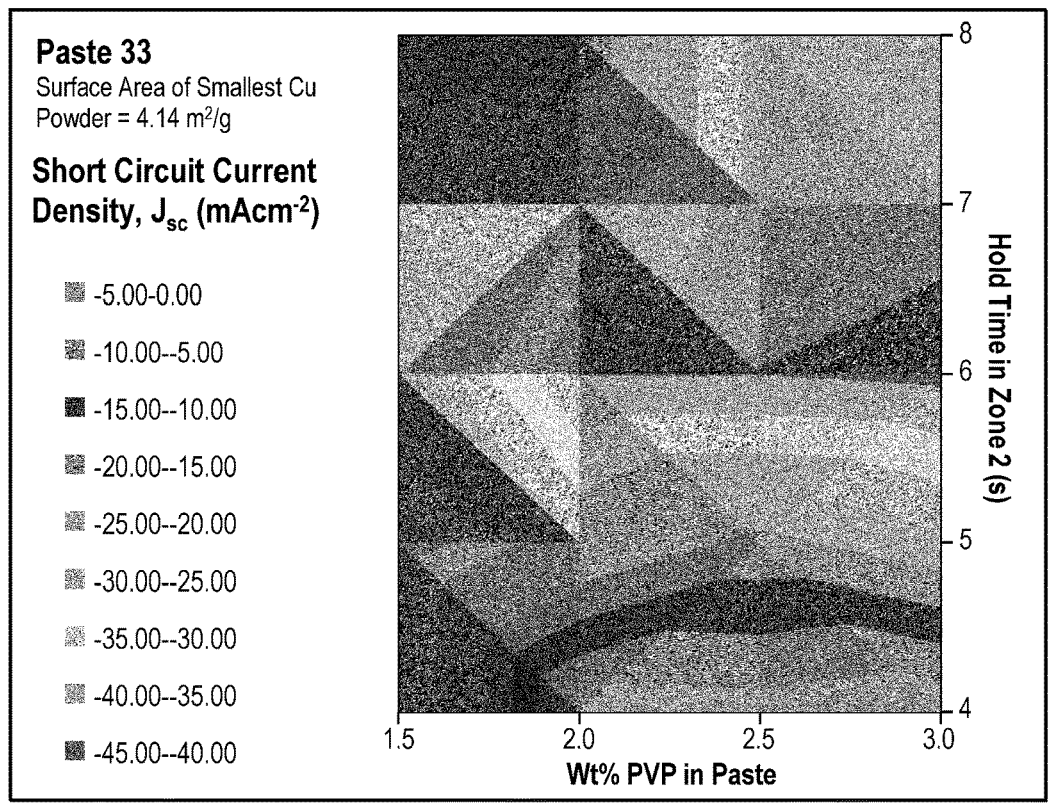
Figure 31L:
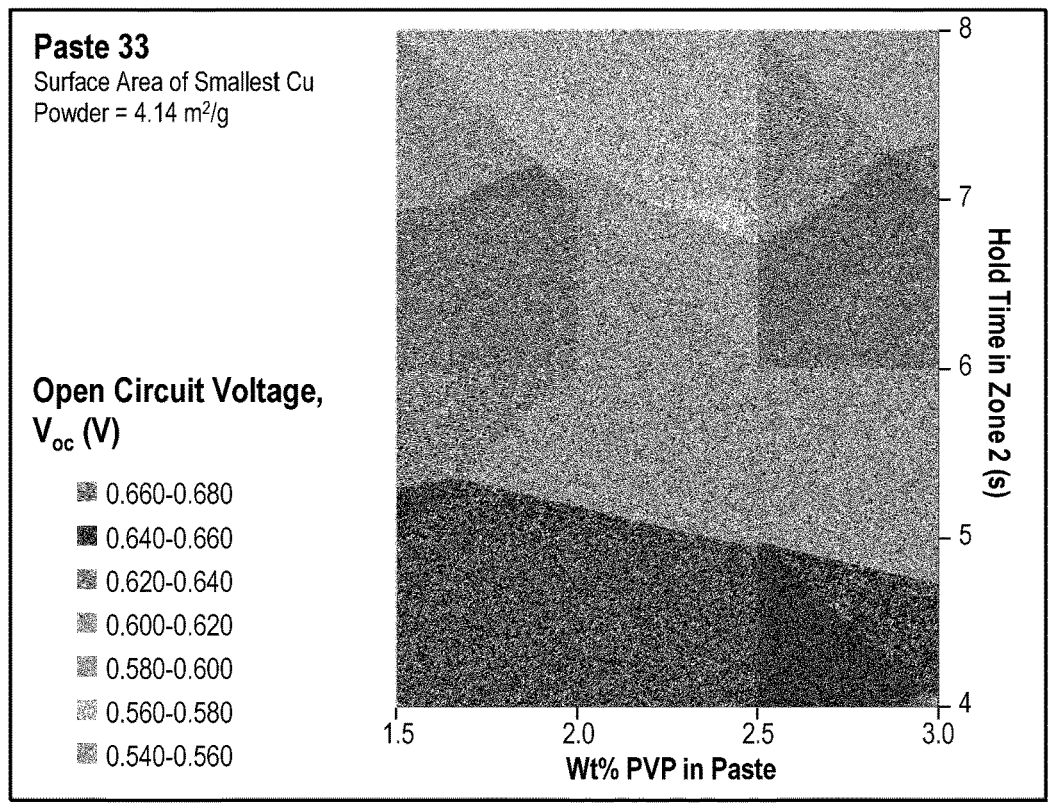
Figure 31M:
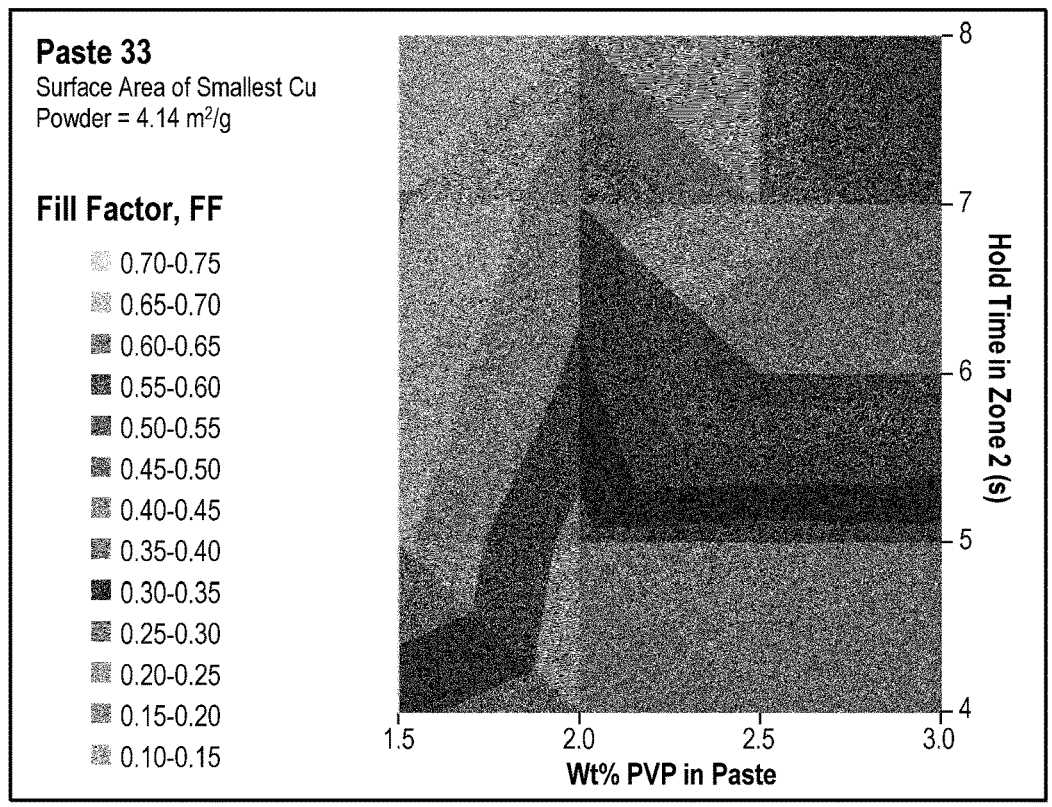
Figure 31N:
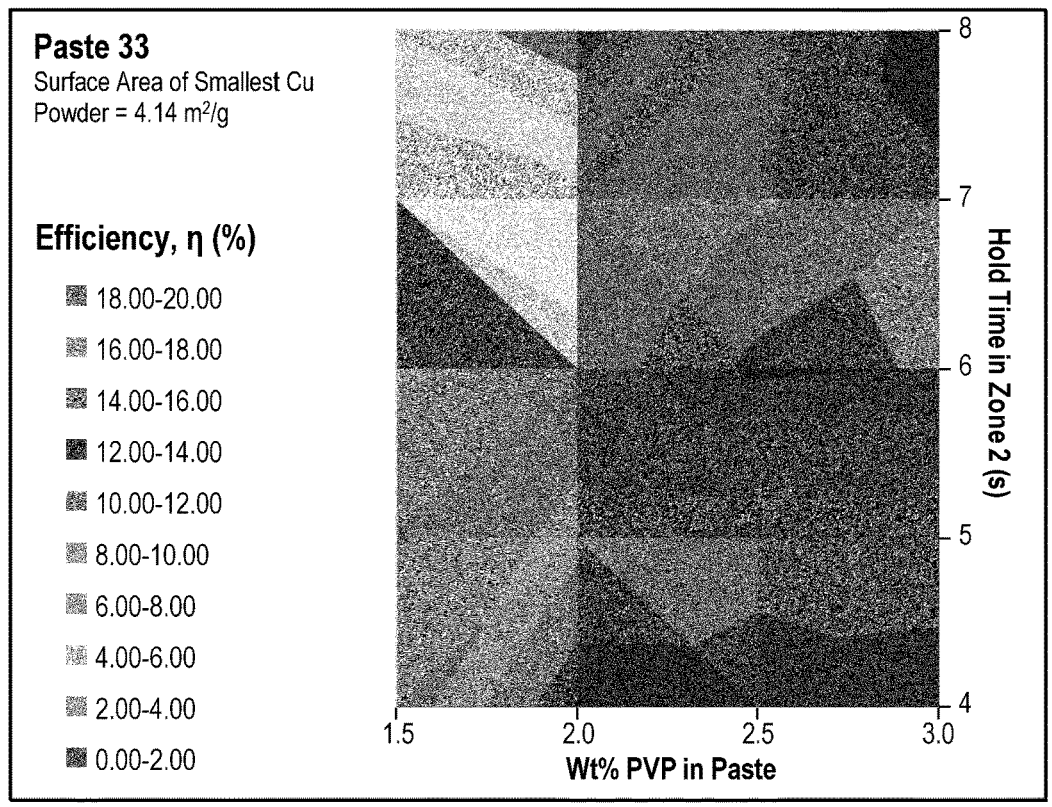
Figure 310:
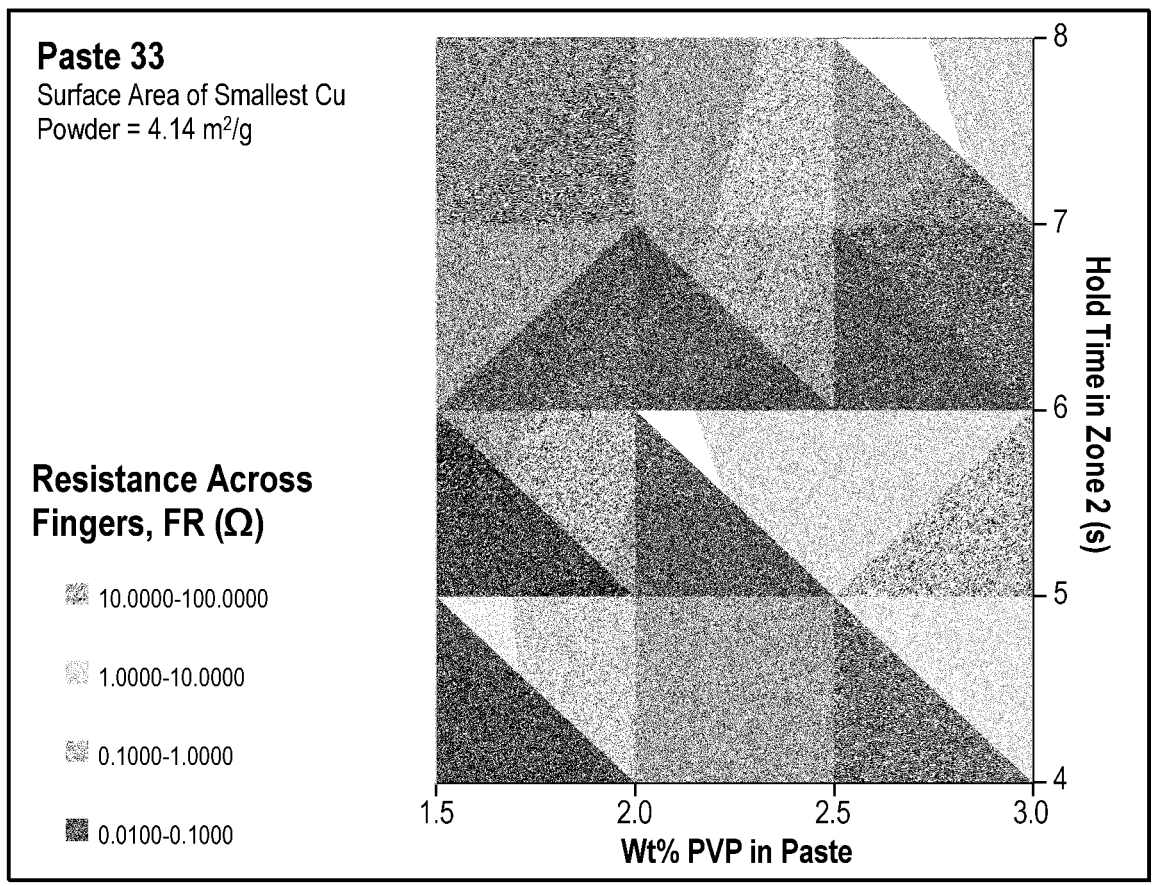
Figure 32A:
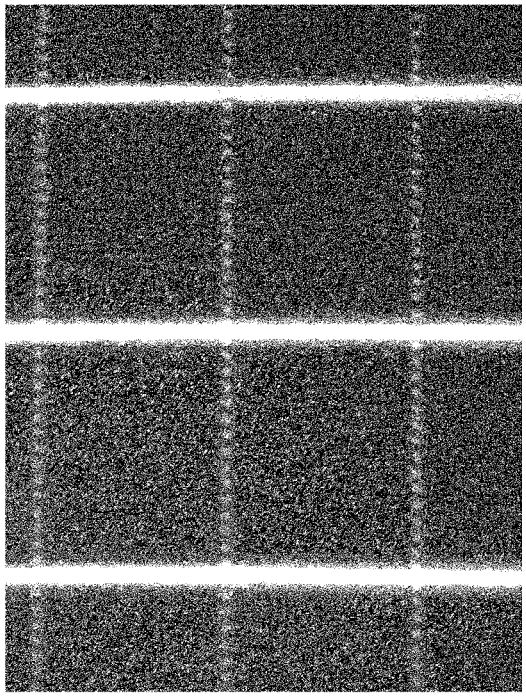
FIGS. 32A, 32B, 32C, 32D, 32E, and 32F are optical microscope images of fingers after firing with FIG. 32A no nanoparticles, FIG. 32B secondary oxide to nanoparticle ratio of 16.75, FIG. 32C secondary oxide to nanoparticle ratio of 8.37, FIG. 32D secondary oxide to nanoparticle ratio of 5.58, FIG. 32E secondary oxide to nanoparticle ratio of 4.19, FIG. 32F secondary oxide to nanoparticle ratio of 3.35.
Figure 32B:
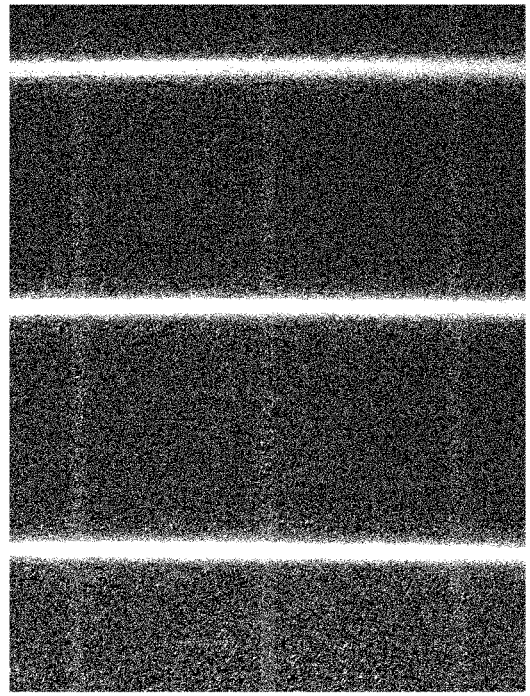
Figure 32C:
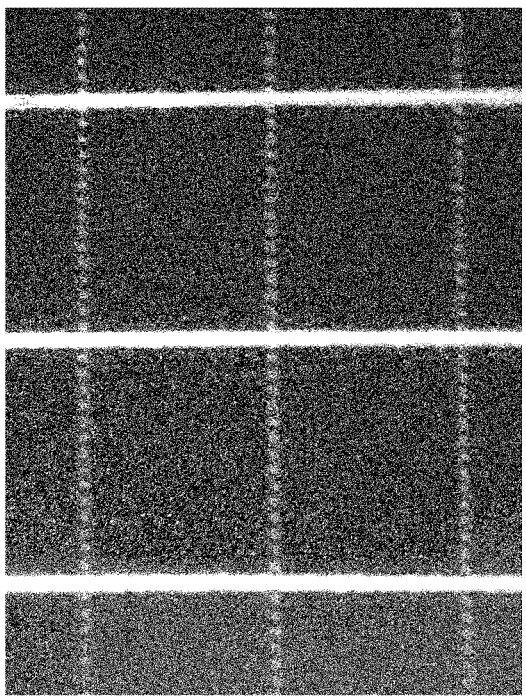
Figure 32D:
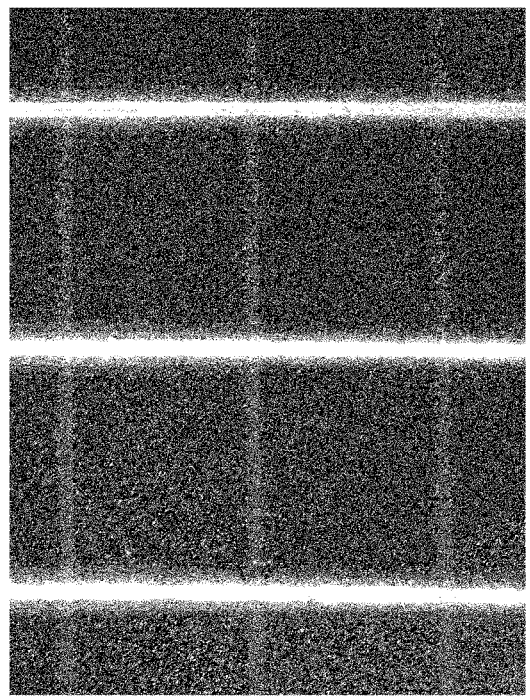
Figure 32F:
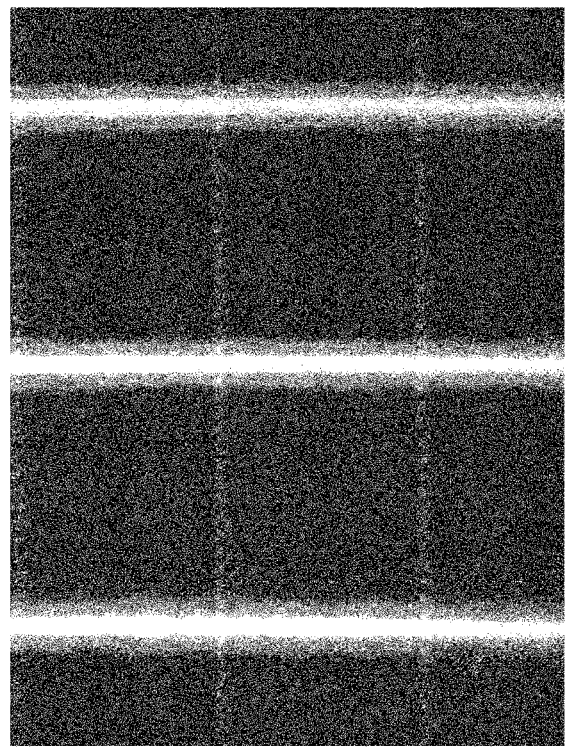
Figure 32E:
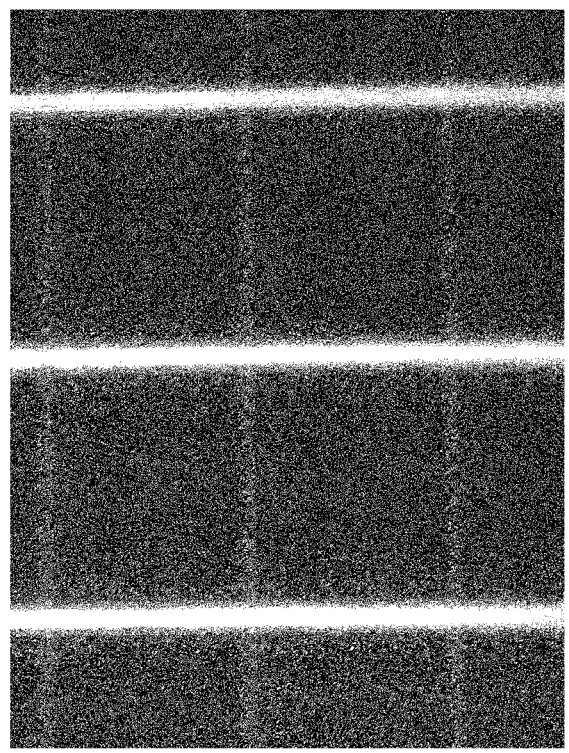

FIGS. 31A-31D provide examples of the role of the PVP in the paste. In this example, the surface area contribution (i.e., the amount of nickel particle coating) from the copper-containing particles with nickel was varied by changing the surface area (e.g., 1.10, 2.65 and 4.14 m$^2$/g) of the fine copper-containing particles in the paste. The effect of the amount of organic binder (PVP) on these different paste compositions was also investigated. Table 15 below lists the paste compositions for pastes made with 1.10 m$^2$/g of fine copper-containing particles and varying amounts (e.g., 1.5, 2.0, 2.5, and 3.0 wt. %) of PVP. The effect of the wt. % of PVP and the surface area of the fine (1.2-3.6 µm) copper-containing particles in the paste on the electrical and PV performance (FIGS. 31A, 31F, and 31K—$J_{sc}$; FIGS. 31B, 31G, and 31L—$V_{oc}$; FIGS. 31C, 31H, and 31M-FF; FIGS. 31D, 31I, and 31N—η; and FIGS. 31E, 31J, and 31O—total resistance across the fingers) of mono c-Si solar cells is shown in FIG. 24. The paste compositions were Paste 31 (FIGS. 31A-31E), Paste 32 (FIGS. 31F-31J), and Paste 33 (FIG. 31K-31O) listed in Table 14 using fine copper powders with surface areas of 1.10, 2.65, and 4.14 m$^2$/g, respectively. The cells were fired using the procedure described in Example 16, with a stage speed of 2.5 cm/s and a zone 2 setpoint temperature of 753° C. The hold time in zone 2 was varied from 4 s to 8 s.

FIGS. 31A-31O shows that for low surface areas (e.g., 1.01 m$^2$/g), low amounts (e.g., 1.5 wt. %) of PVP were enough to reduce the oxides in the paste and etch through the SiN layer. The results also indicate that the hold times in zone 2 or the zone 2's setpoint temperature can be reduced further to improve the PV performance of the devices. Increasing the amount of PVP in these pastes resulted in a lower performance due to increased series resistance. Pastes using copper-containing powders with a high surface area (e.g., 4.14 m$^2$/g), required higher proportions of PVP, longer hold times, and/or higher temperatures to etch the SiN coating and create a cell.

Example 14. Effect of Secondary Oxide Particles and Nanoparticles on the Electrical Properties of the Paste In this example, the impact of the secondary oxide particles (e.g., $Sb_2O_3$) and the nanoparticles (e.g., Cu/Ni/Pb) on the bulk resistivity (ρ) and contact resistivity ($ρ_c$) is demonstrated. Antimony, Sb, is a known n-type dopant for silicon and was introduced as a route to possibly form a n$^+$ region below the contact, and hence lower the contact resistivity. In this example, a commercially available antimony oxide with a particle size range of 1.1-1.8 µm was used. Antimony oxide has a low melting point (656° C.) and lies just below nickel oxide, NiO on the Ellingham diagram. As a result, it requires a similar energy input, to be reduced to its elemental form. Additionally, its position means that antimony can reduce the oxides of the other elements (Ni, Cu, Pb) in the paste, resulting in a more conductive contact. A factorial design of experiments approach was used to introduce antimony oxide to the paste. In this case, the oxide was considered to be part of the glass frit system (in addition to the Cu/Ni/Pb nanoparticles) which chemically reacts with the SiN layer. The amount of glass frits in the paste was kept constant and the ratio of the nanoparticles to secondary oxide particles was varied in 2$^2$ design matrix using predetermined "high" or "low" values for the two components. This resulted in four possible paste combinations, that were mixed, screen printed on mono crystalline silicon solar cells, and fired at 690° C. for 3 s in air (using the fire brick method). The effect of using high and low amounts of the

TABLE 15

| | Paste ID | | | |
|---|---|---|---|---|
| | Pastes 31, 32, - 1.5 wt % | Pastes 31, 32, 33 - 2.0 wt % | Pastes 31, 32, 33 - 2.5 wt % | Pastes 31, 32, 33 - 3.0 wt % |
| Organic Binder: PVP 40,000 | 2.28 g (1.52 wt %) | 2.02 g (2.01 wt %) | 2.52 g (2.48 wt %) | 3.02 g (2.95 wt %) |
| Organic Solvent: Propylene Glycol** | 8.54 g (5.71 wt %) | 6.03 g (5.99 wt %) | 6.53 g (6.43 wt %) | 6.78 g (6.62 wt %) |
| A/B/C nanoparticles: Ni/Ni/Pb Nanoparticles | 2.15 g (1.44 wt %) | 1.43 g (1.42 wt %) | 1.43 g (1.41 wt %) | 1.43 g (1.40 wt %) |
| Secondary Oxide: $Sb_2O_3$ | 7.50 g (5.01 wt %) | 5.00 g (4.97 wt %) | 5.00 g (4.92 wt %) | 5.00 g (4.89 wt %) |
| Cu/D powders: fine 1.2-3.2 µm Cu powders* | 38.75 g (25.90 wt %) | 25.83 g (25.68 wt %) | 25.83 g (25.43 wt %) | 25.83 g (25.24 wt %) |
| Cu/D powders: 10-22 µm spherical Cu powders | 90.42 g (61.43 wt %) | 60.28 g (59.93 wt %) | 60.28 g (59.34 wt %) | 60.28 g (58.90 wt %) |
| TOTAL | 149.64 g (100.00 wt %) | 100.59 g (100.00 wt %) | 101.59 g (100.00 wt %) | 167.82 g (100.00 wt %) |

*Different batches of the fine copper powders were used in order to change the surface area of the fine copper powders to produce pastes 31, 32, and 33.
**The amount of propylene glycol would have been adjusted in order to produce pastes with different viscosities.

secondary oxide particles in the paste on the bulk resistivity, contact resistance, as well as the devices PV performances was investigated. Tables 16, 17, and 18 (below) list the paste compositions for the design matrix.

FIGS. 25A, 25B, 25C, 25D, 25E, and 25F illustrate the effect and interactions of varying the levels of the Cu/Ni/Pb nanoparticles and the $Sb_2O_3$ particles in the paste on the bulk resistivity p (FIG. 25A), the contact resistivity $\rho_c$ (FIG. 25B), short circuit current density $J_{sc}$ (FIG. 25C), fill factor FF (FIG. 25D), open circuit voltage $V_{oc}$ (FIG. 25E), and efficiency η (FIG. 25F) from a $2^2$ factorial design matrix.

The introduction of the secondary oxides to the paste had a large effect in improving both the bulk resistivity and contact resistivity; and hence the overall PV performance of the pastes. SEM images (not shown) of the cross sections showed improved connectivity between the copper particles, but still had a large degree of porosity remaining in the films.

TABLE 16

|  | A: Cu/Ni/Pb nanoparticles | B: Antimony Oxide |
|---|---|---|
| Low Value (−) | 9.0 g | 5.6 g |
| High Value (+) | 12.6 g | 8.4 g |

TABLE 17

| Paste ID | A: Cu/Ni/Pb nanoparticles | B: Antimony Oxide |
|---|---|---|
| BTF_RD_SP5 | 0.6190 | 0.3810 |
| BTF_RD_SP6 | 0.6923 | 0.3077 |
| BTF_RD_SP7 | 0.5200 | 0.4800 |
| BTF_RD_SP8 | 0.6000 | 0.4000 |

TABLE 18

| Material | Paste 34 | Paste 35 | Paste 36 | Paste 37 |
|---|---|---|---|---|
| Organic Binder: PVP 40,000 | 4.46 g (3.60 wt %) | 5.56 g (3.60 wt %) | 5.43 g (3.60 wt %) | 6.41 g (3.60 wt %) |
| Organic Solvent: Propylene Glycol | 14.28 (11.52 wt %) | 17.80 (11.52 wt %) | 17.37 (11.52 wt %) | 20.53 (11.52 |
| A/B/C nanoparticles: Cu/Ni/Pb Nanoparticles | 9.00 g (7.26 wt %) | 12.60 g (8.16 wt %) | 9.00 g (5.97 wt %) | 12.60 g (7.07 wt %) |
| Secondary Oxide: $Sb_2O_3$ | 5.60 g (4.52 wt %) | 5.60 g (3.62 wt %) | 8.40 g (5.57 wt %) | 8.40 g (4.71 wt %) |
| Cu/D powders: 10-22 μm flakes Cu powders | 90.59 g (73.09 wt %) | 112.92 g (73.09 wt %) | 110.20 g (73.09 wt %) | 130.30 g (73.09 |
| A/B combination used in $2^2$ factorial design | Low/Low | High/Low | Low/High | High/High |

Example 15. Secondary Oxide Particles Acting as a Liquid Sintering Agent

It is desirable for the fingers to have a denser microstructure to lower the resistivity of the contacts, and hence the series resistance of the devices. The secondary oxide particles, such as antimony oxide particles, acts as a liquid sintering aid due to their relatively low melting point (for $Sb_2O_3$, melting temperature is 656° C.). A higher proportion of the secondary oxide particles in the paste results in a lower sintering temperature and/or faster sintering process, as well as densification of the contact.

Figure 26A:
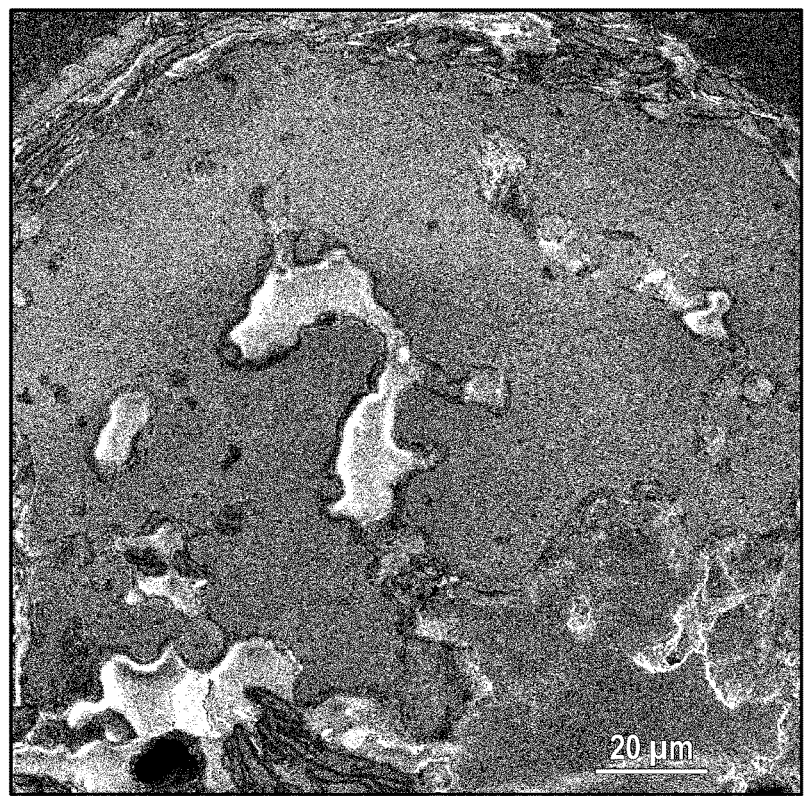
FIGS. 26A and 26B are an SEM image and an image, respectively, illustrating microstructures formed following firing of a paste containing a high proportion of secondary oxides.
Figure 26B:
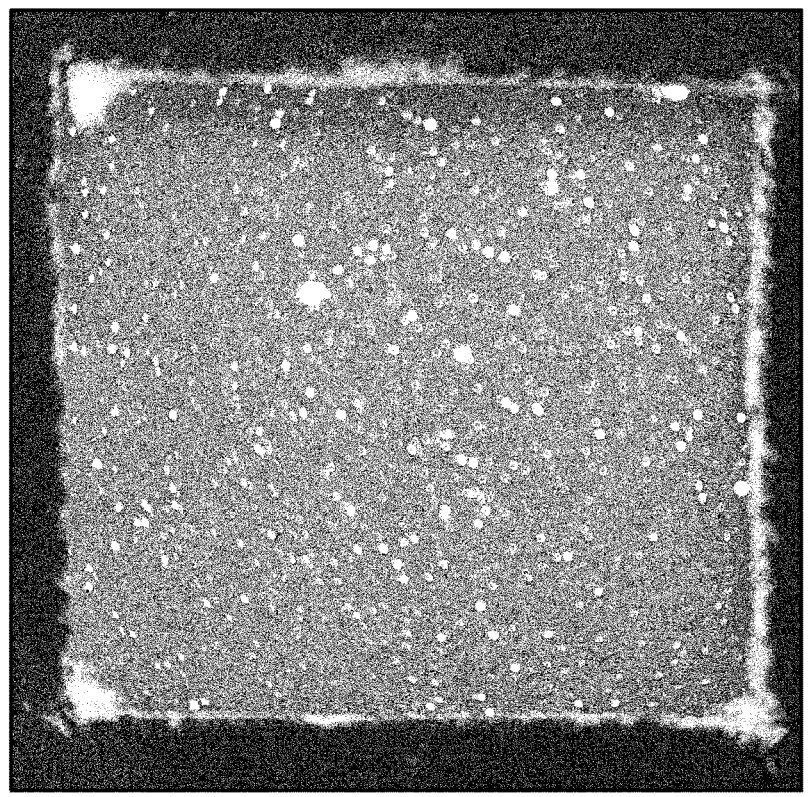

Table 19 shows the composition of a Paste 38 using a 70:30 blend of coarse to fine copper-containing particles (a similar blend to Paste 5). The amount of secondary oxide particles was increased to about 22 wt. %. FIGS. 26A and 26B show that although the copper-containing particles appear denser, large voids are present in the microstructure, causing the delamination of the copper contacts from the silicon substrate. Examination of the delaminated contacts using a light box, showed that the contacts still had a significant amount of porosity.

TABLE 19

| | Paste Id.: Paste 38 | | | | | |
|---|---|---|---|---|---|---|
| Material | Ratio by weight of the different Cu powders | Weight (g) | Volume (cm³) | Packing Volume (cm³) | Space (cm³) | Wt % (of Paste) | Vol % (solids only) |
| 10-22 μm spherical Cu powders (Cu112SP, Chemical Store) | 70 | 116.05 | 12.95 | 20.27 | 7.32 | 47.00 | 38.86 |

TABLE 19-continued

Paste Id.: Paste 38

| Material | Ratio by weight of the different Cu powders | Weight (g) | Volume (cm³) | Packing Volume (cm³) | Space (cm³) | Wt % (of Paste) | Vol % (solids only) |
|---|---|---|---|---|---|---|---|
| 7.5-14.7 μm spherical Cu powders (610, ACuInternational) | — | — | — | — | — | — | — |
| 1.8-7.7 μm spherical Cu powders (603, ACuInternational) | — | — | — | — | — | — | — |
| fine 1.2-3.2 μm Cu powders (C1-2000, Ames Goldsmith) | 30 | 49.74 | 5.55 | 8.69 | 3.14 | 20.14 | 16.66 |
| $Sb_2O_3$ | — | 55.00 | 10.58 | 16.55 | 5.98 | 22.27 | 31.74 |
| Ni/Ni/Pb × 9.2 Nanoparticles | — | 2.75 | 0.33 | 0.52 | 0.19 | 1.11 | 1.00 |
| PVP 40,000 | — | 4.70 | 3.92 | — | — | 1.90 | 11.75 |
| Propylene Glycol | — | 18.68 | 17.96 | — | — | 7.57 | — |
| TOTAL | 100 | 246.92 | 33.33 | — | — | 100.00 | 100.00 |

To densify the contacts further, without causing delamination and voids in the microstructure, the copper-containing particles need to pack together as closely as possible and have a larger volume percentage in the contact. To improve the density of the contacts, packing density studies of the copper-containing particles were carried out using the spherical powders shown in Table 8 (above) of Example 11. Calculations were carried out assuming that the powders had a maximum packing factor of 0.639, and that the smaller spherical powders occupy the free space between the large copper particles. Once this value was calculated, the finest (1.2-3.2 μm) copper powder was added at 30 wt. % of the copper powder in the paste. These calculations resulted in the following blend of copper-containing particles: 37 wt. % (10-22 μm), 21 wt. % (7.5-14.7 μm), 12 wt. % (1.8-7.7 μm), and 30 wt. % (1.2-3.2 μm). FIG. 22(d) shows an example of a cross section of a contact printed with this blend of particle sizes. Although the contact still shows a high degree of porosity, the increased number of particle-to-particle connections appears to have reduced the size of the pores.

The effect of the secondary oxide particles as a liquid sintering aid were studied by increasing the volume percentage of the oxide particles in the pastes containing a blend of four copper-containing powders with different particle sizes. The compositions of the pastes are shown in Table 20.

TABLE 20

| Material | Paste 1 | Paste 40 | Paste 39 |
|---|---|---|---|
| Organic Binder: | 5.75 g | 5.99 g | 6.27 g |
| PVP 40,000 | (1.51 wt %) | (1.51 wt %) | (1.51 wt %) |
| Organic Solvent: | 24.96 | 26.01 | 27.21 |
| Propylene Glycol | (6.55 wt %) | (6.55 wt %) | (6.55 wt %) |
| A/B/C nanoparticles: | 5.45 g | 5.45 g | 5.45 g |
| Ni/Ni/Pb × 9.2 Nanoparticles | (1.43 wt %) | (1.37 wt %) | (1.31 wt %) |
| Secondary Oxide: | 19.00 g | 33.72 g | 50.55 g |
| $Sb_2O_3$ | (4.98 wt %) | (8.49 wt %) | (12.16 wt %) |
| Cu/S powders: | 97.85 g | 97.85 g | 97.85 g |
| fine 1.2-3.2 μm Cu powders | (25.66 wt %) | (24.63 wt %) | (23.54 wt %) |
| Cu/D powders: | 38.68 g | 38.68 g | 38.68 g |
| 1.8-7.7 μm spherical Cu powders | (10.14 wt %) | (8.89 wt %) | (9.31 wt %) |
| Cu/D powders: | 68.46 g | 68.46 g | 68.46 g |
| 7.5-14.7 μm spherical Cu powders | (17.95 wt %) | (15.74 wt %) | (16.47 wt %) |
| Cu/D powders: | 121.18 g | 121.18 g | 121.18 g |
| 10-22 μm spherical Cu powders | (31.78 wt %) | (30.50 wt %) | (29.15 wt %) |

Figure 27A:
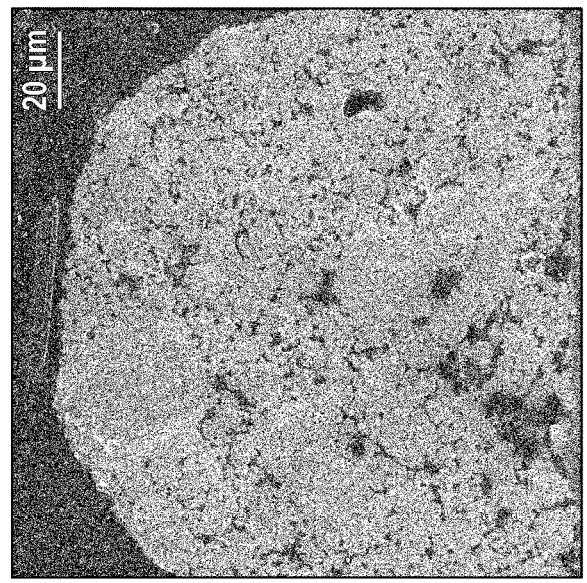
FIGS. 27A, 27B, and 27C are SEM images of cross-sections of fingers printed with exemplary pastes containing different ratios of coarse, medium, small and fine sized copper containing powders.
Figure 27B:
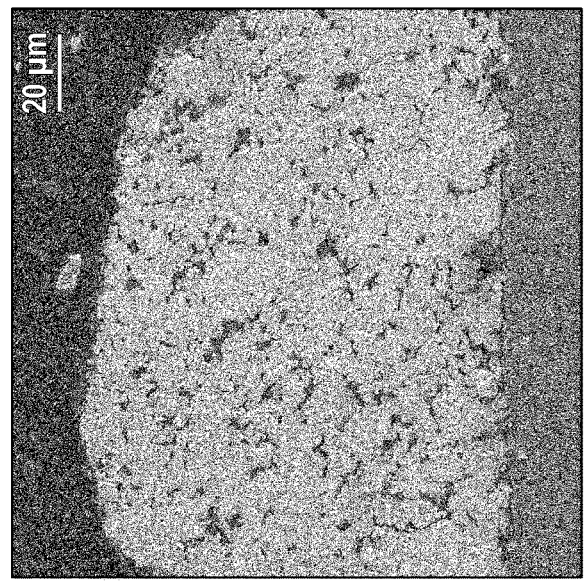
Figure 27C:
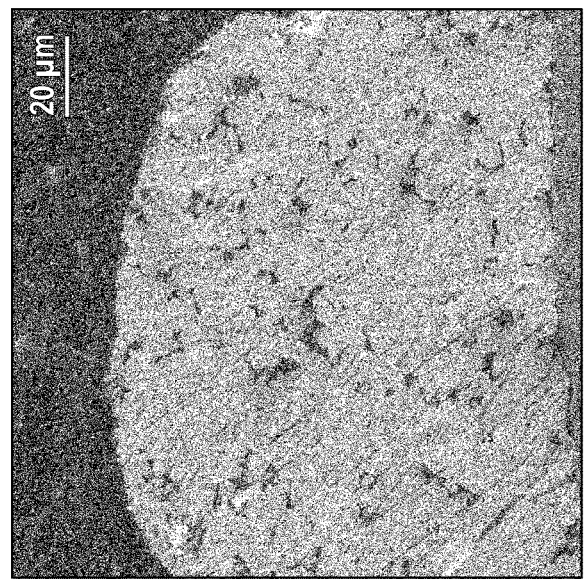

FIGS. 27A, 27B, and 27C show the effect of increasing the amount of secondary oxide particles from (a) 4.98 (Paste 1), to (b) 8.49 (Paste 40) and (c) 12.16 (Paste 39) wt. % on the microstructure. The higher the volume of secondary oxides in the contact, the denser the microstructure. However, as the copper-containing particles formed a denser contact, the structure shrank, and capillary forces pushed the secondary oxide out of the narrowing pores. Due to this densification and shrinkage the prints came off the silicon substrate. The squares were placed on a light box to observe the porosity in the fired prints. The contacts printed with pastes containing 8.49 wt. % and 12.16 wt. % of antimony oxide led to the contact failing to adhere to the silicon cell. A pool of the antimony oxide (and nanoparticles) which had been reduced to their metallic form during the firing process can also be observed at the base of the contact, see FIGS. 28A and 28B.

Figure 28A:
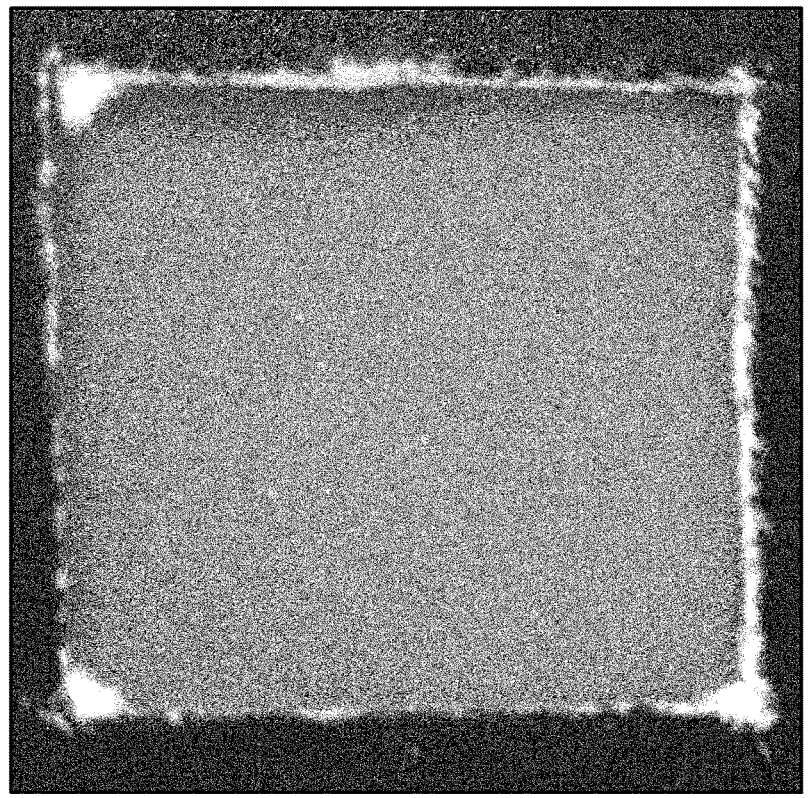
FIGS. 28A and 28B are optical images of a front and back, respectively, of a print made with an exemplary paste, which was formulated to have a low porosity.
Figure 28B:
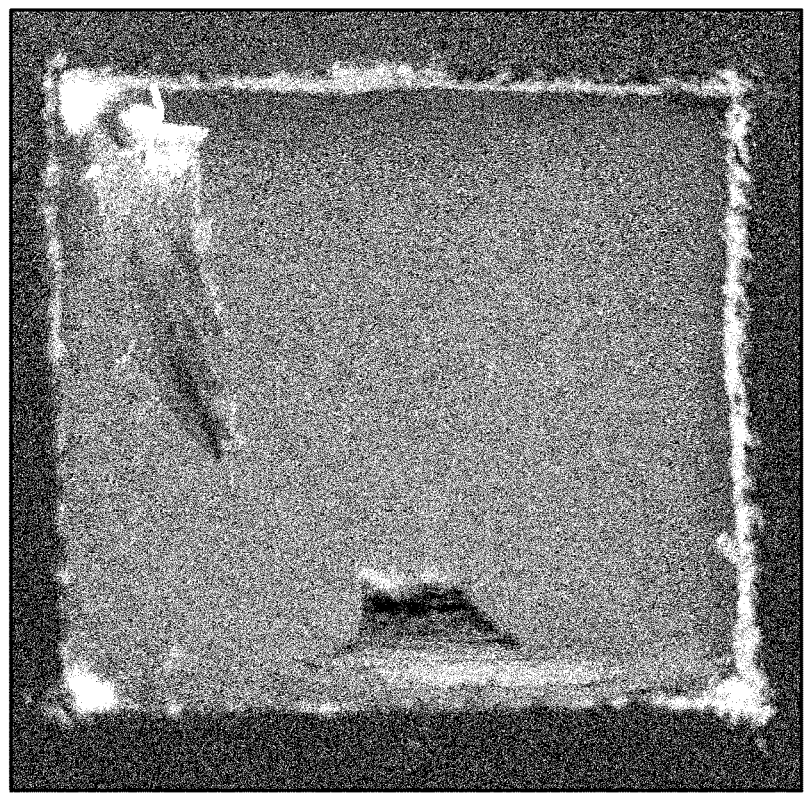
Figure 29A:
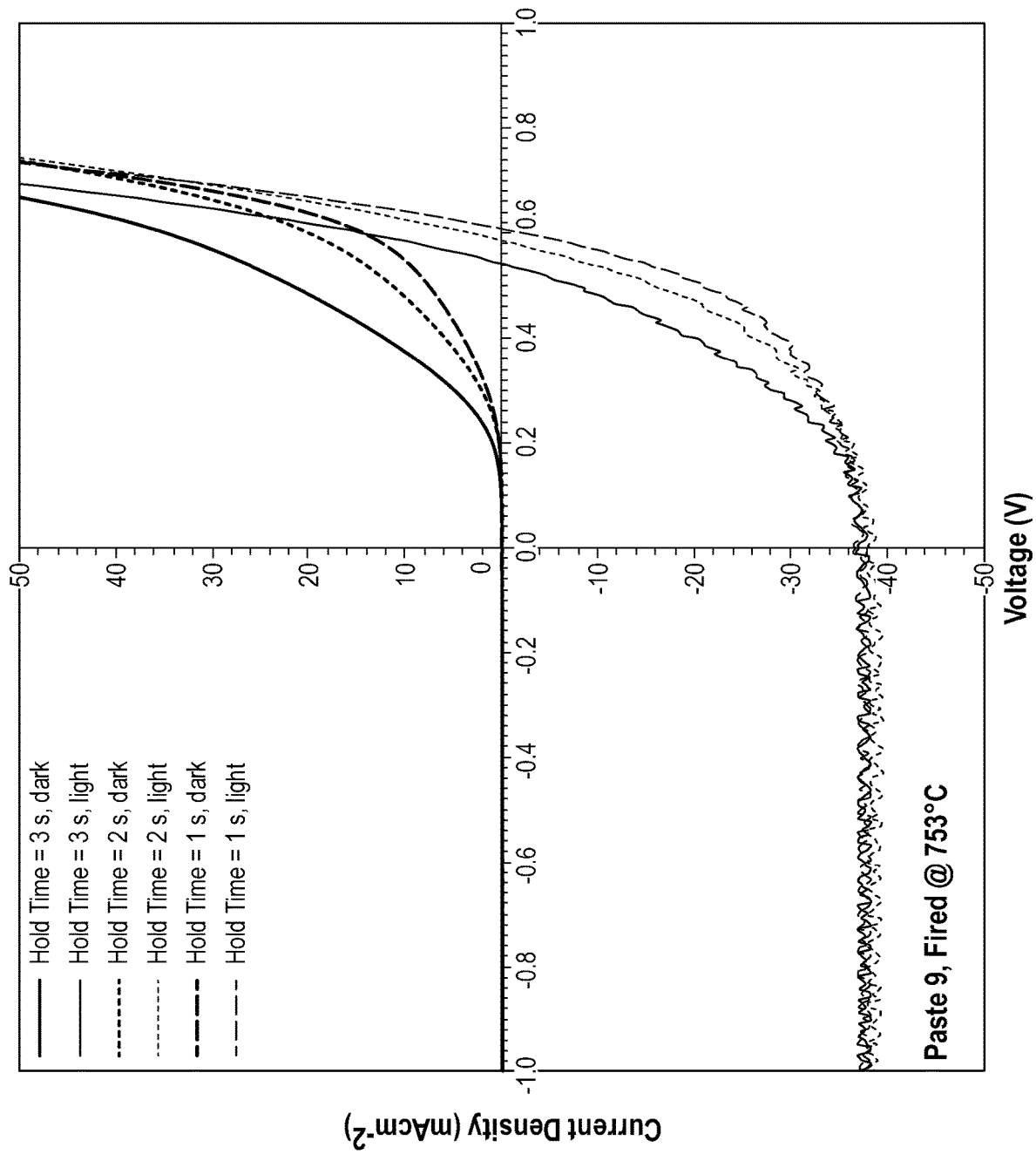
FIGS. 29A, 29B, 29C, 29D, and 29E are voltage vs current density plots for pastes, containing increasing amounts of secondary oxides.
Figure 29B:
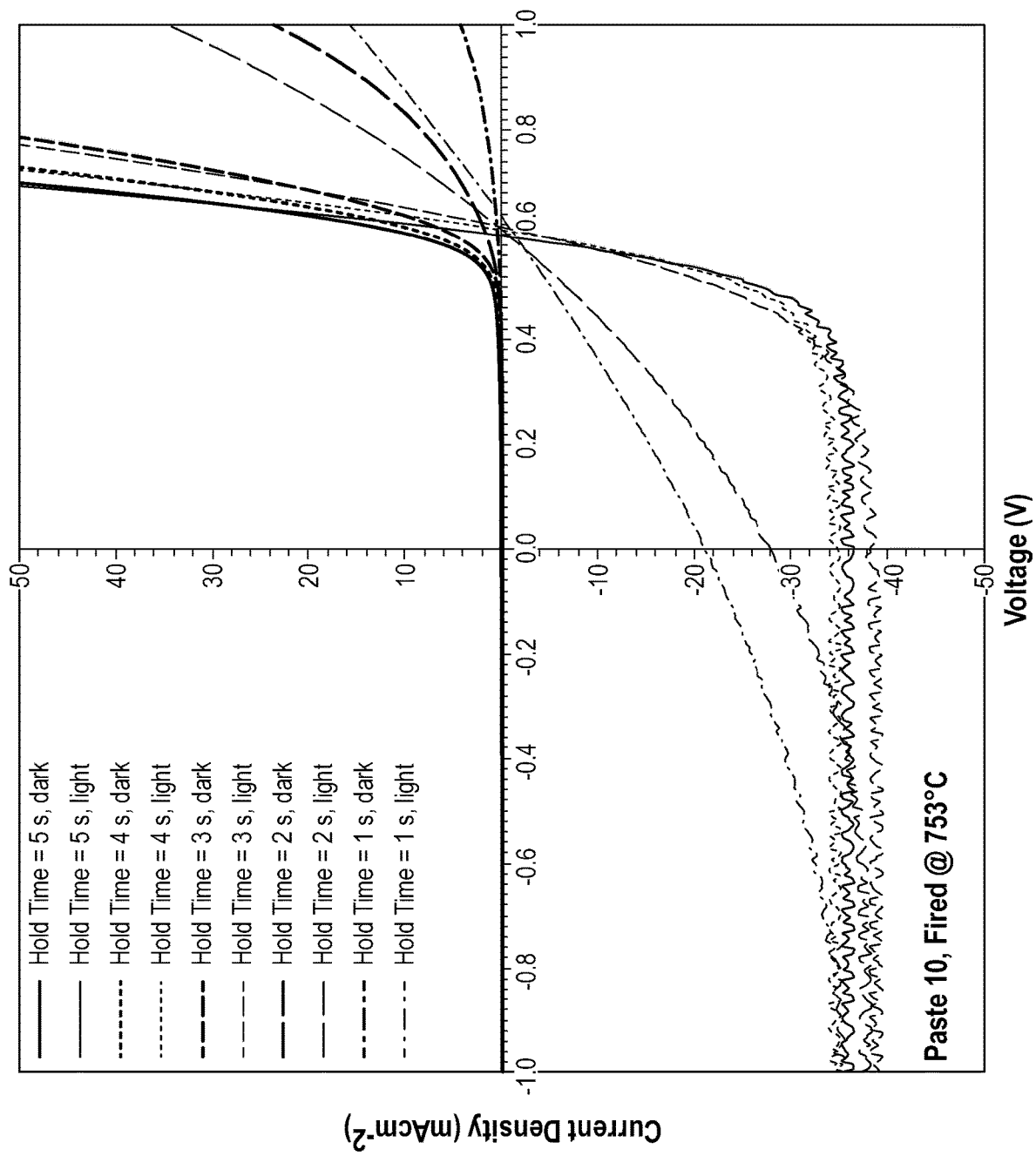
Figure 29C:
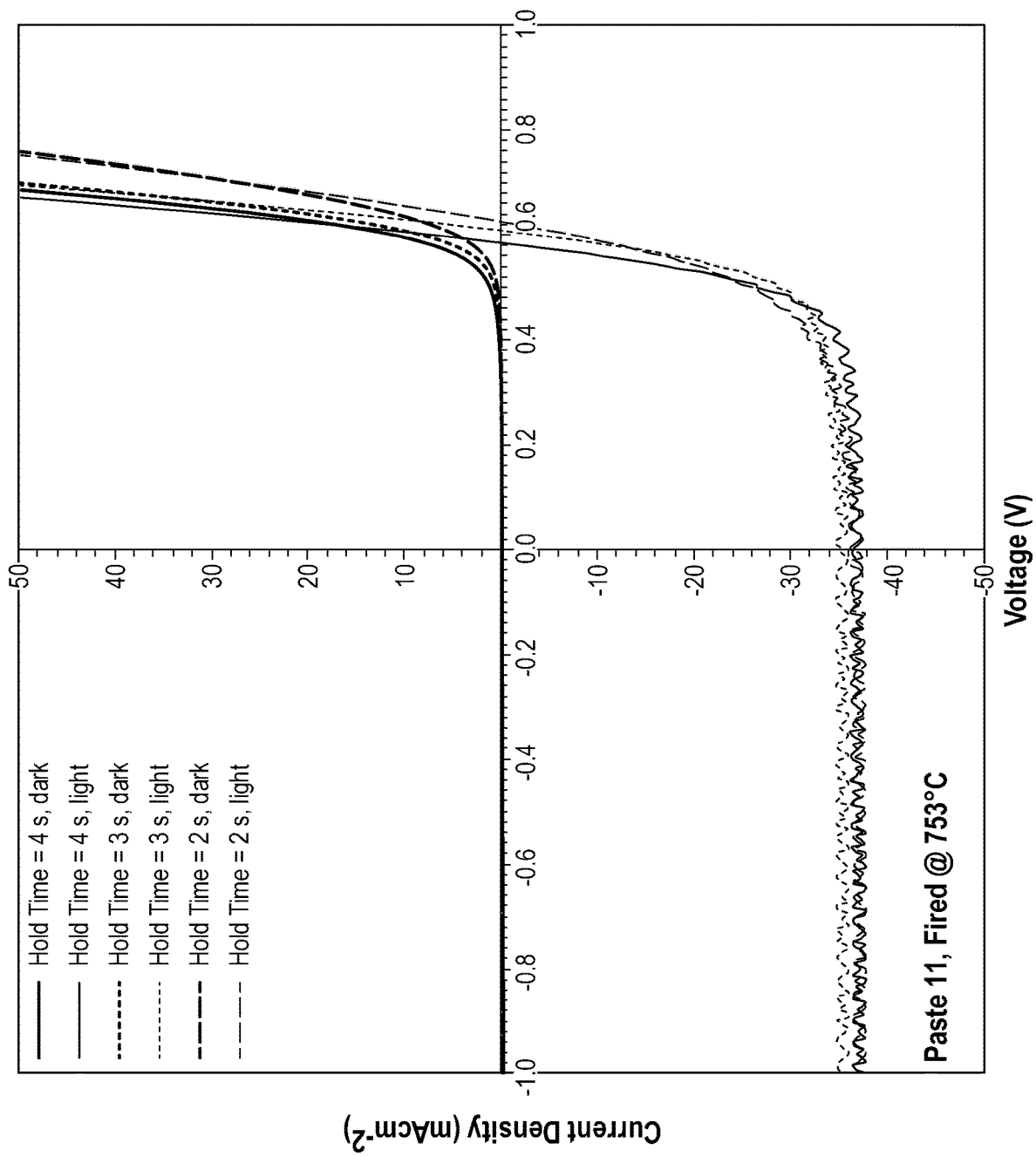
Figure 29D:
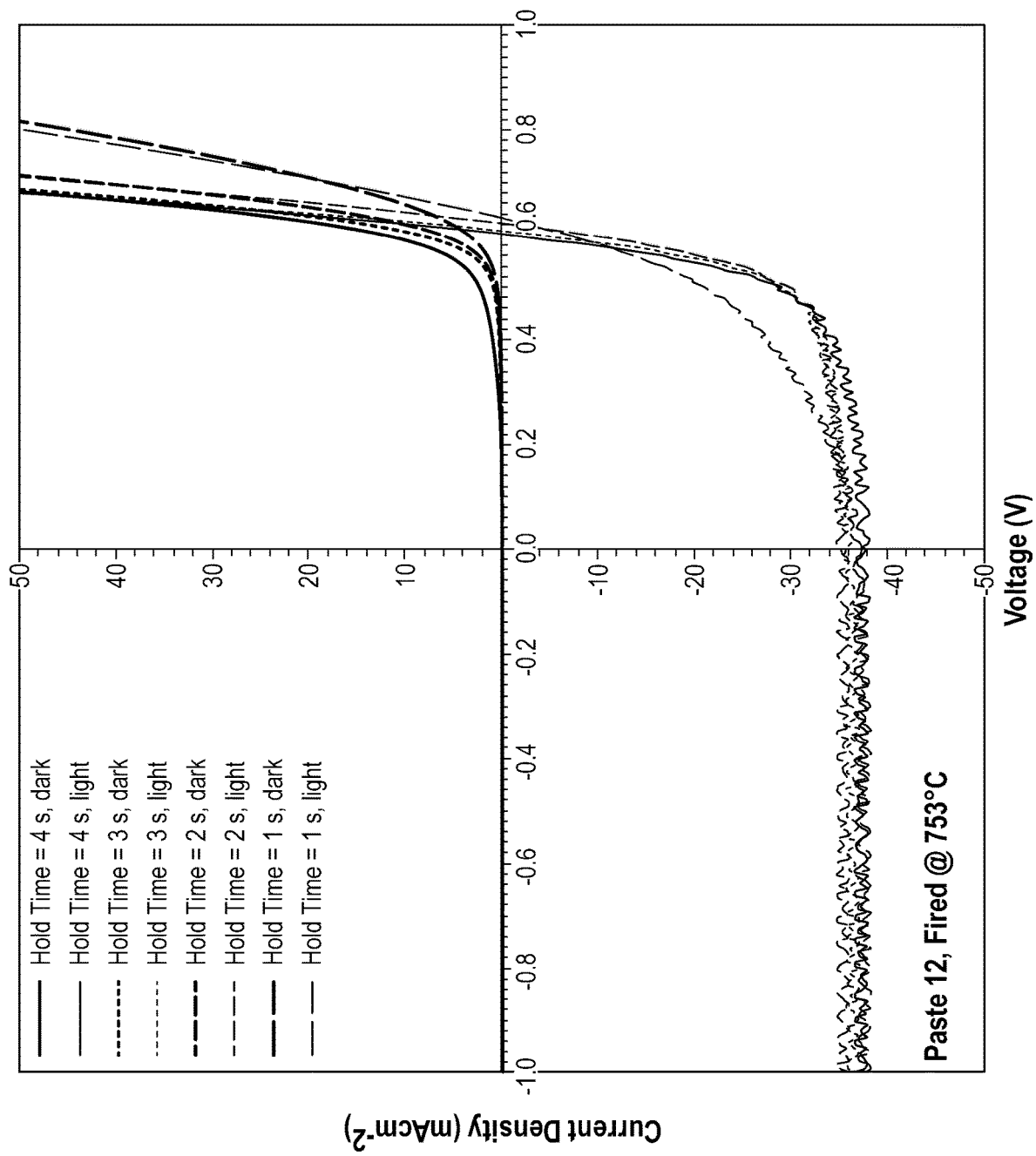
Figure 29E:
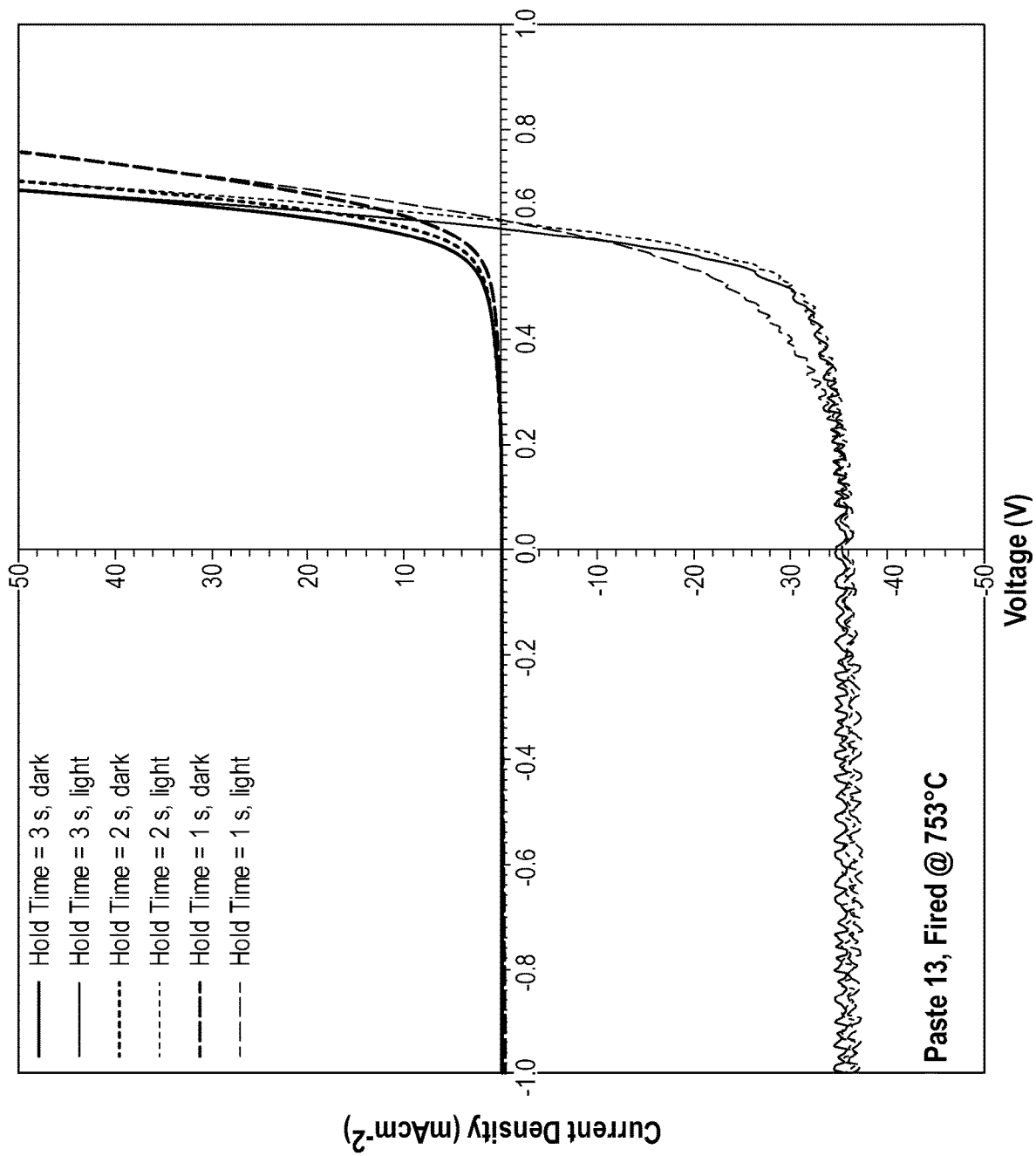

In FIGS. 28A and 28B, a photograph of squares printed Paste 39 is shown with FIG. 28A showing the front and FIG. 28B showing the back of the sample. Due to densification and shrinkage, the prints came off the silicon substrate. The squares were placed on a light box, in order to observe the porosity in the fired prints.

Example 16. Effect of the Secondary Oxide Particles and Nanoparticles on the Etching Function of the Paste and the Firing Conditions In this example, the role the secondary oxide particles and nanoparticles play on the etching functions of the paste is demonstrated. The total surface area contribution of the copper-containing particles used in the pastes was fixed at 0.74 m² per gram of paste. The pastes were printed and fired using the following setup.

The cells were fired in a semi-automated furnace. The system consists of a meter long quartz tube with a volume of approximately 2.4 L. The furnace was built with a low temperature zone (zone 1) and a high temperature zone (zone 2) along the length of the quartz tube. Compressed air with a flow rate of 1 L/min was introduced from the start of zone 1. The cells were placed on a nichrome mesh stage, which has been automated using a stepper motor and Arduino software program, for control of the cell's movement speed. The speed S has an inverse relationship to the time T it takes the cell to travel from zone 1 to zone 2 according to ($T=38.74S^{-1}$). Zone 1 and zone 2 set point temperatures were 150° C. and 753° C., respectively. In a firing procedure, the cell was placed on the nichrome mesh and moved into zone 1 at speed, S, where it was held for 180 s. The cell was then moved in to zone 2 at speed, S and held in zone 2 for time, $t_{hold}$. The stage was then moved back to the start using a speed of 32.4 cm/s. This returned the stage to the start in less than 2 s. The cell was subsequently removed from the stage and rapidly cooled to room temperature by placing it on a metal plate.

FIGS. 29A, 29B, 29C, 29D, and 29E show the current—voltage (I-V) performance of the pastes from Table 21; fired using the method described above. The hold times in zone 2 were varied from 1 s to 5 s. The paste containing no secondary oxide (Paste 9) was able to etch through the SiN layer using hold times of less than 1 s. This paste, however, etched too deeply, leading to lower PV performance. Adding a small amount of the secondary oxide particles (e.g., antimony oxide) to the paste (Paste 10), acts as a barrier to the nanoparticles, and thus slows down the etching carried out by the nanoparticles. As a result, a hold time of 3 s was required before the paste etched through the SiN layer and made a good electrical contact to the cell. Increasing the amount of secondary oxides further (Paste 11, Paste 12, and Paste 13) resulted in the hold time being reduced to 2 s. The secondary oxide also acts as an etchant. But, unlike the material of the nanoparticles, during the firing process, the molten material of the secondary oxide appears to wet and etch the SiN layer more uniformly than the material of the nanoparticles. It is believed that a smaller proportion of nanoparticles are required to etch through the SiN coating and to allow the finger to have a higher volume of copper. By varying the ratio of nanoparticles and secondary oxide particles in the paste, the firing conditions can be controlled.

TABLE 21

| Material | Paste 9 | Paste 10 | Paste 11 | Paste 12 | Paste 13 |
|---|---|---|---|---|---|
| Organic Binder: PVP 40,000 | 2.76 g (1.53 wt %) | 2.79 g (1.53 wt %) | 2.83 g (1.53 wt %) | 2.88 g (1.53 wt %) | 2.92 g (1.52 wt %) |
| Organic Solvent: Propylene Glycol | 9.47 g (5.24 wt %) | 9.54 g (5.23 wt %) | 9.88 g (5.23 wt %) | 10.18 g (5.40 wt %) | 10.57 g (5.51 wt %) |
| A/B/C nanoparticles: Ni/Ni/Pb NPs | 2.75 g (1.52 wt %) | 2.75 g (1.51 wt %) | 2.75 g (1.48 wt %) | 2.75 g (1.46 wt %) | 2.75 g (1.43 wt %) |
| Secondary Oxide: $Sb_2O_3$ | 0 g (0 wt %) | 1.38 g (0.76 wt %) | 4.13 g (2.23 wt %) | 6.88 g (3.65 wt %) | 9.64 g (5.06 wt %) |
| Cu/D powders: Cu/Ni(?)P - fine copper powders (1.2-3.2 microns) | 49.74 g (27.52 wt %) | 49.74 g (27.29 wt %) | 49.74 g (26.83 wt %) | 49.74 g (26.39 wt %) | 49.74 g (25.95 wt %) |
| Cu/D powders: Cu/Ni(?)P -large spherical copper powders (10-20 microns) | 116.05 g (64.20 wt %) | 116.05 g (63.68 wt %) | 116.05 g (62.60 wt %) | 116.05 g (61.57 wt %) | 116.05 g (60.55 wt %) |
| Total vol % Cu (solids only) | 87.53 vol % | 86.37 vol % | 84.15 vol % | 82.03 vol % | 80.02 vol % |
| Copper Containing Particles/ NP ratio (by weight) | 60.29 | 60.29 | 60.29 | 60.29 | 60.29 |
| Secondary Oxide/ NP ratio (by weight) | — | 0.50 | 1.50 | 2.50 | 3.51 |
| Copper Containing Particles to Secondary Oxide ratio (by weight) | — | 120.14 | 40.14 | 24.10 | 17.20 |

Example 17. Effect of the Surface Area of the Copper-Containing Particles with Nickel on the Etching Functions of the Paste and Firing Conditions This example shows the effect the copper-containing particles have on the etching and firing conditions of the paste. Table 6 shows the compositions of the pastes used in this example. All the pastes used a secondary oxide particles of antimony oxide to nanoparticle (Ni/Ni/Pb) ratio of 1.50. The proportion of nickel nanoparticles in the coating surrounding the copper particles is quantified via the surface area of the coated copper powders.

To vary the proportions of nickel nanoparticles in the paste, the surface area of the fine copper-containing particles in the pastes were varied. This was done by blending different batches of copper powders with surface areas of 1.13, 2.61 and 25.63 $m^2/g$ to produce pastes containing 0.74 (Paste 11), 0.83 (Paste 14), 1.01 (Paste 15) and 1.10 (Paste 16) $m^2$ of copper-containing particles per gram of paste.

Samples were fired using the firing process described in Example 16. The cells, were fired using zone 2 temperatures of 753° C., 778° C., and 803° C. with a stage speed of 1.43 cm/s. Table 22 (below) shows the time for which the cells were held in zone 2 to etch through the SiN layer and make a contact to produce FF>0.6. As shown, the time required increased as the surface area of the copper-containing particles was increased. When a highest zone 2 temperature (i.e., 803° C.) was used, the nickel particles on the copper particles no longer assisted in slowing down the etching process, and actually resulted in the cells being overfired.

TABLE 22

| Surface Area contribution from the copper containing particles (m² per gram of paste) | Hold Time Zone 2 (s) Zone 2 Temperature (° C.) | | |
|---|---|---|---|
| | 753° C. | 778° C. | 803° C. |
| 0.74 m² per gram of paste | 3 s | 2 s | 0 s |
| 0.83 m² per gram of paste | 4 s | 3 s | 1 s |
| 1.01 m² per gram of paste | 6 s | 3 s | 2 s (overfired) |
| 1.10 m² per gram of paste | 6 s | 4 s | 2 s (overfired) |

Figure 30A:
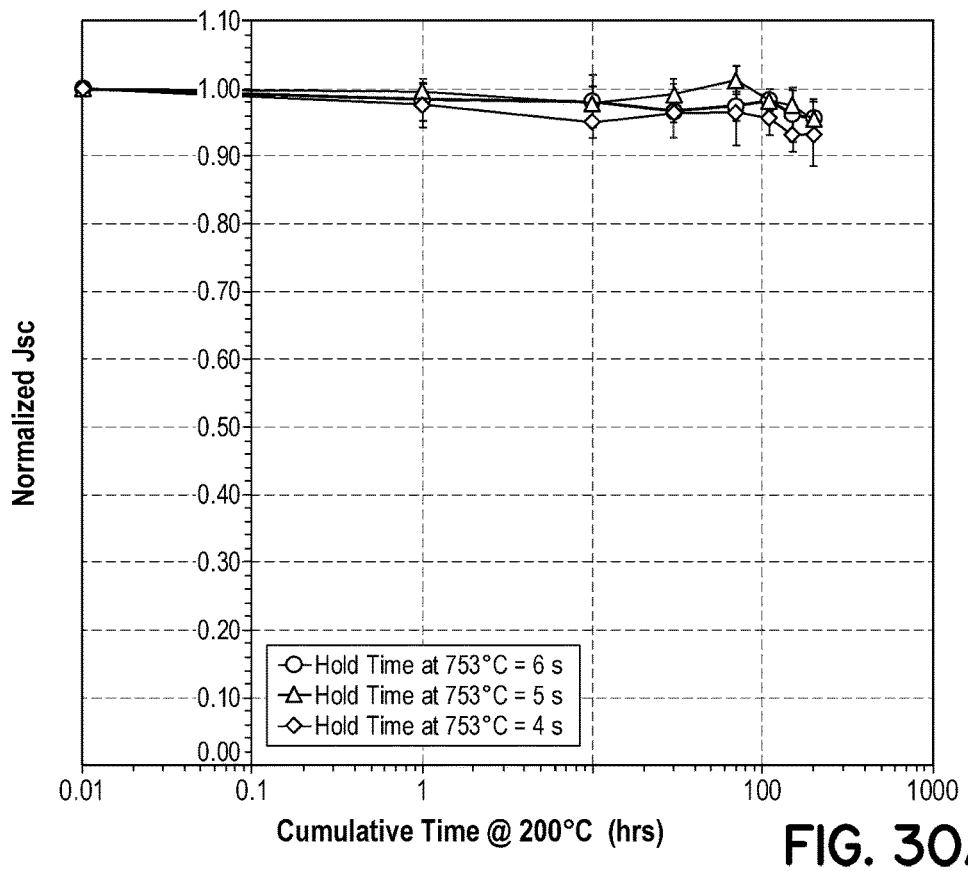
FIGS. 30A, 30B, 30C, 30D, and 30E are graphs of an accelerated aging test on the normalized short circuit current density ($J_{sc}$), normalized fill factor (FF), open circuit voltage ($V_{oc}$), normalized efficiency ($\eta$), and normalized resistance for an exemplary paste fired for increasing durations.
Figure 30B:
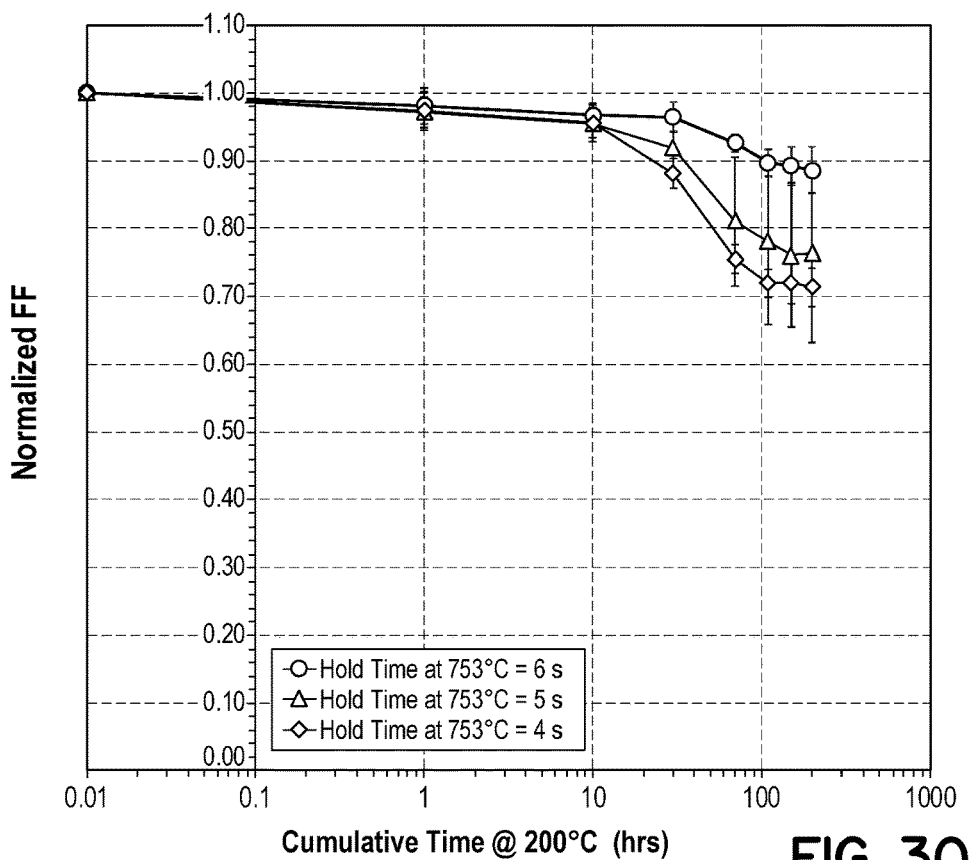
Figure 30C:
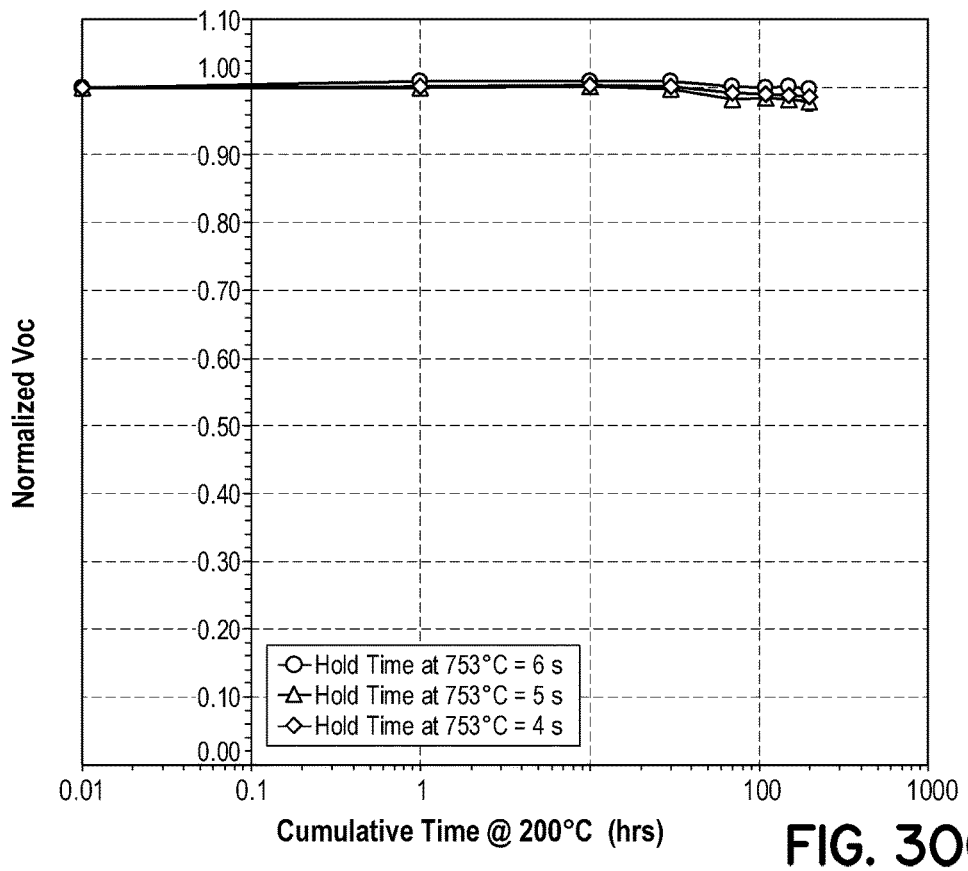
Figure 30D:
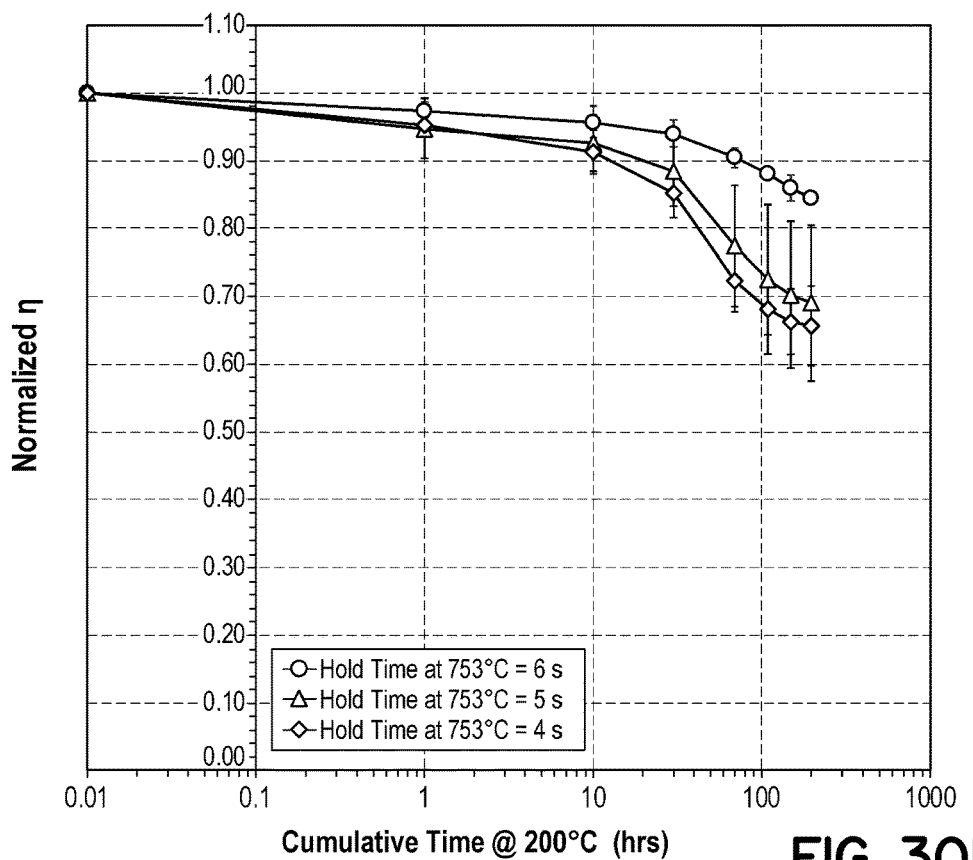
Figure 30E:
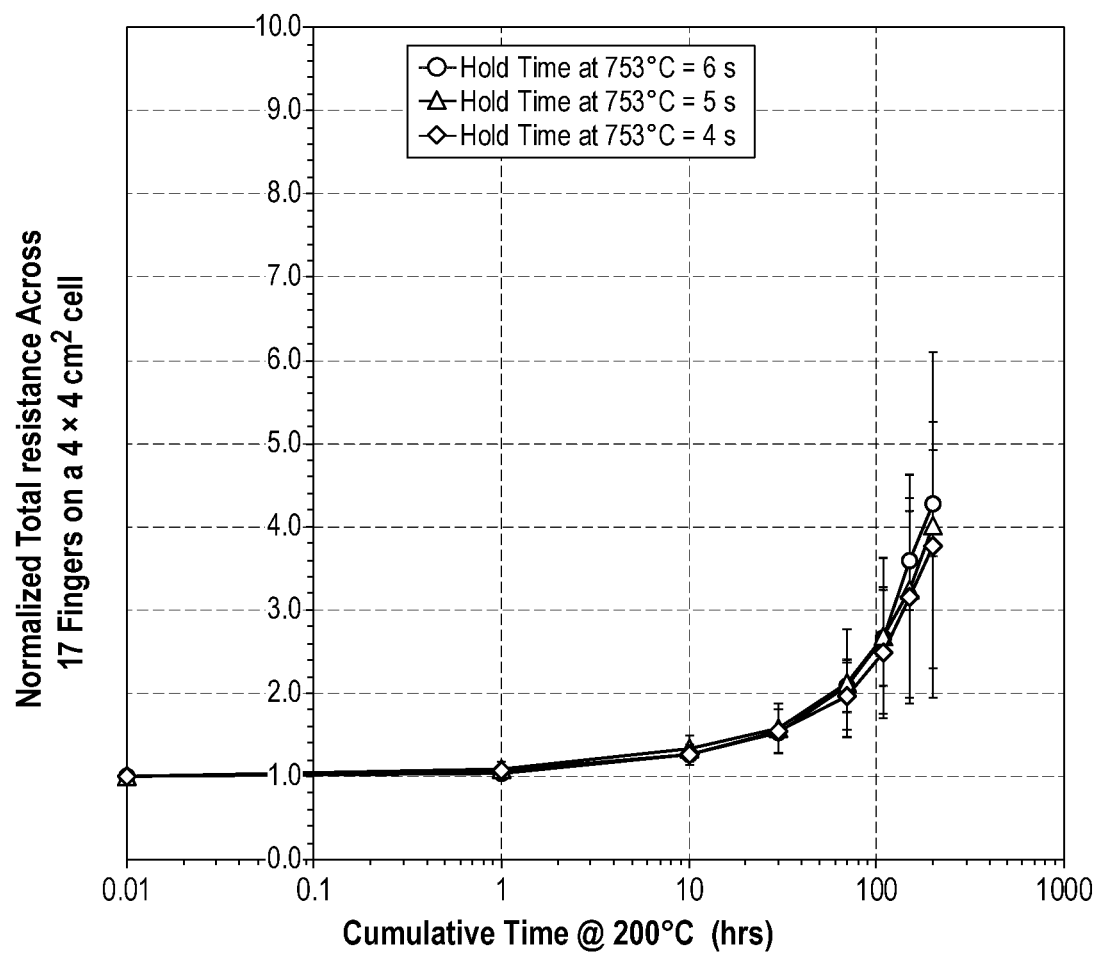
Figure 30F:
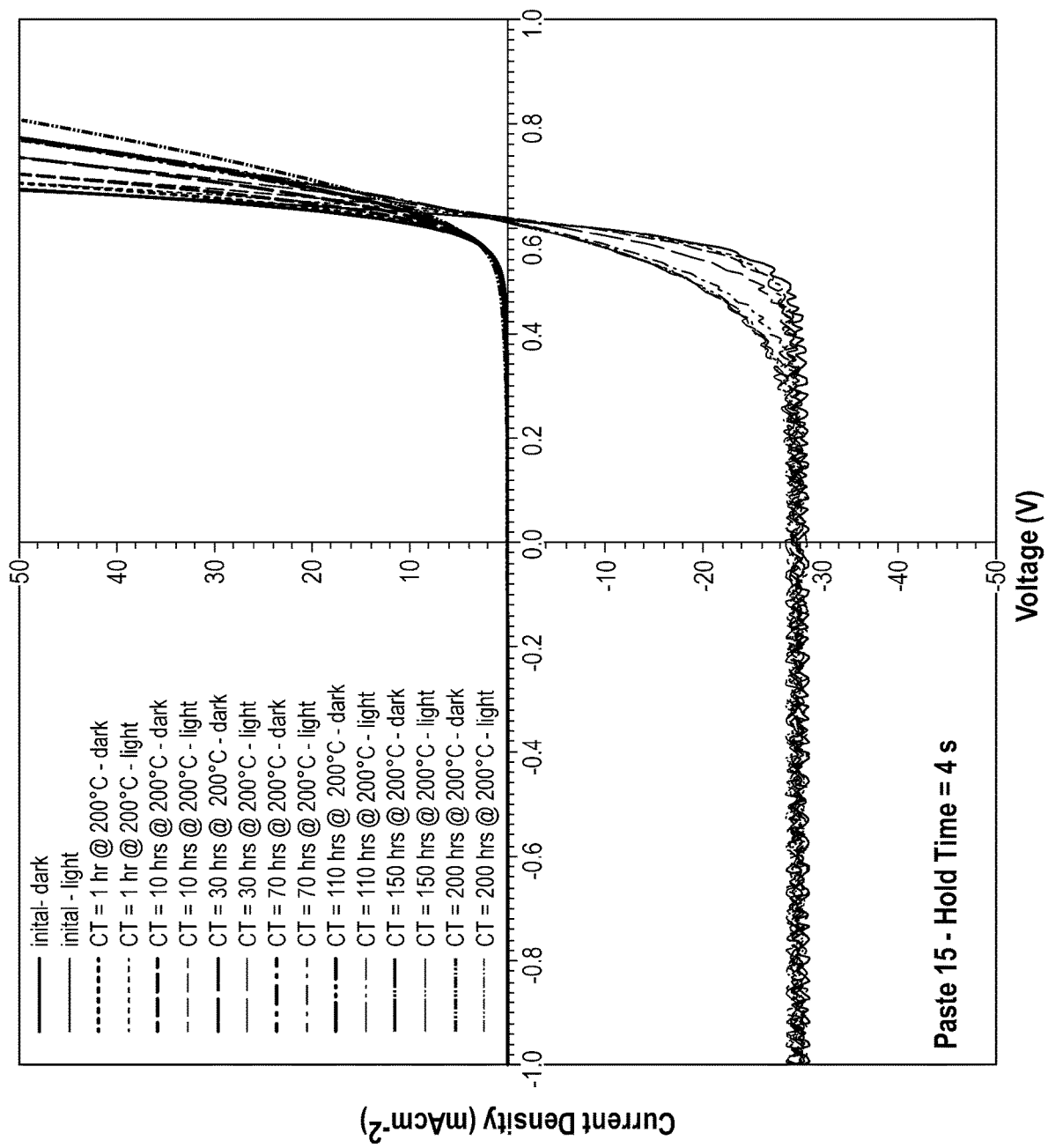
FIGS. 30F, 30G, and 30H are plots of current density vs voltage for an accelerated aging test on exemplary pastes fired for increasing durations.
Figure 30G:
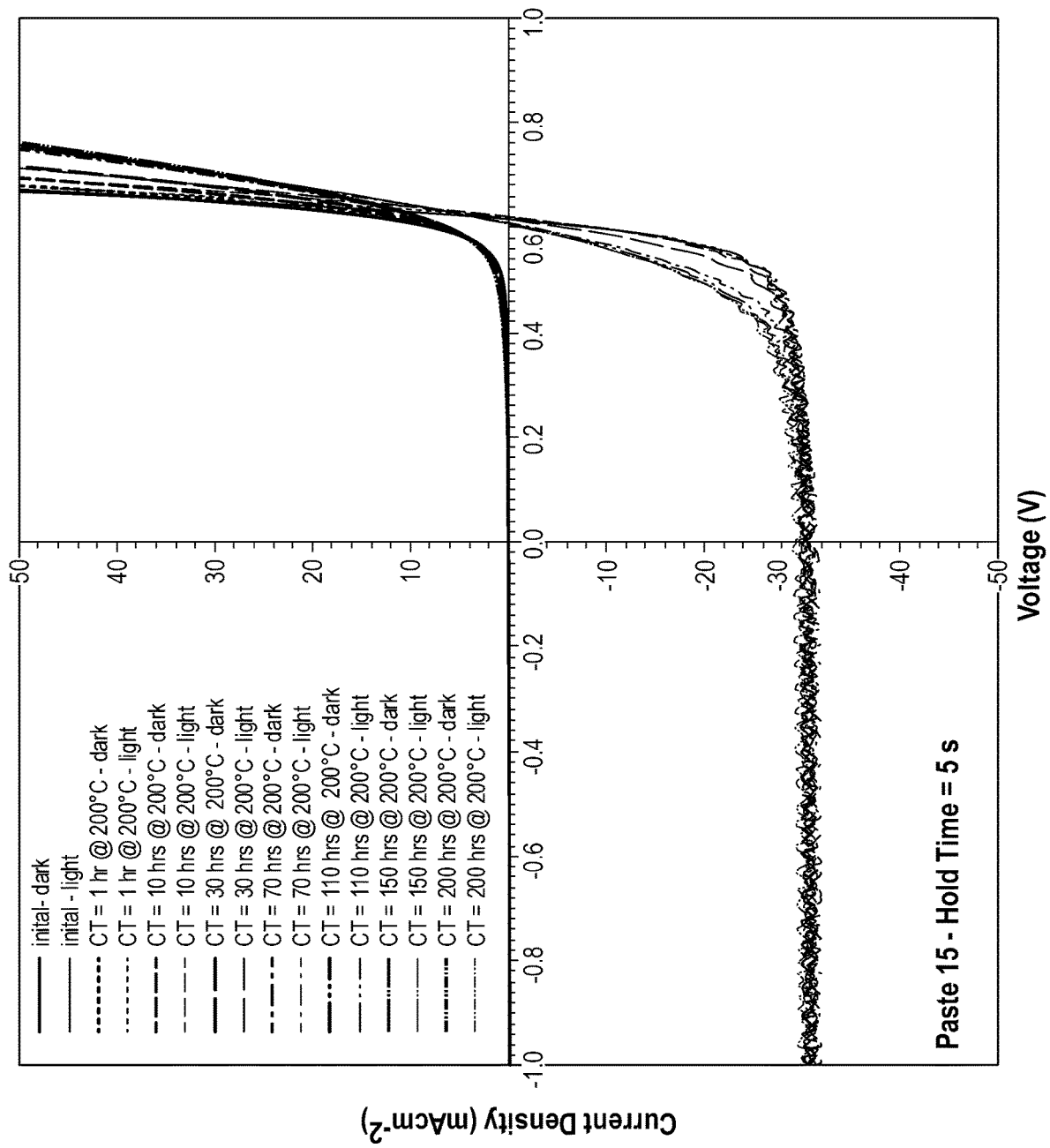
Figure 30H:
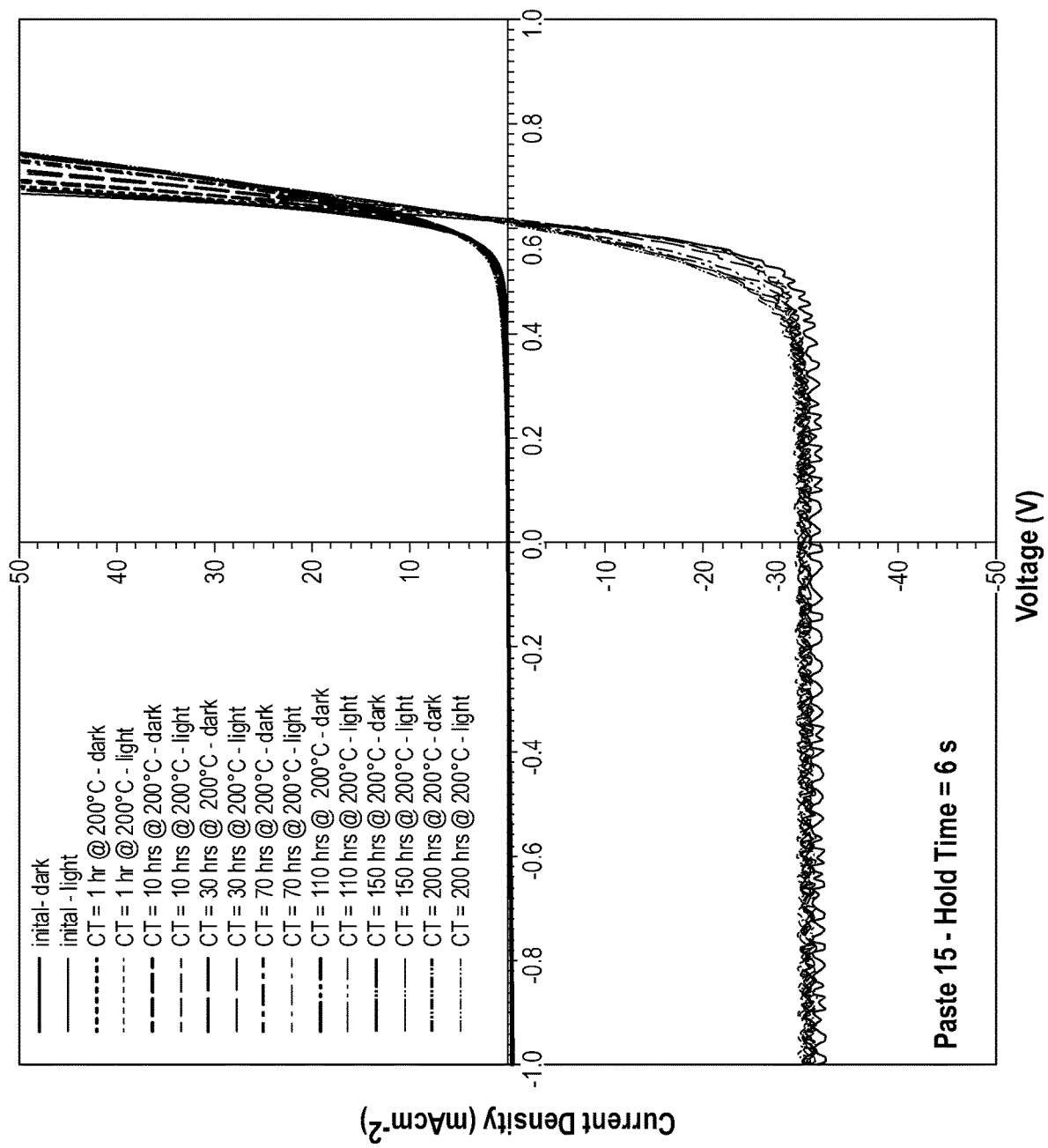

Example 18. Effect of Firing Duration on Performance During Accelerated Aging Tests This example shows the effect the firing conditions can have on the durability of the cells under accelerated aging conditions. The paste was used to metallize mono crystalline silicon solar cells with a full Al BSF rear contact. The paste (Paste 15) shown in Table 6 used a total of 1.01 m² of copper containing particles with nickel per gram of paste. The cells were fired using the procedure described in Example 16 and a stage speed of 1.43 cm/s and zone 2 temperature of 753° C. The time the cells were held in zone 2 was varied. FIGS. 30F-30H show exemplary examples of the I-V curves of cells held for 4, 5 and 6 s at 753° C., respectively. The cells were thermally stressed at 200° C. for up to 200 hrs and the PV performance of the devices over the test duration are also shown in FIGS. 30A-30E. Without being bound by theory, it is believed that the nanoparticles form an electrical pathway through the glassy interface and also form "spikes" in the surface of the silicon. The results show the effect of increasing the firing duration on the lifetime of the cells, with the cells exhibiting improved lifetime after firing for longer firing durations.

Example 19: Secondary Oxide to Nanoparticle Ratio

The secondary oxide particles, nanoparticles, and particles from the coated copper-containing particles in the paste form a liquid sintering aid during the firing process, resulting in the fingers forming a denser contact. The nanoparticles contain lead oxides/hydroxides, which when combined with the other materials lowers the melting point of the mixture. As the organic material burns off, it can expel droplets of the liquid sintering aid across the surface of the cell. These droplets can create an undesirable cosmetic blemish to the surface of the cell. The surface blemish is thought to impede the number of photons reaching the active region of the cell, and thus reduce power output. By changing the ratio of the secondary oxide to nanoparticle ratio, the amount of droplet appearing on the surface can be controlled (FIGS. 32(a)-(f)). In FIGS. 32(a)-(f), the following apply: optical microscope images of the fingers after firing. The mass of paste used to print the fingers was approximately 4 mg per 1/16$^{th}$ (4×4 cm²) cell (about 64 mg for a full cell). (a) The fingers were printed with a paste containing no nanoparticles (Paste 42). The fingers in the remaining images were printed using fingers containing a secondary oxide to nanoparticle ratio of (b) 16.75 (Paste 43), (c) 8.37 (Paste 44), (d) 5.58 (Paste 45), (e) 4.19 (Paste 46) and (f) 3.35 (Paste 47). Table 23 (below) shows the compositions of pastes made with no nanoparticles, and with a secondary oxide particle to nanoparticle ratio of 16.75, 8.37, 5.58, 4.19, and 3.35.

TABLE 23

| Material | Paste ID | | | | | |
|---|---|---|---|---|---|---|
| | Paste 42 | Paste 43 | Paste 44 | Paste 45 | Paste 46 | Paste 47 |
| Organic Binder: PVP 40,000 | 4.26 g (2.06 wt %) | 4.28 g (2.06 wt %) | 4.31 g (2.05 wt %) | 4.34 g (2.05 wt %) | 4.36 g (2.05 wt %) | 4.39 g (2.04 wt %) |
| Organic Solvent: Dipropylene Glycol | 18.59 g (8.97 wt %) | 18.71 g (8.98 wt %) | 19.35 g (9.42 wt %) | | | 20.24 g (9.43 wt %) |
| Organic Solvent: Tripropylene Glycol | | | | 19.85 g (9.37 wt %) | 20.09 g (9.42 wt %) | |
| A/B/C nanoparticles: Ni/Ni/Pb NPs (higher Pb content) | 0 g (0 wt %) | 1.11 g (0.53 wt %) | 2.22 g (1.06 wt %) | 3.33 g (1.57 wt %) | 4.44 g (2.08 wt %) | 5.55 g (2.59 wt %) |
| Secondary Oxide: Sb$_2$O$_3$ | 18.59 g (8.97 wt %) | 18.59 g (8.92 wt %) | 18.59 g (8.84 wt %) | 18.59 g (8.77 wt %) | 18.59 g (8.72 wt %) | 18.59 g (8.66 wt %) |
| Cu/D powders: Cu/Ni(?)P - fine copper powders (1.2-3.2 microns) | 165.79 g (80.00 wt %) | 165.79 g (79.52 wt %) | 165.79 g (78.85 wt %) | 165.79 g (78.24 wt %) | 165.79 g (77.74 wt %) | 16.79 g (77.27 wt %) |
| Secondary Oxide to Nanoparticle ratio | — | 16.75 | 8.37 | 5.58 | 4.19 | 3.35 |
| Total surface area for the copper powders per gram of paste (m² per gram of paste) | 0.51 | 0.51 | 0.51 | 0.51 | 0.51 | 0.60 |

The amount of paste used to print the fingers directly impacts the maximum secondary oxide particle to nanoparticle ratio that can be used; with fingers using less paste being able to tolerate a relatively smaller ratio, before this cosmetic blemish becomes an issue. However, pastes using a higher ratio, require a higher proportion of the overall amount of glass frits (i.e., combined secondary oxides and nanoparticles), as the secondary oxide is a less aggressive etchant than the nanoparticles. As the finger width (W) dimension decreases (see FIG. 6), the amount of etchants per unit area is reduced. Therefore, this ratio may be reduced further as the finger width is reduced. Example 16 (Table 21) shows pastes with a ratio of 0.50. Table 21 also shows a paste containing no secondary oxide particles and only nanoparticles, while Table 23 shows a paste containing no nanoparticles and only the secondary oxide particles.

Example 20: Effect of Finger Dimension on Paste Composition

This example illustrates the impact of finger dimensions on the composition of the paste. The finger dimension can be reduced by reducing the number of prints, leading to a reduction in the height of the fingers. The height as well as the width of the fingers can also be changed by reducing the dimensions of the pattern, mesh and emulsion thickness used by the screen during the screen-printing process.

Reducing the height of the fingers reduces the amount of paste on the cell. This reduces the proportion of nanoparticles and secondary oxide particles available per unit area. At a certain point, the amount of these materials is insufficient to etch through the anti-reflective coating. The etching rate of the combined nanoparticles and secondary oxide particles is lowered by the particles coated on the copper-containing particles. The more particles in the paste, the more nanoparticles and secondary oxide particles are required. However, as the proportion of these materials are increased, the bulk resistivity gradually increases. The quantity of particles in the paste is defined by the surface area of the coated copper-containing particles.

Figure 33A:
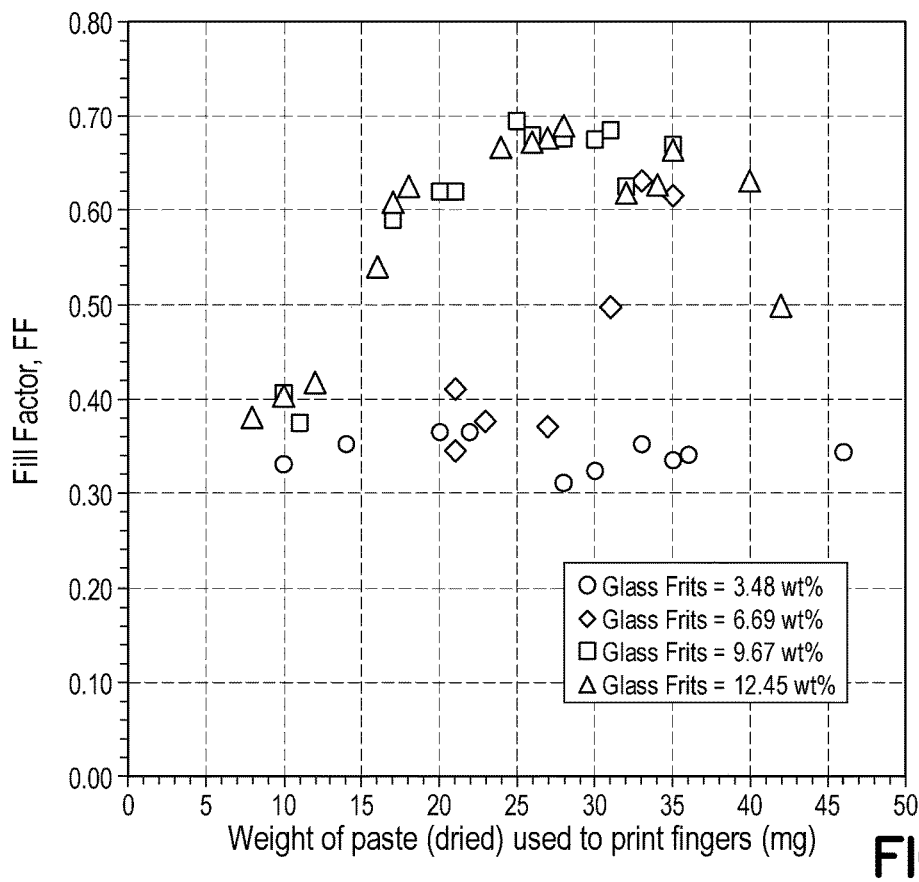
FIGS. 33A and 33B show the impact of increasing the amount of glass frits in the paste on the PV performance (Fill Factor, FF) as a function of the printed weight for pastes made using copper containing powders a surface area contribution of (a) about 0.80 and (b) 0.57 m$^2$ per gram of paste.
Figure 33B:
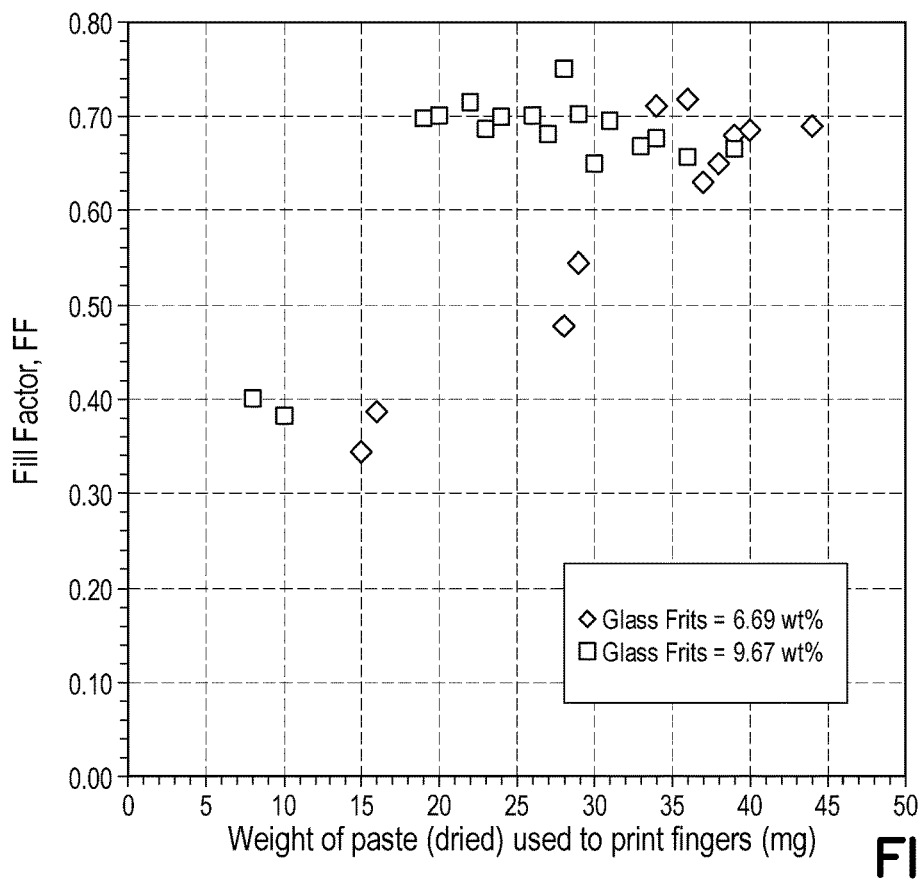
Figure 34A:
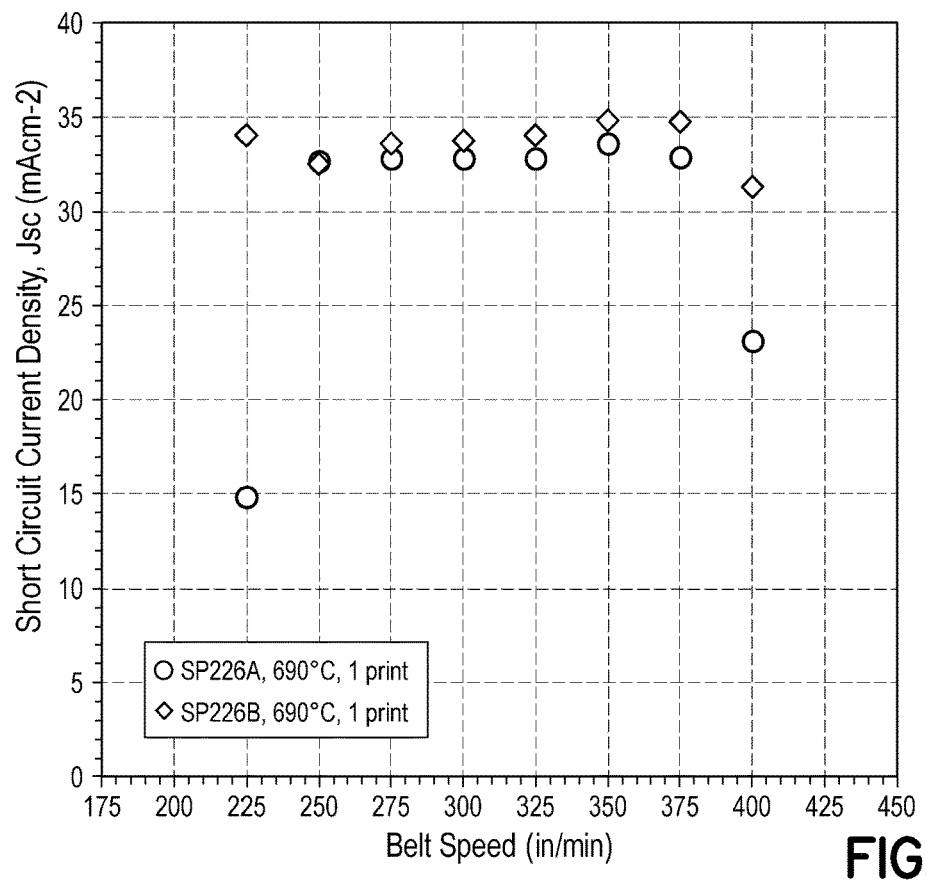
FIGS. 34A, 34B, 34C, and 34D show PV performance (FIG. 34A short circuit current density, FIG. 34B open circuit voltage, FIG. 34C fill factor, and FIG. 34D efficiency, respectively) as a function of the belt speed used to fire the cells in an industrial IR belt furnace.
Figure 34B:
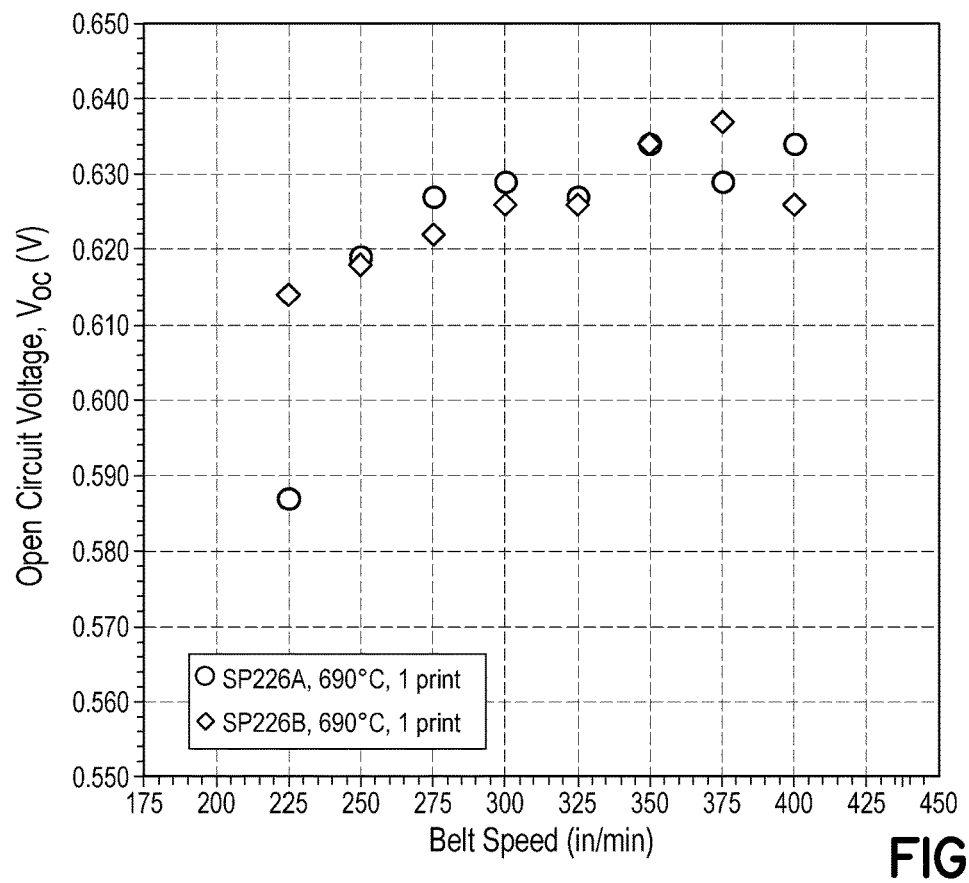
Figure 34C:
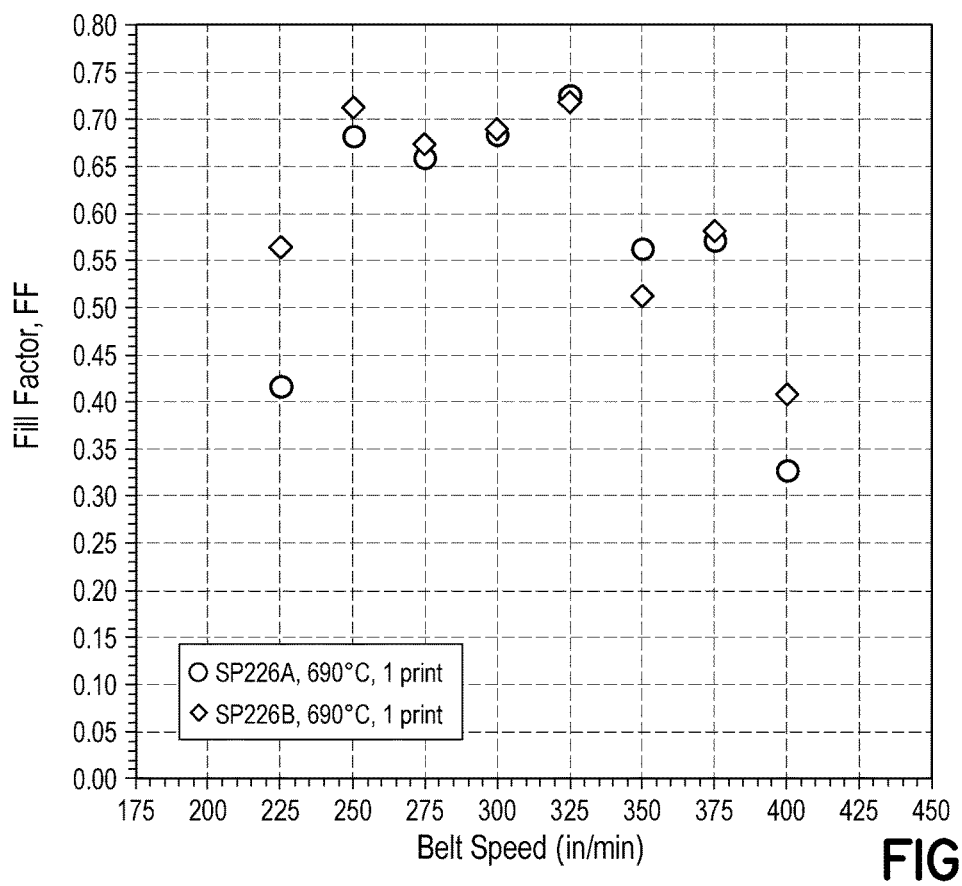
Figure 34D:
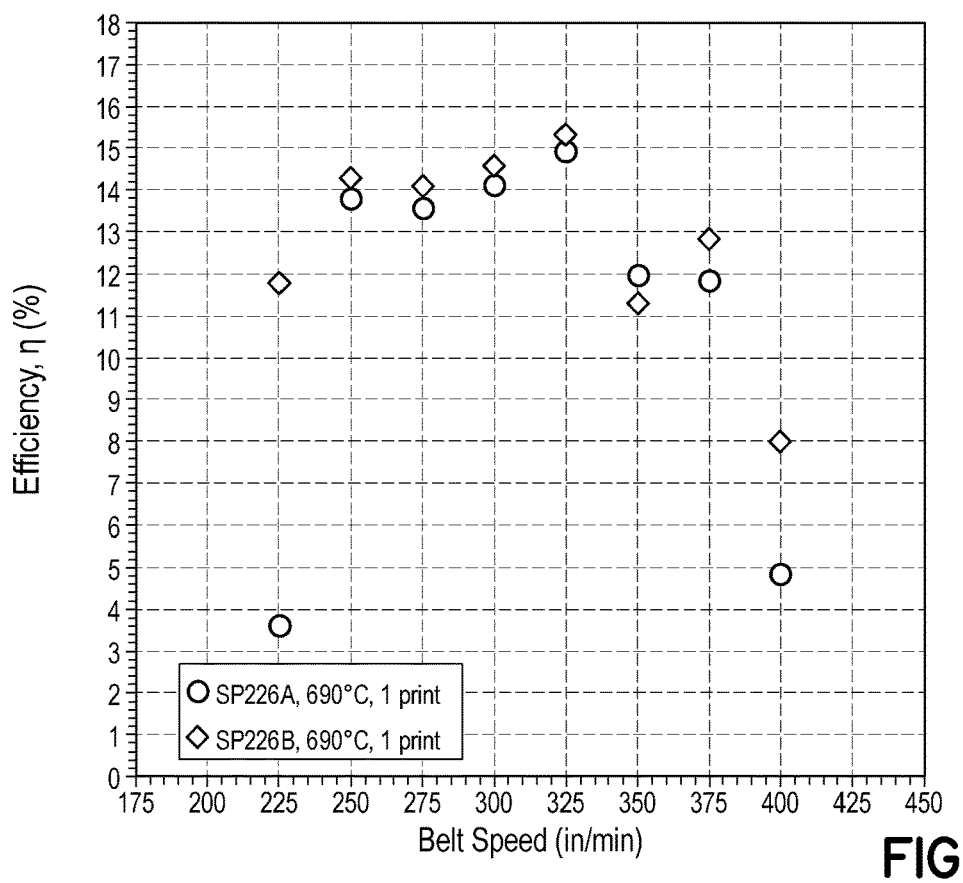

The amount of power generated by a solar cell is dependent on the number of photons of light reaching the cell. Therefore, the larger the area covered by the electrical conductors, the less photons reach the cell and the lower the power output. In order reduce the dimensions of the fingers, and thus the amount of paste used to print the fingers without impacting the performance of the devices, the surface area for the copper containing particle per gram of paste needed to be reduced. To reduce the finger width, a pattern opening size on a screen is reduced. Since, the theoretical maximum particle size should be at least 2.5 times smaller than the mesh opening, the average particle size also needed to be reduced. The copper-containing particle has the largest particles in the paste. Consequently, reducing the particle size distribution range of this material naturally leads to an increase in the amount of coating in the paste. When the particle size range of coarse copper-containing particles in the paste was lowered from a particle size range of 10-22 μm to 7.5-14.7 μm, the proportion of binder in the paste was increased, as the larger surface area made the powders more susceptible to oxidation during the firing process. The pastes were printed on poly crystalline silicon solar cells and fired using the same semi-automated furnace described in Example 16. FIGS. 33(a) and 33(b) show the impact of increasing the amount of glass frit and surface area contribution of the copper-containing particles on the amount of paste needed to maintain the fill factor of the device. In FIGS. 33(a) and 33(b), the following applies: impact of increasing the amount of glass frits in the paste on the PV performance (Fill Factor, FF); as a function of the printed weight for pastes made using copper-containing powders a surface area contribution of (a) 0.80 and (b) 0.57 m$^2$ per gram of paste. The cells were fired using stage speed=1.43 cm/s, zone 1=192° C., zone 2=820° C., air flow=5 L/min, zone 2 hold time=5 s. The cells were printed with 17, 100 μm wide fingers on a 4×4 cm$^2$ poly crystalline silicon cell. The compositions of the pastes are shown in Table 24 (below). The pastes used a secondary oxide to nanoparticle ratio of about 16.75. The results show that a reduction in the mass of paste needed to print the fingers can be achieved by reducing the surface area contribution of the copper containing particles from about 0.80 to about 0.57 m$^2$ per gram of paste. The surface area contribution of the copper containing particles was controlled by lowering the surface area of the fine copper powders in the paste from 2.41 m$^2$/g to 1.61 m$^2$/g. Thus far, the amount of paste used to print the fingers has been controlled by the number prints, that is, 3 prints. The reduction in surface area led to the print process being able to use a double print method to achieve devices with a similar performance.

TABLE 24

| Material | Paste 48 | Paste 49 | Paste 50 | Paste 51 | Paste 52 | Paste 53 |
|---|---|---|---|---|---|---|
| Organic Binder: PVP 40,000 | 4.48 g (2.37 wt %) | 4.65 g (2.37 wt %) | 4.82 g (2.37 wt %) | 4.99 g (2.37 wt %) | 4.65 g (2.37 wt %) | 4.82 g (2.37 wt %) |
| Organic Solvent: Propylene Glycol | 12.46 g (6.58 wt %) | 12.94 g (6.58 wt %) | 13.41 g (6.58 wt %) | 13.89 g (6.58 wt %) | 12.94 g (6.58 wt %) | 13.41 g (6.58 wt %) |
| A/B/C nanoparticles: Ni/Ni/Pb NPs | 0.37 g (0.20 wt %) | 0.74 g (0.38 wt %) | 1.11 g (0.54 wt %) | 1.48 g (0.70 wt %) | 0.74 g (0.38 wt %) | 1.11 g (0.54 wt %) |
| Secondary Oxide: Sb$_2$O$_3$ | 6.20 g (3.28 wt %) | 12.39 g (6.31 wt %) | 18.59 g (9.31 wt %) | 24.78 g (11.75 wt %) | 12.39 g (6.31 wt %) | 18.59 g (9.13 wt %) |
| Cu/D powders: Cu/Ni(?)P - fine copper powders (1.2-3.2 microns) | 49.74 g (26.28 wt %) | 49.74 g (25.31 wt %) | 49.74 g (24.42 wt %) | 49.74 g (23.58 wt %) | 49.74 g (25.31 wt %) | 49.74 g (24.42 wt %) |
| Cu/D powders: Cu/Ni(?)P - spherical copper powders (7.5-14.7 microns) | 116.05 g (61.30 wt %) | 116.05 g (59.06 wt %) | 116.05 g (56.96 wt %) | 116.05 g (55.02 wt %) | 116.05 g (59.06 wt %) | 116.05 g (56.96 wt %) |
| Secondary Oxide to Nanoparticle ratio | 16.76 | 16.74 | 16.75 | 16.74 | 16.74 | 16.75 |
| Total amount of glass frits | 3.48 wt % | 6.69 wt % | 9.67 wt % | 12.45 wt % | 6.69 wt % | 9.67 wt % |
| Total surface area for the copper powders per gram of paste (m$^2$ per gram of paste) | 0.80 | 0.78 | 0.75 | 0.72 | 0.57 | 0.55 |

The screen-printing process was reduced to a single print by reducing the surface area of the fine copper powders down to 1.15 m²/g; thus resulting in a total surface area contribution from the copper-containing particle of 0.40 m² per gram of paste. Full sized poly c-Si cells were printed using pastes with a 0.40 m² per gram of paste, and a secondary oxide to nanoparticle ratio of between 16.70 and 16.75. The proportion of binder in the pastes was increased from 1.69 to 2.32 wt. %. The cells were fired in a TP Solar Model M-225 (Neutrino Series) IR belt furnace. The furnace contained six heated zones and a cooling zone approximately 30% longer that the combined length of the heated sections. The zones are built such that the front and rear of the cell were heated simultaneously using IR heat lamps. The temperatures for zones 1 through 5 were 620, 460, 440, 450 and 520° C., respectively. Zone 6 was varied from 665° C. to 690° C. The belt speed was varied from 225-400 in/min. The cells were sectioned into 4×4 cm2 samples in order to measure the PV performance. FIGS. 34A, 34B, 34C, and 34D show the impact of firing conditions on the PV performance of the full-sized cells sectioned into smaller pieces. For FIGS. 34A-34D the following apply: PV performance ((a) short circuit current density, (b) open circuit voltage, (c) fill factor, and (d) efficiency) as a function of the belt speed used to fire the cells in an industrial IR belt furnace. The temperature in zones 1 to 5 of the furnace was not changed. Zone 6's temperature was increased from 665 to 690° C. Two versions of the CuBert™ paste, containing 1.69 wt. % binder (Paste 54) and 2.32 wt. % binder (Paste 55) were printed on full-sized poly crystalline silicon cells. The cells were printed with one print. After firing the cells were cut into 4×4 cm² sections for measurement. The results shown in FIGS. FIGS. 34A-34D illustrate the average results of between ⅛ to ¼ of the full-sized cell. The compositions of the pastes are shown in Table 25.

TABLE 25

| | Paste ID | |
|---|---|---|
| Material | Paste 54 | Paste 55 |
| Organic Binder: PVP 40,000 | 9.65 g (1.69 wt %) | 13.81 g (2.32 wt %) |
| Organic Solvent: Propylene Glycol | 44.97 g (7.88 wt %) | 50.90 g (8.54 wt %) |
| A/B/C nanoparticles: Ni/Ni/Pb NPs | 3.09 g (0.54 wt %) | 3.18 g (0.53 wt %) |
| Secondary Oxide: $Sb_2O_3$ | 51.60 g (9.05 wt %) | 53.26 g (8.93 wt %) |
| Cu/D powders: Cu/Ni(?)P - fine copper powders (1.2-3.2 microns) | 138.35 g (24.25 wt %) | 142.51 g (23.91 wt %) |
| Cu/D powders: Cu/Ni(?)P - spherical copper powders (7.5-14.7 microns) | 322.78 g (56.58 wt %) | 332.49 g (55.77 wt %) |
| Secondary Oxide to Nanoparticle ratio | 16.70 | 16.75 |
| Total amount of glass frits | 9.59 wt % | 9.46 wt % |
| Total surface area for the copper powders per gram of paste (m² per gram of paste) | 0.41 | 0.41 |

Figure 35:
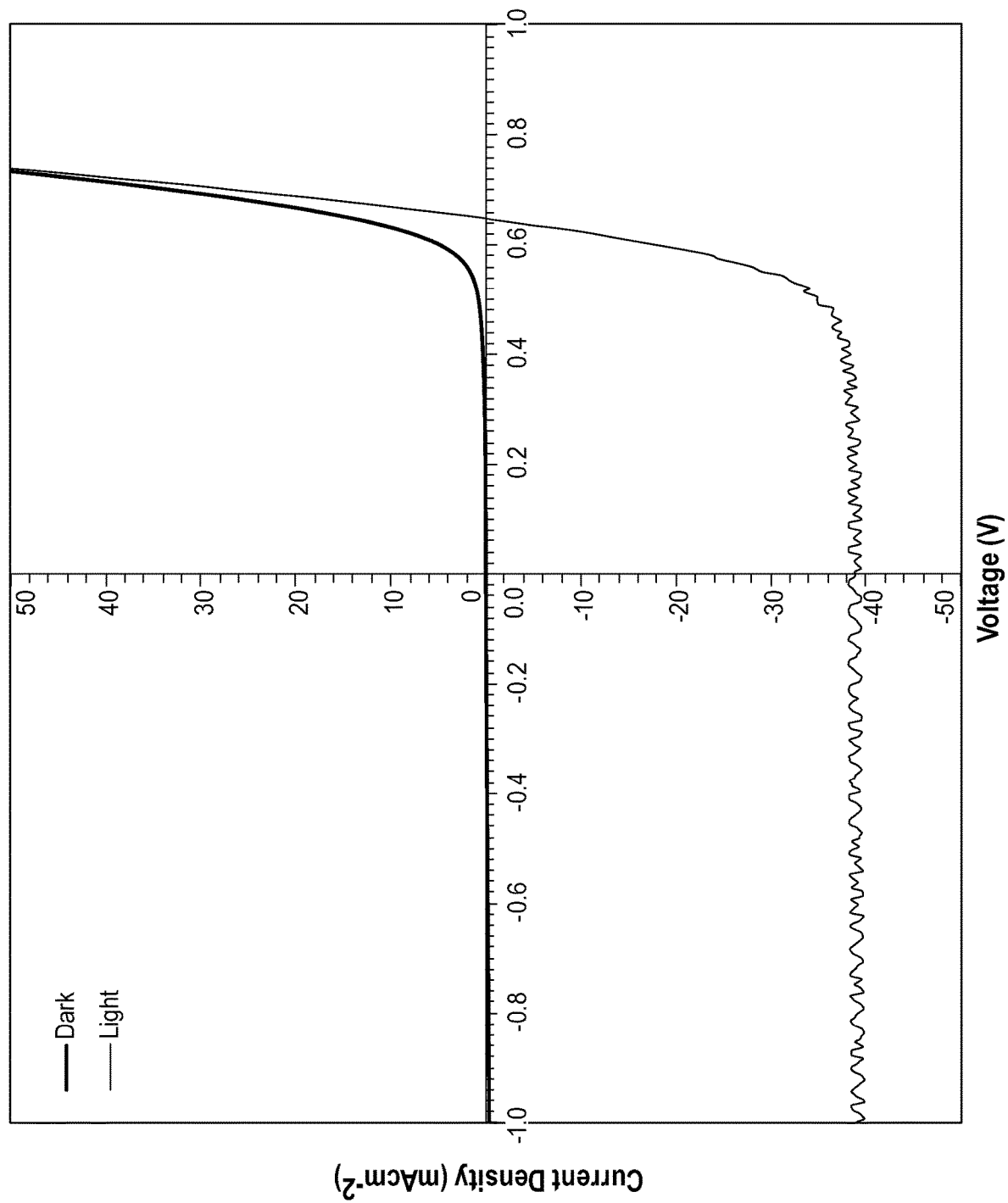
FIG. 35 shows Current—Voltage (IV) curves under dark and illuminated conditions for a paste made using only the fine 1.2-3.2 µm copper containing powders.

The width and mass of paste used to print the fingers can be decreased further by reducing the size of the screen opening. To accomplish this goal only copper-containing particles with a size range of 1.20 to 3.20 μm were used in the paste. FIG. 35 shows the impact of the pastes made using copper-containing particles with a surface area contribution of 0.51 m² per gram of paste (Paste 56—see Table below). The pastes used a secondary oxide to nanoparticle ratio of 3.35 and a binder concentration of 3.28 wt. %. As a result, the mass of paste used to print the fingers on $\frac{1}{16}^{th}$ (4×4 cm²) section was lowered to ~6 mg (about 96 mg for a full-sized cell). The pastes were printed on mono crystalline Passivated Emitter Rear Contact (PERC) silicon solar cells and fired using a modified version of the semi-automated furnace described in Example 16. In this case three separate tube furnaces were combined in to one system with a single 122 cm long quartz tube passing through all three furnaces: thus, creating a three-zone furnace. Air flow through the system was controlled by the exhaust gas outlets positioned at either end of the quartz tube. The cells were positioned on a nichrome wire stage, which had been automated using a stepper motor and Arduino software program, for control of the cells speed through the individual zones. The speed of the cell through the different zones was varied to mimic the belt speeds used in the TP Solar IR six zone belt furnace. The cell moved continuously through the different zones until it reached the end of the quartz tube where a fan switches on to rapidly cool the cell back down to room temperature. The cell is then removed from the stage. FIG. 35 shows the I-V curve of a cell fired using zone 1, 2 and 3 temperatures of 255, 505 and 990° C., respectively. In FIG. 35, the following apply: Current—Voltage (IV) curves under dark and illuminated conditions for a paste (Paste 56) made using only the fine 1.2-3.2 μm copper-containing powders. The paste was printed on a mono crystalline silicon PERC cell and was fired using a three zone semi-automated furnace. The temperatures in zone's 1, 2 and 3 were 255, 505 and 990° C., respectively. The cell was fired with a belt speed of 325 in/min.

Figure 36A:
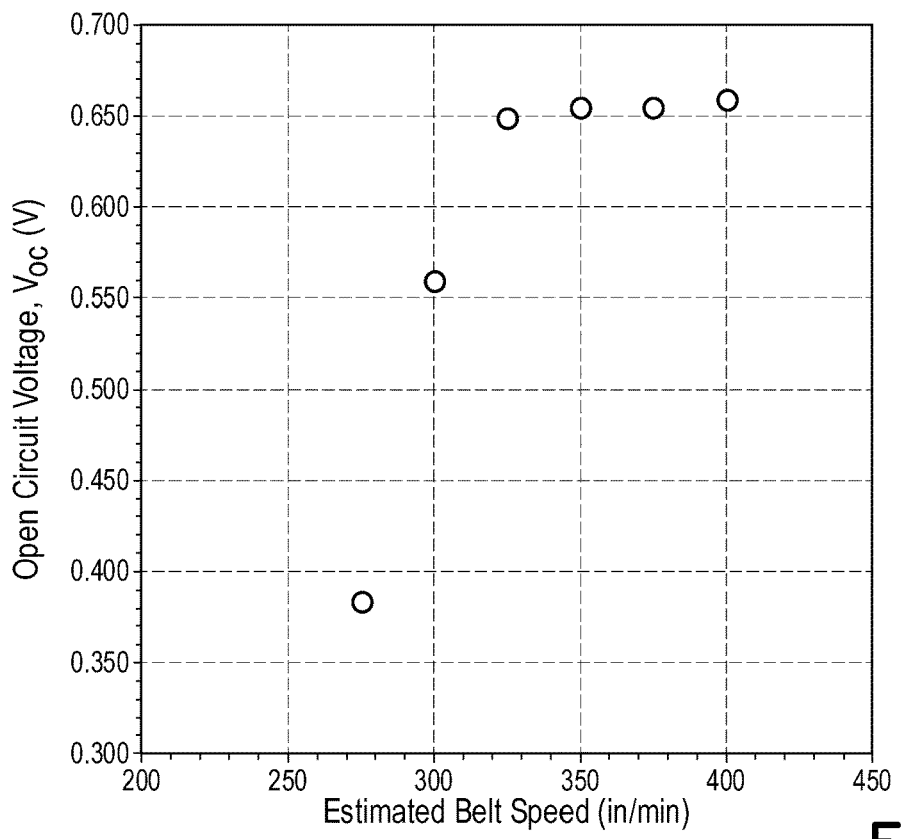
FIGS. 36A, 36B, and 36C show the impact of using copper-containing particles with a surface area of FIG. 36A 0.51 m$^2$ per gram of paste, FIG. 36B 0.57 m$^2$ per gram of paste, and FIG. 36C 0.65 m$^2$ per gram of paste on the open circuit voltage, $V_{oc}$.
Figure 36B:
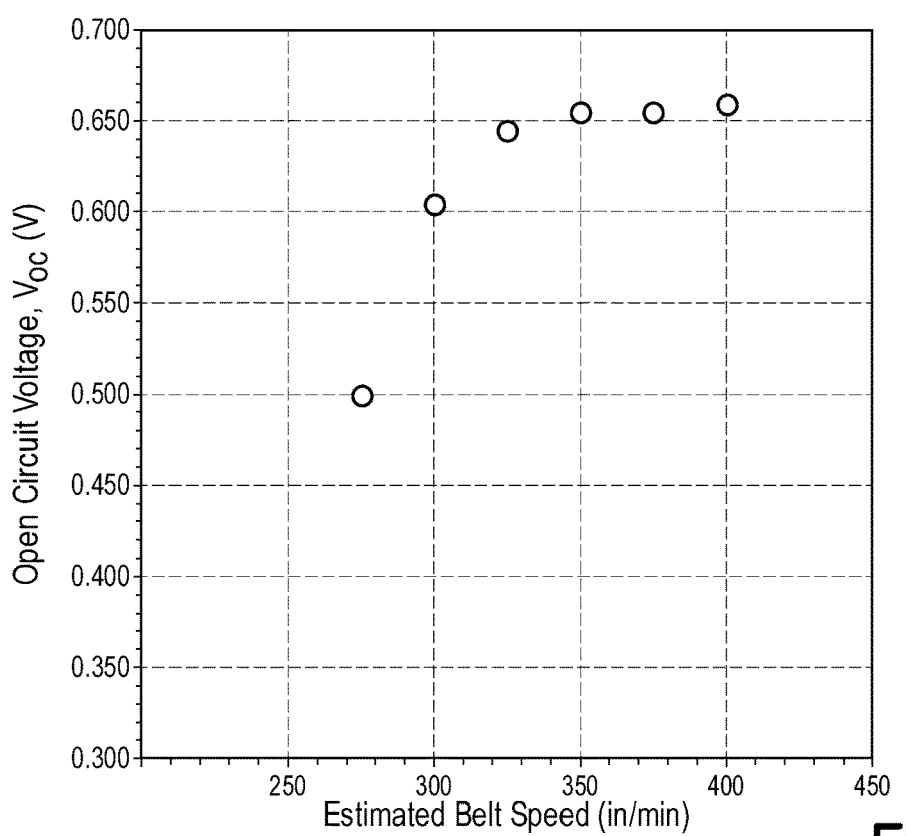
Figure 36C:
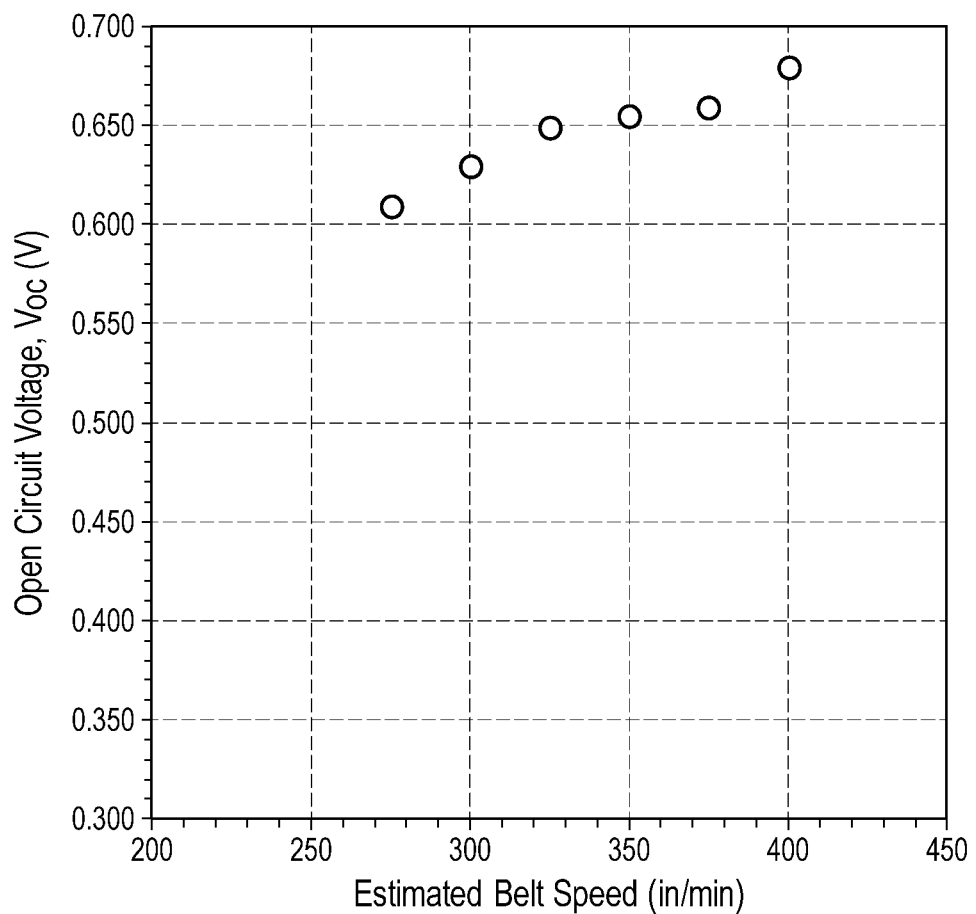

Lowering the surface area contribution of the smaller copper-containing particle 46 further can limit the belt speed at which the cells can be fired. FIGS. 36A, 36C, and 36D shows the impact of firing conditions on the cells' open circuit voltage, $V_{oc}$ for pastes made using a surface area contribution of 0.51, 0.57, and 0.65 m² per gram of paste. The pastes used a secondary oxide to nanoparticle ratio of 3.35 and a binder concentration of 3.28 wt. %. The compositions of the pastes are shown in Table 26 (below). The lower secondary to nanoparticle ratio in combination with lower surface area, result in a significantly reduced $V_{oc}$ at the slower speeds.

TABLE 26

| | Paste ID | | |
|---|---|---|---|
| Material | Paste 56 | Paste 57 | Paste 58 |
| Organic Binder: PVP 8,000 | 7.05 g (3.28 wt %) | 7.05 g (3.29 wt %) | 7.05 g (3.29 wt %) |
| Organic Solvent: Dipropylene Glycol | 17.99 g (8.37 wt %) | 16.99 g (7.94 wt %) | 16.99 g (7.94 wt %) |
| A/B/C nanoparticles: Ni/Ni/Pb NPs (higher Pb content) | 5.55 g (2.58 wt %) | 5.55 g (2.59 wt %) | 5.55 g (2.59 wt %) |
| Secondary Oxide: $Sb_2O_3$ | 18.59 g (8.65 wt %) | 18.59 g (8.69 wt %) | 18.59 g (8.69 wt %) |
| Cu/D powders: Cu/Ni(?)P - fine copper powders (1.2-3.2 microns) | 165.79 g (77.12 wt %) | 165.79 g (77.48 wt %) | 165.79 g (77.48 wt %) |
| Secondary Oxide to Nanoparticle ratio | 3.35 | 3.35 | 3.35 |

TABLE 26-continued

| Material | Paste 56 | Paste 57 | Paste 58 |
|---|---|---|---|
| Total amount of glass frits | 11.23 wt % | 11.28 wt % | 11.28 wt % |
| Surface Area of Cu/Ni(?)P - fine copper powders (1.2-3.2 microns) | 0.66 m²/g | 0.73 m²/g | 0.88 m²/g |
| Total surface area for the copper powders per gram of paste (m² per gram of paste) | 0.51 | 0.57 | 0.68 |

The changes to the pastes composition, surface area contribution and resulting amount of paste required to generate devices with a fill factor>0.6 are summarized in Table 27.

TABLE 27

| Material/Paste ID | No. of fingers printed and width of screen pattern used to print the fingers | No. of Prints | Average mass of paste used to print fingers on cell (Values in italic are calculated) Full Sized Cell ~15.8 × 15.8 cm² | 1/16 cell ~4 × 4 cm² | Ratio of the different sized copper containing powders used in the paste and their corresponding surface area (m²/g) 10-22 μm spherical Cu powders (Cu112SP, Chemical Store) | 7.5-14.7 μm spherical Cu powders (610, ACuInternational) |
|---|---|---|---|---|---|---|
| Paste 5 | 74 / 200 μm | 3 | 10 / 24 mg | *64 mg* | 70 / 0.25 m²/g | |
| Paste 5 | 74 / 200 μm | 2 | 90 / 1 mg | *56 mg* | 70 / 0.25 m²/g | |
| Paste 53 | 74 / 100 μm | 3 | 36 / 0 mg | *23 mg* | | 70 / 0.33 m²/g |
| Paste 62 | 74 / 100 μm | 2 | 30 / 5 mg | *19 mg* | | |
| Paste 54 | 74 / 100 μm | 1 | 23 / 3 mg | *15 mg* | | 70 / 0.24 m²/g |
| Paste 55 | 74 / 100 μm | 1 | 19 / 1 mg | *12 mg* | | 70 / 0.24 m²/g |
| Paste 55 | 116 / 83 μm | 1 | 22 / 4 mg | *14 mg* | | 70 / 0.22 m²/g |
| Paste 58 | 116 / 83 μm | 1 | 17 / 5 mg | *11 mg* | | 70 / 0.23 m²/g |
| Paste 56 | 88 / 60 μm | 1 | *94 mg* | 6 mg | | |

| Material/Paste ID | Ratio of the different sized copper containing powders used in the paste and their corresponding surface area (m²/g) 1.8-7.7 μm Spherical (603, ACuInternational) | Fine 1.2-3.2 μm Cu powders, Ames Goldsmith | Total surface area contribution of the copper containing powders (m² per gram of paste) | Ratio of secondary oxide particles to nanoparticles and total amount of glass frits in the paste | Amount of binder in the paste |
|---|---|---|---|---|---|
| Paste 5 | | 30 / 2.31 m²/g | 0.75 | 3.50 / 6.49 wt % | 1.54 wt % |
| Paste 5 | | 30 / 2.31 m²/g | 0.75 | 3.50 / 6.49 wt % | 1.54 wt % |
| Paste 53 | | 30 / 1.59 m²/g | 0.58 | 16.91 / 9.67 wt % | 2.37 wt % |
| Paste 62 | 70 / 0.59 m²/g | 30 / 1.59 m²/g | 0.89 | 16.68 / 9.59 wt % | 2.36 wt % |
| Paste 54 | | 30 / 1.15 m²/g | 0.41 | 16.70 / 9.59 wt % | 1.69 wt % |
| Paste 55 | | 30 / 1.15 m²/g | 0.41 | 16.75 / 9.46 wt % | 2.32 wt % |
| Paste 55 | | 30 / 1.16 m²/g | 0.40 | 16.75 / 9.46 wt % | 2.32 wt % |
| Paste 58 | | 30 / 1.12 m²/g | 0.40 | 8.40 / 10.03 wt % | 2.68 wt % |
| Paste 56 | | 100 / 0.66 m²/g | 0.51 | 3.35 / 11.23 wt % | 3.28 wt % |

Figure 37A:
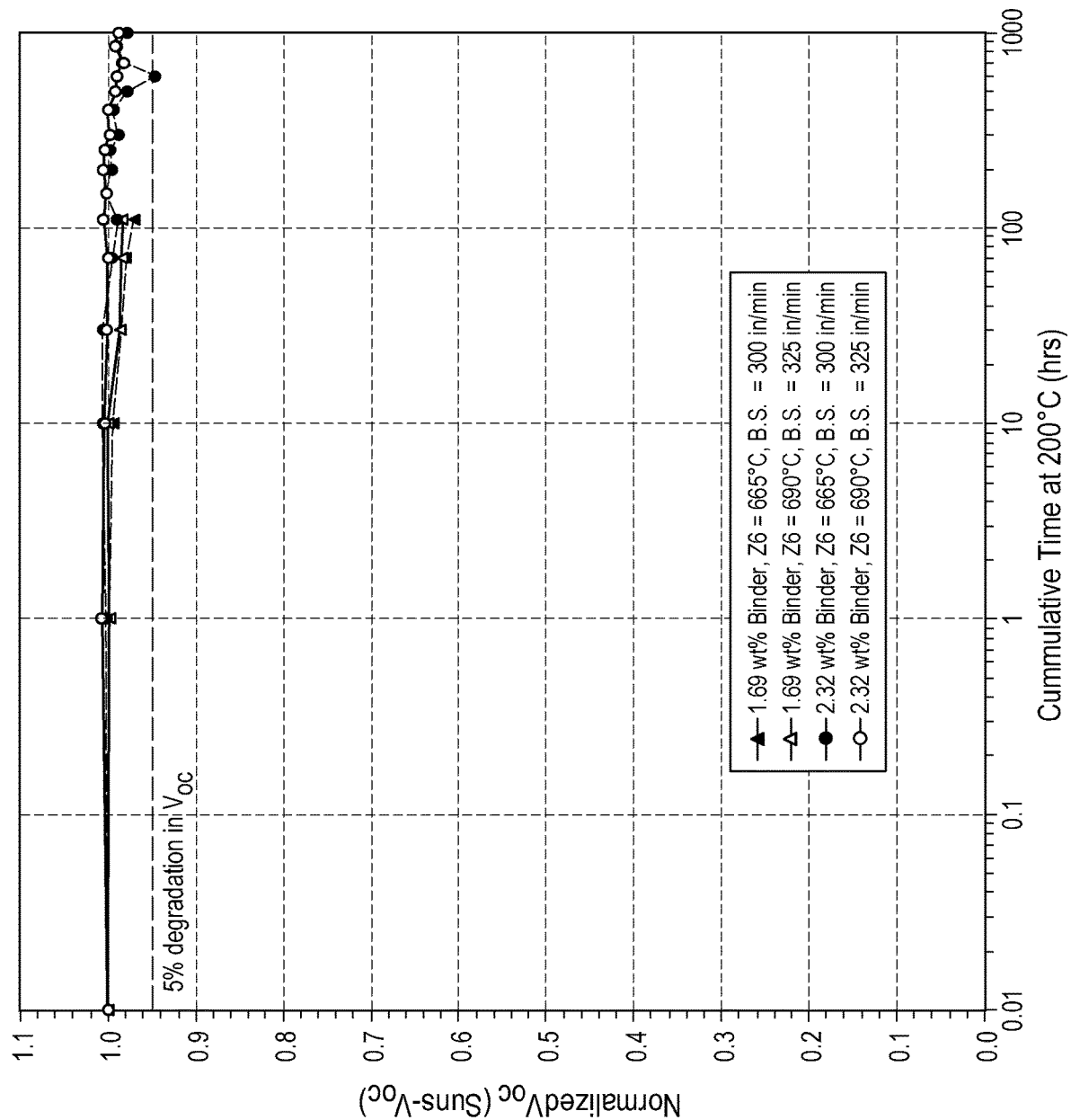
FIGS. 37A and 37B show the effect of accelerated aging tests at 200° C. on the PV performance FIG. 37A open circuit voltage and FIG. 37B pseudo fill factor of poly c-Si cells with a full Al BSF rear contact, metalized with CuBert™ pastes.
Figure 37B:
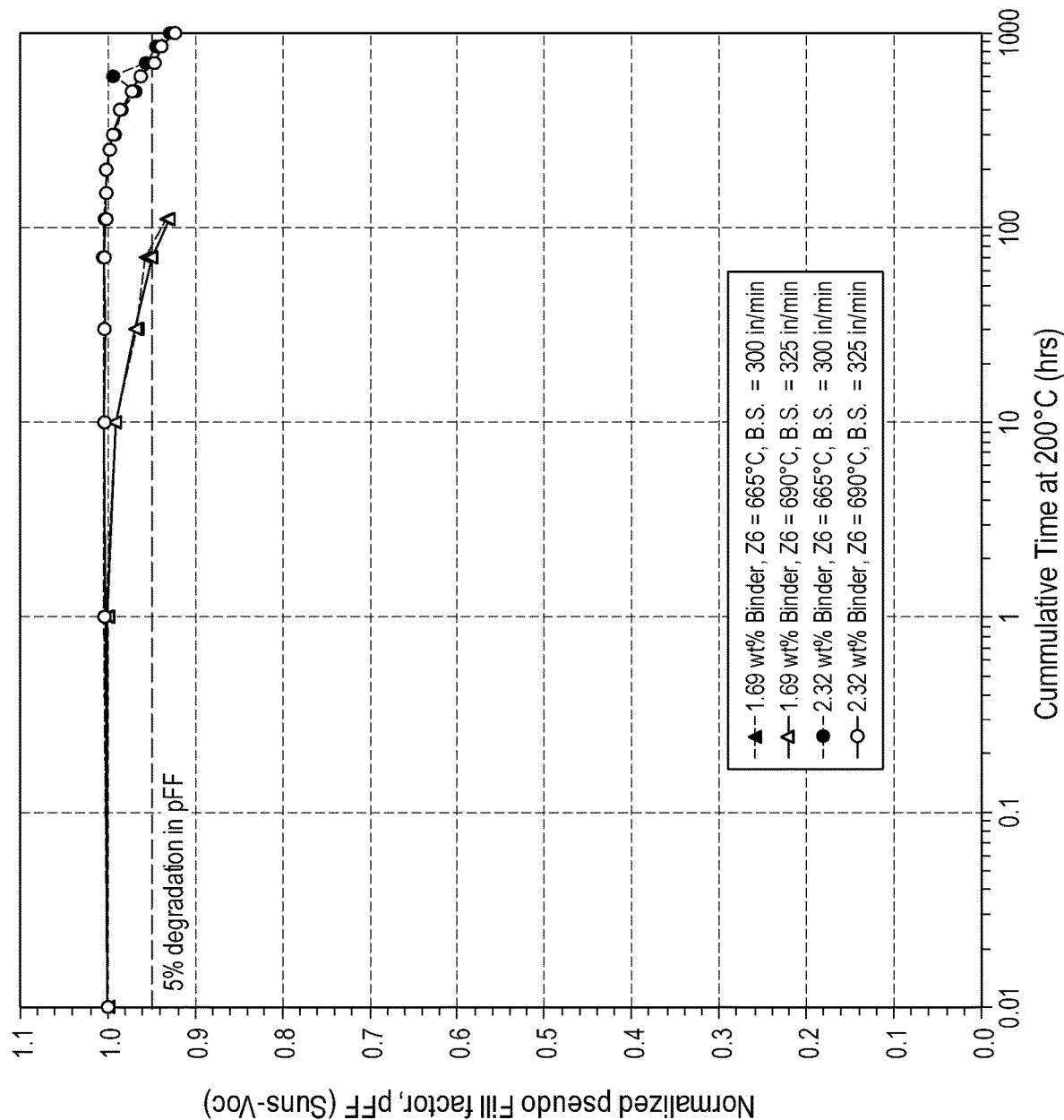

Example 21: Controlling the Etching Depth and the Impact of the Binder on Durability FIGS. 37A and 37B show the impact of the proportion of binder in the paste on the durability of the cells under accelerated aging conditions. In FIGS. 37A and 37B, the following apply: Effect of accelerated aging tests at 200° C. on the PV performance ((a) open circuit voltage, (b) pseudo fill factor) of poly c-Si cells with a full Al BSF rear contact, metalized with CuBert™ pastes. Two versions of the CuBert™ paste, containing 1.69 wt. % binder (Paste 54) and 2.32 wt. % binder (Paste 55) were printed on 6-inch poly c-Si cells. The results below show the average results for 4×4 cm² sections cut from full sized cells fired in an IR belt furnace using a zone 6 temperature of 665° C. and a belt speed (B.S.) of 300 in/min. The charts also show the results of samples fired using a zone 6 temperature of 690° C. and belt speed (B.S). of 325 in/min. Poly crystalline cells were printed using pastes containing 1.69 and 2.36 wt. % of binder. The compositions of the paste are provided in Table 25. The cells were fired using the six zone TP Solar IR belt furnace described in Example 20. The furnace used zone 1, 2, 3, 4 and 5 temperatures of 620, 460, 440, 450, and 520° C., respectively. Zone 6's temperature was changed from 665 to 690° C. The belt speed was varied. The full-size cells were cut into smaller 4×4 cm2 pieces, in order to evaluate their PV performance. Accelerated aging tests were carried out by heating the cells at 200° C. under an inert atmosphere for 1000 hrs. The cells were periodically pulled out over the testing period to measure their PV performance. The performance was determined by monitoring the open circuit voltage, $V_{oc}$ and pseudo fill factor, pFF measured using a Sinton Instruments Suns-$V_{oc}$ system (FIG. 37). The $V_{oc}$ and pFF are sensitive to the diffusion of copper into the junction and are expected to decrease over time if it occurs. The results show that increasing the proportion of binder in the pastes reduces the depth the paste etches into the cells; thereby increasing the durability of the cell.

Example 22: Impact of the Composition of the Nanoparticles

Figure 38A:
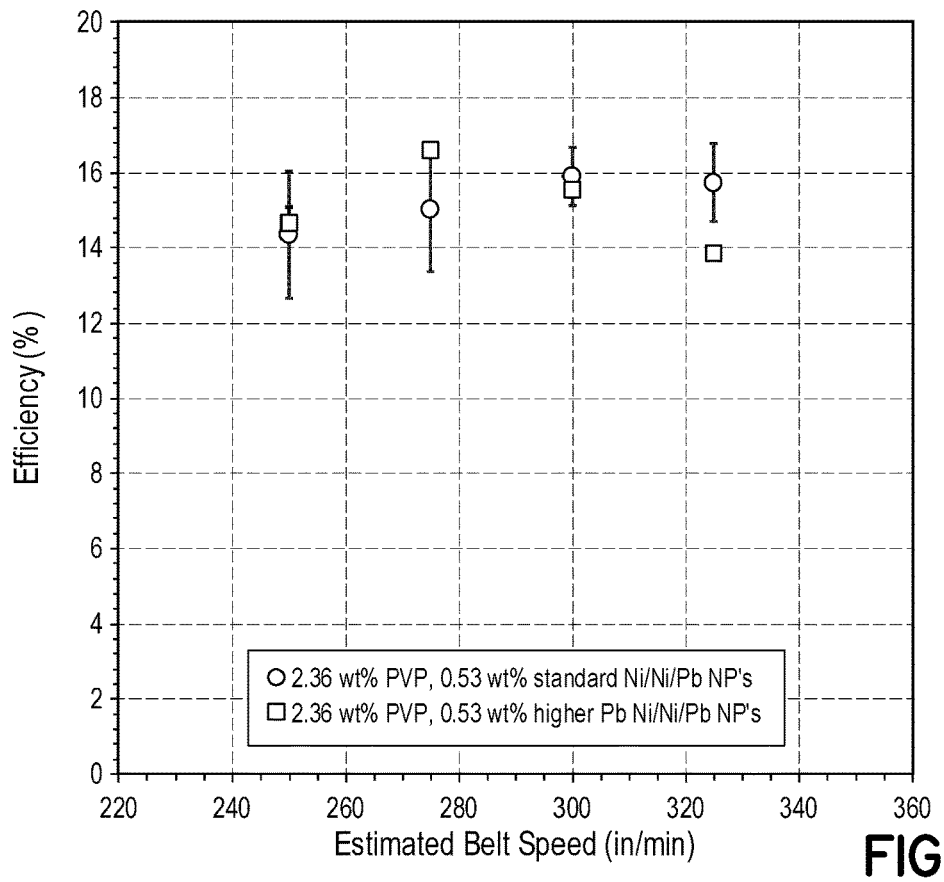
FIGS. 38A and 38B show the efficiency of mono crystalline silicon PERC solar cells printed with pastes made using standard Ni/Ni/Pb nanoparticles with a Ni/Pb ratio of 1.52 and with a ratio of 0.52 and also show the impact of doubling the proportion of nanoparticles and the amount of binder on the PV performance.
Figure 38B:
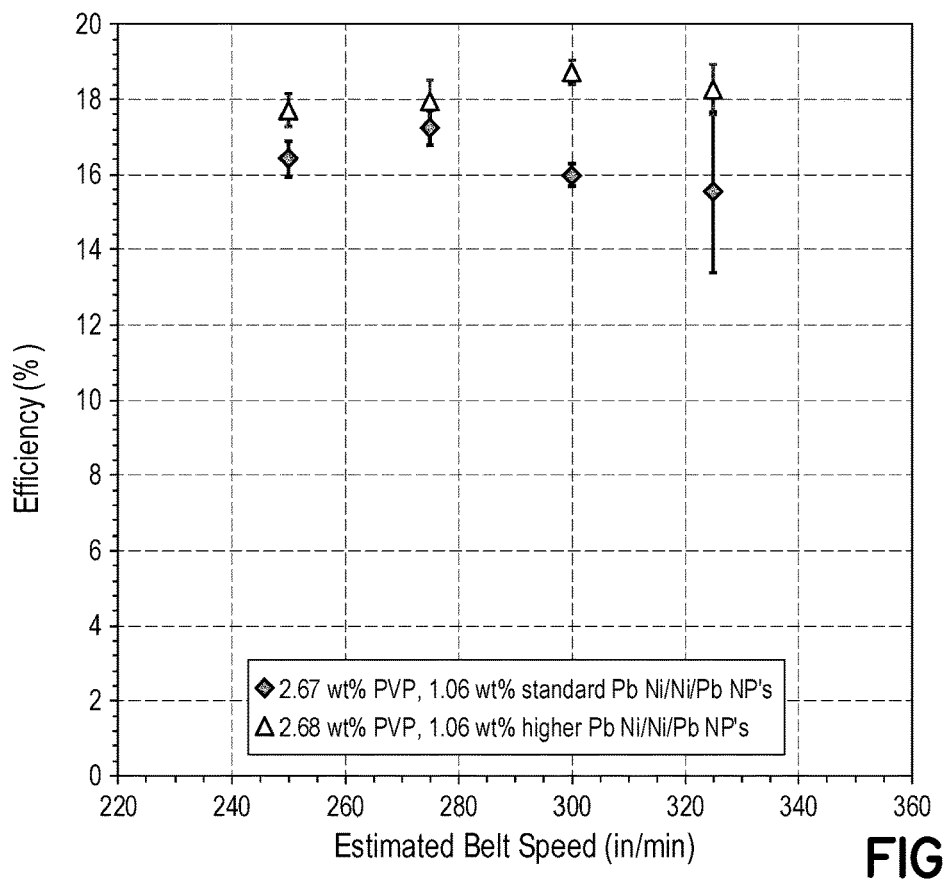

The nanoparticles and secondary oxide particles provide the etching functionality of the paste. The rate of etching can be varied by changing the ratio of these two materials in the paste. It can also be changed by changing the composition of the nanoparticles. The aggressiveness of nanoparticles can be controlled by changing the ratio of the different elements during the synthesis of the nanoparticles, as described above. In this example the molar ratio of nickel (Ni) and lead (Pb) in the Ni/Ni/Pb nanoparticles was decreased from 1.52 to 0.52, during the synthesis. Pastes were made using these two nanoparticle compositions and were printed on mono crystalline silicon PERC cells. The cells were fired in the three zone semi-automated firing system described in Example 20. The temperatures in the zone's 1, 2 and 3 were 650, 450 and 925° C., respectively. FIGS. 38A, and 38B show the impact these nanoparticles have on the PV performance. In FIGS. 38A and 38B, the following apply: Efficiency of mono crystalline silicon PERC solar cells printed with pastes made using standard Ni/Ni/Pb nanoparticles with a Ni/Pb ratio of 1.52 (Pastes 55 and 57) and with a ratio of 0.52 (Pastes 56 and 58). The graphs also show the impact of doubling the proportion of nanoparticles and the amount of binder on the PV performance. The compositions of the pastes are shown in Table 28.

TABLE 28

| | Paste ID | | | |
|---|---|---|---|---|
| Material | Paste 55 | Paste 56 | Paste 57 | Paste 58 |
| Organic Binder: PVP 40,000 | (2.31 wt %) | (2.35 wt %) | (2.67 wt %) | (2.68 wt %) |
| Organic Solvent: Propylene Glycol | (9.18 wt %) | (7.53 wt %) | (7.81 wt %) | (7.34 wt %) |
| A/B/C nanoparticles: Ni/Ni/Pb NPs | (0.53 wt %) | | (1.06 wt %) | (1.06 wt %) |
| A/B/C nanoparticles: Ni/Ni/Pb NPs (higher Pb content) | | (0.53 wt %) | | |
| Secondary Oxide: Sb$_2$O$_3$ | (8.87 wt %) | (9.03 wt %) | (8.92 wt %) | (8.96 wt %) |
| Cu/D powders: Cu/Ni(?)P - fine copper powders (1.2-3.2 microns) | (23.74 wt %) | (24.17 wt %) | (23.86 wt %) | (23.98 wt %) |
| Cu/D powders: Cu/Ni(?)P - spherical copper powders (7.5-14.7 microns) | (55.39 wt %) | (55.77 wt %) | (55.69 wt %) | (55.97 wt %) |
| Secondary Oxide to Nanoparticle ratio | 16.89 | 16.89 | 8.45 | 8.45 |
| Total amount of glass frits | 9.40 wt % | 9.56 wt % | 9.98 wt % | 10.02 wt % |
| Total surface area for the copper powders per gram of paste (m² per gram of paste) | 0.40 | 0.41 | 0.41 | 0.41 |

Figure 39A:
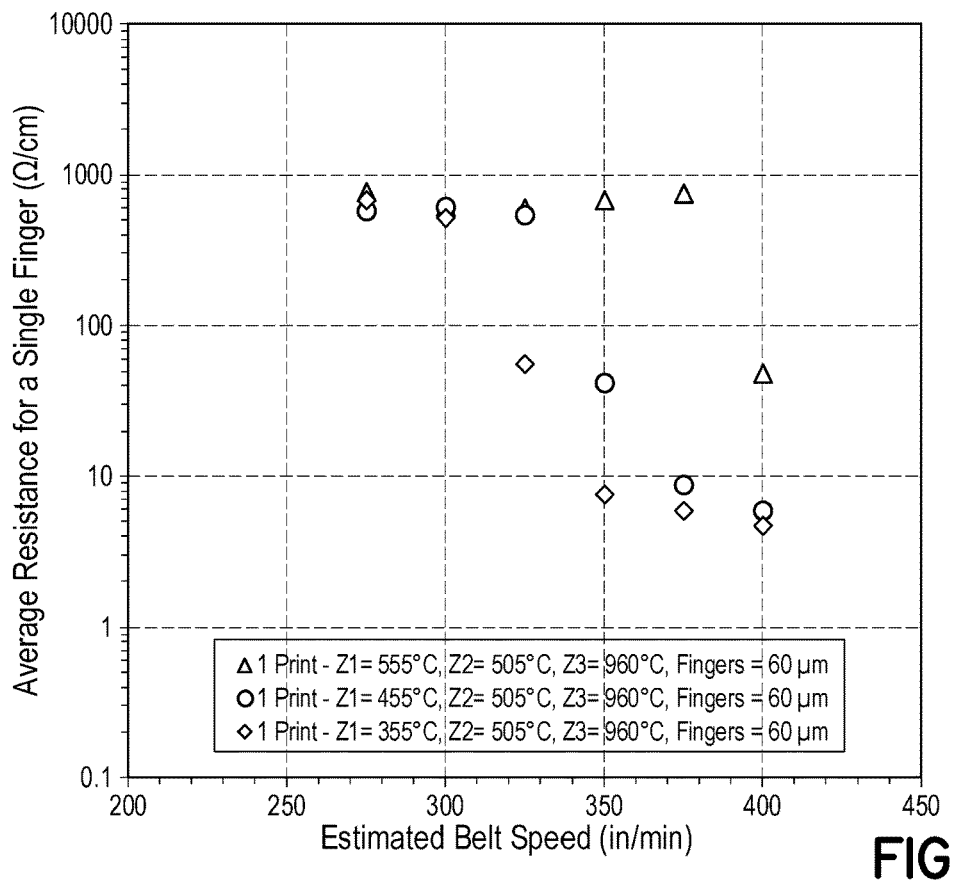
FIGS. 39A, 39B, and 39C show the impact of firing conditions on the resistance across 22 fingers 3.2 mm in length printed using pastes containing FIG. 39A 2.05 wt. % binder, FIG. 39B 2.35 wt. % binder, and FIG. 39C 2.64 wt. % binder.
Figure 39B:
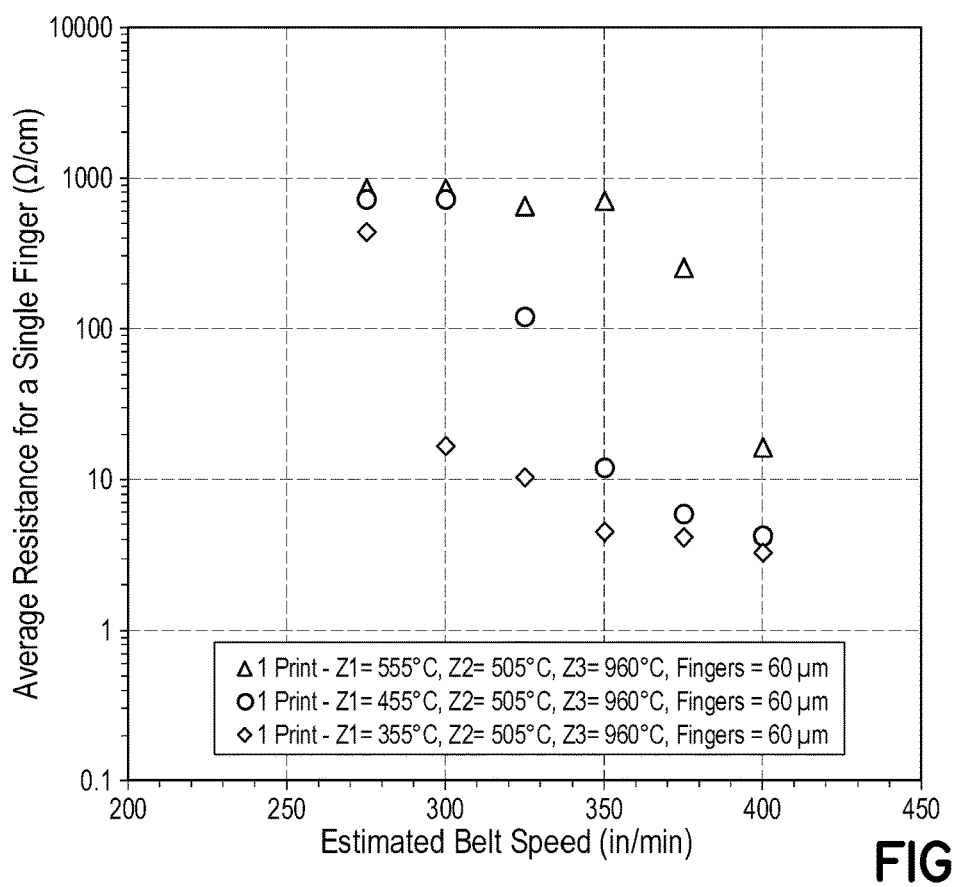
Figure 39C:
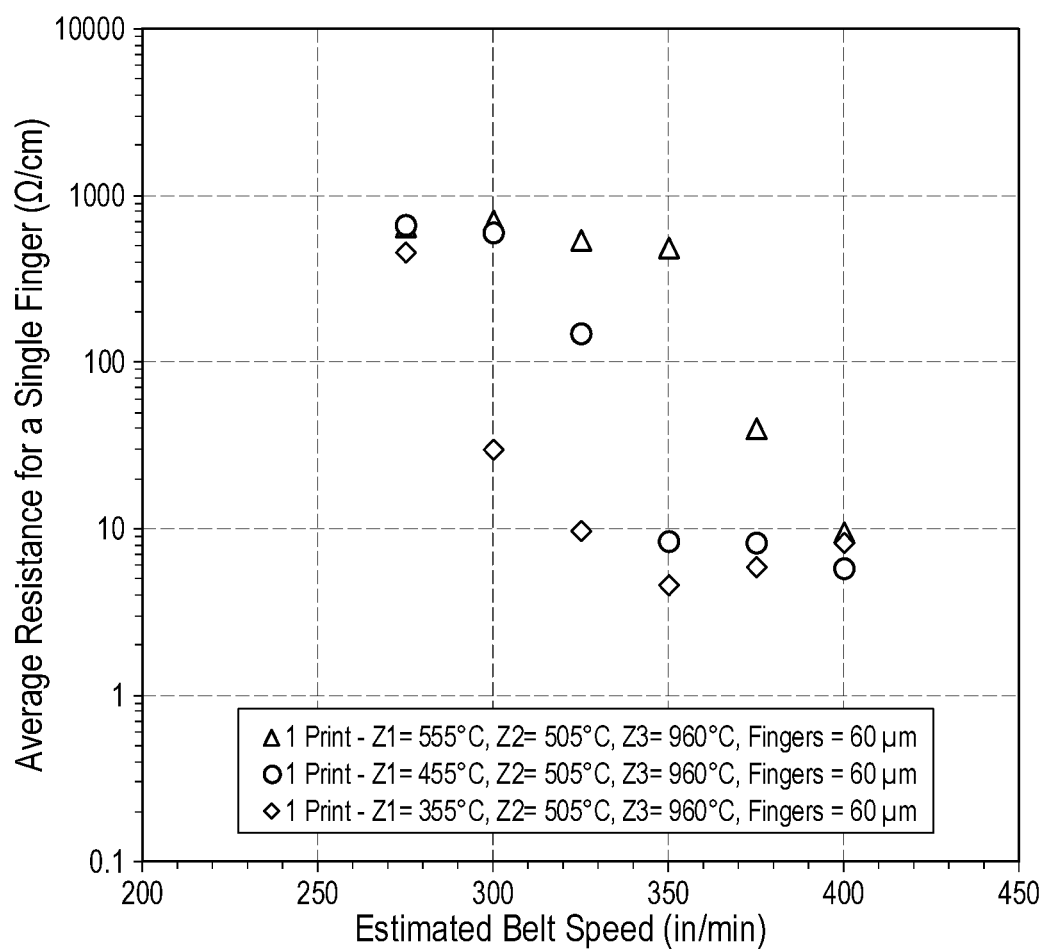

Example 23: Impact of the Size of the Copper Containing Particles on Firing Conditions Reduction to the finger dimensions, requires not only changes to the paste composition, but also changes to the firing conditions. The smaller the size of the copper-containing particles, the more susceptible the particles are to oxidation. Increasing the proportion of binder in the paste, as well as the amount of etchants in the paste aids in reducing any oxides, as well as those formed during firing. However, both components can only be increased to a certain level before they impact the devices performance. Therefore, changes to the firing conditions were required. The cells were fired using the three zone semi-automated firing system described in Example 20. In the first two zones most of the binder is burnt off, but with smaller finger dimensions, the proportion of binder present is already smaller. Consequently, the temperature in the first zone was reduced, to account for this impact. FIGS. 39A, 39B, and 39C show the impact on the lateral resistance of a finger as the temperature in zone 1 was reduced, and the amount of binder in the paste was increased. Table 29 shows the composition of the pastes. The cells were printed with about 3.5 mg of paste on a 4×4 cm² mono crystalline silicon PERC cell. In FIGS. 39A, 39B, and 39C, the following apply: impact of firing conditions on the resistance across 22 fingers 3.2 mm in length printed using pastes containing (a) 2.05 (Paste 59), (b) 2.35 (Paste 60), (c) 2.64 (Paste 61) wt. % binder. The fingers were printed with approximately 3.5 mg of paste on a 4×4 cm² mono crystalline silicon PERC cell.

TABLE 29

| | Paste ID | | |
|---|---|---|---|
| Material | Paste 59 | Paste 60 | Paste 61 |
| Organic Binder: PVP 40,000 | 4.52 g (2.04 wt %) | 5.20 g (2.35 wt %) | 5.88 g (2.64 wt %) |
| Organic Solvent: Propylene Glycol | 20.80 g (9.42 wt %) | 20.80 g (9.39 wt %) | 21.11 g (9.49 wt %) |
| A/B/C nanoparticles: Ni/Ni/Pb NPs (higher Pb content) | 11.10 g (5.03 wt %) | 11.10 g (5.01 wt %) | 11.10 g (4.99 wt %) |
| Secondary Oxide: Sb₂O₃ | 18.59 g (8.42 wt %) | 18.59 g (8.39 wt %) | 18.59 g (8.36 wt %) |
| Cu/D powders: Cu/Ni(?)P - fine copper powders (1.2-3.2 microns) | 165.79 g (75.09 wt %) | 165.79 g (74.86 wt %) | 165.79 g (74.52 wt %) |
| Secondary Oxide to Nanoparticle ratio | 1.67 | 1.67 | 1.67 |
| Total amount of glass frits | 13.45 wt% | 13.40 wt% | 13.35 wt% |
| Surface Area of Cu/Ni(?)P - fine copper powders (1.2-3.2 microns) | 0.78 m²/g | 0.78 m²/g | 0.78 m²/g |

TABLE 29-continued

| | Paste ID | | |
|---|---|---|---|
| Material | Paste 59 | Paste 60 | Paste 61 |
| Total surface area for the copper powders per gram of paste (m² per gram of paste) | 0.58 | 0.58 | 0.58 |

Example 24: Increasing the Screen Life of the Pastes for Smaller Finger Dimensions The reduction in the size of the particles in the paste can lead to a reduced screen life for the paste, as the increased surface area increases the rate at which the paste dries. The screen life can be extended by directly substituting the solvent used in the medium with a solvent with a lower evaporation rate. Table 30 shows the physical properties of the solvents that have been tested in the paste.

TABLE 30

| Solvent Name | Boiling Point (° C.) | Viscosity (cP) | Evaporation Rate (n-Butyl Acetate = 1) |
|---|---|---|---|
| Propylene Glycol | 187.4 | 48.6 | 0.0157 |
| Dipropylene Glycol | 232.2 | 75.0 | 0.00155 |
| Tripropylene Glycol | 265.1 | 57.2 | 0.000214 |
| Butyl Carbitol (Diethylene Glycol Monbutyl Ether) | 230 | 4.9 | 0.004 |
| Texanol Ester Alcohol (2,2,4-Trimethyl 1.3-pentanediol monoisobuyrate) | 255-260.5 | 13.5 | 0.002 |

Example 25: Finger Dimension

Figure 40:
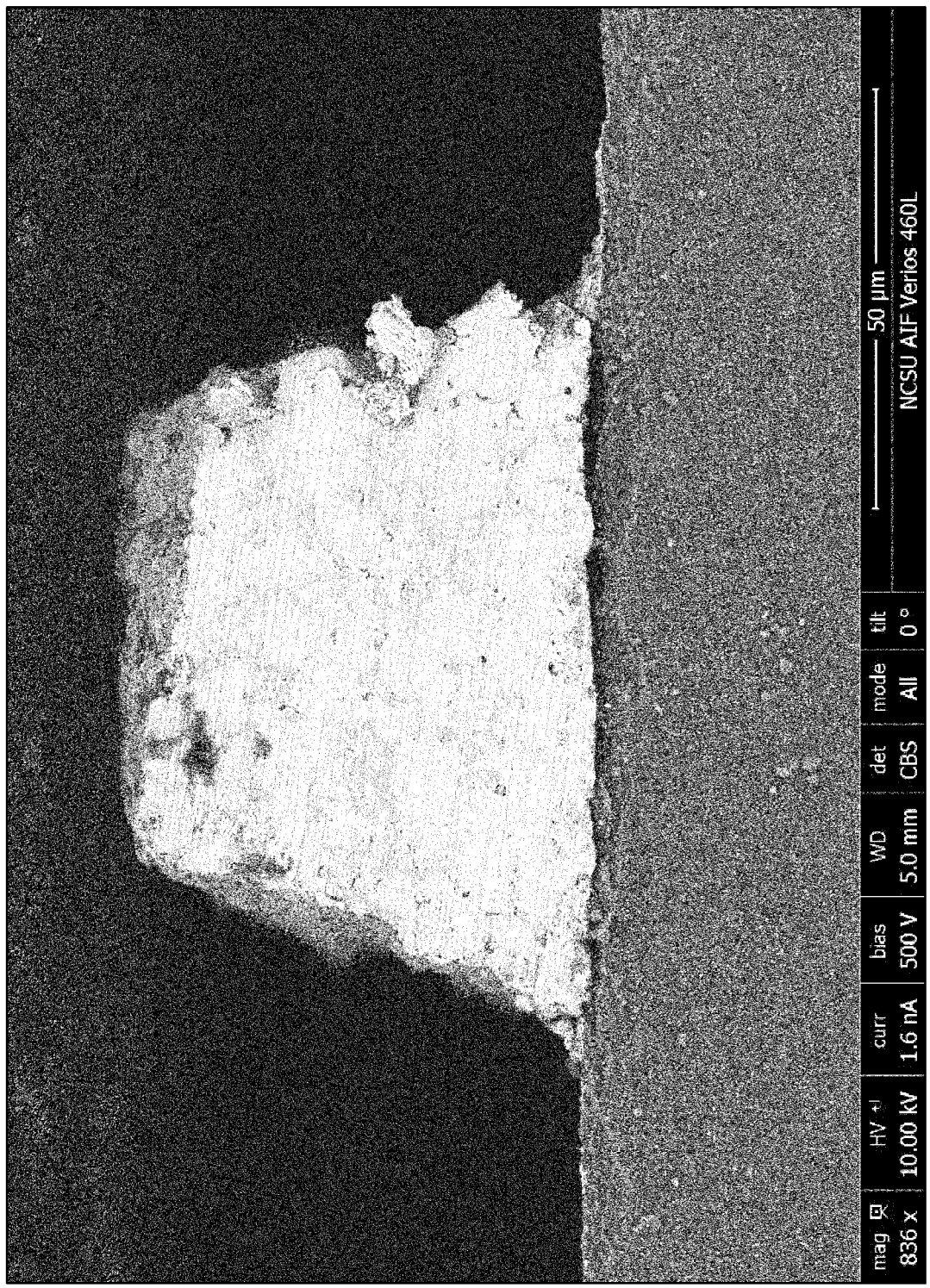
FIG. 40 is an optical micrograph of a finger according to one example.

Table 31 shows the average dimensions of a high viscosity paste (Paste 53) printed through a 300 mesh screen with a 20 μm emulsion over mesh (EOM) coating and 100 μm wide finger opening. The cells were fired using a TP Solar six zone IR belt furnace with zone 1, 2, 3, 4, 5 and 6 temperatures of 620, 460, 440, 450, 520 and 840° C., respectively. The average width and height of the fingers for the unfired and fired fingers were measured from cross sectional images using an optical microscope and scanning electron microscope, respectively. FIG. 40 shows a cross sectional image of a fired finger. The reduction to the dimensions was due to the densification of the internal structure. The cross-sectional SEM image of a finger (printed with past 53) fired using a TP solar six zone IR belt furnace is shown in FIG. 40.

TABLE 31

| Paste ID | No. of prints | Average mass of paste used to print fingers on cell 1/16 cell ~4 × 4 cm² (mg) | No. of fingers (mg) | Screen opening for fingers (μm) | Average width of unfired fingers (μm) | Average height of unfired fingers (μm) | Average width of fired fingers (μm) | Average height of fired fingers (μm) |
|---|---|---|---|---|---|---|---|---|
| Paste 53 | 3 | 18 | 23 | 100 | 115 | 82 | 91.8 | 55.4 |

Figure 41B:
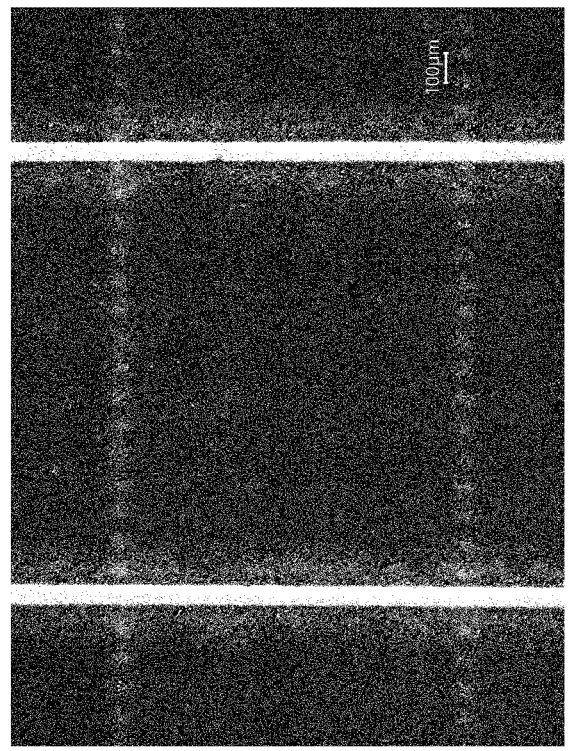
FIGS. 41A and 41B are optical microscope images of a finger printed through two different screen sizes before firing according to one example.
Figure 41A:
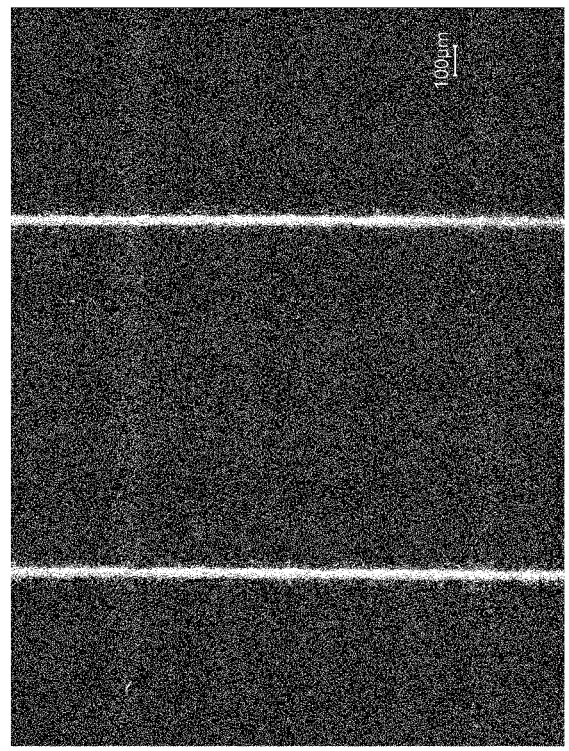

The printed width (see e.g., $W_2$ in FIG. 4) can be reduced further by adjusting the screen. Reducing the finger opening and increasing the mesh count to a higher number leads to smaller openings, thus reducing the amount of paste passing through the screen. A screen opening smaller than the target finger width is typically used. In other words, the printed width is usually wider than the corresponding screen opening dimension. Reducing the diameter of the wires in the mesh, as well as the EOM reduces the thickness of the deposit. These changes coupled with changes to the print speed are common changes made to achieve the target. Table 32 and FIGS. 41A and 41B illustrate the impact of the screen parameters on the printed width of a relatively lower viscosity paste. In FIGS. 41A and 41B, the optical microscope image of the paste (Paste 63) is shown following printing through a 360 mesh screen with 60 μm wide finger opening (see FIG. 41A) and a 400 mesh screen with a 35 μm wide finger opening (see FIG. 41B).

TABLE 32

| Material | Paste ID Paste 63 |
|---|---|
| Organic Binder: PVP 8,000 | 8.36 g (3.86 wt %) |
| Organic Solvent: Dipropylene Glycol | 17.99 g (8.32 wt %) |
| A/B/C nanoparticles: Ni/Ni/Pb NPs (higher Pb content) | 5.55 g (2.57 wt %) |
| Secondary Oxide: $Sb_2O_3$ | 18.59 g (8.60 wt %) |
| Cu/D powders: Cu/Ni(?)P - fine copper powders (1.2-3.2 microns) | 165.79 g (76.66 wt %) |
| Secondary Oxide to Nanoparticle ratio | 3.35 |
| Total amount of glass frits | 11.17 wt% |
| Surface Area of Cu/Ni(?)P - fine copper powders (1.2-3.2 microns) | 0.67 $m^2/g$ |
| Total surface area for the copper powders per gram of paste ($m^2$ per gram of paste) | 0.51 |

While the present invention has been illustrated by a description of various embodiments and while these embodiments have been described in some detail, it is not the intention of the inventors to restrict or in any way limit the scope of the appended claims to such detail. Thus, additional advantages and modifications will readily appear to those of ordinary skill in the art. The various features of the invention may be used alone or in any combination depending on the needs and preferences of the user.

What is claimed is:

1. A paste for use in metallization of a solar cell, the paste comprising:
   an organic vehicle including polyvinylpyrrolidone, and
   a mixture of copper-containing particles, metal-oxide-containing nanoparticles, and secondary oxide particles in the organic vehicle,
   wherein the metal-oxide-containing nanoparticles include nanoparticles consisting of a mixed oxide selected from oxides of
   (i) nickel and lead;
   (ii) manganese and lead;
   (iii) copper, nickel, and lead;
   (iv) copper, silver, nickel, and lead;
   (v) cobalt and lead;
   (vi) nickel, cobalt, and lead; or
   (vii) nickel, silver, and lead, or
   (viii) a mixture of two or more nanoparticles (i)-(vii), and
   wherein the secondary oxide particles include particles of a metal oxide, and a metal of the metal oxide is capable of reducing at least some of the metal-oxide-containing nanoparticles to metal when the paste is heated to a temperature at which the organic vehicle decomposes.

2. The paste of claim 1 wherein the copper-containing particles include metallic copper particles, copper-containing alloy particles, or copper-containing non-metallic particles or a mixture of two or more thereof.

3. The paste of claim 2 wherein the copper-containing particles have a plurality of metallic particles and/or a plurality of oxide/hydroxide particles on a surface thereof.

4. The paste of claim 3 wherein the plurality of oxide/hydroxide particles are metal oxide particles in which the metal of the metal oxide is selected from nickel, cobalt, and manganese or combinations thereof.

5. The paste of claim 3 wherein the plurality of metallic particles and/or the plurality of oxide/hydroxide particles on the surface of the copper-containing particles are doped with at least phosphorous.

6. The paste of claim 3 wherein the surfaces of the copper-containing particles are not fully covered by the plurality of metallic particles and/or the plurality of oxide/hydroxide particles.

7. The paste of claim 1 wherein the secondary oxide particles include particles consisting of antimony oxide.

8. The paste of claim 1 wherein the metal-oxide-containing nanoparticles consist of a mixed oxide of nickel and lead.

9. The paste of claim 1 wherein a ratio of secondary oxide particles to metal-oxide-containing nanoparticles is in a range of 0.50 to 16.96 by weight.

10. The paste of claim 3 wherein the plurality of metallic particles include one metal selected from nickel, cobalt, and manganese or a combination thereof and the copper-containing particles with the plurality of metallic particles have a surface area in the range of 0.22 $m^2/g$ to 5 $m^2/g$.

11. A paste comprising:
   an organic vehicle including polyvinylpyrrolidone, and
   a mixture of particles including metallic copper particles, nanoparticles, and metal oxide particles in the organic vehicle,
   wherein the nanoparticles include nanoparticles consisting of a mixed oxide selected from oxides of
   (i) nickel and lead;
   (ii) manganese and lead;
   (iii) copper, nickel, and lead;
   (iv) copper, silver, nickel, and lead;
   (v) cobalt and lead;
   (vi) nickel, cobalt, and lead; or
   (vii) nickel, silver, and lead, or
   (viii) a mixture of two or more nanoparticles (i)-(vii), and
   wherein the metal oxide particles include a metal oxide selected from oxides of antimony, tin, tellurium, manganese, phosphorous, bismuth, chromium, aluminum, cobalt, copper, and nickel or combinations thereof.

12. The paste of claim 11 wherein the metal oxide of the metal oxide particles has a more negative Gibbs Free Energy of Formation than the mixed metal oxide of the nanoparticles.

13. A solar cell made with the paste of claim 1.

14. The paste of claim 1 wherein the metal oxide of the secondary oxide particles is one or more of antimony oxide, tin oxide, tellurium oxide, manganese oxide, phosphorous oxide, bismuth oxide, chromium oxide, and aluminum oxide.

15. The paste of claim 1 wherein all dimensions of the metal-oxide-containing nanoparticles are equal to or less than 100 nm.

16. The paste of claim 11 wherein all dimensions of the nanoparticles are equal to or less than 100 nm.

17. The paste of claim 11 wherein the metal oxide of the metal oxide particles is selected from oxides of antimony, tin, tellurium, manganese, phosphorous, bismuth, chromium, and aluminum or combinations thereof.

18. The paste of claim 11 wherein the metallic copper particles have a plurality of metallic particles and/or a plurality of oxide/hydroxide particles on a surface thereof.

19. The paste of claim 18 wherein the plurality of oxide/hydroxide particles are metal oxide particles in which the metal of the metal oxide is selected from nickel, cobalt, and manganese or combinations thereof.

20. The paste of claim 18 wherein the plurality of metallic particles and/or the plurality of oxide/hydroxide particles on the surface of the metallic copper particles are doped with at least phosphorous.

21. The paste of claim 18 wherein the surfaces of the metallic copper particles are not fully covered by the plurality of metallic particles and/or the plurality of oxide/hydroxide particles.

22. The paste of claim 18 wherein the plurality of metallic particles and/or a plurality of oxide/hydroxide particles include one metal selected from nickel, cobalt, and manganese or a combination thereof and the metallic copper particles with the plurality of metallic particles and/or a plurality of oxide/hydroxide particles have a surface area in the range of 0.22 $m^2$/g to 5 $m^2$/g.

23. The paste of claim 11 wherein a ratio of metal oxide particles to nanoparticles is in a range of 0.50 to 16.96 by weight.

24. The paste of claim 11 wherein the metal oxide particles include particles consisting of antimony oxide.

25. A solar cell made with the paste of claim 11.

26. A paste for use in metallization of a solar cell, the paste comprising:
an organic vehicle, and
a mixture of copper-containing particles, metal-oxide-containing nanoparticles, and secondary oxide particles in the organic vehicle,
wherein the metal-oxide-containing nanoparticles include nanoparticles consisting of a mixed oxide selected from oxides of
(i) nickel and lead;
(ii) manganese and lead;
(iii) copper, nickel, and lead;
(iv) copper, silver, nickel, and lead;
(v) cobalt and lead;
(vi) nickel, cobalt, and lead; or
(vii) nickel, silver, and lead, or
(viii) a mixture of two or more nanoparticles (i)-(vii), and
wherein the secondary oxide particles include particles consisting of antimony oxide and antimony is capable of reducing at least some of the metal-oxide-containing nanoparticles to metal when the paste is heated to a temperature at which the organic vehicle decomposes.

27. A paste comprising:
an organic vehicle, and
a mixture of particles including metallic copper particles, nanoparticles, and metal oxide particles in the organic vehicle,
wherein the nanoparticles include nanoparticles consisting of a mixed oxide selected from oxides of
(i) nickel and lead;
(ii) manganese and lead;
(iii) copper, nickel, and lead;
(iv) copper, silver, nickel, and lead;
(v) cobalt and lead;
(vi) nickel, cobalt, and lead; or
(vii) nickel, silver, and lead, or
(viii) a mixture of two or more nanoparticles (i)-(vii), and
wherein the metal oxide particles include particles consisting of antimony oxide.

28. The paste of claim 1 wherein the copper-containing particles consist essentially of copper.

29. The paste of claim 26 wherein the copper-containing particles consist essentially of copper.

30. The paste of claim 1 wherein the paste is from 62 wt. % to 98 wt. % copper metal.

31. The paste of claim 11 wherein the paste is from 62 wt. % to 98 wt. % copper metal.

32. The paste of claim 26 wherein the paste is from 62 wt. % to 98 wt. % copper metal.

33. The paste of claim 27 wherein the paste is from 62 wt. % to 98 wt. % copper metal.

* * * * *